US006407480B1

(12) United States Patent
Nakanishi et al.

(10) Patent No.: US 6,407,480 B1
(45) Date of Patent: Jun. 18, 2002

(54) CIRCUIT FOR DRIVING PIEZOELECTRIC TRANSFORMER

(75) Inventors: Hideyuki Nakanishi; Takahiro Kobayashi, both of Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/581,974

(22) PCT Filed: Oct. 19, 1999

(86) PCT No.: PCT/JP99/05772

§ 371 (c)(1), (2), (4) Date: Jul. 12, 2000

(87) PCT Pub. No.: WO00/24115

PCT Pub. Date: Apr. 27, 2000

(30) Foreign Application Priority Data

Oct. 21, 1998 (JP) ........................................ 10-319778
Nov. 2, 1998 (JP) ........................................ 10-311761

(51) Int. Cl.[7] ........................................ H01L 41/08

(52) U.S. Cl. ........................................ 310/316.01

(58) Field of Search ........................ 310/316.01, 317, 310/318, 319, 359

(56) References Cited

U.S. PATENT DOCUMENTS

| | | | | |
|---|---|---|---|---|
| 5,705,879 A | * | 1/1998 | Abe et al. | 310/359 |
| 5,731,652 A | | 3/1998 | Shimada | |
| 5,739,622 A | | 4/1998 | Zaitsu | |
| 5,942,835 A | | 8/1999 | Furuhashi et al. | |
| 6,078,124 A | * | 6/2000 | Furuhashi et al. | 310/318 |
| 6,087,757 A | * | 7/2000 | Honbo et al. | 310/316.01 |
| 6,198,198 B1 | * | 3/2001 | Fujimura et al. | 310/316.01 |

FOREIGN PATENT DOCUMENTS

| | | |
|---|---|---|
| EP | 0 388 109 | 10/1989 |
| EP | 0 706 306 | 4/1996 |
| EP | 0 758 159 A2 | 2/1997 |

(List continued on next page.)

OTHER PUBLICATIONS

WO 98/09369, Control Citcuit and Method for Piezoelectric Transformer, Publication Date Mar. 5, 1998.

Nikkei Electronics Journal, No. 621, (XP002159420), Nov. 1994, pp. 147–157 (cited on p. 3 of specification).

(List continued on next page.)

*Primary Examiner*—Mark O. Budd
(74) *Attorney, Agent, or Firm*—Pearne & Gordon LLP

(57) ABSTRACT

In order to provide a piezoelectric transformer-driving circuit capable of obtaining a drive pulse signal having a high frequency resolution from a clock having a low frequency, carrying out voltage detection by using a low-cost configuration, and carrying out digital processing, a piezoelectric transformer-driving circuit in accordance with the present invention is configured so that an error voltage calculation circuit multiplies the difference data between the output data of an A/D converter and reference data supplied externally by a constant and outputs the result as error data, so that a frequency setting circuit sets the frequency of the drive pulse signal of the piezoelectric transformer as M-bit data depending on the error data, and so that a frequency division ratio distribution divider circuit divides a clock having a predetermined frequency to generate the drive pulse signal of the piezoelectric transformer, wherein the frequency division ratio of the frequency division ratio distribution divider circuit is distributed for the period of N cycles (N: an integer) of the drive pulse signal of the piezoelectric transformer, and the average frequency division ratio for the period of N cycles is substantially equal to the value obtained by dividing the M-bit data output from the above-mentioned frequency setting circuit by N.

40 Claims, 62 Drawing Sheets

FOREIGN PATENT DOCUMENTS

| | | | |
|---|---|---|---|
| EP | 0 758 839 | | 2/1997 |
| EP | 0 762 808 | | 3/1997 |
| EP | 0 763 966 | | 3/1997 |
| EP | 0 782 374 | | 7/1997 |
| EP | 0 910 229 | A2 | 4/1999 |
| JP | 59-190724 | | 10/1984 |
| JP | 2-152198 | | 6/1990 |
| JP | 8-251929 | | 9/1996 |
| JP | 0 827 3862 | | 10/1996 |
| JP | 9-51681 | | 2/1997 |
| JP | 10-127058 | | 5/1998 |
| JP | 10-223390 | | 8/1998 |

OTHER PUBLICATIONS

WO 98/54934, Control Circuit and Method for Piezoelectric Transformer, Internatl. Publ. Date Dec. 1998.

PCT Appplication number WO 98/19348, "Converter with Piezoceramic Transformer", Published May 1998.

PCT Application number WO 98/25441, "Circuit Arrangement", Published Jun. 1998.

* cited by examiner (a) When A/D input signal is DC voltage (b) When A/D input signal is AC voltage Frequency characteristic of piezoelectric transformer

CIRCUIT FOR DRIVING PIEZOELECTRIC TRANSFORMER

TECHNICAL FIELD

The present invention relates to a driving circuit for a piezoelectric transformer, widely used as a step-up transformer for driving the backlight of a liquid crystal display monitor, and the like.

BACKGROUND ART

In recent years, liquid crystal display monitors have been incorporated in portable compact video apparatuses, such as a VCR integrated with a camera and a digital camera. As a step-up transformer for driving a cold cathode tube widely used for the backlight etc. of a liquid crystal display monitor of compact video apparatus, a piezoelectric transformer which can be made thinner, has higher efficiency and can be free from the generation of magnetic line forces has begun to be used in place of an electromagnetic transformer having been used conventionally. The piezoelectric transformer is a voltage conversion device, wherein an input AC voltage is applied to the primary electrode of a piezoelectric device, mechanical vibration is generated by using a piezoelectric effect, and a voltage amplified depending on a voltage step-up ratio determined by the shape of the piezoelectric transformer is taken out from the secondary electrode thereof. The piezoelectric transformer does not cause any leak magnetic fluxes because it does not use a method wherein voltage is changed via magnetic energy by using windings. For this reason, it is advantageous in not causing noise outside its inverter. In addition, since the piezoelectric transformer selects and outputs only the frequency determined by its outer dimensions, its output waveform is close to a sine wave, thereby being advantageous in reducing the occurrence of high-frequency noise. Furthermore, since the piezoelectric transformer is a mineral formed by sintering a ceramic material, it has the advantage of causing no risk of smoking and ignition.

FIG. 61 is a graph showing the general characteristic of a piezoelectric transformer, the abscissa represents the frequency [Hz] of an input voltage, and the ordinate represents an output value [dB].

As shown in FIG. 61, the piezoelectric transformer has a resonance characteristic, and the output value obtained from the secondary electrode differs depending on the frequency of the AC voltage input to the primary electrode. Therefore, in the piezoelectric transformer, in order to control the brightness of the backlight at a constant level, the voltage output from the secondary electrode can be adjusted to a desired level by controlling the frequency of the AC voltage input to the piezoelectric transformer. As described above, the voltage having the desired level is output from the secondary electrode of the piezoelectric transformer, whereby a stable voltage is applied to a cold cathode tube. A typical technology for the driving circuit of such a piezoelectric transformer has been disclosed in a Japanese monthly magazine, NIKKEI ELECTRONICS, Nov. 7, 1994 (No. 621), pages 147 to 157.

The configuration of the piezoelectric transformer-driving circuit in accordance with the above-mentioned prior art will be described briefly below by referring to FIG. 62. FIG. 62 is a block diagram showing the configuration of the above-mentioned conventional piezoelectric transformer-driving circuit.

In FIG. 62, a piezoelectric transformer 101 is a voltage transformation device for obtaining an amplified voltage. A transformer with winding 102 disposed ahead of the piezoelectric transformer 101 and used as a pre-transformer is an electromagnetic transformer provided to supplement the insufficient voltage step-up of the piezoelectric transformer 101. The voltage from the piezoelectric transformer 101 is applied to a cold cathode tube 103. A current detector 104 detects the current flowing through the cold cathode tube 103 and converts it into a voltage signal. A rectifying circuit 105 rectifies the sine wave like AC voltage output from the current detector 104, and converts it into a detection signal of a near DC voltage. A first adder 107 calculates the balance voltage between the detection signal output from the rectifying circuit 105 and a brightness setting voltage, that is, reference data (a reference voltage) which is input externally. An integrator 150 used as a filter circuit integrates the balance voltage output from the first adder 107 and converts it into a DC voltage.

A second adder 180 adds the DC voltage, which is the output of the integrator 150, to an initial value for determining the oscillation frequency of the piezoelectric transformer 101 at the time of power-on, and outputs a frequency setting voltage. A V-F converter 190 oscillates at a frequency corresponding to the above-mentioned frequency setting voltage. The V-F converter 190 has been set so that the oscillation frequency becomes high when the frequency setting voltage is negative, and so that the oscillation frequency becomes low when the frequency setting voltage is positive. Furthermore, the V-F converter 190 has been set to oscillate at a frequency sufficiently higher than the resonance frequency of the piezoelectric transformer 101 at the time of power-on. A driving circuit 110 formed of a power transistor amplifies the signal output from the V-F converter 190 to drive the winding transformer 102.

In the driving circuit of the piezoelectric transformer 101 configured as described above, at the time of power-on, the V-F converter 190 oscillates at a frequency higher than the resonance frequency of the piezoelectric transformer 101, and a voltage lower than the voltage level of the resonance frequency is output from the secondary electrode of the piezoelectric transformer 101. The voltage output from the secondary electrode of the piezoelectric transformer 101 is applied to the cold cathode tube 103.

A current in proportion to the applied voltage flows through the cold cathode tube 103, and the current flowing through the cold cathode tube 103 is converted into a voltage by the current detector 104, and is further converted into a nearly DC voltage by the rectifying circuit 105.

In the above-mentioned configuration, when the reference voltage to be supplied externally has a voltage level shown at point A of the characteristic curve shown in FIG. 61 and when the voltage obtained from the rectifying circuit 105 is the voltage at point B of the characteristic curve shown in FIG. 61, the balance voltage at the first adder 107 becomes positive. For this reason, the input voltage of the V-F converter 190 rises gradually, and the oscillation frequency output from the V-F converter 190 begins to lower. This operation raises the level of the voltage output from the piezoelectric transformer 101 and increases the current flowing through the cold cathode tube 103.

On the other hand, when the voltage obtained from the rectifying circuit 105 is the voltage at point C of the characteristic curve shown in FIG. 61, the balance voltage at the first adder 107 becomes negative, and the oscillation frequency output from the V-F converter 190 rises. This operation lowers the voltage level output from the piezoelectric transformer 101 and reduces the current flowing through the cold cathode tube 103.

As described above, the conventional piezoelectric transformer-driving circuit feeds back the current flowing through the cold cathode tube 103 and controls the oscillation frequency so that the current value is equal to the level of the reference data supplied externally thereby stabilizing the brightness of the backlight.

Furthermore, as another method of stabilizing the brightness of the backlight, methods have been disclosed in the Japanese published unexamined Utility Model Application No. Hei 4-58085 and the Japanese published unexamined Utility Model Application No. Hei 5-4779. In both of these methods, control is carried out at the resonance frequency at which the piezoelectric device has the highest efficiency. The principle thereof uses the fact that the phase difference between the voltage phase and the current phase obtained from the secondary side of the piezoelectric device becomes zero at the resonance frequency; the phase difference between the two is detected and frequency control is carried out so that the difference becomes zero. In this case, the output voltage is fixed at the output voltage obtained at the resonance point, therefore, it is general that the method of adjusting the brightness of the backlight is carried out by adjusting the voltage of the power supply.

When installing this kind of conventional piezoelectric transformer-driving circuit in compact video apparatuses such as a VCR integrated with a camera, a digital camera and the like, the apparatuses are desired to be made more compact so that the portability of the compact video apparatuses can be enhanced. For this reason, it is necessary to reduce the number of parts and to save space. However, since the conventional piezoelectric transformer-driving circuit is formed of an analog circuit, it has been difficult to reduce the number of parts.

Therefore, the piezoelectric transformer-driving circuit is desired to be digitalized in order to reduce the number of parts. However, the following requirements must be satisfied to digitalize the conventional piezoelectric transformer-driving circuit formed of an analog system.

(1) A high-frequency clock is required to obtain the frequency accuracy required for controlling the piezoelectric transformer.

(2) A multi-bit A/D converter is required to obtain voltage detection performance nearly equivalent to that of the analog system, therefore, an expensive LSI is required.

The above-mentioned requirements (1) and (2) will be described specifically.

Regarding the requirement (1), as a method of generating the drive pulse signal for the piezoelectric transformer, a method of obtaining a drive pulse signal having a desired frequency by frequency-dividing the clock is available. In this method of frequency-dividing the clock, the frequency of the clock required to control the current of the cold cathode tube in a predetermined range (±1% for example) is simply obtained from the frequency characteristic curve showing the relationship between the output (dB) and the drive frequency (Hz) at the secondary electrode of the piezoelectric transformer in FIG. 61.

In a typical piezoelectric transformer, its resonance frequency is about 100 KHz, and the average frequency sensitivity in the frequency range (on the higher frequency side from the resonance frequency) to be controlled is to the extent that the change in the voltage value is about nearly +100% to −50% depending on the frequency change of 1 KHZ. Since the current flowing through the cold cathode tube is proportional to the voltage of the secondary electrode of the piezoelectric transformer, the voltage of the secondary electrode of the piezoelectric transformer is required to be limited within about ±1% in order to limit the value of the current flowing through the cold cathode tube within ±1%.

In order to reduce the voltage of the secondary electrode of the piezoelectric transformer within about ±1%, the frequency resolution of the drive pulse signal is required to be at least about 10 to 20 Hz. The clock frequency required to obtain a frequency resolution of 10 to 20 Hz at about 100 KHZ is 500 MHz to 1 GHz. This kind of high clock frequency is not a practical clock frequency in consideration of emission interference, supply power and the like.

Regarding the above-mentioned requirement (2), a current detector having a detection accuracy of ±1% or less is required to control the current of the cold cathode tube within a predetermined range (±1% for example just as in the above-mentioned case). Furthermore, more accurate detection is necessary in consideration of the variations in the current detector and the rectifying circuit. Therefore, in order to control the current of the cold cathode tube within the predetermined range, an 8 or 9-bit A/D converter is required eventually. If such a converter is built in an LSI, the area of the chip becomes large, thereby being disadvantageous in cost.

The present invention has been devised to solve the above-mentioned problems, and is intended to propose a piezoelectric transformer-driving circuit capable of forming a drive pulse signal having a high frequency resolution from a clock having a low frequency and capable of detecting a voltage suited for digital processing by using a simple low-cost configuration.

DISCLOSURE OF INVENTION

In order to attain the above-mentioned objects, a piezoelectric transformer-driving circuit in accordance with the present invention comprises:

- a piezoelectric transformer supplied with a controlled current to be supplied to a cold cathode tube and driven at the frequency of a drive pulse signal,
- a current detector for detecting a load current flowing through the above-mentioned cold cathode tube,
- a rectifying circuit for converting a sine wave like AC voltage obtained from the above-mentioned current detector into a substantially DC voltage,
- an A/D converter for converting the voltage signal rectified by the above-mentioned rectifying circuit into a digital signal,
- an error voltage calculation circuit for multiplying the difference data between the output data of the above-mentioned A/D converter and reference data supplied externally by a constant and for outputting the result as error data,
- a frequency setting circuit for setting the frequency of the drive pulse signal of the piezoelectric transformer as M-bit data (M: an integer) depending on the above-mentioned error data,
- a divider circuit for dividing a clock having a predetermined frequency at a predetermined frequency division ratio to generate the drive pulse signal of the piezoelectric transformer, for distributing the above-mentioned frequency division ratio for the period of N cycles (N: an integer) of the drive pulse signal of the above-mentioned piezoelectric transformer and for carrying out control so that the average frequency division ratio in the period of N cycles is substantially equal to the value obtained by dividing the M-bit data output from the above-mentioned frequency setting circuit by N, and

- a power transistor for driving the above-mentioned piezoelectric transformer.

In accordance with the present invention configured as described above, the frequency division ratio of the drive pulse signal is distributed, and therefore, the resolution of the average frequency is improved, and it is possible to obtain a piezoelectric transformer-driving circuit capable of obtaining a frequency for setting the brightness of the cold cathode tube at a desired value.

A piezoelectric transformer-driving circuit in accordance with the present invention from another point of view comprises:

- a piezoelectric transformer supplied with a controlled current to be supplied to a cold cathode tube and driven at the frequency of a drive pulse signal,
- a current detector for detecting a load current flowing through the above-mentioned cold cathode tube,
- a rectifying circuit for converting a sine wave like AC voltage obtained from the above-mentioned current detector into a substantially DC voltage,
- an A/D converter for converting the voltage signal rectified by the above-mentioned rectifying circuit into a digital signal,
- an error voltage calculation circuit for multiplying by a constant the difference data between the output data of the above-mentioned A/D converter and the reference data supplied externally, thereby outputting the result as error data,
- a frequency setting circuit for setting the frequency of the drive pulse signal of the piezoelectric transformer as M-bit data (M: an integer) in accordance with the above-mentioned error data,
- a divider circuit for dividing a clock having a predetermined frequency to generate the drive pulse signal of the piezoelectric transformer, and
- a power transistor for driving the above-mentioned piezoelectric transformer, wherein
- the frequency division ratio of the above-mentioned divider circuit is distributed in the period of predetermined cycles, and the frequency division ratio at the $(\mathbf{A0}\cdot 2^0+\mathbf{A1}\cdot 2^1+ \ldots +An-1\cdot 2^{n-1})$th cycle (wherein, in the above-mentioned expression, Ax represented by A0, A1, . . . An−1 is a numerical value, 0 or 1) is given from the low-order n-bit data $(\mathbf{B0}\cdot 2^0+\mathbf{B1}\cdot 2^1+ \ldots +Bn-1\cdot 2^{n-1}$; where, in the above-mentioned expression, Bx represented by B0, B1, . . . , Bn−1 is a numerical value, 0 or 1) and the high-order m-bit data C (C: a decimal number) of the M-bit data output from the above-mentioned frequency setting circuit by the following expression (5):

$$\{A\mathbf{0}\cdot Bn-1+\overline{A\mathbf{0}}\cdot A\mathbf{1}\cdot Bn-2+ \ldots +\overline{A\mathbf{0}}\cdot A\mathbf{1}\cdot \ldots An-2\cdot An-1\cdot B\mathbf{0}\}+C \quad (5).$$

In the expression (5), "$\overline{\text{Ax}}$" represents the inversion of "Ax" (1 is converted into 0, and 0 is converted into 1), and the upper bars in the following descriptions are used to represent this meaning.

In accordance with the present invention configured as described above, the levels of the low frequency components become lower, and therefore, it is possible to obtain a piezoelectric transformer-driving circuit capable of suppressing the flicker phenomenon that is apt to appear as the frequency is lower or as the level of the change in brightness is larger.

A piezoelectric transformer-driving circuit in accordance with the present invention from another point of view comprises:

- a piezoelectric transformer supplied with a controlled current to be supplied to a cold cathode tube and driven at the frequency of a drive pulse signal,
- a current detector for detecting a load current flowing through the above-mentioned cold cathode tube,
- a rectifying circuit for converting a sine wave like AC voltage obtained from the above-mentioned current detector into a substantially DC voltage,
- an A/D converter for converting the rectified voltage signal into a digital signal by using a predetermined sampling clock,
- a smoothing circuit for smoothing the output data of the above-mentioned A/D converter in a predetermined cycle,
- an error voltage calculation circuit for multiplying the difference data between the output data of the above-mentioned smoothing circuit and reference data supplied externally by a constant and for outputting the result as error data,
- a frequency setting circuit for setting the frequency of the drive pulse signal of the piezoelectric transformer as M-bit data depending on the above-mentioned error data,
- a divider circuit for dividing a clock having a predetermined frequency to generate the drive pulse signal of the piezoelectric transformer, and
- a power transistor for driving the above-mentioned piezoelectric transformer.

In accordance with the present invention configured as described above, a high voltage detection resolution can be obtained even if a low-bit A/D converter is used, thereby having a great effect in reducing cost, in addition, it is not necessary to install a large-capacitance capacitor, and therefore, the space for parts can be saved, thereby being highly effective in making compact video apparatuses more compact.

A piezoelectric transformer-driving circuit in accordance with the present invention from another point of view comprises:

- a piezoelectric transformer supplied with a controlled current to be supplied to a cold cathode tube and driven at the frequency of a drive pulse signal,
- a current detector for detecting a load current flowing through the above-mentioned cold cathode tube,
- a half-wave rectifying circuit for half-wave rectifying a sine wave like AC voltage obtained from the above-mentioned current detector,
- a comparator for comparing the half-wave rectified voltage signal with a predetermined reference voltage and for outputting "H" level data or "L" level data,
- a pulse width detection circuit for detecting the pulse width of the output data of the above-mentioned comparator,
- a smoothing circuit for smoothing the pulse width data output from the above-mentioned pulse width detection circuit in a predetermined cycle,
- an error voltage calculation circuit for multiplying the difference data between the output data of the above-mentioned smoothing circuit and reference data supplied externally by a constant and for outputting the result as error data,
- a frequency setting circuit for multiplying the output data of the above-mentioned smoothing circuit by a constant and for setting the frequency of the drive pulse signal of the piezoelectric transformer as M-bit data (M: an integer), a divider circuit for dividing a clock having a predetermined frequency to generate the drive pulse signal of the piezoelectric transformer, and a power transistor for driving the above-mentioned piezoelectric transformer.

In accordance with the present invention configured as described above, voltage detection is carried out by using the half-wave rectifying circuit and the comparator, therefore, voltage detection is made possible with high accuracy by using a simple and low-cost configuration, whereby the effect thereof is significant in the digitalization of the piezoelectric transformer-driving circuit.

A piezoelectric transformer-driving circuit in accordance with the present invention from another point of view comprises:

a piezoelectric transformer supplied with a controlled current to be supplied to a cold cathode tube and driven at the frequency of a drive pulse signal, a current detector for detecting a load current flowing through the above-mentioned cold cathode tube, a rectifying circuit for converting a sine wave like AC voltage obtained from the above-mentioned current detector into a substantially DC voltage, a comparator for comparing the rectified voltage signal with a predetermined reference voltage and for outputting "H" level data or "L" level data, a counter circuit for counting the output data of the above-mentioned comparator for a predetermined period, a smoothing circuit for smoothing the count data output from the above-mentioned counter circuit in a predetermined cycle, a selector circuit for selecting the output data of the above-mentioned smoothing circuit or the output data of the above-mentioned counter circuit and for outputting the selected data, an error voltage calculation circuit for multiplying the difference data between the output data of the above-mentioned selector circuit and reference data supplied externally by a constant and for outputting the result as error data, a frequency setting circuit for setting the frequency of the drive pulse signal of the piezoelectric transformer as M-bit data (M: an integer) depending on the above-mentioned error data, a divider circuit for dividing a clock having a predetermined frequency to generate the drive pulse signal of the piezoelectric transformer, and a power transistor for driving the above-mentioned piezoelectric transformer.

In accordance with the present invention configured as described above, voltage detection values can be digitalized with high accuracy by a simple configuration using the comparator, in addition, a significant effect is obtained for the digitalization of the piezoelectric transformer-driving circuit.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a rectifying circuit for converting a sine wave like voltage obtained from the above-mentioned current detection circuit into a DC voltage, an A/D converter for converting the rectified voltage signal into a digital signal, an error voltage calculation circuit for multiplying the difference data between the output data of the above-mentioned A/D converter and reference data supplied externally by a constant and for outputting the result as error data, a frequency setting circuit for setting the frequency of the drive pulse signal of the piezoelectric transformer as M-bit data depending on the above-mentioned error data, a divider circuit for performing frequency division at the positive edges of a clock having a predetermined frequency to generate the drive pulse signal of the piezoelectric transformer, a reverse-edge processing circuit for latching the output pulse signal of the above-mentioned divider circuit at the reverse edges of the above-mentioned clock and for outputting the latched signal, a selector for selecting the drive pulse signal output from the above-mentioned divider circuit or the drive pulse signal output from the above-mentioned reverse-edge processing circuit and for outputting the selected pulse signal, and a power transistor for driving the piezoelectric transformer, wherein the frequency division ratio of the above-mentioned divider circuit is distributed for the period of N cycles of the drive pulse signal of the above-mentioned piezoelectric transformer so that the average frequency division ratio for the period of N cycles is substantially equal to the value obtained by dividing the M-bit data output from the above-mentioned frequency setting circuit by N and so that the fluctuation of the frequency division ratio for the period of N cycles is one or less.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a rectifying circuit for converting a sine wave like voltage obtained from the above-mentioned current detection circuit into a DC voltage, an A/D converter for converting the rectified voltage signal into a digital signal, an error voltage calculation circuit for multiplying the difference data between the output data of the above-mentioned A/D converter and reference data supplied externally by a constant and for outputting the result as error data, a frequency setting circuit for setting the frequency of the drive pulse signal of the piezoelectric transformer as M-bit data depending on the above-mentioned error data, a divider circuit for dividing a clock having a predetermined frequency to generate the drive pulse signal of the piezoelectric transformer, a pulse width setting circuit for setting the duty ratio of the drive pulse signal output from the above-mentioned divider circuit depending on power supply voltage information from an external microcomputer system, and a power transistor for driving the piezoelectric transformer.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a rectifying circuit for converting a sine wave like voltage obtained from the above-mentioned current detection circuit into a DC voltage, an A/D converter for converting the rectified voltage signal into a digital signal, an error voltage calculation circuit for multiplying the difference data between the output data of the above-mentioned A/D converter and reference data supplied externally by a constant and for outputting the result as error data, a peak detection circuit for holding the output data of the above-mentioned A/D converter for a predetermined period and for comparing the output data with previous data to detect the resonance point of the piezoelectric transformer, a polarity inversion circuit for inverting the polarity of the above-mentioned error data depending on the output data of the above-mentioned peak detection circuit a frequency setting circuit for setting the frequency of the drive pulse signal of the piezoelectric transformer by adding the output data of the above-mentioned polarity inversion circuit to the previous frequency setting value, a divider circuit for dividing a clock having a predetermined frequency at a frequency division ratio depending on the output data of the above-mentioned frequency setting circuit to generate the drive pulse signal of the piezoelectric transformer, and a power transistor for driving the above-mentioned piezoelectric transformer.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a rectifying circuit for converting a sine wave like voltage obtained from the above-mentioned current detection circuit into a DC voltage, an A/D converter for converting the rectified voltage signal into a digital signal, an error voltage calculation circuit for multiplying the difference data between the output data of the above-mentioned A/D converter and reference data supplied externally by a constant and for outputting the result as error data, a peak detection circuit for holding the output data of the above-mentioned A/D converter for a predetermined period and for comparing the output data with previous data to detect the resonance point of the piezoelectric transformer, a frequency setting circuit for adding the above-mentioned error data to the previous frequency setting data and for outputting the result, a selector for selecting the output of the above-mentioned frequency setting circuit or the frequency setting data at the previous N-th time and for outputting the selected data as the frequency setting data of the drive pulse signal of the piezoelectric transformer, a divider circuit for dividing a clock having a predetermined frequency at a frequency division ratio depending on the output data of the above-mentioned selector to generate the drive pulse signal of the piezoelectric transformer, and a power transistor for driving the above-mentioned piezoelectric transformer.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a voltage detection circuit for detecting the output voltage of the piezoelectric transformer, a rectifying circuit for detecting the sine wave like voltage obtained from the above-mentioned current detection circuit or the sine wave like voltage obtained from the above-mentioned voltage detection circuit, whichever larger, and for converting the voltage into a DC voltage, a turning-off circuit for periodically turning off the output of the above-mentioned voltage detection circuit for a predetermined period, an A/D converter for converting the rectified voltage signal into a digital signal, a lighting detection circuit for detecting the output voltage of the A/D converter at the time when the above-mentioned turning-off circuit is on and for judging the lighting of the cold cathode tube, an error voltage calculation circuit for multiplying the difference data between the output data of the above-mentioned A/D converter and reference data supplied externally by a constant and for outputting the result as error data, a selector for selecting the above-mentioned reference data at the time of lighting or the above-mentioned reference data at the time of start and for outputting the selected data, a frequency setting circuit for setting an initial frequency at the time of start and for adding the above-mentioned error data to the previous frequency setting data and outputting the result at the next time and thereafter, a divider circuit for dividing a clock having a predetermined frequency at a frequency division ratio depending on the output data of the above-mentioned frequency setting circuit to generate the drive pulse signal of the piezoelectric transformer, and a power transistor for driving the above-mentioned piezoelectric transformer, wherein the frequency of the drive pulse signal of the above-mentioned piezoelectric transformer is held constant at the time when the above-mentioned turning-off circuit is on.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a rectifying circuit for detecting the sine wave like voltage obtained from the above-mentioned current detection circuit and for converting the voltage into a DC voltage, an A/D converter for converting the rectified voltage signal into a digital signal, a lighting detection circuit for detecting the output voltage of the A/D converter and for judging the lighting of the cold cathode tube, an error voltage calculation circuit for multiplying the difference data between the output data of the above-mentioned A/D converter and reference data supplied externally by a constant and for outputting the result as error data, a frequency setting circuit for setting an initial frequency at the time of start and for adding the above-mentioned error data to the previous frequency setting data and outputting the result at the next time and thereafter, a divider circuit for dividing a clock having a predetermined frequency at a frequency division ratio depending on the output data of the above-mentioned frequency setting circuit to generate the drive pulse signal of the piezoelectric transformer, an output enable circuit for controlling the output of the drive pulse signal output from the above-mentioned divider circuit, a power transistor for driving the above-mentioned piezoelectric transformer, and a restart processing circuit that disables the above-mentioned output enable circuit if the above-mentioned lighting detection circuit does not judge that lighting is attained even after a predetermined period has passed and sets the frequency setting data output from the above-mentioned frequency setting circuit at the initial frequency to perform restart processing.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a voltage detection circuit for detecting the output voltage of the piezoelectric transformer, a rectifying circuit for detecting the sine wave like voltage obtained from the above-mentioned current detection circuit or the sine wave like voltage obtained from the above-mentioned voltage detection circuit, whichever larger, and for converting the voltage into a DC voltage, a turning-off circuit for periodically turning off the output of the above-mentioned voltage detection circuit for a predetermined period, an A/D converter for converting the rectified voltage signal into a digital signal, an error voltage calculation circuit for multiplying the difference data between the output data of the above-mentioned A/D converter and reference data supplied externally by a constant and for outputting the result as error-data, a frequency setting circuit for setting an initial frequency at the time of start and for adding the above-mentioned error data to the previous frequency setting data and outputting the result at the next time and thereafter, a divider circuit for dividing a clock having a predetermined frequency at a frequency division ratio depending on the output data of the above-mentioned frequency setting circuit to generate the drive pulse signal of the piezoelectric transformer, an output enable circuit for controlling the output of the drive pulse signal output from the above-mentioned divider circuit, an abnormality detection circuit for detecting the output voltage A of the above-mentioned A/D converter when the above-mentioned turning-off circuit is on or for detecting the output voltage B of the above-mentioned A/D converter when the above-mentioned turning-off circuit is off, a protection circuit having functions for outputting a reset signal used to switch the frequency data of the above-mentioned frequency setting circuit to the initial frequency for a predetermined period and to disable the above-mentioned output enable circuit when the above-mentioned output voltage B is less than a predetermined level, and for disabling the output enable circuit to stop outputting when the output voltage A is less than the predetermined level and the output voltage B is not less than the predetermined level, and a power transistor for driving the above-mentioned piezoelectric transformer.

A piezoelectric transformer-driving circuit in accordance with the present invention from another point of view, wherein the output voltage thereof is changed by changing the frequency of a drive pulse signal to control the current flowing through a cold cathode tube, comprises:

a current detection circuit for detecting a load current, a rectifying circuit for converting the sine wave like voltage obtained from the above-mentioned current detection circuit into a DC voltage, an A/D converter for converting the rectified voltage signal into a digital signal, an error voltage calculation circuit for multiplying the difference data between the output data of the above-mentioned A/D converter and reference data supplied externally by a constant and for outputting the result as error data, a clip circuit for clipping the above-mentioned error data value in a predetermined range, a frequency setting circuit for adding the output data of the above-mentioned clip circuit to the previous frequency setting data and for outputting the result as the frequency setting data of the drive pulse signal of the piezoelectric transformer, a divider circuit for dividing a clock having a predetermined frequency at a frequency division ratio depending on the above-mentioned frequency setting data to generate the drive pulse signal of the piezoelectric transformer, and a power transistor for driving the above-mentioned piezoelectric transformer.

In accordance with the present invention configured as described above, an analog detection voltage can be converted into a highly accurate digital signal by using a simple low-cost configuration while highly accurate control performance is attained, thereby being effective in obtaining a piezoelectric transformer-driving circuit for greatly contributing to enhancing cost merit in the LSI formation of the driving circuit, thereby being greatly effective in making compact video apparatuses more compact and lower in cost.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

BEST MODE FOR CARRYING OUT THE INVENTION

Preferred embodiments of a piezoelectric transformer-driving circuit in accordance with the present invention will be described below by referring to the accompanying drawings.

<<Embodiment 1>>

Figure 1:
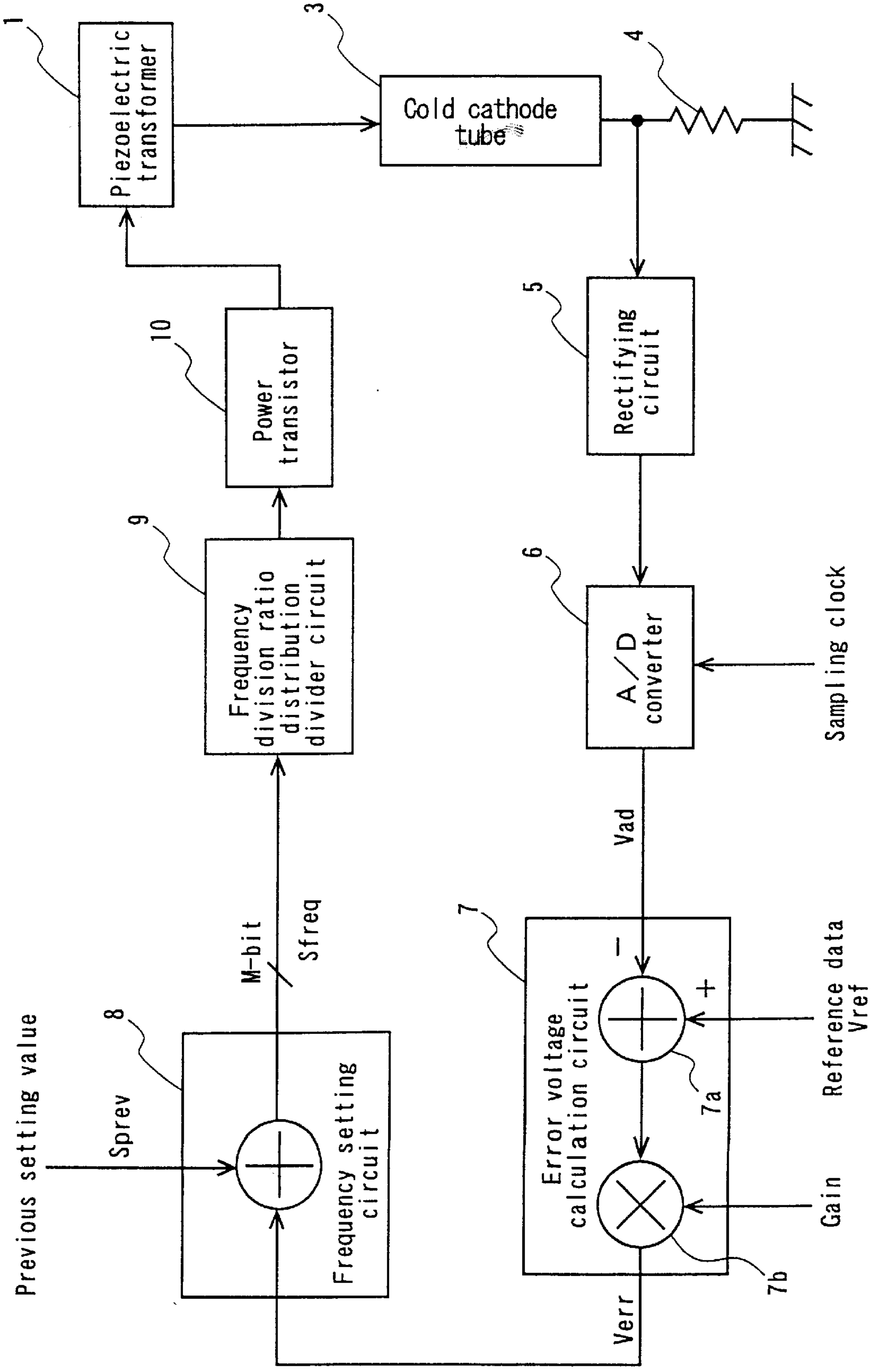
FIG. 1 is a block diagram showing the configuration of a piezoelectric transformer-driving circuit in accordance with embodiment 1 of the present invention.

FIG. 1 is a block diagram showing the configuration of a piezoelectric transformer-driving circuit in accordance with embodiment 1 as an embodiment of the present invention. FIGS. 1, 2, 3 and 4 are timing waveform diagrams showing the operations of the piezoelectric transformer-driving circuit.

In FIG. 1, a piezoelectric transformer 1 is a voltage transformation device for taking out an amplified voltage, and a voltage controlled by the piezoelectric transformer 1 is applied to a cold cathode tube 3 for light emission. A current detector 4 detects the current flowing through the cold cathode tube 3 and converts it into a voltage signal. A rectifying circuit 5 rectifies the sine wave like voltage signal output from the current detector 4, and converts it into a DC voltage.

An A/D converter 6 converts the DC voltage output from the rectifying circuit 5 into a digital signal. The A/D converter 6 has a sufficient number of bits, 8 or 9 bits for example, in order to obtain high voltage detection accuracy, and the sampling clock input to the A/D converter 6 has a frequency wherein the response speed required for control can be obtained sufficiently. The A/D converter 6 outputs a digital signal Vad used as a detection signal.

An error voltage calculation circuit 7 compares the digital signal Vad output from the A/D converter 6 with reference data Vref to be set externally and calculates the difference between the two. Then, the error voltage calculation circuit 7 multiplies the calculated difference data by a predetermined coefficient K and outputs error data Verr. Therefore, the error voltage calculation circuit 7 comprises an adder 7*a* for calculating the difference between the reference data Vref and the digital signal Vad, and a multiplier 7*b* for multiplying the output data of the adder 7*a* by the coefficient K and for outputting the result.

A frequency setting circuit 8 is provided to set the frequency of the drive pulse signal of the piezoelectric transformer 1. The frequency setting circuit 8 adds or subtracts the frequency corresponding to the error data Verr to or from the previous frequency setting value Sprev, and outputs M-bit data Sfreq (M: an integer). The frequency setting circuit 8 is configured to output a preset initial value at the time of power-on. In addition, the output timing of the frequency setting value has been set to be a frequency given by the previous frequency setting value Sprev.

On the basis of the data Sfreq output from the frequency setting circuit 8, a frequency division ratio distribution divider circuit 9 divides the frequency of the master clock by distributing a frequency division ratio Div so that the average frequency division ratio Div of the drive pulse signal for N cycles (N: an integer) becomes Div=Sfreq/N. This means that when Sfreq=15 and N=4 for example, the frequency division ratio of the drive pulse signal for four cycles is distributed to "3, 5, 4 and 3" so that its average becomes 15/4=3.75. This is defined as frequency division ratio distribution in the present invention. The frequency division ratio distribution divider circuit 9 is a frequency converter for converting the master clock, that is an input frequency, into an integral fraction of the frequency and for outputting the frequency. This output of the frequency division ratio distribution divider circuit 9 becomes a drive pulse signal for driving the piezoelectric transformer 1.

A power transistor 10 amplifies the drive pulse signal output from the frequency division ratio distribution divider circuit 9 to drive the piezoelectric transformer 1.

The error voltage calculation circuit 7, the frequency setting circuit 8 and the frequency division ratio distribution divider circuit 9 can be formed into one chip of a digital LSI with including other LSI regions; and the system clock can also be used as the clock for the piezoelectric transformer-driving circuit of the embodiment 1. For example, the clock for a liquid crystal controller can also be used as the clock for the embodiment 1; therefore the clock can be used as the master clock.

Figure 21:
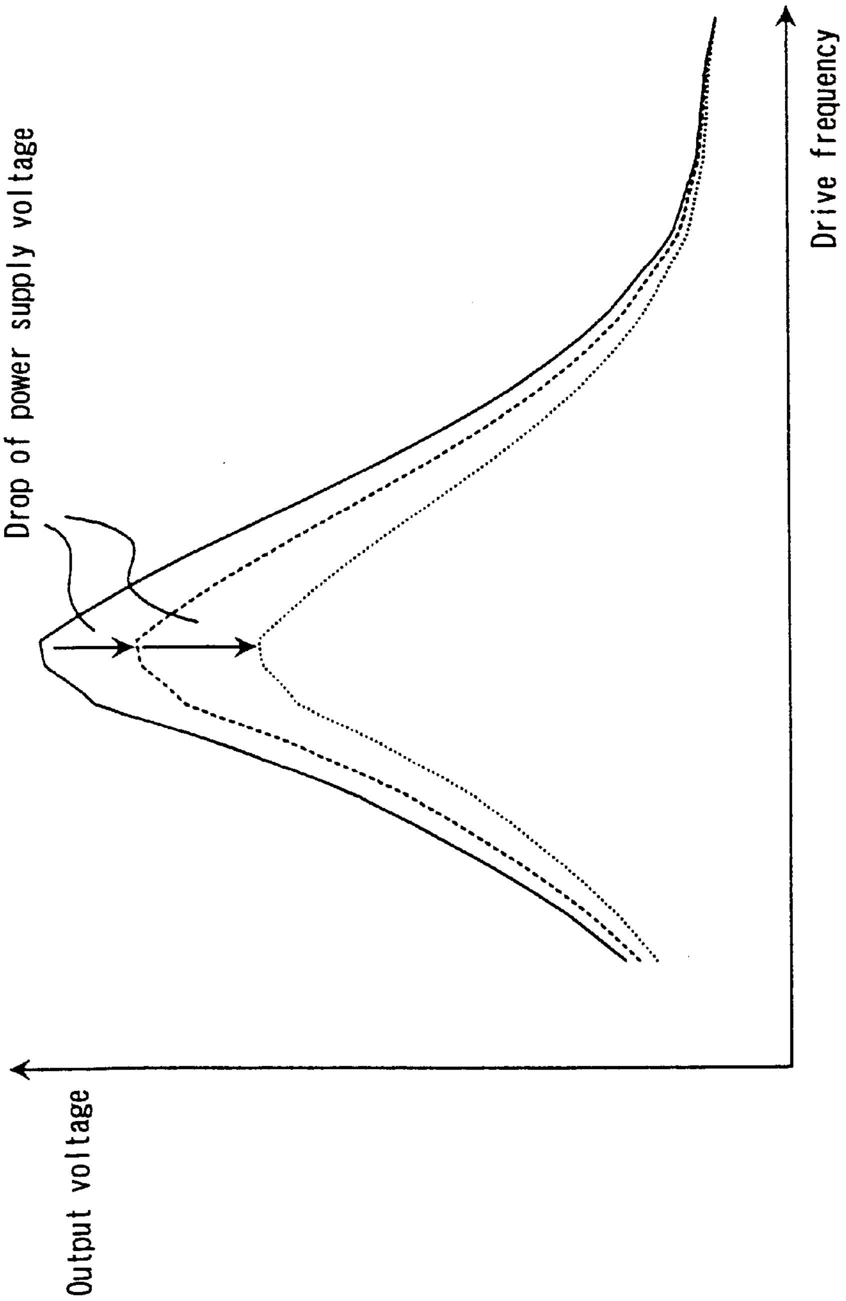
FIG. 21 is a waveform diagram showing the change in the frequency characteristic of the piezoelectric transformer.

In the piezoelectric transformer-driving circuit of the embodiment 1 configured as described above, the initial value of the frequency setting value output from the frequency setting circuit 8 is set at a value on the sufficiently higher frequency side from the resonance point in the frequency characteristic of the piezoelectric transformer 1 shown in FIG. 21 for example, and control is carried out by using the inclination on the high frequency side of the frequency characteristic curve.

Figure 62:
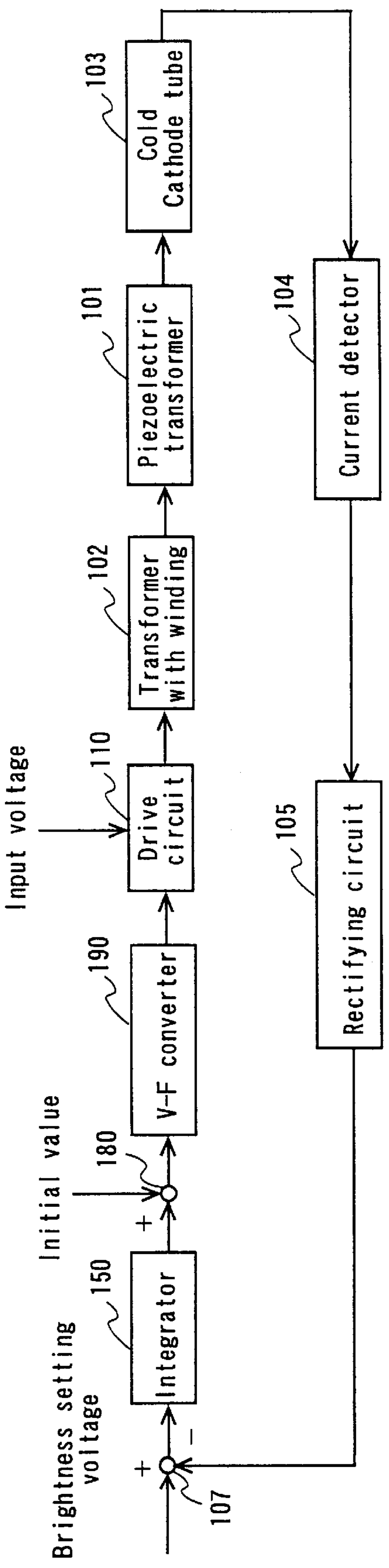
FIG. 62 is a graph showing the frequency characteristic of the conventional piezoelectric transformer.

In the example of the conventional piezoelectric transformer-driving circuit shown in FIG. 62, an example provided with the electromagnetic transformer 102 for compensating for insufficiency of voltage step-up ratio of the piezoelectric transformer 101 is shown; wherein the electromagnetic transformer is omitted since the electromagnetic transformer does not directly relate to the embodiment 1 of the present invention. However, when the step-up ratio of the piezoelectric transformer 1 is insufficient, it is needless to say that the electromagnetic transformer can be provided as necessary.

Next, the operations of the piezoelectric transformer-driving circuit of the embodiment 1 configured as shown in FIG. 1 will be described on the basis of the timing waveform diagrams shown in FIGS. 2 to 4.

Figure 2:
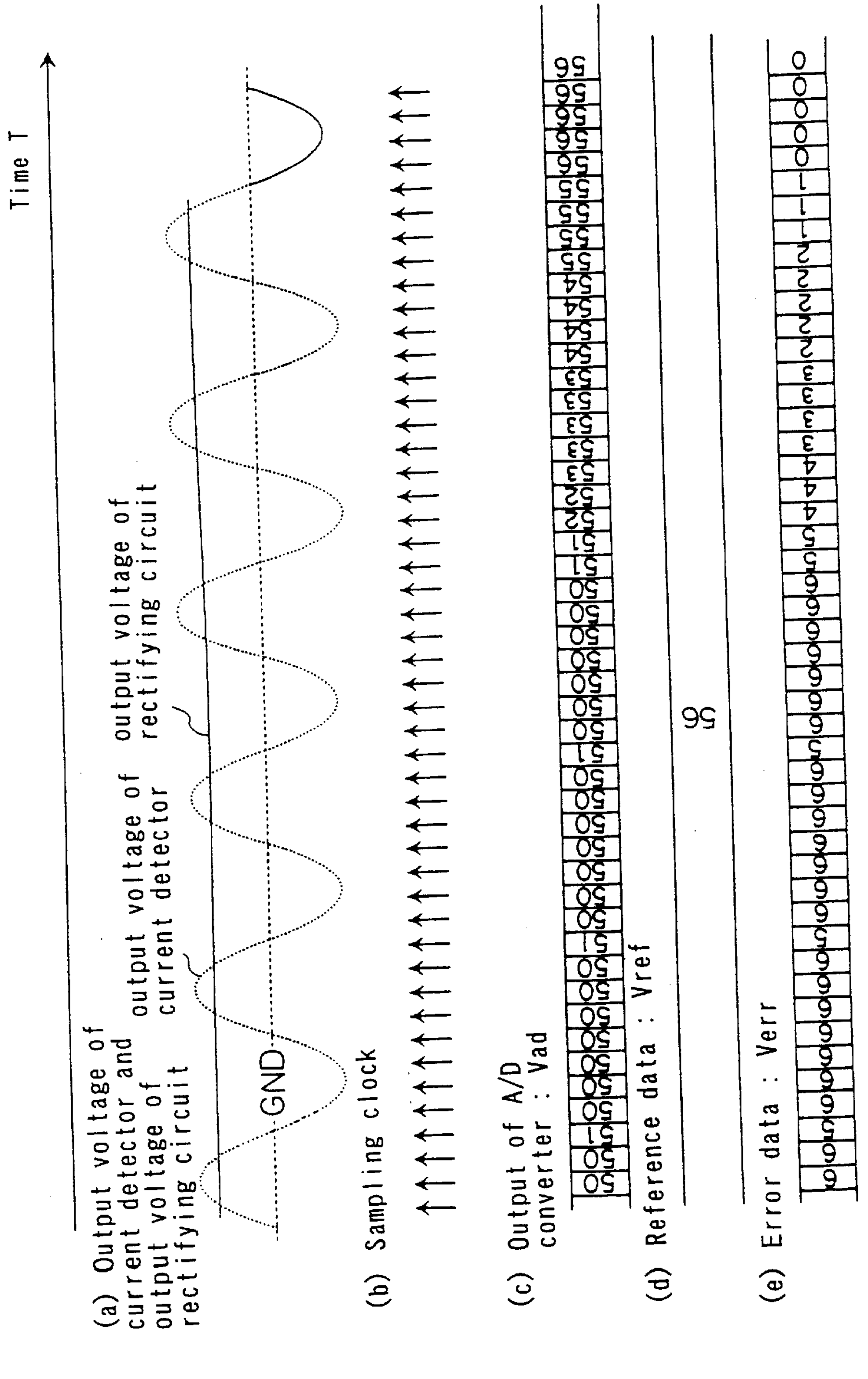
FIG. 2 is a timing waveform diagram illustrating the operation of the embodiment 1 of the present invention.

The sine wave likeform shown in a dot line in (a) of FIG. 2 is a voltage waveform obtained by the current detector 4. A rectangular waveform is generally used to drive the piezoelectric transformer 1; however, since the sharpness of resonance, i.e., the Q value, of the frequency characteristic of the piezoelectric transformer 1 is high as shown in the above-mentioned FIG. 21, only the fundamental wave component is taken out from the secondary electrode of the piezoelectric transformer 1, thereby becoming a substantially sine wave. In order to convert this sine wave signal into a controllable DC voltage signal, the sine wave signal is rectified by the rectifying circuit 5 and converted into a DC voltage signal. In (a) of FIG. 2, the waveform indicated in a solid line is a DC voltage signal output from the rectifying circuit 5.

Next, the rectified DC voltage signal is converted into the digital signal Vad by the A/D converter 6 at the timing of the sampling clock shown in (b) of FIG. 2. The error data Verr, which is the output of the error voltage calculation circuit 7 to which the digital signal Vad is input, is obtained by the following calculation.

$$Verr=K\times(Vref-Vad)$$

In the embodiment 1, the reference data Vref is 56 as shown in (d) of FIG. 2. The output of the A/D converter 6 at the time when the reference data Vref is 56 is shown in (c) of FIG. 2, and the error data of the error voltage calculation circuit 7 is shown in (e) of FIG. 2.

The error data Verr output from the error voltage calculation circuit 7 is supplied to the frequency setting circuit 8. In the frequency setting circuit 8, the error data Verr is added to the previous setting value Sprev, and data Sfreq is output. In the frequency division ratio distribution divider circuit 9, frequency division is carried out so that the average frequency division ratio Div of the drive pulse signal in N cycles becomes Sfreq/N as described above.

Figure 3:
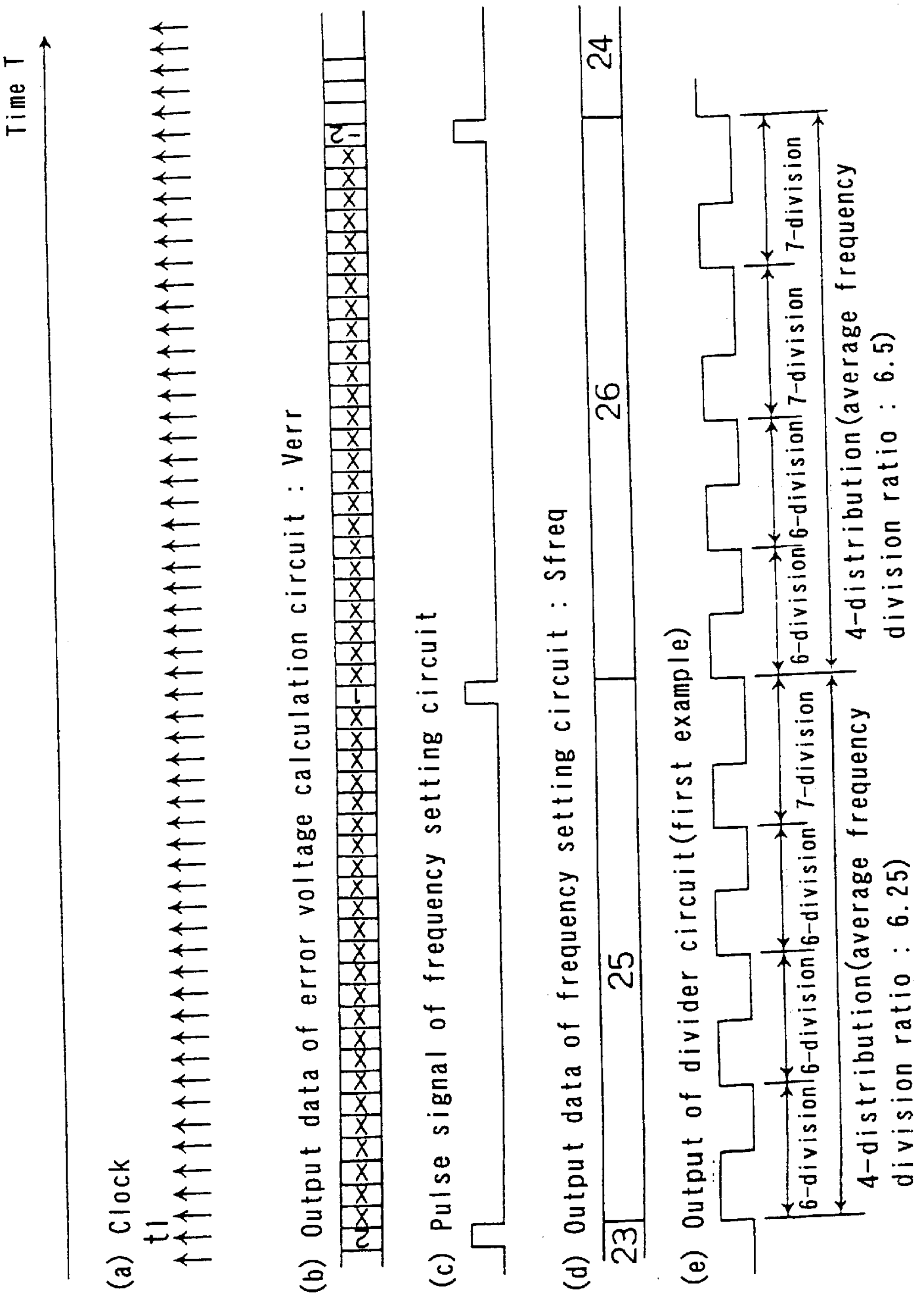
FIG. 3 is a timing waveform diagram illustrating the operation of frequency division ratio distribution in the embodiment 1 of the present invention.
Figure 4:
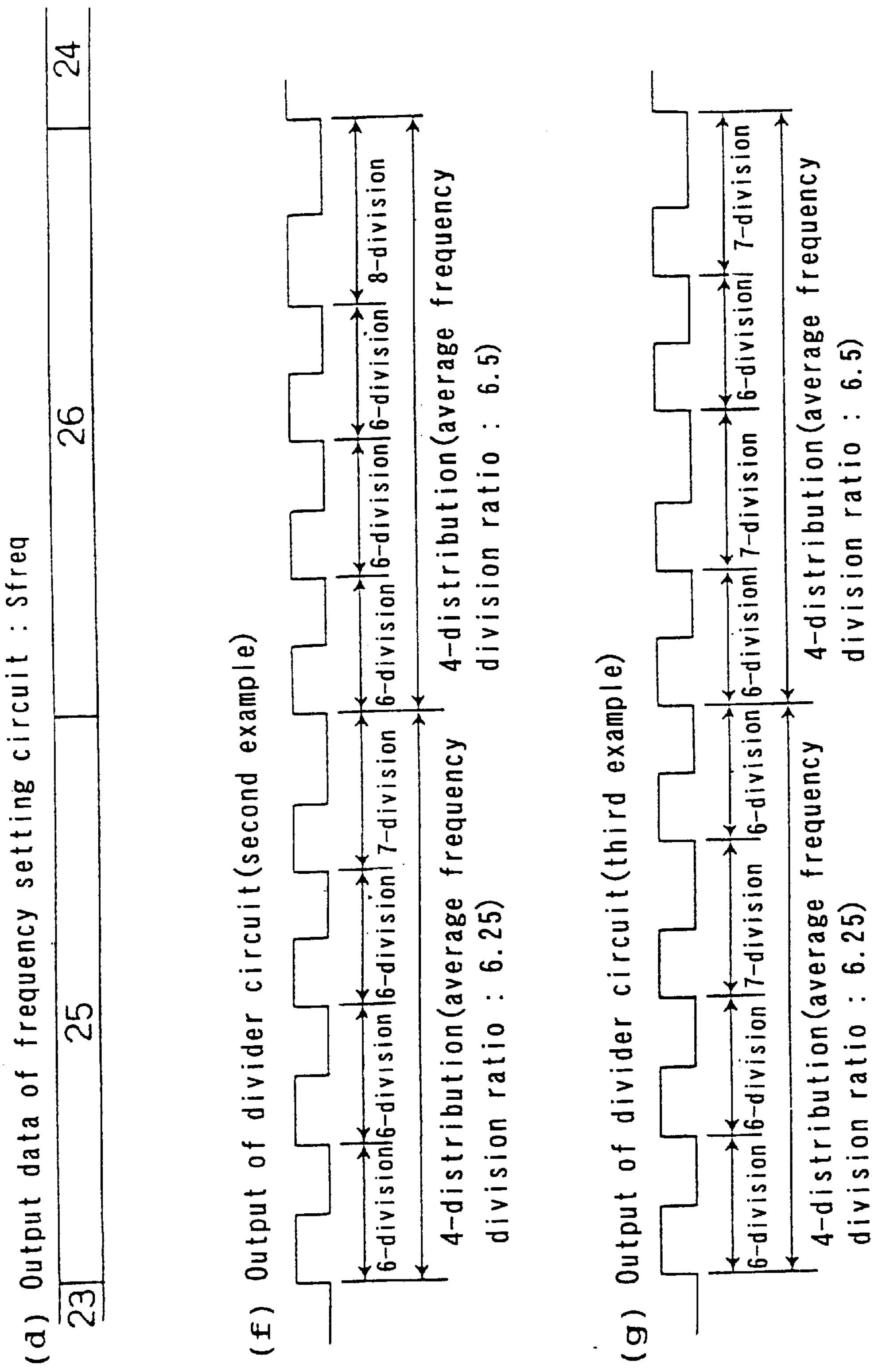
FIG. 4 is a timing waveform diagram illustrating the operation of frequency division ratio distribution in the embodiment 1 of the present invention.

Examples of the output signal from the frequency division ratio distribution divider circuit 9 in the condition of N=4 are shown in the timing waveform diagrams in (e) of FIG. 3, (f) of FIG. 4 and (g) of FIG. 4. The master clock is shown in (a) of FIG. 3; in synchronization with this clock, the error data Verr shown in (b) of FIG. 3 is output from the error voltage calculation circuit 7. In (b) of FIG. 3, only the data obtained when the output pulse signal of the frequency setting circuit 8 (in(c) of FIG. 3) is at the "H" level is effective as the error data Verr of the error voltage calculation circuit 7. Therefore, in the error data, X is written at the positions of unnecessary data, and specific values are thus not indicated.

In the frequency setting circuit 8, the error data Verr is added to the present frequency setting value Sprev in synchronization with the output pulse signal of the frequency setting circuit 8, and data Sfreq is output at time t1. In the example shown in FIG. 3, the error data Verr is 2 when the first output pulse in (c) of FIG. 3 has the "H" level, and the value of the frequency setting value Vpref at that time is 23; therefore, the sum, 25, of the two is output as data Sfreq at the next clock time (time t1). This data Sfreq is input to the frequency division ratio distribution divider circuit 9 and frequency-divided and distributed.

Distribution examples depending on various frequency division ratios are shown in (e) of FIG. 3, (f) of FIG. 4 and (g) of FIG. 4; in all of these cases, operation is carried out so that the clock cycle for the period of four cycles of the drive pulse signal obtained by frequency division is equal to the value of the output data Sfreq from the frequency setting circuit 8, thereby raising the average frequency resolution. The drive pulse signal obtained by the frequency division ratio distribution divider circuit 9 as described above is power-amplified by the power transistor 10 to drive the piezoelectric transformer 1.

In the above-mentioned operation, when the current value detected by the current detector 4 is lower than a desired value, that is, when the digital signal Vad output from the A/D converter 6 is lower than the reference level Vref, the error data Verr output from the error voltage calculation circuit 7 becomes a positive value, and the frequency division ratio distribution divider circuit 9 operates in the direction wherein the division frequency ratio increases. In other words, in the above-mentioned case, the piezoelectric transformer-driving circuit of the embodiment 1 operates in the direction wherein the frequency of the drive pulse signal lowers, and the step-up ratio of the piezoelectric transformer 1 increases. By this operation, the current flowing through the cold cathode tube 3 increases.

On the other hand, when the current value detected by the current detector 4 is higher than the desired value, in other words, when the digital signal Vad output from the A/D converter 6 is higher than the reference data Vref, the operation opposite to that described above is carried out, whereby the step-up ratio of the piezoelectric transformer 1 lowers, and the current flowing through the cold cathode decreases.

When the current value detected by the current detector 4 becomes the desired value by repeating the above-mentioned adjustment operation, in other words, when the digital signal Vad output from the A/D converter 6 is equal to the reference data Vref, the error data Verr output from the error voltage calculation circuit 7 becomes zero, and the frequency of the drive pulse signal stabilizes.

In the operation of the piezoelectric transformer-driving circuit of the embodiment 1, the average frequency deviation ratio is changed in every N cycles of the drive pulse signal as described above to distribute the frequency division ratio of the drive pulse signal; as a result, the resolution of the average frequency is raised, and it is possible to obtain a frequency for setting the brightness of the cold cathode tube 3 at a desired value.

In the above-mentioned embodiment 1, when generating the drive pulse signal by frequency-dividing the master clock, the frequently division ratio is distributed in a predetermined cycle, thereby raising the frequency resolution of the average frequency as described above.

In the case when obtaining the frequency resolution of 10 Hz at the time when the frequency of the drive pulse signal of the piezoelectric transformer 1 is 100 KHz, a clock of 1 GHz is required for a method of simply dividing the clock as described before.

On the other hand, when the distribution frequency N is 100 for example in the above-mentioned embodiment 1, an average frequency resolution of 10 Hz can be obtained from a clock of about 10 MHz usually used for the liquid crystal controller and the like.

In the embodiment 1, the multi-bit A/D converter 6 is used as a means for converting the detected voltage into the digital signal; therefore, it can be built in an LSI. For this reason, the error voltage calculation circuit 7, the frequency setting circuit 8 and the frequency division ratio distribution divider circuit 9 can be included and formed in an LSI; therefore, the number of parts can be reduced significantly, and it is possible to obtain a higher effect of making compact video apparatuses more compact.

In the embodiment 1 of the present invention, when generating the drive pulse signal by frequency-dividing the master clock, the frequency division ratio is distributed in the predetermined cycle, whereby the resolution of the average frequency can be raised. Therefore, it is possible to obtain a high resolution from a clock of about 10 MHz usually used for the liquid crystal controller and the like. For this reason, the piezoelectric transformer-driving circuit can be attained in the form of an LSI in the level of practical use, whereby the number of parts can be reduced significantly, and compact video apparatuses can be made more compact.

The piezoelectric transformer-driving circuit in accordance with the embodiment 1 of the present invention can with high accuracy carry out drive control for the cold cathode tube 3 depending on the usage environment (brightness, temperature etc.) of the cold cathode tube 3 driven by this driving circuit. In this case, calculation is carried out on the basis of measurement data indicating the usage environment, and frequency control is carried out depending on the result of the calculation, whereby control can be carried out to set the brightness of the cold cathode tube 3 at a desired value.

<<Embodiment 2 >>

Figure 5:
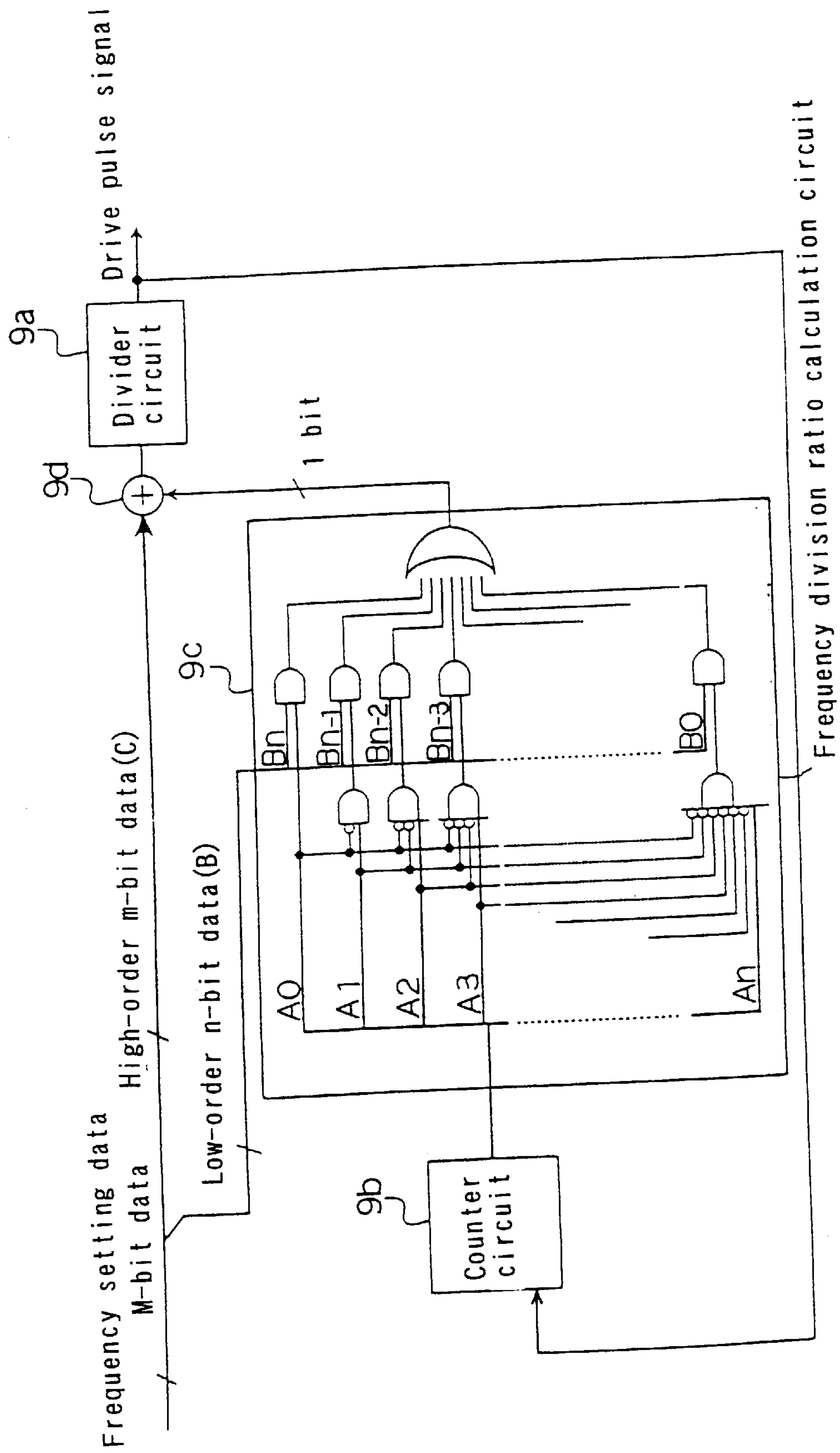
FIG. 5 is a block diagram showing a piezoelectric transformer-driving circuit in accordance with embodiment 2 of the present invention.
Figure 6:
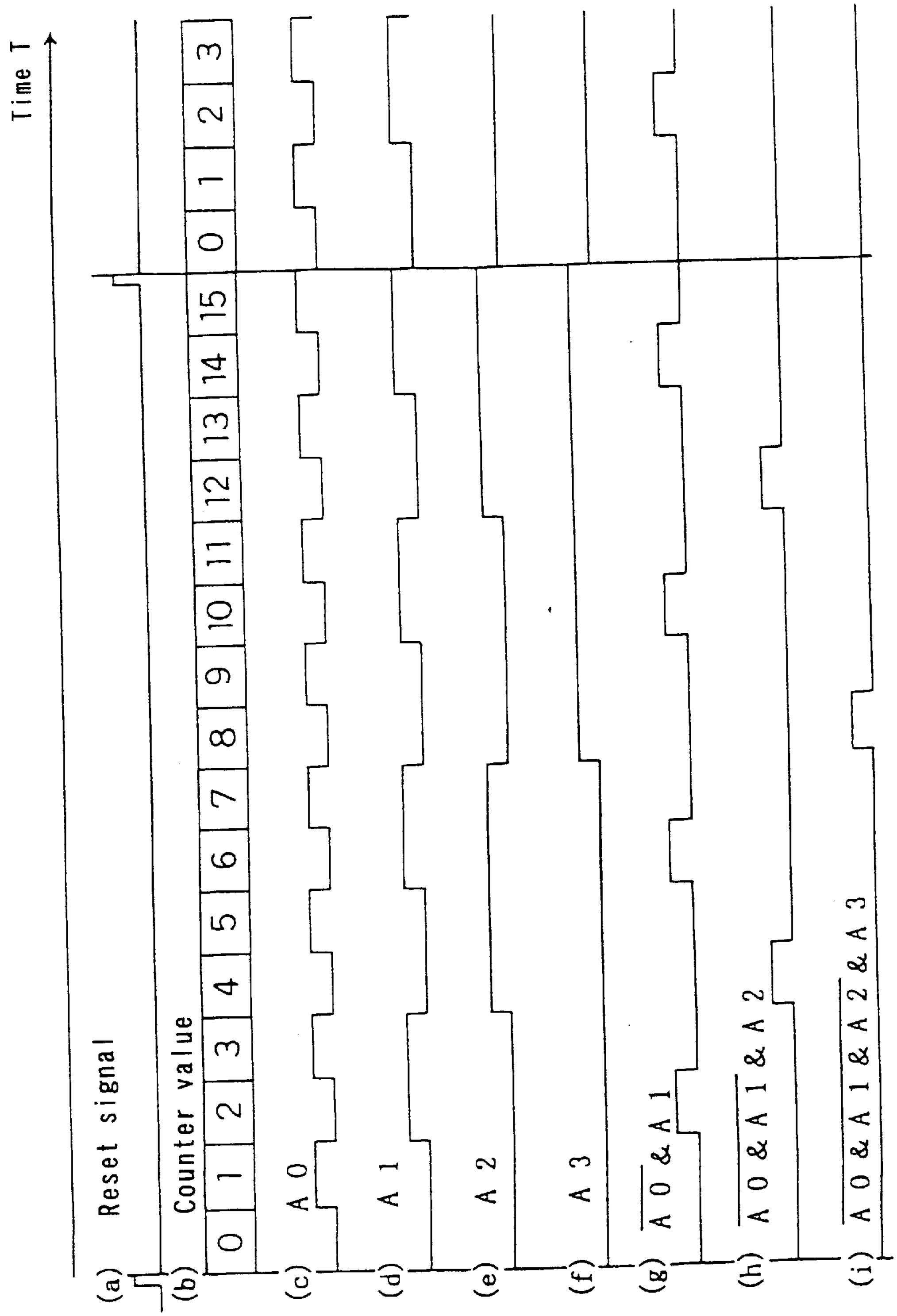
FIG. 6 is a timing waveform diagram illustrating the operation of the embodiment 2 of the present invention.
Figure 7:
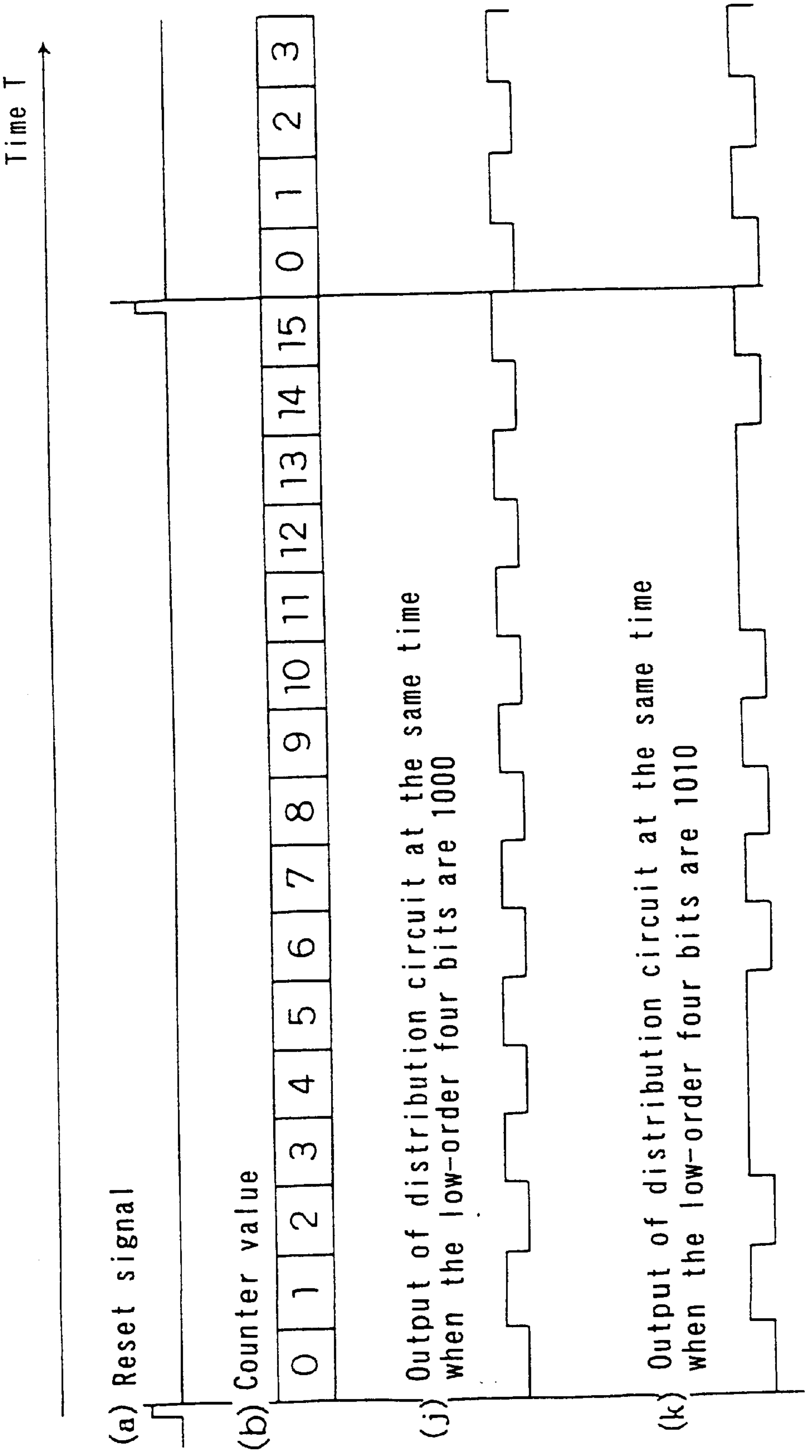
FIG. 7 is a timing waveform diagram illustrating the operation of the distribution circuit of the embodiment 2 of the present invention.
Figure 8:
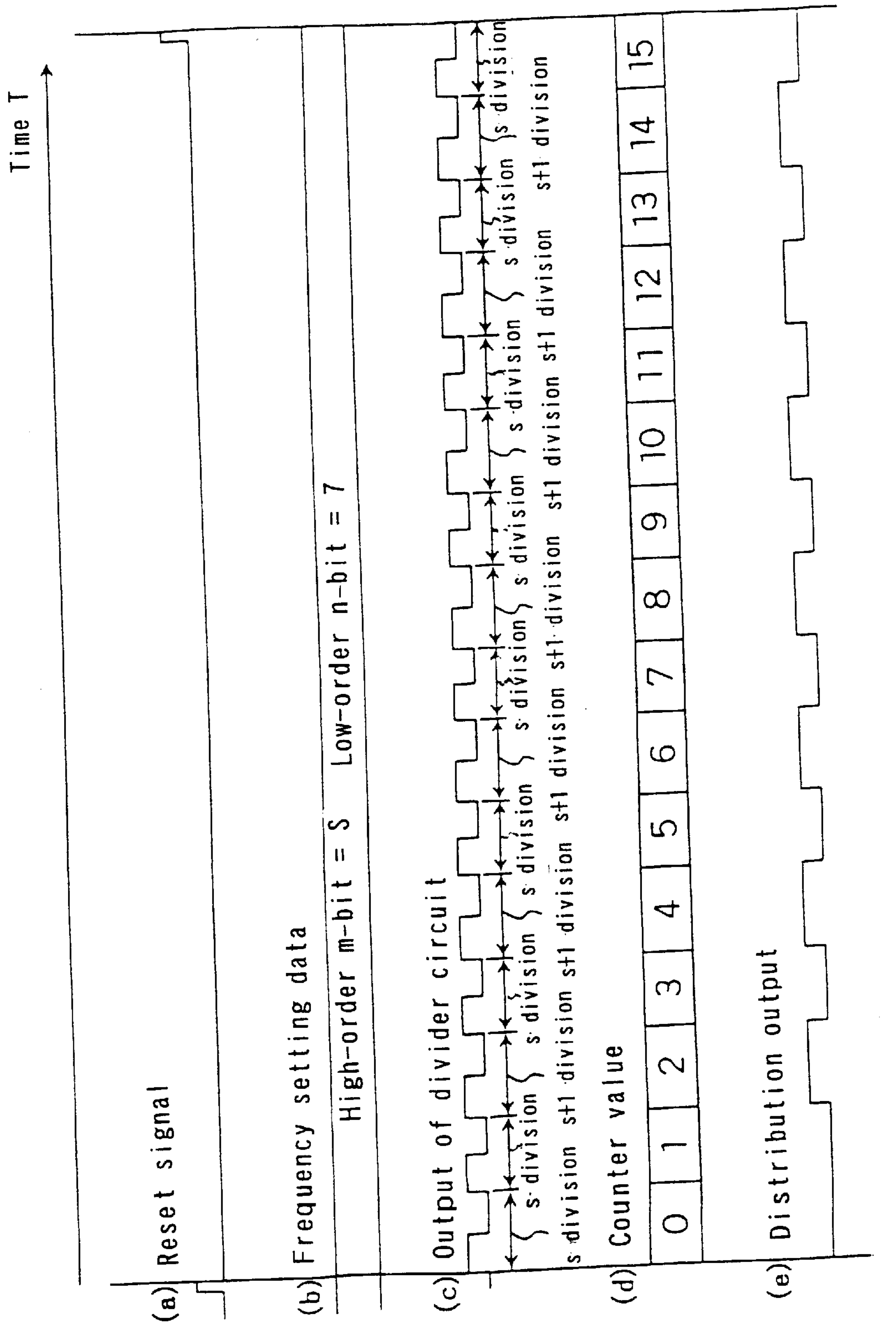
FIG. 8 is a timing waveform diagram illustrating the operation of frequency division ratio distribution in the embodiment 2 of the present invention.

FIG. 5 is a block diagram showing the configuration of the frequency division ratio distribution divider circuit in a piezoelectric transformer-driving circuit in accordance with embodiment 2, an embodiment of the present invention. Other configurations of the piezoelectric transformer-driving circuit are the same as those of the above-mentioned embodiment 1; the same configurations are designated by the same numerals, and the explanations of the above-mentioned embodiment 1 are applied to the same configurations, thereby omitting overlap explanations. FIGS. 6, 7 and 8 are timing waveform diagrams showing the operations of the frequency division ratio distribution divider circuit.

In FIG. 5, a divider circuit 9*a* is used to carry out frequency division, and a counter circuit 9*b* is used to count the drive pulses output from the divider circuit 9*a*. The counter circuit 9*b* is configured so as to be reset in synchronization with the frequency division ratio distribution cycle N of the drive pulse signal.

In a frequency division ratio calculation circuit 9*c*, the low-order n+1 bit data B(=B0·$2^0$+B1·$2^1$+ . . . +Bn−1·$2^{n-1}$+Bn·$2^n$; wherein in the above-mentioned expression, Bx represented by B0, B1, . . . , Bn−1, Bn is a numerical value, 0 or 1) of the M-bit frequency setting value Sfreq output from the frequency setting circuit 8, and the count value A(=A0·$2^0$+A1·$2^1$+ . . . +An−1·$2^{n-1}$+An·$2^n$; wherein, in the above-mentioned expression, Ax represented by A0, A1, . . . An−1, An is a numerical value, 0 or 1) output from the above-mentioned counter circuit 9*b* are input, and the calculation of the following expression (6) is carried out. In the expression (6), "$\overline{Ax}$" represents the inversion of "Ax" (1 is converted into 0, and 0 is converted into 1), and the upper lines in the following descriptions are used to represent this meaning.

$$A0\cdot Bn+\overline{A0}A1\cdot Bn-1+\ldots+\overline{A0}\cdot\overline{A1}\cdot\ldots\cdot\overline{An-2}\cdot\overline{An-1}\cdot An\cdot B0 \quad (6)$$

In FIG. 5, an adder 9*d* addes the high-order m-bit data C of the M-bit frequency setting value Sfreq to the output value of the above-mentioned frequency division ratio calculation circuit 9*c*.

In the frequency division ratio distribution divider circuit, the configuration of which is shown in FIG. 5, is formed of a digital LSI, and can be made in a 1-chip form together with other LSI regions, whereby the system clock can also be used as the clock for the frequency division ratio distribution divider circuit. For example, the clock for the liquid crystal controller can also be used as the clock for the frequency division ratio distribution divider circuit; therefore, the clock can be used as the master clock.

Next, the operation of the frequency division ratio distribution divider circuit shown in FIG. 5 will be described by referring to the timing waveform diagrams in FIGS. 6 and 7. The examples shown in FIGS. 6 and 7 are timing waveform diagrams in the case when the distribution cycle N of the frequency division ratio of the drive pulse signal is 16.

(a) of FIG. 6 shows a pulse waveform having a frequency division ratio distribution cycle N (=16), and this pulse waveform becomes the reset signal for the counter circuit 9*b*. (b) of FIG. 6 shows the count value A (=0 to 15) of the counter circuit 9*b*. (c), (d), (e) and (f) of FIG. 6 show the waveforms of the count values A0 to A3 output from the counter circuit 9*b*. In other words, the count values A0 to A3 each show a value (0 or 1) of each digit when the count values are represented in binary notation.

In the calculation at the frequency division ratio calculation circuit 9*c*, (g), (h) and (i) of FIG. 6 show the waveforms of multiplication coefficients multiplied by the bits B0 to B3 of the low-order n-bit data B (four-bit data in this example) of the frequency setting value Sfreq.

As clearly shown by the waveforms of (g), (h) and (i) of FIG. 6, the waveform of the multiplication coefficient is evenly disposed for the period of frequency division ratio distribution cycle N (=16) of the drive pulse signal. In order to obtain the following expression (7) with respect to each bit value of the low-order n-bit data B of the M-bit frequency setting value Sfreq output from the frequency setting circuit 8, an approximately even pulse signal can be obtained for the period of N cycles from the logical OR of the below-mentioned expression (8).

$$A0\cdot B3+\overline{A0}\cdot A1\cdot B2+\overline{A0}\cdot\overline{A1}\cdot A2\cdot B1+\overline{A0}\cdot\overline{A1}\cdot\overline{A2}\cdot A3\cdot B0 \quad (7)$$

$$A0\cdot B3$$

or $$\overline{A0}\cdot A1\cdot B2$$

or $$\overline{A0}\cdot\overline{A1}\cdot A2\cdot B1$$

or $$\overline{A0}\cdot\overline{A1}\cdot\overline{A2}\cdot A3\cdot B \quad (8)$$

As an example, (j) of FIG. 7 shows the output waveform of the frequency division ratio calculation circuit 9*c* in the case when the low-order 4-bit data of the data Sfreq from the frequency setting circuit 8 is "1000." Furthermore, (k) of FIG. 7 shows the output waveform of the frequency division ratio calculation circuit 9*c* in the case when the low-order 4-bit data is "1010." The frequency division ratio of the divider circuit 9*a* is determined by the addition of the high-order m-bit data C of the data Sfreq and the output value of the above-mentioned frequency division ratio calculation circuit 9*c* at the adder 9*d*, and the drive pulse signal shown in (c) of FIG. 8 is output.

By the above-mentioned operation, when the value of the data Sfreq used as the frequency setting value output from the frequency setting circuit 8 becomes larger, the average frequency division ratio in N cycles increases, and the frequency of the drive pulse signal decreases. On the other hand, when the value of the data Sfreq output from the frequency setting circuit 8 becomes smaller, the average frequency division ratio in N cycles decreases, and the frequency of the drive pulse signal increases.

As described above, in the above-mentioned embodiment 2, when the frequency division ratio is distributed in a predetermined cycle, the distribution method thereof is configured so that frequencies are not unbalanced at specific frequencies and so that the frequencies are approximately balance, without using a distribution method wherein the level of a specific low frequency component rises. Therefore, in the piezoelectric transformer-driving circuit of the embodiment 2, the levels of the low frequency components become lower; therefore, an effect owing to a flicker phenomenon, that is, screen flicker, is unlikely to occur even if the distribution cycle N is made larger.

As described above, the levels of the low frequency components become lower in the embodiment 2; therefore, it is possible to suppress the flicker phenomenon that is apt to appear as the frequency is lower or as the level of the change in brightness is larger. For this reason, the piezoelectric transformer-driving circuit of the embodiment 2 can have a necessary frequency resolution by making the distribution cycle N larger even if the frequency of the master clock is low.

As described above, the piezoelectric transformer-driving circuit of the embodiment 2 has the effect of eliminating the flicker phenomenon that is apt be caused by a method wherein the frequency division ratio is distributed in the predetermined frequency N to raise the frequency resolution just as in the case of the above-mentioned embodiment 1, particularly when the distribution cycle N is required to be made larger.

In this way, the embodiment 2 of the present invention has an effect of raising the resolution of the average frequency while avoiding the problem of flicker by evenly distributing the frequency division ratio. Since flicker causes the problem of image flicker when a piezoelectric transformer is used to drive the backlight of a liquid crystal panel, the present invention provides an apparatus capable of greatly contributing to the improvement of the quality of image display.

<<Embodiment 3>>

A piezoelectric transformer-driving circuit in accordance with embodiment 3, an embodiment of the present invention, will be described below by referring to the accompanying drawings.

Figure 9:
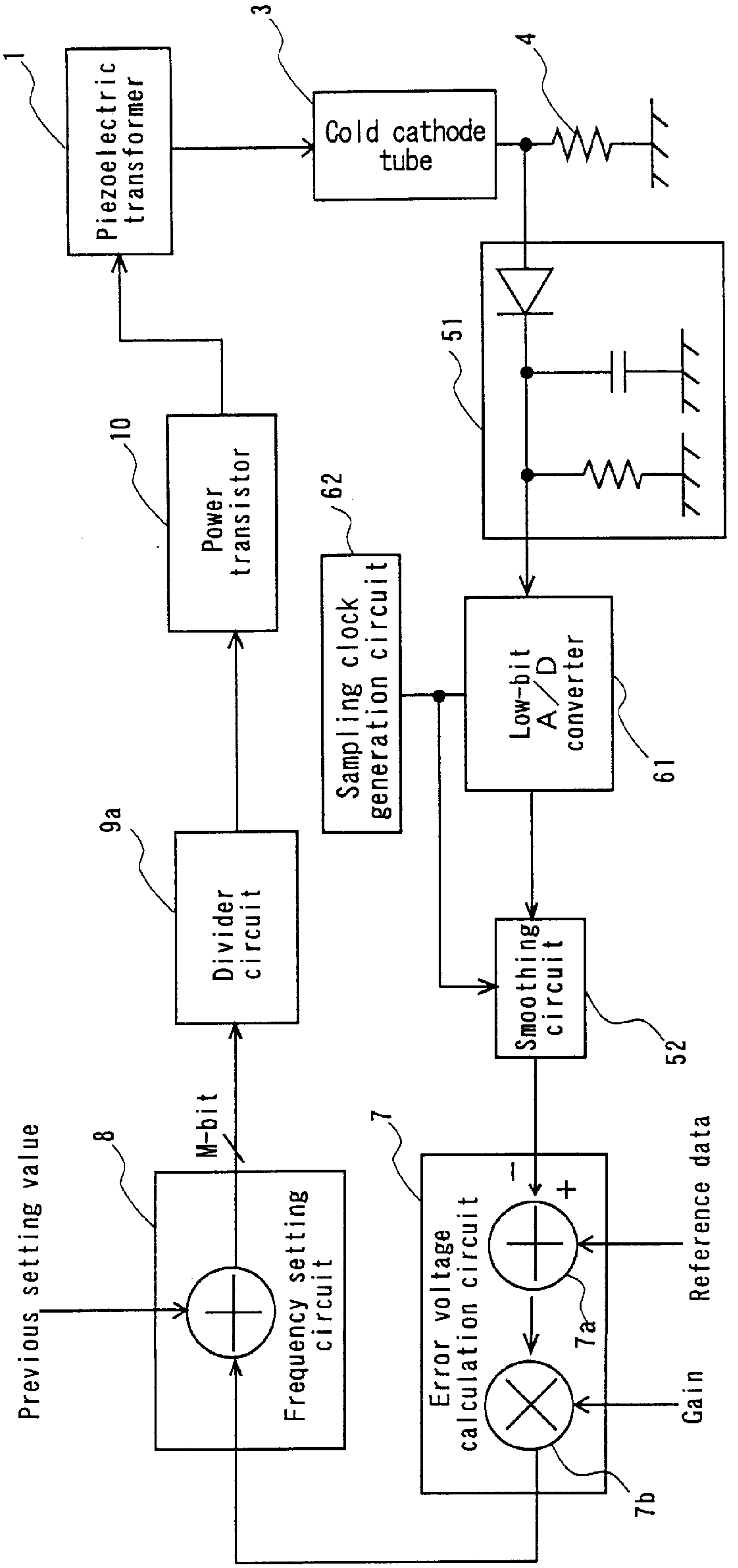
FIG. 9 is a block diagram showing the configuration of a piezoelectric transformer-driving circuit in accordance with embodiment 3 of the present invention.

FIG. 9 is a block diagram showing the configuration of the piezoelectric transformer-driving circuit of the embodiment 3 of the present invention. The same configurations as those of the above-mentioned embodiment 1 are designated by the same numerals, and the explanations of the above-mentioned embodiment 1 are applied to the same configurations, thereby omitting overlap explanations.

Figure 10:
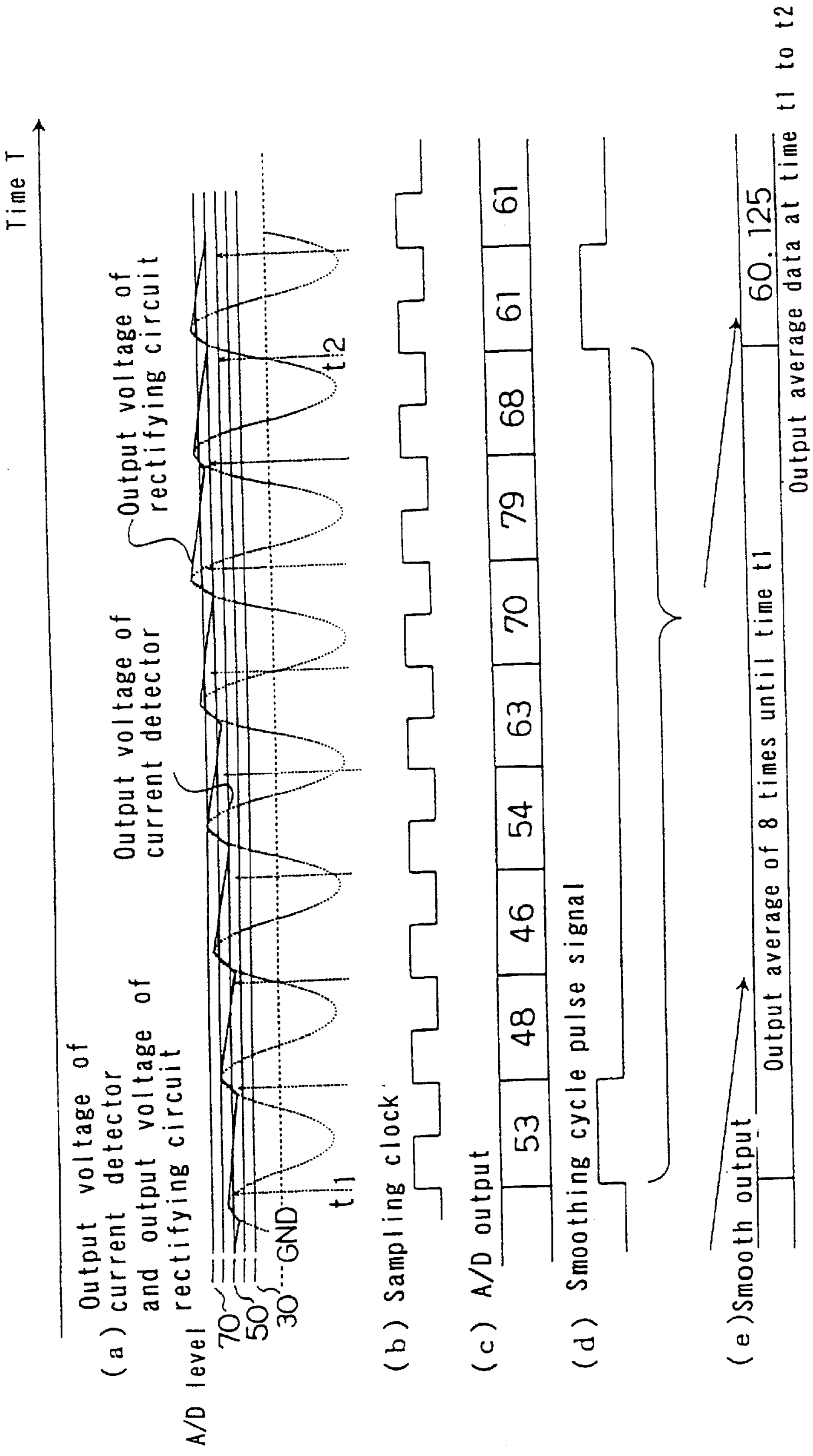
FIG. 10 is a timing waveform diagram illustrating the operation of the embodiment 3 of the present invention.
Figure 11:
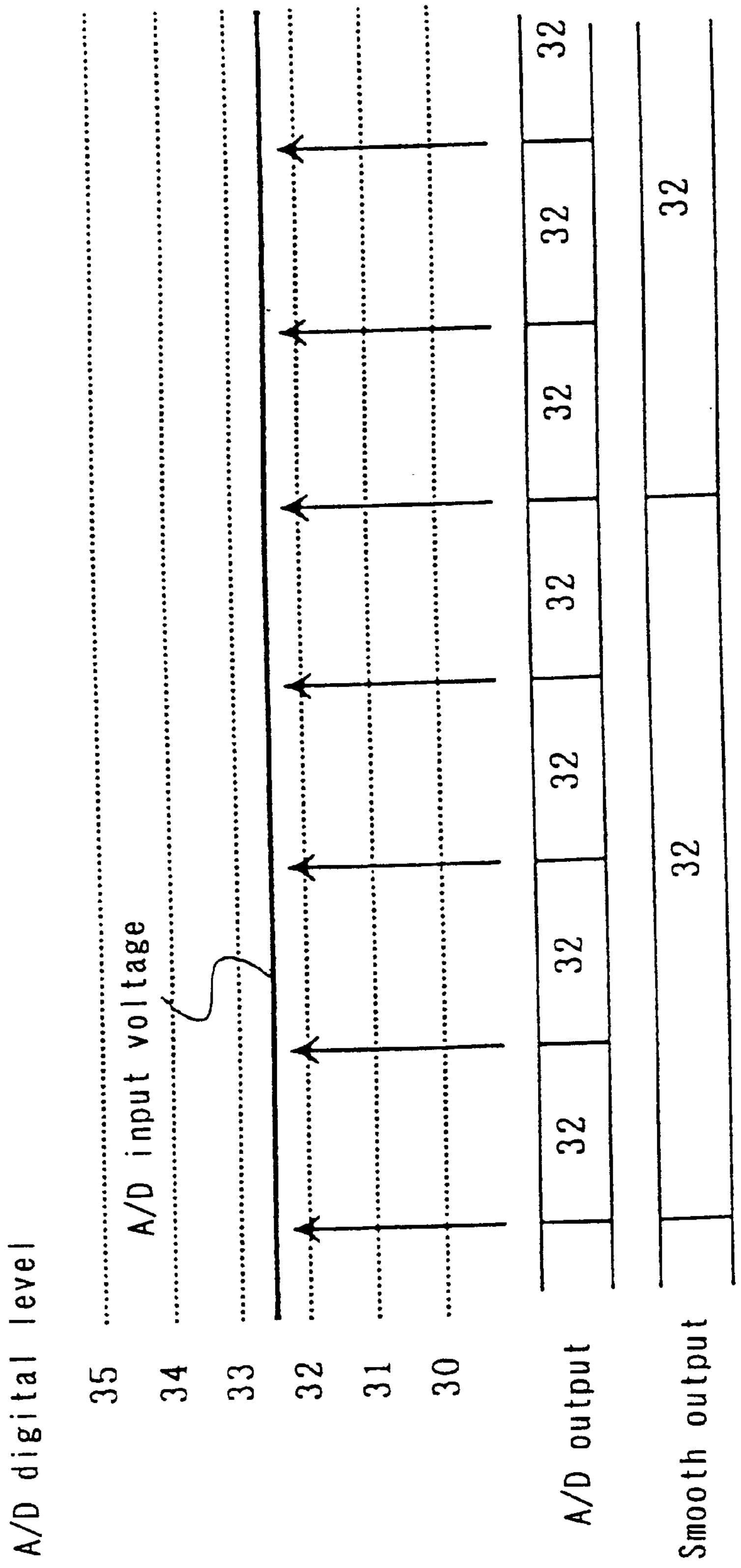
FIG. 11 is a timing waveform diagram illustrating the principle, of the embodiment 3 of the present invention.
Figure 12:
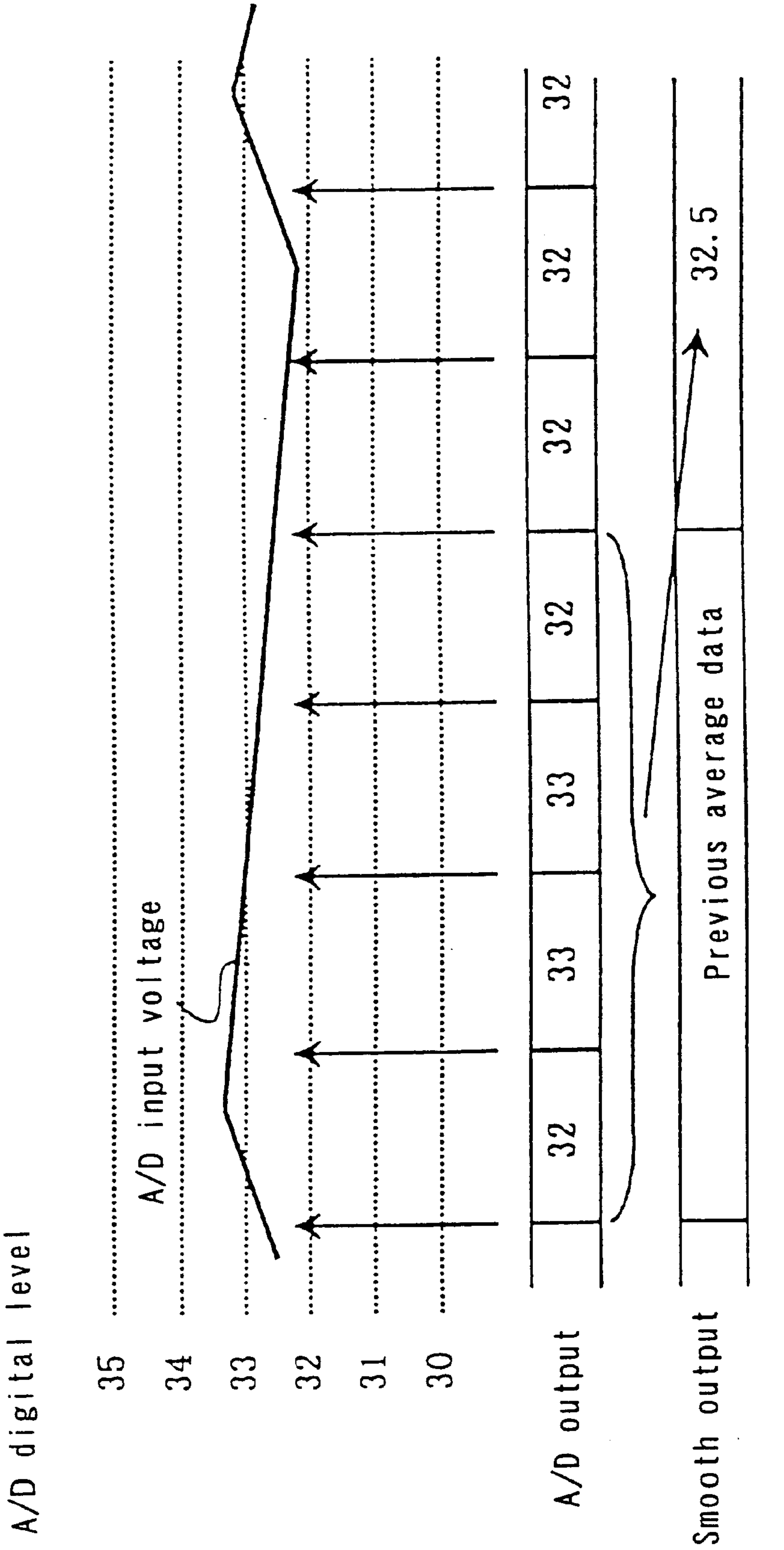
FIG. 12 is a timing waveform diagram illustrating the principle of the embodiment 3 of the present invention.

FIG. 10 is a timing waveform diagram showing the operation of a rectifying circuit, an A/D converter and a smoothing circuit. FIGS. 11 and 12 are views showing voltage detection resolution by an A/D converter.

In FIG. 9, a rectifying circuit 51 is a peak hold circuit that carries out rectifying by peak-holding the voltage signal from a current detector 4. The output signal from the rectifying circuit 51 is input to an A/D converter 61. The A/D converter 61 is a low-bit (5 or 6-bit) A/D converter. A sampling clock generation circuit 62 generates a sampling clock used for the smoothing circuit 52 when the A/D converter 61 converts an analog signal into a digital signal. The smoothing circuit 52 smoothes the digital signal output from the A/D converter in every four cycles of the sampling clock by average processing.

The embodiment 3 is characterized in that the piezoelectric transformer-driving circuit is attained by using the inexpensive low-bit A/D converter 61 as described above and that the capacitor having a large capacitance used in the embodiment 1 is eliminated. The characteristics thereof will be described below.

The piezoelectric transformer-driving circuit of the embodiment 3 detects the voltage of the detection signal from the average value of the values at plural sample points and converts the voltage into a digital signal; the A/D converter 61 is made to have a low-bit configuration. If the input voltage of the A/D converter 61 is a DC voltage at this time, only low voltage detection accuracy nearly determined by the number of bits is obtained regardless of the number of samples. However, the embodiment 3 is configured so that various voltages are sampled by using the discharge phenomenon of the peak-hold circuit in the rectifying circuit 51 so that high detection accuracy can be obtained by smoothing.

The elimination of the large-capacitance capacitor in the embodiment 3 will be supplementally described below; in the above-mentioned conventional piezoelectric transformer-driving circuit shown in FIG. 62, only the rectifying circuit 5 is insufficient to convert the sine wave detection current into the DC voltage, thereby requiring the filter circuit 50. The time constant of this filter circuit 50 is required to be several Hz to several tens of Hz to eliminate drive frequency components of about 100 KHz.

In order to configure the filter circuit 50 in this kind of conventional piezoelectric transformer-driving circuit, a large-capacitance capacitor is required. However, as the capacitor has a large capacitance, its volume increases; therefore, in consideration of the installation space of the capacitor, the use of a large capacitor leads to a bigger apparatus; this is undesirable. For this reason, the embodiment 3 is configured to carry out digital processing by using the smoothing circuit 52 without using any large-capacitance capacitors.

Next, the characteristic operations of the embodiment 3 will be described below by referring to FIG. 10.

When a voltage signal having a sine wave shown in a dot line in (a) of FIG. 10 is output from the current detector 4 and input to the rectifying circuit 51, the rectifying circuit 51 outputs a voltage signal having a wave shown in a solid line in (a) of FIG. 10 by the peak hold operation. In the low-bit A/D converter 61, the rectified voltage signal is A/D converted depending on the sampling clock that is shown in (b) of FIG. 10 and output from the sampling clock generation circuit 62, and then a digital signal shown in (c) of FIG. 10 is output.

Next, the smoothing circuit 52 averages the output data from the A/D converter 61 in the cycle of the smoothing cycle pulse signal shown in (d) of FIG. 10, and the processed data is output. The embodiment 3 is described assuming that the cycle of the smoothing cycle pulse signal is 8; however, if this cycle is made longer, the number of samples increases in proportion thereto, and the number of bits for the A/D converter 61 increases equivalently.

The principle of the above-mentioned average processing will be described below by referring to FIGS. 11 and 12.

FIG. 11 shows a case wherein the detection current is sufficiently rectified into a DC voltage by the rectifying circuit 51 and input to the A/D converter 61. Furthermore, FIG. 12 shows a case wherein the detection current is not sufficiently rectified by the rectifying circuit 51 and has AC components. In FIGS. 11 and 12, the tips of the arrows indicate the sample points of the A/D converter 61. In the case shown in FIG. 11, even if the sample points are increased, the voltage detection resolution to be obtained remains unchanged, and only the resolution determined by the number of bits of the A/D converter 61 can be obtained. However, in the case shown in FIG. 12, by applying the AC components to one or two levels corresponding to the low-order one or two bits of the A/D converter 61, it is possible to obtain a resolution corresponding to the number of samples in addition to the number of bits.

The characteristics and operations of the rectifying circuit 51, the smoothing circuit 52 and the A/D converter 61 in the embodiment 3 have been described above; the operations of other circuits, such as the error voltage calculation circuit 7, the frequency setting circuit 8 and the like, are the same as those described in the above-mentioned embodiment 1 and embodiment 2.

The divider circuit 9*a* in the embodiment 3 may have the same configuration as that of the divider circuit 9*a* of the above-mentioned embodiment 2; however, even if a general divider circuit is used, it does not affect the voltage detection operation of the embodiment 3.

As described above, in the embodiment 3, by using the rectifying circuit 51 for carrying out rectifying by peak holding and the smoothing circuit 52, a high voltage detection resolution can be obtained even if a low-bit A/D converter is used, thereby having a great effect in reducing cost.

In addition, it is not necessary to install a large-capacitance capacitor in the piezoelectric transformer-driving circuit of the embodiment 3; therefore, the space for parts can be saved, thereby being highly effective in making compact video apparatuses more compact.

Furthermore, in the embodiment 3, the smoothing circuit 52 is configured to carry out average processing; however, this average processing is basically filter processing; therefore, an IIR digital filter for example can be used instead as a smoothing circuit.

Moreover, in the embodiment 3, the peak hold circuit was used for the rectifying circuit 51; however, this rectifying circuit is not particularly required to be the peak hold system, provided that the circuit uses a system capable of carrying out conversion into a substantial DC signal; for example, a system for carrying out conversion into a substantial DC signal may be used in combination with a filter circuit having a relatively small time constant in comparison with that of a full-wave rectifying system; in addition, it is possible to use configurations of a variety of general rectifying circuits.

Figure 13:
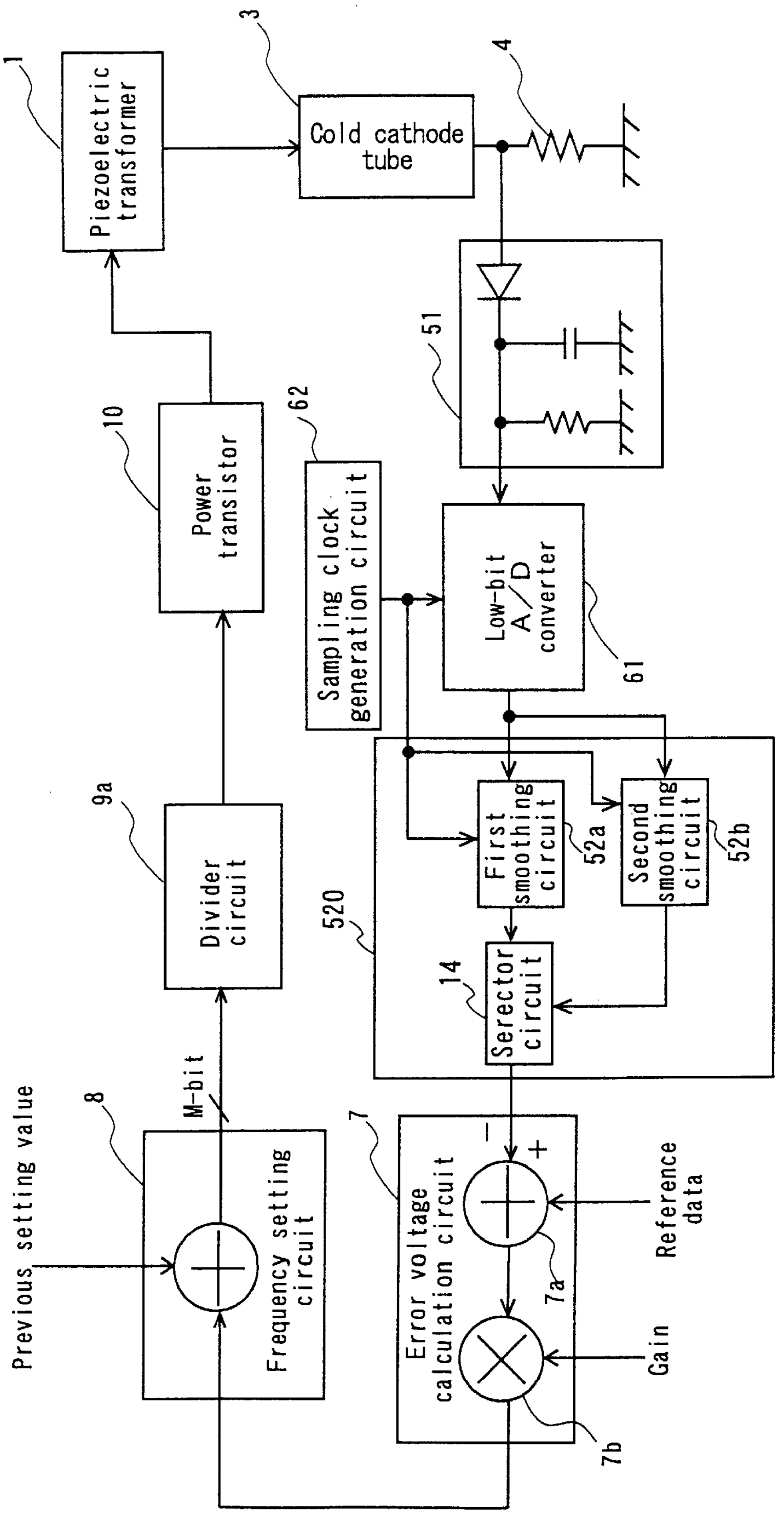
FIG. 13 is a block diagram showing the configuration of a piezoelectric transformer-driving circuit in accordance with another example of the embodiment 3 of the present invention.

FIG. 13 is a block diagram showing the configuration of a piezoelectric transformer-driving circuit in accordance with another example of the embodiment 3. In the embodiment 3, as the smoothing cycle of the smoothing circuit 52 increases, the detection resolution rises in proportional thereto; however, it is estimated that the response speed of control lowers. The piezoelectric transformer-driving circuit shown in FIG. 13 is a circuit for preventing the problem of this low response speed.

Figure 14:
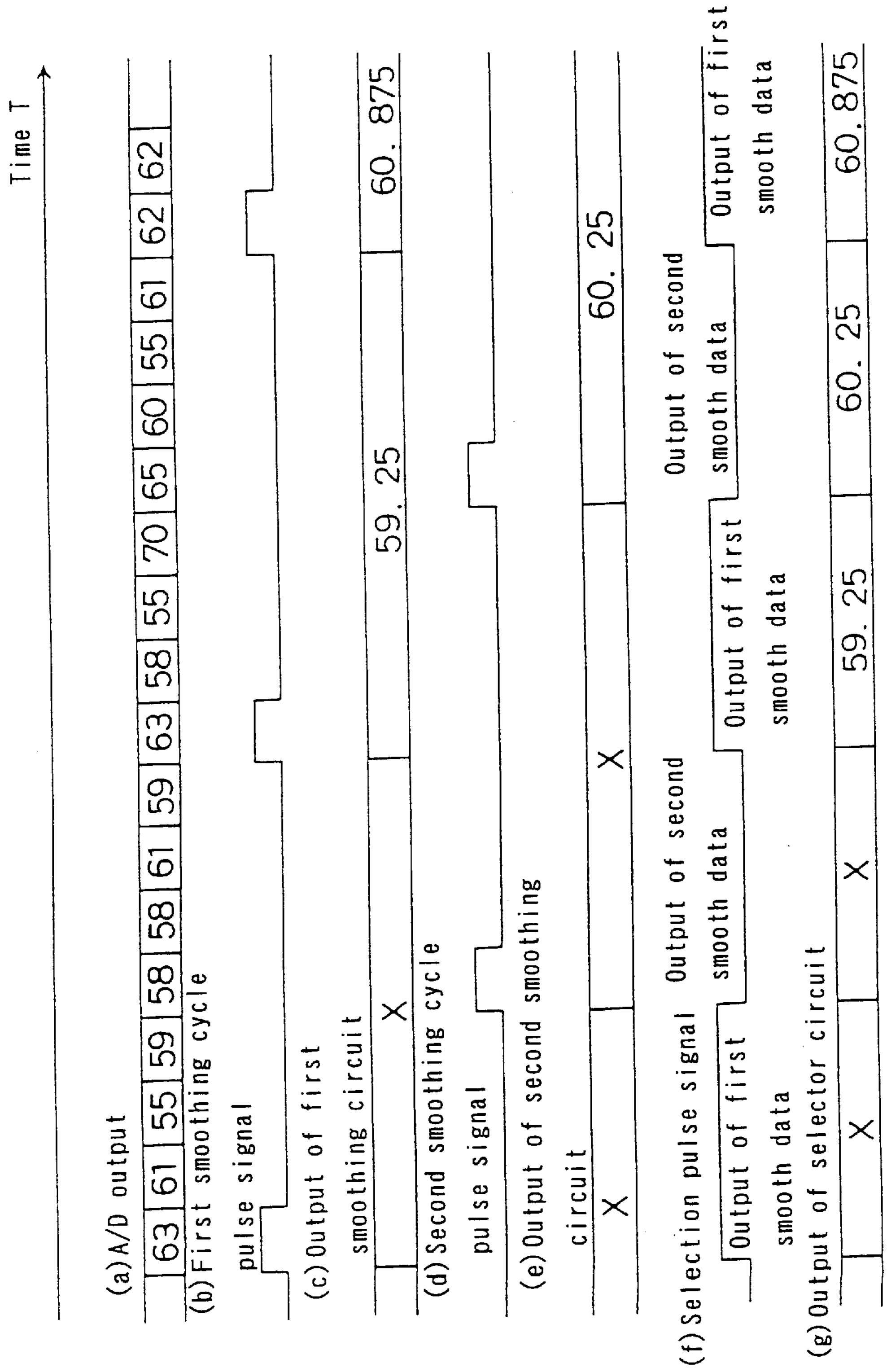
FIG. 14 is a timing waveform diagram illustrating the operation of the other example of the embodiment 3 of the present invention.

The piezoelectric transformer-driving circuit of FIG. 13 is provided with a smoothing portion 520 comprising two smoothing circuits 52*a* and 52*b* and a selector circuit 14, instead of the smoothing circuit 52 shown in FIG. 9. The first smoothing circuit 52*a* and the second smoothing circuit 52*b* have the same smoothing cycle, and their smoothing phases are different from each other. The selector circuit 14 is configured to switch the outputs of the two circuits, that is, the first smoothing circuit 52*a* and the second smoothing circuit 52*b,* so as to output the newest smooth data at all times. In the piezoelectric transformer-driving circuit of FIG. 13, the same components as those shown in the above-mentioned FIG. 9 are represented by the same numerals, and the above-mentioned explanations are applied, thereby omitting overlap explanations. The operation timing of the piezoelectric transformer-driving circuit shown in FIG. 13 is shown in FIG. 14. FIG. 14 is a timing diagram for the low-bit A/D converter 61, the first smoothing circuit 52*a* and the second smoothing circuit 52*b.*

In FIG. 14, (a) shows digital data that is output after being A/D converted at sample points depending on the sampling clock output from the sampling clock generation circuit 62. This digital data is input to both the first smoothing circuit 52*a* and the second smoothing circuit 52*b,* and averaged in the cycle of the first smoothing cycle pulse signal ((b) of FIG. 14) and the cycle of the second smoothing frequency pulse signal ((d) of FIG. 14) respectively. As shown in (b) and (d) of FIG. 14, the first smoothing cycle pulse signal (b) and the second smoothing cycle pulse signal (d) have the same cycle and different phases, and are configured to output smooth data alternately. The output from the first smoothing cycle pulse signal and the output from the second smoothing cycle pulse signal are switched by the selector circuit 14 and then output from the smoothing portion 520. As a result, as shown in (g) of FIG. 14, it is possible to obtain a digital signal smoothened in the half cycle of the smoothing cycle. X in the timing diagram of FIG. 14 designates any given data.

In the piezoelectric transformer-driving circuit shown in the above-mentioned FIG. 13, the example using the two smoothing circuits 52*a* and 52*b* is shown; however, it is possible to additionally install smoothing circuits. If the divider circuit 9*a* in the embodiment 3 is configured just like the above-mentioned embodiment 2, the frequency resolution of the drive pulse signal can be obtained by using a low clock frequency of about 10 MHz, whereby the effect of the LSI formation can be made higher.

In the embodiment 3 of the present invention, as described above, the A/D converter is made to have a low-bit configuration; therefore, an analog detection voltage can be converted into a digital signal by using a low-cost configuration, thereby being greatly effective in improving cost merit in the LSI formation of the driving circuit. In addition, the conventional analog circuit requires a large-capacitance capacitor being disadvantageous in saving installation space; however, in the present invention, by digitalizing smoothing, it is possible to obtain a great effect in saving installation space.

<<Embodiment 4>>

A piezoelectric transformer-driving circuit in accordance with embodiment 4, an embodiment of the present invention, will be described below by referring to the accompanying drawings.

Figure 15:
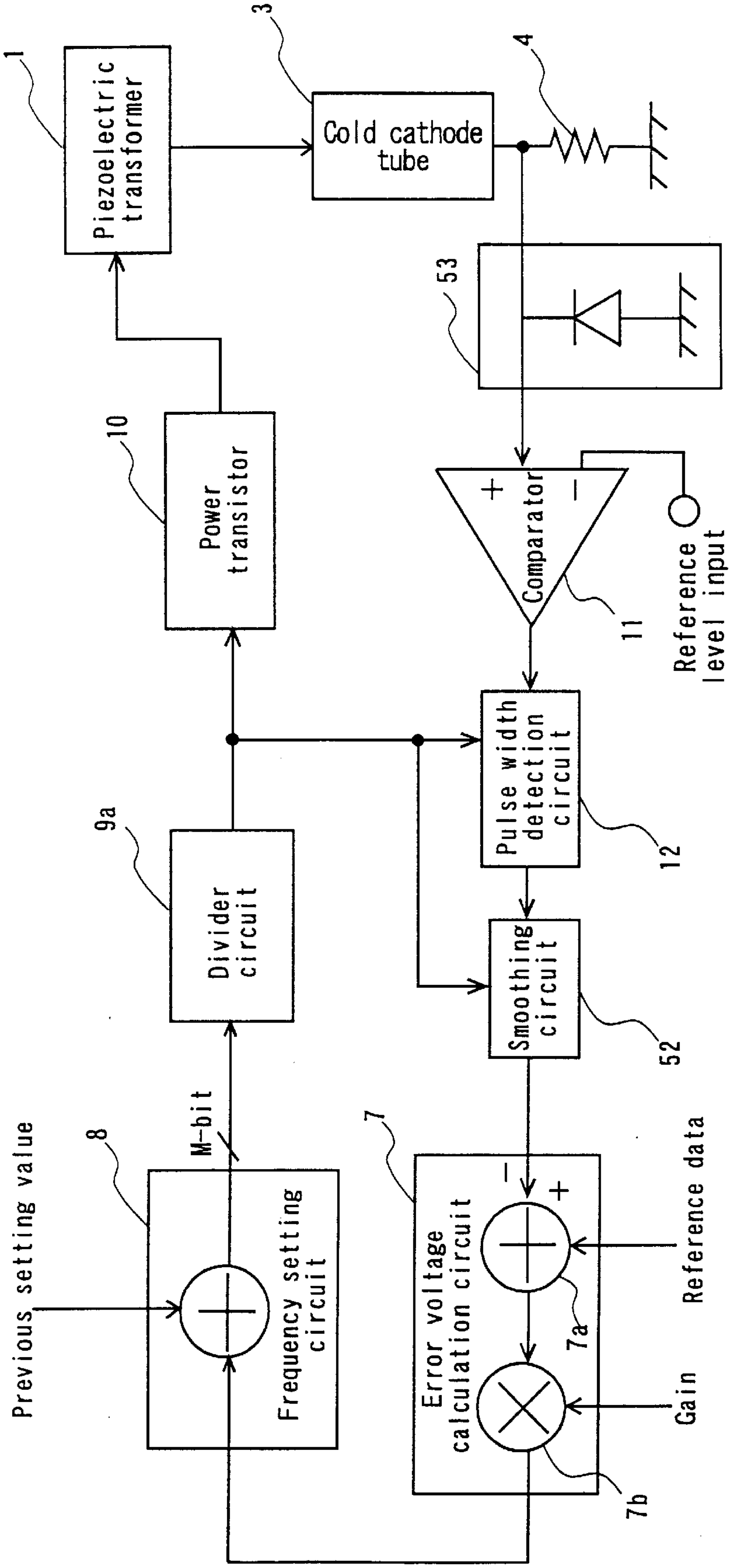
FIG. 15 is a block diagram showing the configuration of a piezoelectric transformer-driving circuit in accordance with embodiment 4 of the present invention.
Figure 16:
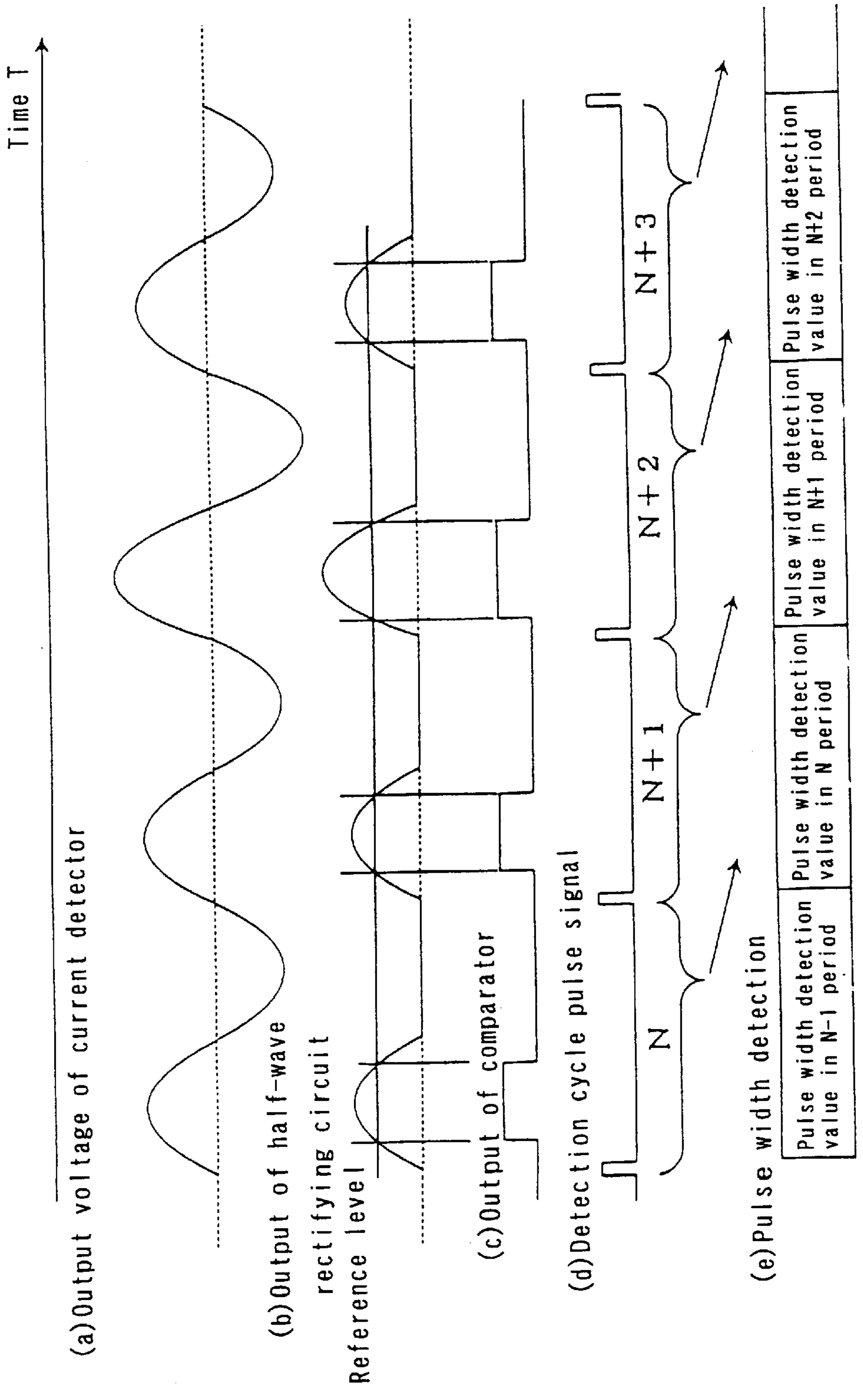
FIG. 16 is a timing waveform diagram illustrating the operation of the embodiment 4 of the present invention.
Figure 17:
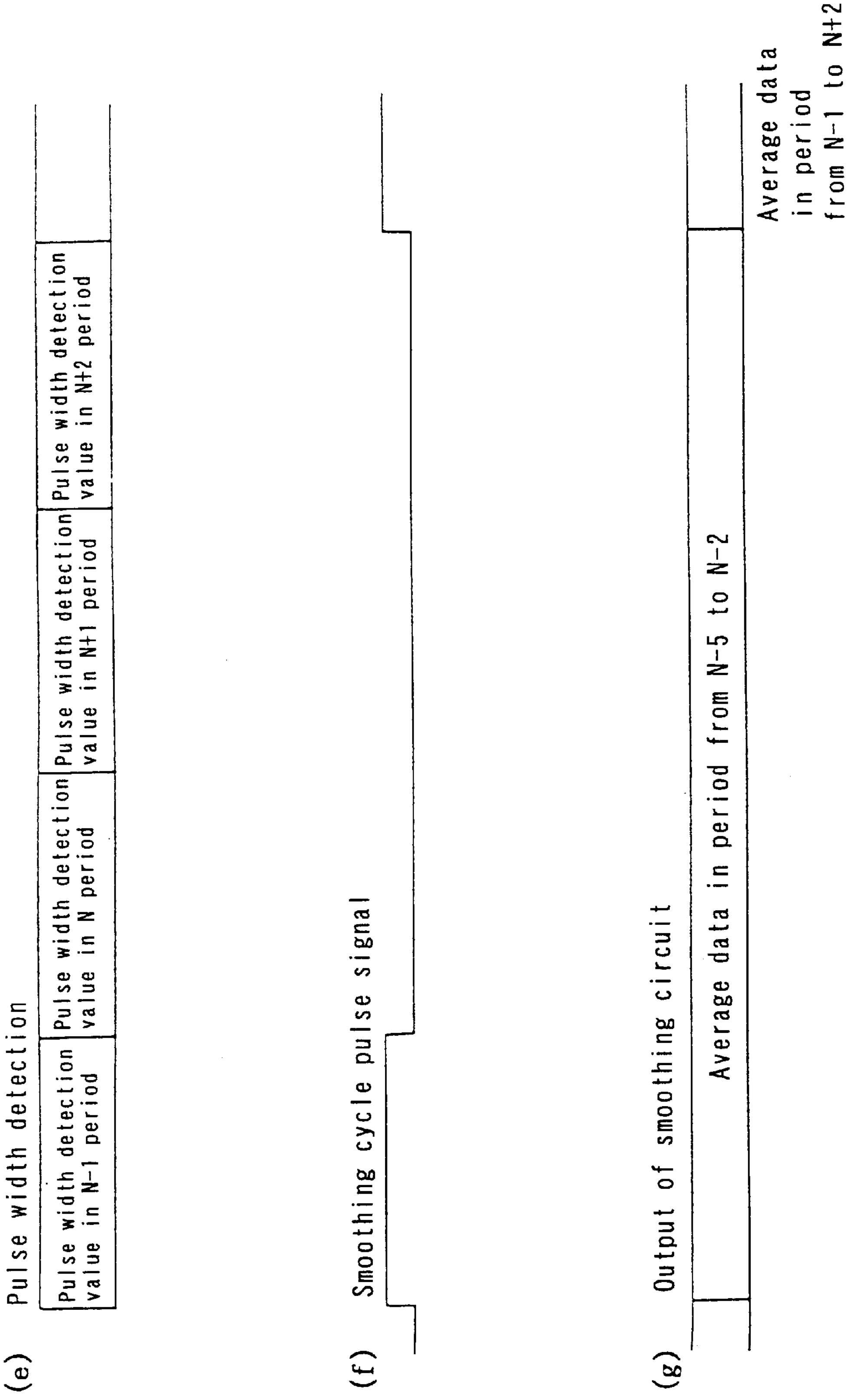
FIG. 17 is a timing waveform diagram illustrating the operation of the embodiment 4 of the present invention;.

FIG. 15 is a block diagram showing the configuration of the piezoelectric transformer-driving circuit of the embodiment 4, an embodiment of the present invention. In the embodiment 4, the same configurations as those of the above-mentioned embodiment 1 are designated by the same numerals; the explanations of the embodiment 1 are applied to the same configurations, thereby omitting overlap explanations. FIGS. 16 and 17 are timing waveform diagrams showing the operations of the piezoelectric transformer-driving circuit of the embodiment 4.

In FIG. 15, the half-wave rectifying circuit 53 connected to a current detector 4 half-wave rectifies the detection voltage. The comparator 11 connected to the half-wave rectifying circuit 53 compares the half-wave rectified voltage signal with a reference level signal input externally. When the voltage of the half-wave rectified voltage signal is lower than the reference level, the comparator 11 outputs an "L" level pulse signal to a pulse width detection circuit 12; when the voltage is higher than the reference level, the comparator 11 outputs an "H" level pulse signal to the pulse width detection circuit 12.

The pulse width detection circuit 12 detects the pulse width of the pulse signal output from the comparator 11. The pulse width detection circuit 12 is configured so that a drive pulse signal from a divider circuit 9*a* is input and so that the pulse width is detected in synchronization with the drive pulse signal.

As described above, the piezoelectric transformer-driving circuit of the embodiment 4 is configured to use the comparator 11 and the half-wave rectifying circuit 53 as voltage detection means and to detect the voltage level by detecting the pulse width of the pulse signal output from the voltage detection means. Since the piezoelectric transformer-driving circuit of the embodiment 4 is configured in this way, an analog voltage can be converted into a digital signal by using the cost-reduced configuration.

In addition, just as in the case of the above-mentioned embodiment 3, the piezoelectric transformer-driving circuit of the embodiment 4 is not required to include a large-capacitance capacitor; therefore, the space for parts can be saved, thereby being greatly effective in making compact video apparatuses more compact.

The operations of the piezoelectric transformer-driving circuit of the embodiment 4 will be described below by referring to FIGS. 16 and 17.

The sine wave shown in (a) of FIG. 16 is a signal waveform output from the current detector 4 and is a voltage signal. This voltage signal is half-wave rectified by the half-wave rectifying circuit 53, and the voltage signal shown in a solid line in (b) of FIG. 16 is output from the half-wave rectifying circuit 53. At the comparator 11, the half-wave rectified signal from the half-wave rectifying circuit 53 is compared with the reference level indicated in a dot line in (b) of FIG. 16, and the pulse waveform shown in (c) of FIG. 16 is output.

As can be understood from the waveforms in (b) and (c) of FIG. 16, the pulse width of the pulse signal output from the comparator 11 changes depending on the amplitude of the half-wave rectified signal at the reference level.

By using this change in amplitude, the piezoelectric transformer-driving circuit of the embodiment 4 detects the voltage obtained by the current detector 4 depending on the pulse width of the pulse signal output from the comparator 11. In the pulse width detection circuit 12, the detection of the pulse width is required to be carried out in the cycle units of the substantially sine signal output from the current detector 4. For this reason, the pulse width detection circuit 12 is configured to carry out detection by using a pulse signal in synchronization with the signal from the divider circuit 9*a* for generating the drive pulse signal.

(d) of FIG. 16 shows a detection cycle pulse signal to be input from the divider circuit 9*a* to the pulse width detection circuit 12. The pulse width detection circuit 12 counts the pulse widths in the cycle of the detection cycle pulse signal, and outputs pulse width data shown in (e) of FIG. 16. This pulse width data is smoothened by a smoothing circuit 52. The smoothing operation of the smoothing circuit 52 and the effect thereof are the same as those described in the above-mentioned embodiment 3.

(f) of FIG. 17 shows the smoothing cycle pulse signal in the smoothing circuit 52, and (g) of FIG. 17 shows the output timing of the average data, that is, the output data of the smoothing circuit 52.

The operations of an error voltage calculation circuit 7, a frequency setting circuit 8 and the divider circuit 9*a*, and the overall control operation in the embodiment 4 are the same as those described in the above-mentioned embodiments 1 to 3.

As described above, in the piezoelectric transformer-driving circuit of the embodiment 4, voltage detection is carried out by using the half-wave rectifying circuit 53 and the comparator 11; therefore, voltage detection is made possible with high accuracy by using a simple and low-cost configuration, whereby the effect thereof is significant in the digitalization of the piezoelectric transformer-driving circuit.

The detection resolution of the voltage detection system in the embodiment 4 is explained; when it is assumed that the comparator 11 has an ideal characteristic, the resolution of the voltage detection by the comparator 11 depends on the frequency of the master clock for counting the pulse widths and the cycle of the smoothing circuit 52. For example, when it is assumed that the drive frequency of a piezoelectric transformer 1 is 100 KHz and that the master clock is 10 MHz, 10 MHz/100 KHz=100 (resolution) is obtained only by pulse width detection, and this is nearly equal to the resolution performance of a 7-bit A/D converter.

Furthermore, in the embodiment 4, the resolution is improved by the smoothing circuit 52; therefore, it is possible to obtain sufficient detection performance.

In the embodiment 4, even if the smoothing circuit 52 is configured to carry out digital filter processing instead of average processing, just as in the case of the above-mentioned embodiment 3, an effect similar to that of the above-mentioned embodiment 4 can be obtained.

Figure 18:
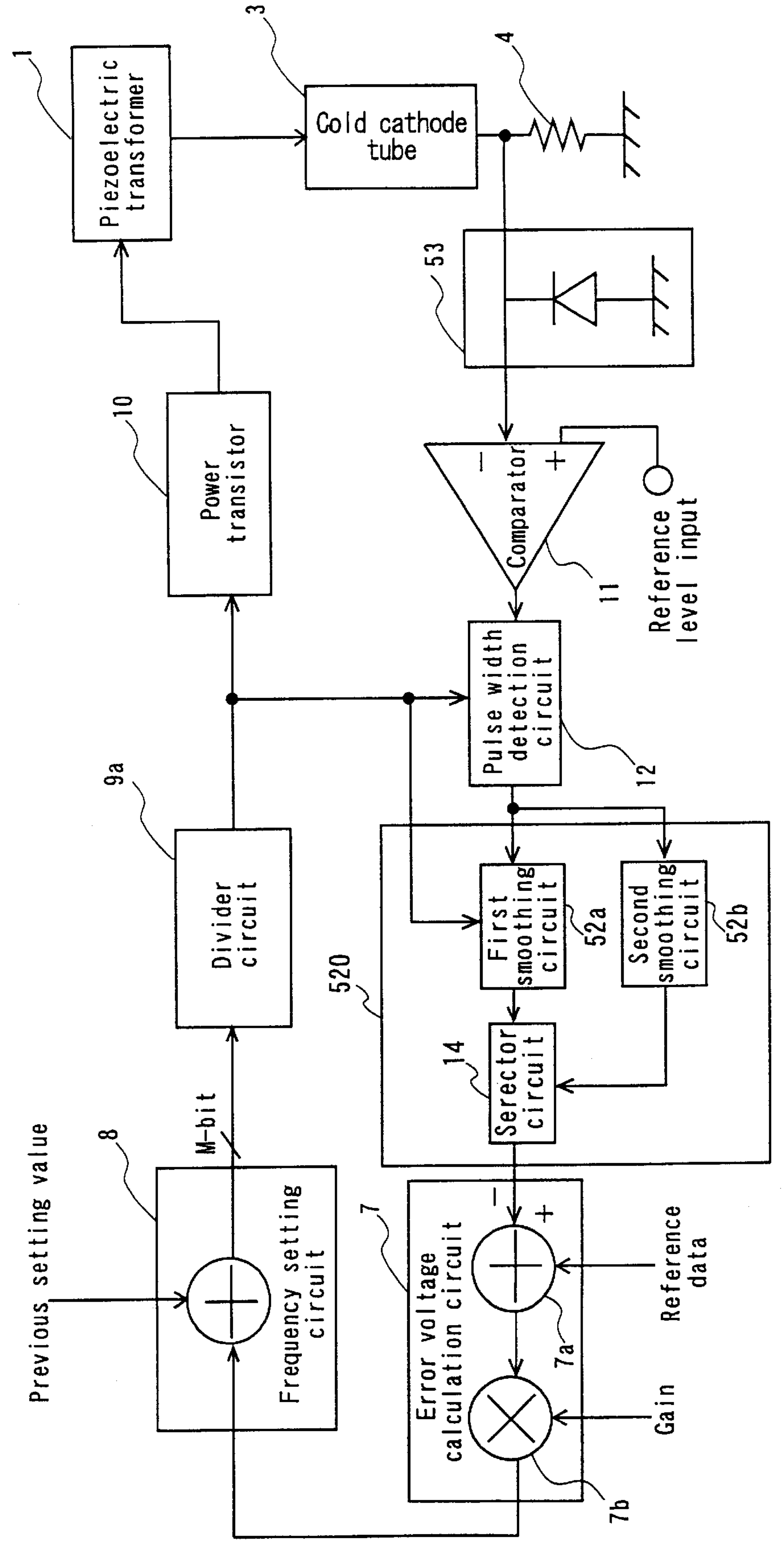
FIG. 18 is a block diagram showing the configuration of a piezoelectric transformer-driving circuit in accordance with another example of the embodiment 4 of the present invention.

FIG. 18 is a block diagram showing the configuration of another piezoelectric transformer-driving circuit in accordance with the above-mentioned embodiment 4 shown in FIG. 15. The piezoelectric transformer-driving circuit of FIG. 18 is provided with a smoothing portion 520 comprising plural smoothing circuits 52*a* and 52*b* and a selector circuit 14, instead of the smoothing circuit 52 of the embodiment 4. As shown in FIG. 18, the smoothing portion 520 is provided with the first smoothing circuit 52*a* and the second smoothing circuit 52*b*, and these are switched by the selector circuit 14 to improve the response speed. In FIG. 18, other configurations are identical to those of the piezoelectric transformer-driving circuit shown in the above-mentioned FIG. 15, and represented by the same numerals, and the explanations thereof are applied.

Since the operations and the effects of the first smoothing circuit 52*a* and the second smoothing circuit 52*b* of the smoothing circuit 520 in FIG. 18 are identical to those of the smoothing portion 52 of the above-mentioned embodiment 3 shown in FIG. 13, the explanations of the embodiment 3 are applied.

Furthermore, in the piezoelectric transformer-driving circuit of the embodiment 4, by forming the divider circuit 9*a* for generating the drive pulse signal by using the configuration of the divider circuit 9*a* of the above-mentioned second and third embodiments, the frequency resolution of the drive pulse signal can be obtained at a low clock frequency of about 10 MHz; therefore, the effect of LSI formation can be enhanced further.

In the embodiment 4 of the present invention, the pulse width detection method using the comparator is employed as described above; therefore, an analog detection voltage can be converted into a digital signal by using a simple low-cost configuration, thereby being greatly effective in improving cost merit in the LSI formation of the driving circuit.

<<Embodiment 5>>

A piezoelectric transformer-driving circuit in accordance with embodiment 5, an embodiment of the present invention, will be described below by referring to the accompanying drawings.

Figure 19:
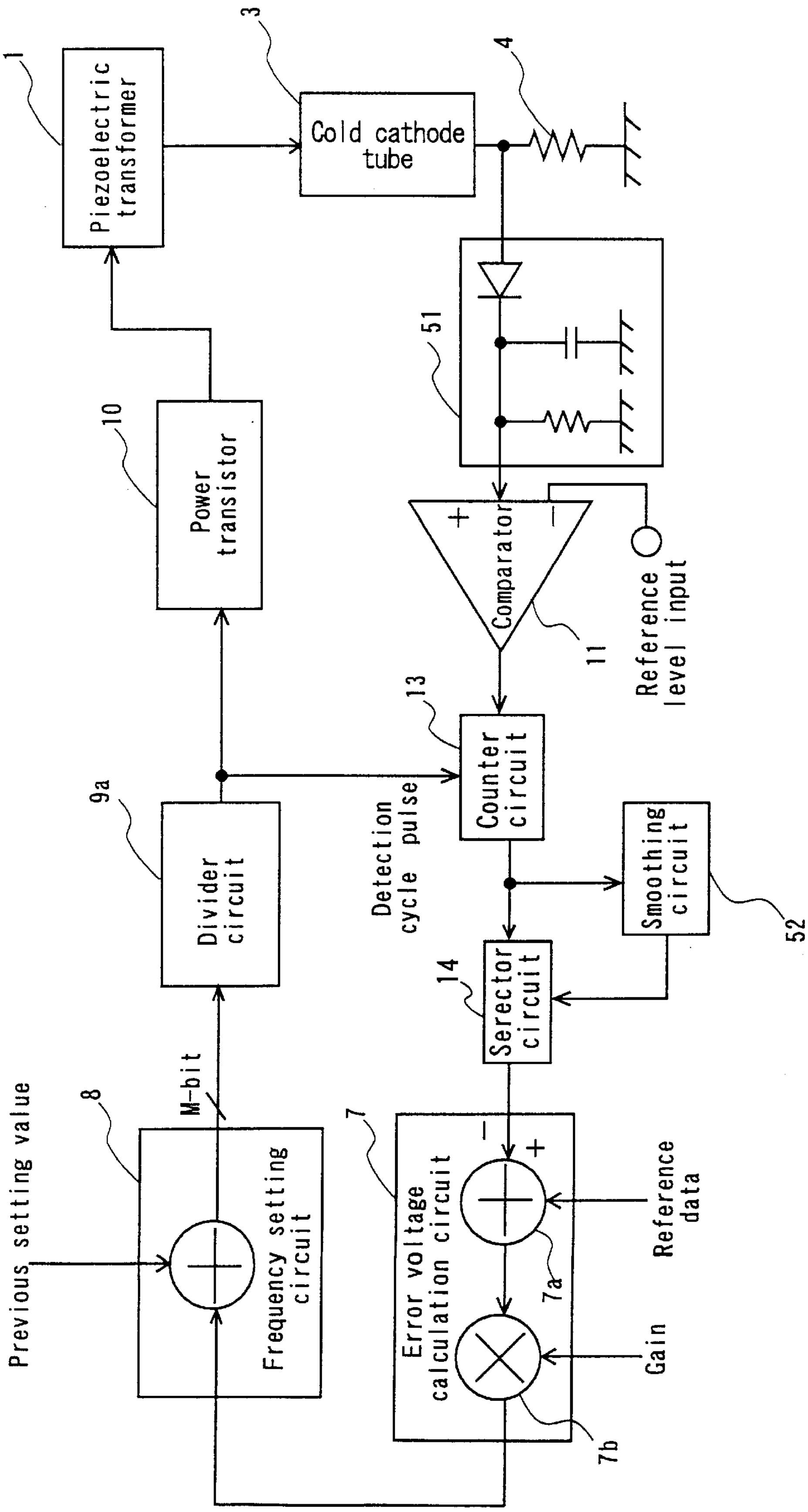
FIG. 19 is a block diagram showing the configuration of a piezoelectric transformer-driving circuit in accordance with embodiment 5 of the present invention.
Figure 20:
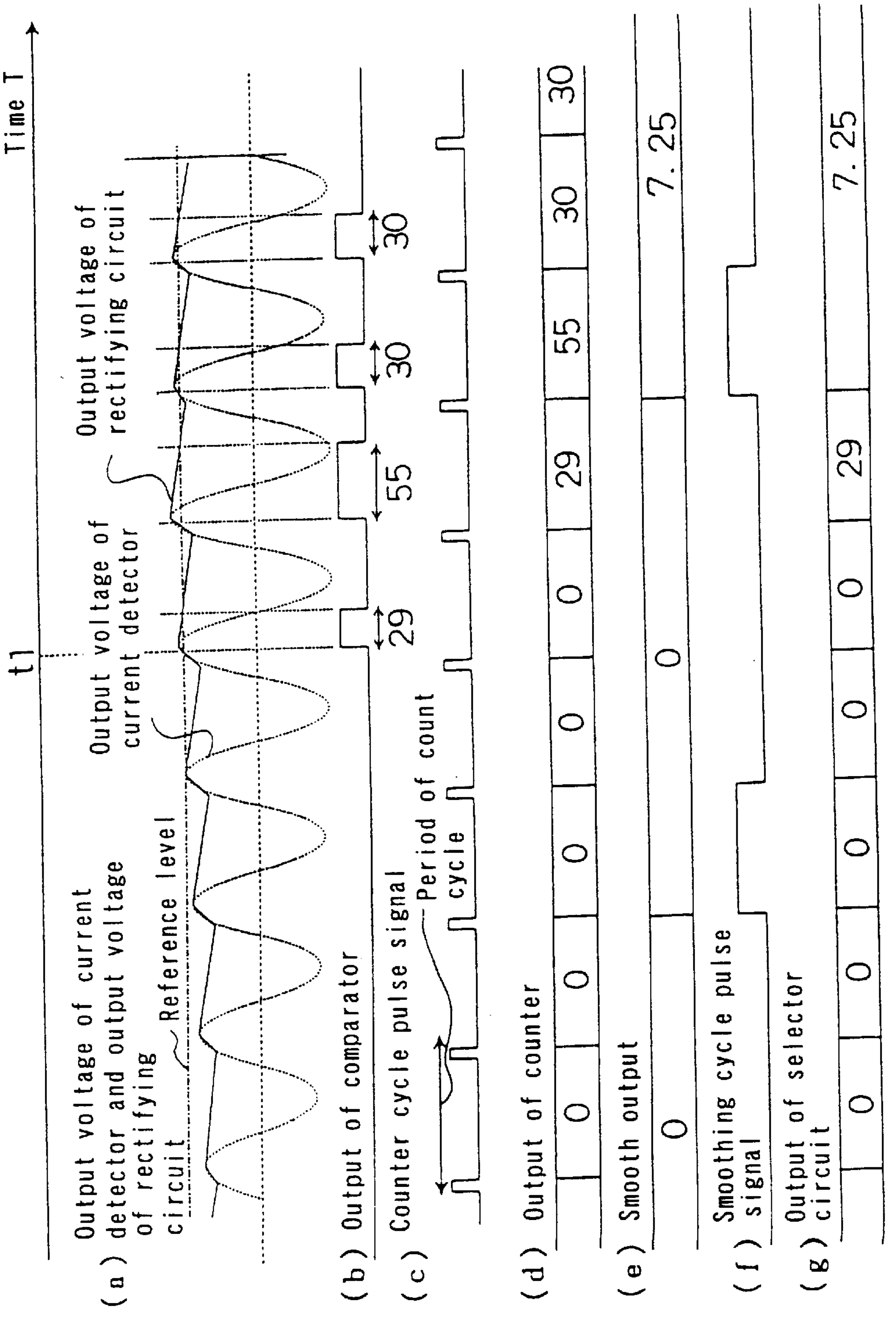
FIG. 20 is a timing waveform diagram illustrating the operation of the embodiment 5 of the present invention.

FIG. 19 is a block diagram showing the configuration of the piezoelectric transformer-driving circuit of the embodiment 5, an embodiment of the present invention. In the embodiment 5, the same configurations as those of the above-mentioned embodiment 1 are designated by the same numerals, and the explanations of the embodiment 1 are applied to the same configurations, thereby omitting overlap explanations. FIG. 20 is a timing waveform diagram showing the operations of the piezoelectric transformer-driving circuit of the embodiment 5.

In FIG. 19, a rectifying circuit 51 has the same configuration as that of the above-mentioned embodiment 3 shown in FIG. 9, carries out rectifying by peak holding, and outputs a voltage signal including slight AC components, without carrying out conversion into a complete DC voltage. A comparator 11 compares the peak-held voltage signal with a reference level input externally. When the peak-held voltage signal is smaller than the reference level, the comparator 11 outputs an "L" level pulse to a counter circuit 13; when the signal is larger than the reference level, the comparator 11 outputs an "H" level pulse to the counter circuit 13.

The counter circuit 13 counts the "H" level pulses output from the comparator 11, and is configured to detect the pulse widths in synchronization with the drive pulse signal output from a divider circuit 9*a*. A smoothing circuit 52 has the same configuration as that of the smoothing circuit 52 of the above-mentioned embodiment 4. A selector circuit 14 switches and outputs the smooth data output from the smoothing circuit 52 or the count data output from the counter circuit 13.

When the count data is a preset minimum (MIN) value or less or a preset maximum (MAX) value or more, the selector circuit 14 is set to output count data; in other cases, the selector circuit 14 is set to output smooth data.

The piezoelectric transformer-driving circuit of the embodiment 5 is characterized in that the rectifying circuit 51 based on peak holding and the comparator 11 are used as voltage detection means and that voltage detection is carried out from a signal having a small amplitude and output from the rectifying, circuit 51.

The piezoelectric transformer-driving circuit of the embodiment 5 is superior to the above-mentioned embodiment 4 in the voltage detection resolution near a target voltage; however, since the amplitude of the signal output from the rectifying circuit 51 is small, if the detection voltage is away from the reference level, it is likely that only two values, "H", level and "L" level, can be distinguished. For this reason, in the embodiment 5, it is necessary to quickly bring the detection voltage close to the target voltage value; therefore, high-speed control for changing the change amount of frequency depending on the present detection voltage cannot be carried out, thereby being likely to cause a problem of lowering response speed.

In this case, usually, control for bringing the detection voltage close to the target is carried out while the change amount of frequency at one control loop is limited within the frequency range corresponding to the level of the amplitude of the signal output from the rectifying circuit 51.

To prevent this, the piezoelectric transformer-driving circuit of the embodiment 5 is configured to increase the response speed of control by directly outputting the output of the counter circuit 13 to an error voltage calculation circuit 7 without passing it through the smoothing circuit 52 at the time of transition during which no stable operation is required, and is also configured to smoothen the count data by using the smoothing circuit 52 near the target voltage wherein stable operation is required.

The operations of the piezoelectric transformer-driving circuit of the embodiment 5 will be described below referring to FIG. 20.

FIG. 20 is a timing waveform diagram showing the output signals of the current detector 4, the rectifying circuit 51, the comparator 11, the counter circuit 13, the smoothing circuit 52 and the selector circuit 14 of the embodiment 5. FIG. 20 is a waveform diagram in the case when "0" is set as the minimum (MIN) value of the count data of the counter circuit 13.

The sine wave in a dot line in (a) of FIG. 20 shows the voltage signal obtained at the current detector 4, and the waveform in a solid line in (a) of FIG. 20 is the voltage waveform peak-held by the rectifying circuit 51. (b) of FIG. 20 shows the output waveform of the comparator 11. As shown in (b) of FIG. 20, the output of the comparator 11 has the "L" level until time t1; therefore, the output of the counter circuit 13 shown in (d) of FIG. 20 is the minimum setting value "0." In this period, the count data ((d) of FIG. 20), that is, the output of the counter circuit 13, is directly output to the error voltage calculation circuit 7. At this time, the error voltage calculation circuit 7 calculates an error voltage at each drive pulse cycle, and the error voltage is reflected to the frequency division ratio of the next drive pulse signal. As a result, the frequency setting value in the frequency setting circuit 8 can get close to the target frequency quickly.

Next, when the value gets close to the frequency near the target at time t1 and reaches a range wherein voltage detection is possible, that is, when the value becomes larger than the minimum setting value of the counter, the output to the error voltage calculation circuit 7 is switched to the output ((e) of FIG. 20) of the smoothing circuit 52, thereby attaining stable operation.

In the above description, the case of an operation wherein the detection voltage gets close to the target value from a value lower than the reference level is explained; however, the case of the opposite operation wherein the detection voltage gets close to the target value from a value higher than the reference level is the same as the above-mentioned case.

Next, the voltage detection resolution in the embodiment 5 will be described. When it is assumed that the comparator 11 has an ideal characteristic, its resolution is determined by the clock frequency for the period of count cycles and the amplitude of the detection voltage output from the rectifying circuit 51. In other words, the resolution is improved as the clock frequency is higher and the amplitude of the detection voltage is smaller. When it is assumed that the period of count cycles=drive pulse signal=100 KHz, and that the master clock is 10 MHz, a resolution of 10 MHz/100 KHz=100 is obtained in the range of the amplitude of the voltage output from the peak hold rectifying circuit 51. As described above, in accordance with the embodiment 5, voltage detection values can be digitalized with high accuracy by a simple configuration using the comparator 11.

In addition, the embodiment 5 is configured so that smoothed data and non-smoothed data are switched and input to the error voltage calculation circuit 7 in order to eliminate a disadvantage in the response of control. This offers a significant effect in the digitalization of the piezoelectric transformer-driving circuit of the embodiment 5.

Furthermore, the embodiment 5 is configured to carry out switching depending on whether smoothing is present or not; however, even if it is configured to carry out switching depending on the time constant for smoothing, it is possible to greatly contribute to improvement in the response speed.

Moreover, in the present invention, various applications and developments can be attained by using other general rectifying means as the rectifying circuit 51 of the embodiment 5 or by using the frequency division ratio distribution divider circuit of the above-mentioned embodiment 1 or the frequency division system of the embodiment 2 as the divider circuit 9*a*. These can also provide the same effect as that of the embodiment 5.

As described above, in accordance with the embodiment 5 of the present invention, an analog detection voltage can be with high accuracy converted into a digital signal by using a simple low-cost configuration while practical control performance is attained by the comparator, the peak-hold means and response speed measures, thereby being greatly effective in enhancing cost merit in the LSI formation of the driving circuit. For this reason, the present invention is greatly effective in making compact video apparatuses more compact and lower in cost.

<<Embodiment 6 to Embodiment 13 >>

Embodiments 6 to 13 of a piezoelectric transformer-driving circuit in accordance with the present invention will be described below.

Just as in the cases of the above-mentioned embodiments 1 to 5, the piezoelectric transformer-driving circuits of the embodiments 6 to 13 are intended to propose piezoelectric transformer-driving circuits capable of forming a drive pulse signal having a high frequency resolution from a clock having a low frequency and capable of detecting a voltage suited for digital processing by using a simple low-cost configuration.

Furthermore, the piezoelectric transformer-driving circuits of the embodiments 6 to 13 are provided to solve the following problems.

In order to install liquid crystal display monitors in compact video apparatuses, such as a VCR integrated with a camera and a digital camera, a piezoelectric transformer for driving the backlight of the liquid crystal display monitor and the like is provided. When installing the piezoelectric transformer in these compact video apparatuses, it is important to attain the following objects.

(A) Reducing the number of parts and saving space (B) Attaining stable operation at low power supply voltage (C) Attaining highly efficient drive against power supply voltage fluctuation (D) Preventing no-lighting of cold cathode tube First, the object (A) will be described. In order to enhance the portability of the above-mentioned compact video apparatuses, the piezoelectric transformer-driving circuit is also desired to have less space by reducing the number of parts. At present, the piezoelectric transformer-driving circuit is mainly formed of an analog circuit and has a large number of parts. As a method of reducing the number of parts of the piezoelectric transformer-driving circuit and of saving its space, a method of attaining IC formation so that the driving circuit is formed of one chip is available; however, a small package cannot be used because of the restriction in the number of pins at the time of IC formation; therefore, it is impossible to obtain any significant effects.

Therefore, it is considered to use a method of forming the driving circuit in one chip together with the digital LSI for the liquid crystal controller and the like. This method is greatly effective in saving space; however, when the piezoelectric transformer-driving circuit is formed of an analog circuit, the circuit becomes a digital/analog mixture circuit. For this reason, this method is disadvantageous in the cost of the LSI; therefore, it is desired to digitalize the piezoelectric transformer-driving circuit.

However, in order to digitalize the piezoelectric transformer-driving circuit, it is necessary to have a clock having a high frequency capable of obtaining a highly accurate frequency required to control the piezoelectric transformer.

As explained in the descriptions of the above-mentioned prior art, in order to generate a piezoelectric transformer drive pulse signal by digital processing, a method wherein a clock is frequency-divided to obtain a drive pulse signal having a desired frequency has been disclosed. In this clock frequency division method, the clock frequency required to control the current of the cold cathode tube within a predetermined range (±1% for example) must be very high.

More specifically, in a typical piezoelectric transformer, its resonance frequency is about 100 KHz, and the average frequency sensitivity in the frequency range to be controlled (on the high frequency side from the resonance frequency) is represented by a voltage change of about +100% to −50% depending on a frequency change of 1 KHz. The current flowing through the cold cathode tube is proportional to the voltage at the secondary electrode of the piezoelectric transformer; therefore, in order to suppress the current flowing through the cold cathode tube within about ±1%, it is necessary to suppress the voltage at the secondary electrode of the piezoelectric transformer within about ±1%.

In order to suppress the voltage at the secondary electrode of the piezoelectric transformer within ±1% in this way, the frequency resolution of the drive pulse signal is required to be at least about 10 to 20 Hz. The clock frequency required to obtain a frequency resolution of 10 to 20 Hz is 500 MHz to 1 GHz at about 100 KHz in the vicinity of about 100 KHz. This kind of high clock frequency is not a practical clock frequency in consideration of emission interface, supply power and the like.

Next, the object (B) in the case when installing the piezoelectric transformer in a compact video apparatus will be described.

Figure 61:
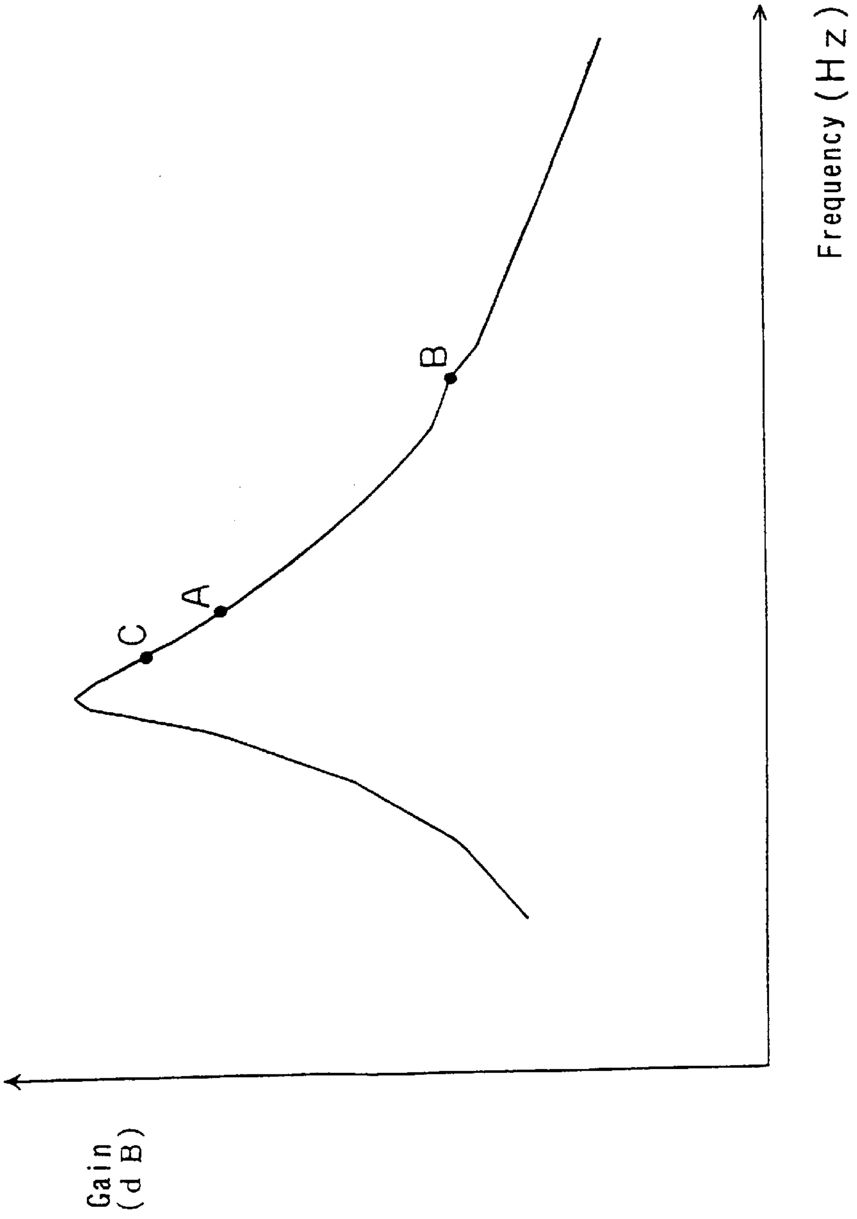
FIG. 61 is a block diagram showing the configuration of the conventional piezoelectric transformer-driving circuit.

The power supply of the above-mentioned portable compact video apparatus is basically a battery. Therefore, the output voltage gradually lowers as the remaining power amount of the battery decreases. However, the piezoelectric transformer-driving circuit is desired to operate stably even if the power supply voltage lowers. FIG. 21 shows the relationship between the power supply voltage and the output voltage of the piezoelectric transformer in the above-mentioned conventional driving circuit shown in FIG. 61. When the power supply voltage lowers, the step-up ratio of the electromagnetic transformer 102 used as a pre-transformer decreases, whereby the voltage output from the piezoelectric transformer 101 lowers.

In the case when the control system disclosed in the above-mentioned monthly magazine, NIKKEI ELECTRONICS, Nov. 7, 1994 (No. 621), pages 147 to 157 (hereinafter simply referred to as document 1) is used, as the power supply voltage lowers, the control frequency shifts to the low frequency side to hold the output voltage of the piezoelectric transformer 101 constant. However, if the power supply voltage lowers further and the target output voltage cannot be obtained at the piezoelectric transformer 101, control becomes impossible, and the voltage required to maintain the lighting of the cold cathode tube 103 cannot be obtained.

As a result, this causes a problem of turning off the cold cathode tube 103; or in the worst case, this causes a problem of damaging the piezoelectric transformer 1 and the like because of the application of a drive pulse signal having irregular frequencies. Therefore, in the configuration in accordance with the above-mentioned document 1, to prevent the above-mentioned problems, it is necessary to use a piezoelectric transformer or a pre-transformer having a sufficiently large output capable of coping with power supply voltage drop.

Furthermore, power is supplied from the home-use 100 V AC power supply via an AC adaptor instead of a battery in a certain case. In this case, instantaneous power interruption may occur depending on power supply circumstances. The power supply of the piezoelectric transformer is usually configured so that the output of the AC adaptor is directly input without passing through the power supply circuit in order to minimize power loss; therefore, the power supply is directly affected by the instantaneous power interruption. In other words, the desired output voltage cannot be obtained because of the instantaneous power interruption, and the drive frequency changes beyond the resonance frequency of the piezoelectric transformer, whereby an uncontrollable condition similar to that in the above-mentioned case may occur. However, the above-mentioned document 1 does not mention this matter.

On the other hand, in the control methods disclosed in the Japanese published unexamined Utility Model Application No. Hei 4-58085 and Japanese published unexamined Utility Model Application No. Hei 5-4779, control is carried out by the resonance frequency at all times even if the power supply voltage fluctuates; therefore, the above-mentioned problem can be avoided. However, in these control methods, in addition to the detection of the load current flowing through the cold cathode tube, the detection of the phase of the output voltage from the piezoelectric transformer is carried out on principle; therefore, a detection means such as a comparator or the like is necessary separately. For this reason, the piezoelectric transformer-driving circuit provided with an LSI having this kind of detection means has a problem of high cost. In addition, in these control methods, the output voltage is fixed at the step-up ratio at the resonance frequency; therefore, in order to carry out dimming, it is necessary to control the power supply voltage by time division switching or the like, whereby it is inevitable that efficiency reduction occurs because of power loss at the switching device.

Next, the object (C) in the case when installing the piezoelectric transformer in a compact video apparatus will be described.

Generally, the voltage supplied to the cold cathode tube is not obtained sufficiently only by the step-up ratio of the piezoelectric transformer. As shown in the above-mentioned FIG. 63, the electromagnetic transformer 102 is disposed ahead to compensate for the insufficient step-up. An optimum value exists as the duty value of the drive pulse signal applied to the power transistor 110 for driving this electromagnetic transformer 102.

The reason for this will be described below. The voltage in the half-wave sine wave likeform obtained from the electromagnetic transformer 102 changes in proportional to the power supply voltage; therefore the step-up ratio of the overall system including the piezoelectric transformer 101 changes.

Figure 22:
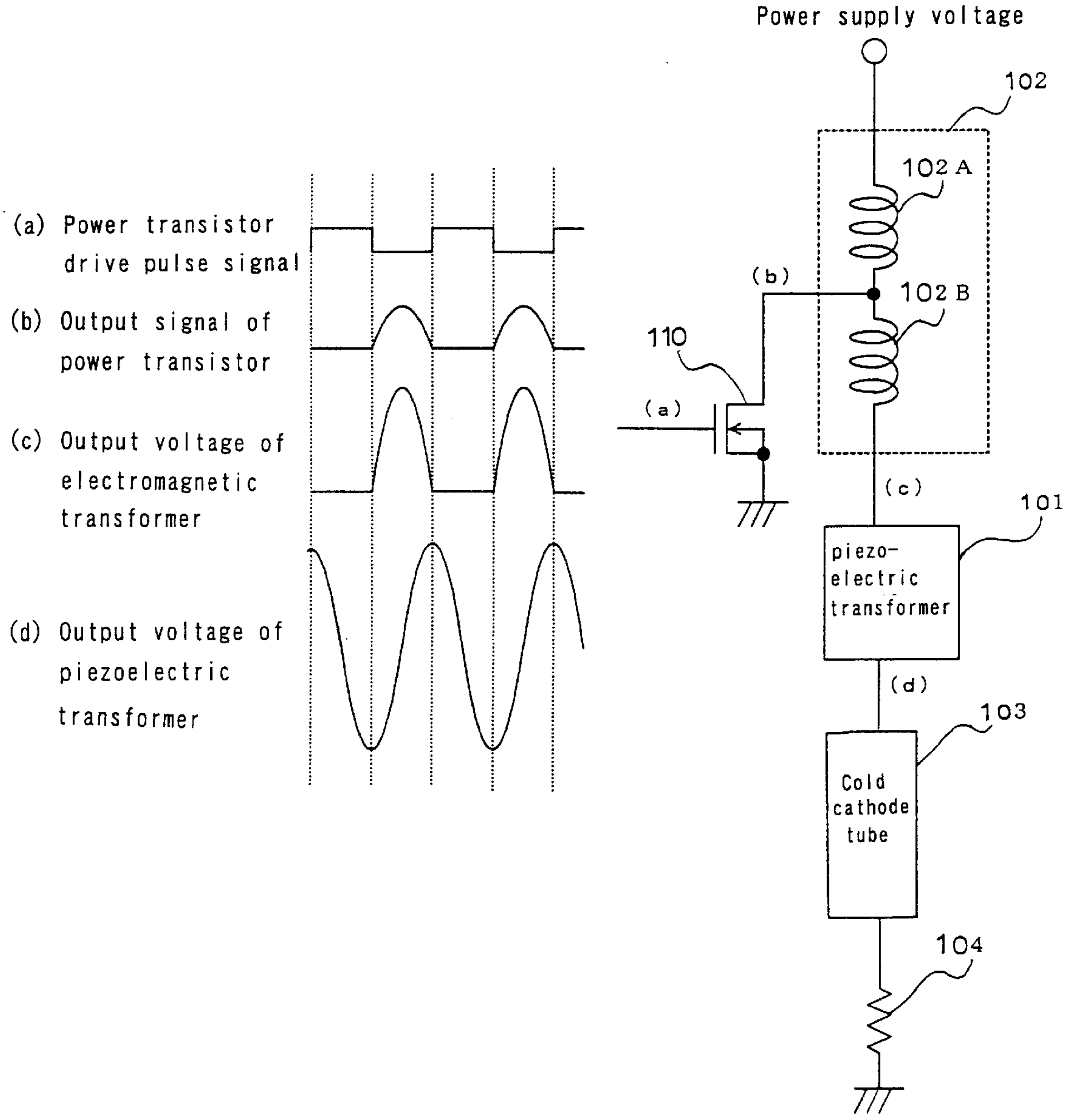
FIG. 22 is a view illustrating the operation of a conventional piezoelectric transformer drive portion.

FIG. 22 is a waveform diagram at various portions from the output of the power transistor 110 to the output of the piezoelectric transformer 101 in the conventional piezoelectric transformer-driving circuit. At this time, by changing the frequency of the drive pulse signal, drive control is carried out to hold the current flowing through the cold cathode tube 103 constant even if the power supply voltage fluctuates.

Figure 23:
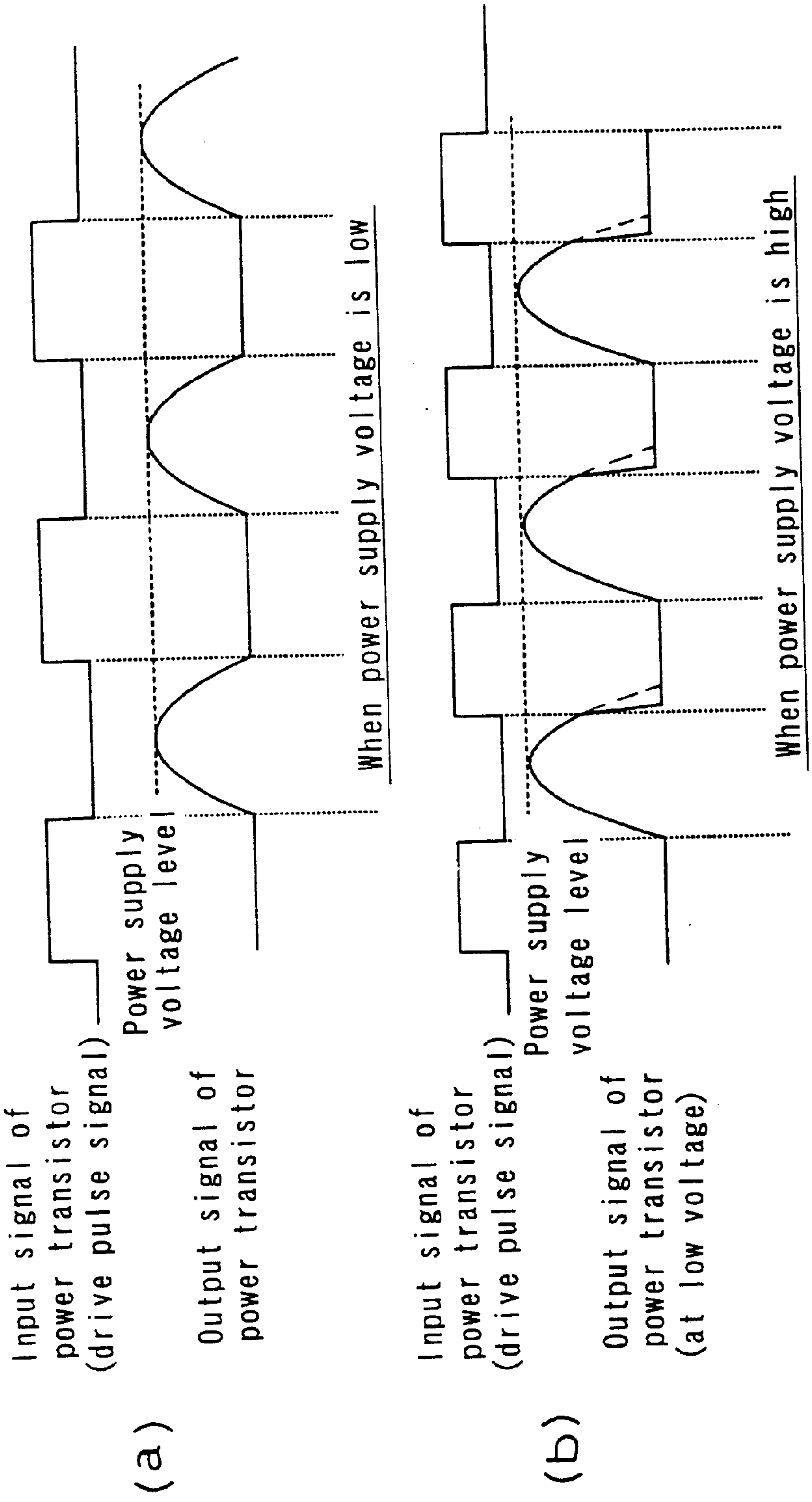
FIG. 23 is a view illustrating the operation of the conventional piezoelectric transformer drive portion.

FIG. 23 is a waveform diagram showing the drive control conditions in FIG. 22; (a) of FIG. 23 shows the output signal of the power transistor 110 at the time when the power supply voltage is low, and (b) shows the output signal at the time when the power supply voltage is high. Although the frequency of the drive pulse signal changes in this way, the frequency of the voltage having the half-wave sine wave likeform input to the piezoelectric transformer 101 becomes a fixed frequency determined by the resonance frequency of the inductance L of the electromagnetic transformer and the input capacitance C of the piezoelectric transformer. For this reason, particularly when the power supply voltage is high, the width of the half-wave of the output signal of the power transistor 110 becomes larger as shown in (b) of FIG. 39, and the power transistor turns on before the output signal of the power transistor 110 becomes zero, that is, before the input voltage of the piezoelectric transformer 101 becomes zero.

When the power transistor 110 turns on, the charge stored in the input capacitance of the piezoelectric transformer 101 is grounded via the power transistor 110, and a surge current flows. As a result, loss increases at the power transistor 110 and the piezoelectric transformer 101, thereby causing lower efficiency, and in the worst case, resulting in the breakdown of the piezoelectric transformer 101.

On the other hand, if the duty value of the drive pulse signal is set low, the energy to be stored in the electromagnetic transformer 102 decreases inversely, thereby lowering the efficiency. For this reason, it was necessary to control the duty value of the drive pulse signal in the wide power supply voltage range so that the value becomes the optimum duty value depending on the power supply voltage. However, in the case when the conventional driving circuit is formed of an analog circuit, there is a limit in optimization in a wide power supply voltage range.

Next, the aforementioned object (D) in the case when installing the piezoelectric transformer in a compact video apparatus will be described.

Generally, in order to light the cold cathode tube, a voltage several times as high as the voltage of the lighting state is required. In the case of a backlight for a four-inch liquid crystal display for example, the voltage required to hold the lighting state is about 300 Vrms; however, in order to light it, it is necessary to apply a voltage of 500 to 700 Vrms. Particularly when the backlight is left for a long time at a low ambient temperature or at a dark place, the lighting performance deteriorates, and the backlight is not lit unless the above-mentioned voltage is applied for a long time or unless a higher voltage is applied.

However, if, the output voltage of the piezoelectric transformer is raised, stress applied to the piezoelectric transformer increases inversely, thereby causing breakdown. For this reason, before starting lighting, it is necessary to carry out control to improve the lighting performance while preventing an excessive voltage from occurring at the piezoelectric transformer at the time of lighting start.

As a known document for solving this kind of problem, the Japanese published unexamined Patent Application No. Hei 10-52068 is present. This Japanese published unexamined Patent Application No. Hei 10-52068 discloses a system for detecting the output voltage of the piezoelectric transformer and for controlling the drive frequency on the basis of the detected output voltage. The output voltage is raised by lowering the drive frequency; if the detected output voltage is a predetermined voltage or more, the drive frequency is shifted to the high-frequency side to lower the output voltage. Then, the drive frequency is lowered again to raise the output voltage; if the output voltage is the predetermined value or more, the drive frequency is shifted to the high-frequency side. As described above, the Japanese published unexamined Patent Application No. Hei 10-52068 discloses a control method wherein the drive frequency is changed to prevent the output voltage from rising significantly.

However, in the control method of the Japanese published unexamined Patent Application No. Hei 10-52068, the above-mentioned control operation is repeated as long as the cold cathode tube is not lit; therefore, even if the upper limit of the output voltage has been set, stress is applied to the piezoelectric transformer for a long time; therefore, this method is not necessarily the best control method.

In addition, in the case when one-chip formation together with the liquid crystal controller by the digitalization of the driving circuit is considered, an A/D converter for detecting the output voltage of the piezoelectric transformer is necessary separately in consideration of the above-mentioned object (A). Therefore, this causes a problem of increasing the cost of the LSI.

The piezoelectric transformer-driving circuits in accordance with the present invention, described in the embodiment 6 to the embodiment 13, have been devised in consideration of the above-mentioned objects (A), (B), (C) and (D) in order to attain the following matters (1), (2), (3), (4) and (5).

(1) a drive system suited for digitalization, capable of obtaining a drive pulse signal having a high frequency resolution from a clock having a low frequency (2) a drive system capable of attaining stable operation regardless of power supply voltage fluctuation (3) a drive pulse duty control system capable of attaining high efficiency in a wide power supply voltage range (4) a start control system for maintaining the lighting performance of the cold cathode tube without applying excessive stress to the piezoelectric transformer (5) a protection function at the time of abnormality due to instantaneous power interruption, wire breakage and the like.

The piezoelectric transformers of the embodiment 6 to the embodiment 13 in accordance with the present invention will be described below by referring to the accompanying drawings.

<<Embodiment 6 >>

Figure 24:
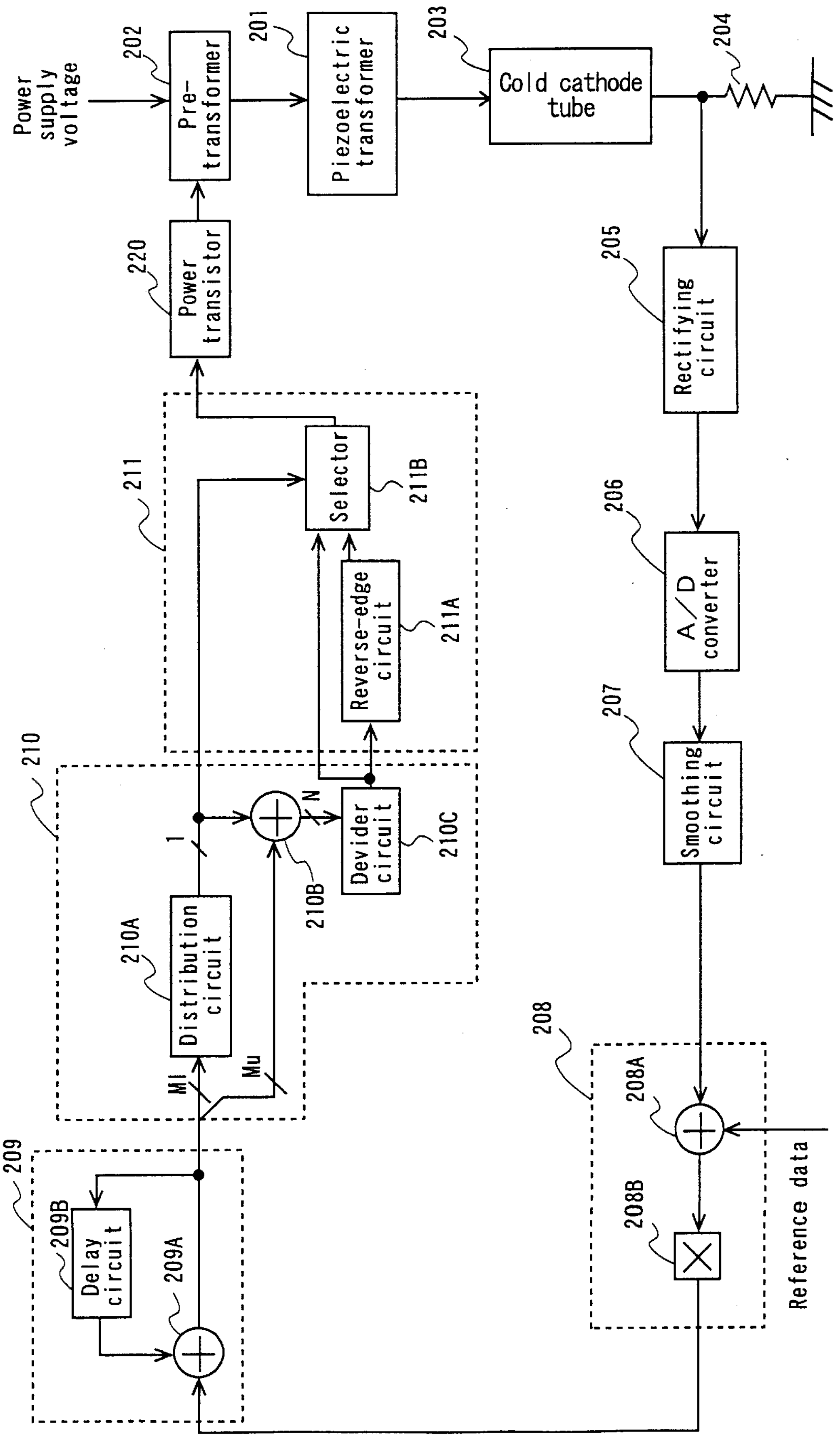
FIG. 24 is a block diagram showing the configuration of a piezoelectric transformer-driving circuit in accordance with embodiment 6 of the present invention.

FIG. 24 is a block diagram showing the piezoelectric transformer drive system of the embodiment 6 in accordance with the present invention. In FIG. 24, a piezoelectric transformer 201 is a voltage transformation device for forming an amplified voltage, and the voltage from the piezoelectric transformer 201 is applied to the cold cathode tube 201. A pre-transformer 202 is an electromagnetic transformer and is disposed ahead of the piezoelectric transformer 201 to compensate for the insufficient step-up ratio of the piezoelectric transformer 201. A current detection circuit 204 detects the current flowing through the cold cathode tube 203 and converts it into a voltage signal. A rectifying circuit 205 peak-holds the sine wave like voltage signal taken out from the current detection circuit 204 and converts it into a substantially DC voltage. An A/C converter 206 converts the voltage output from the rectifying circuit 205 into a digital signal. A smoothing circuit 207 smoothes the digital signal Vad output from the A/D converter 206 in a predetermined cycle. The smoothening circuit 207 in the embodiment 6 carries out smoothing by average processing.

An error voltage calculation circuit 208 compares the smooth signal Vlpf output from the smoothing circuit 207 with the reference data Vref set externally, calculates the error between the two, multiplies the error by a predetermined coefficient K, and outputs the result as error data Verr. The error voltage calculation circuit 208 comprises an adder 208A for calculating the difference between the reference data Vref and the smooth signal Vlpf and a multiplier 208B for multiplying the output data of the adder 208A by the coefficient K and outputting the result.

A frequency setting circuit 9 sets the frequency of the drive pulse signal of the piezoelectric transformer 1. The frequency setting circuit 209 has an adder 209A and a delay circuit 209B. The frequency setting circuit 209 adds or subtracts the frequency corresponding to the error voltage Verr to or from the previous frequency setting value Fprev output from the delay circuit 209B, and outputs M-bit data Ffreq. The frequency setting circuit 209 is configured to output a preset initial value at the time of power-on. In addition, the output timing of the frequency setting value from the frequency setting circuit 209 is set to have the cycle provided by data Fprev.

A frequency division ratio distribution divider circuit 210 divides the frequency of the master clock by distributing the frequency division ratio so that the average frequency division ratio Div in the N cycles of the drive pulse signal is Ffreq/N on the basis of the M-bit data Ffreq output from the frequency setting circuit 209. The frequency division ratio distribution divider circuit 210 has a distribution circuit 210A, an adder 210B and a divider circuit 210C. The distribution circuit 210A is a circuit for distributing the lower Ml-bit data A of the data Ffreq in the N cycles of the drive pulse signal. The number of bits Ml has been set so that the relationship between Ml and the distribution cycle N is N=2Ml; therefore, H (high) level data is output A times during the N cycles of the drive pulse signal.

At the adder 210B, the output data (0 or 1) of the distribution circuit 210A is added to the high-order Mu-bit (=M−Ml) data of the above-mentioned M-bit data Ffreq. The output data from this adder 210B is input to the divider circuit 210C, and a frequency pulse signal frequency-divided by its frequency division ratio is output.

A reverse-edge processing circuit 211 is a circuit for carrying out the reverse-edge processing (the clock's falling edge processing) of the master clock for the frequency-divided pulse signal output from the frequency division ratio distribution divider circuit 209. The reverse-edge processing circuit 211 has a reverse-edge circuit 211A (in FIG. 31 described later) for latching the above-mentioned frequency-divided pulse signal at the reverse edges and a selector 211B. The selector 211B outputs the data from the reverse-edge circuit 211A when the output of the distribution circuit 210A has the H (high) level, or outputs the data from the divider circuit 210C when the output has the L (low) level. A power transistor 220 drives the piezoelectric transformer 201 by using the drive pulse signal output from the reverse-edge processing circuit 211.

In the embodiment 6 configured as described above, the initial value of the frequency set value output from the frequency setting circuit 209 is set on the high-frequency side sufficiently higher than the resonance point of the piezoelectric transformer 201, and control is carried out by using the inclination on the high-frequency side. In the above-mentioned configuration, the smoothing cycle of the smoothing circuit 207 is set so as to be equal to the distribution cycle N of the frequency division ratio distribution divider circuit 210.

Figure 25:
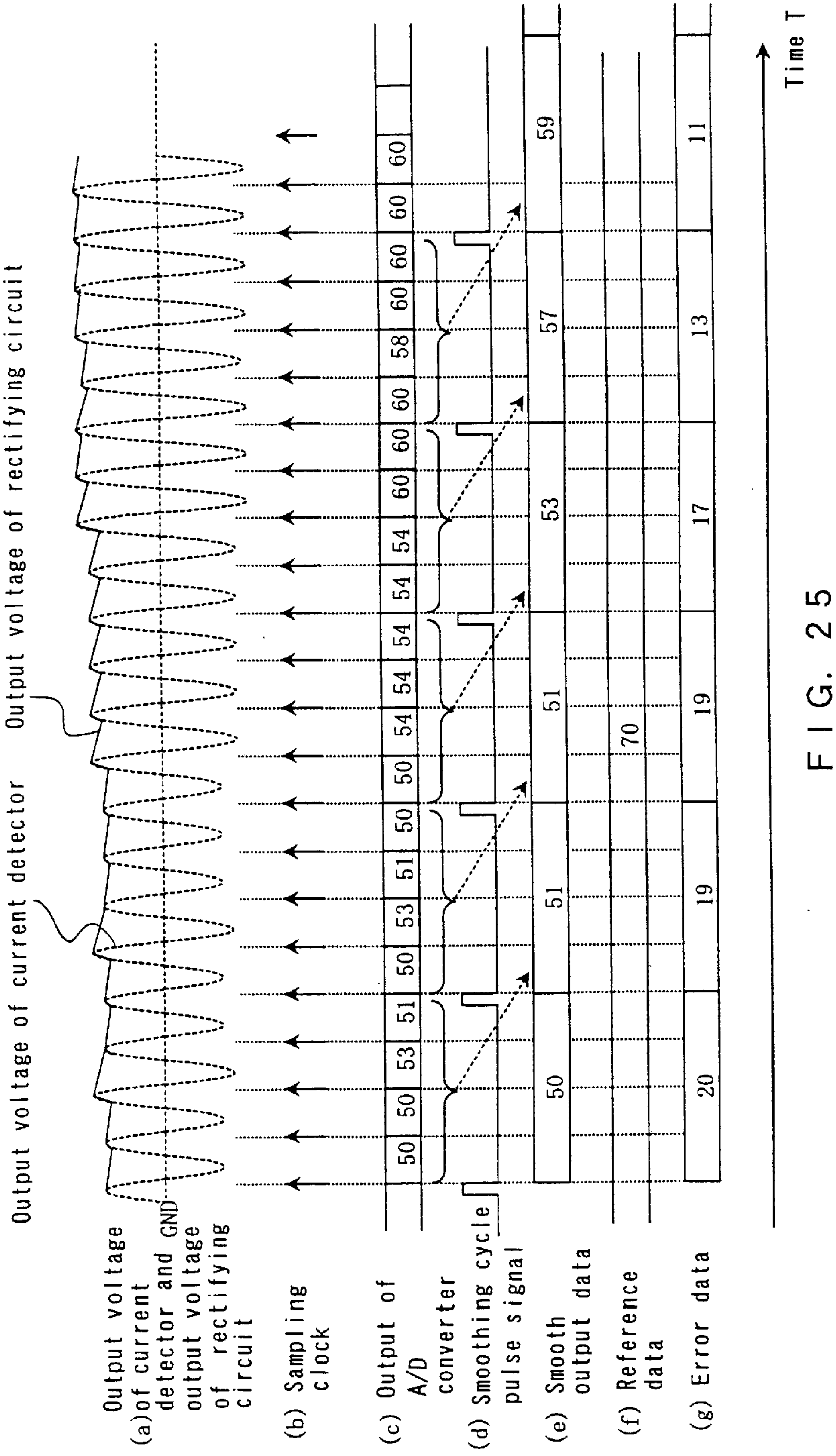
FIG. 25 is a waveform diagram showing the operation timing of the driving circuit of the embodiment 6.
Figure 26:
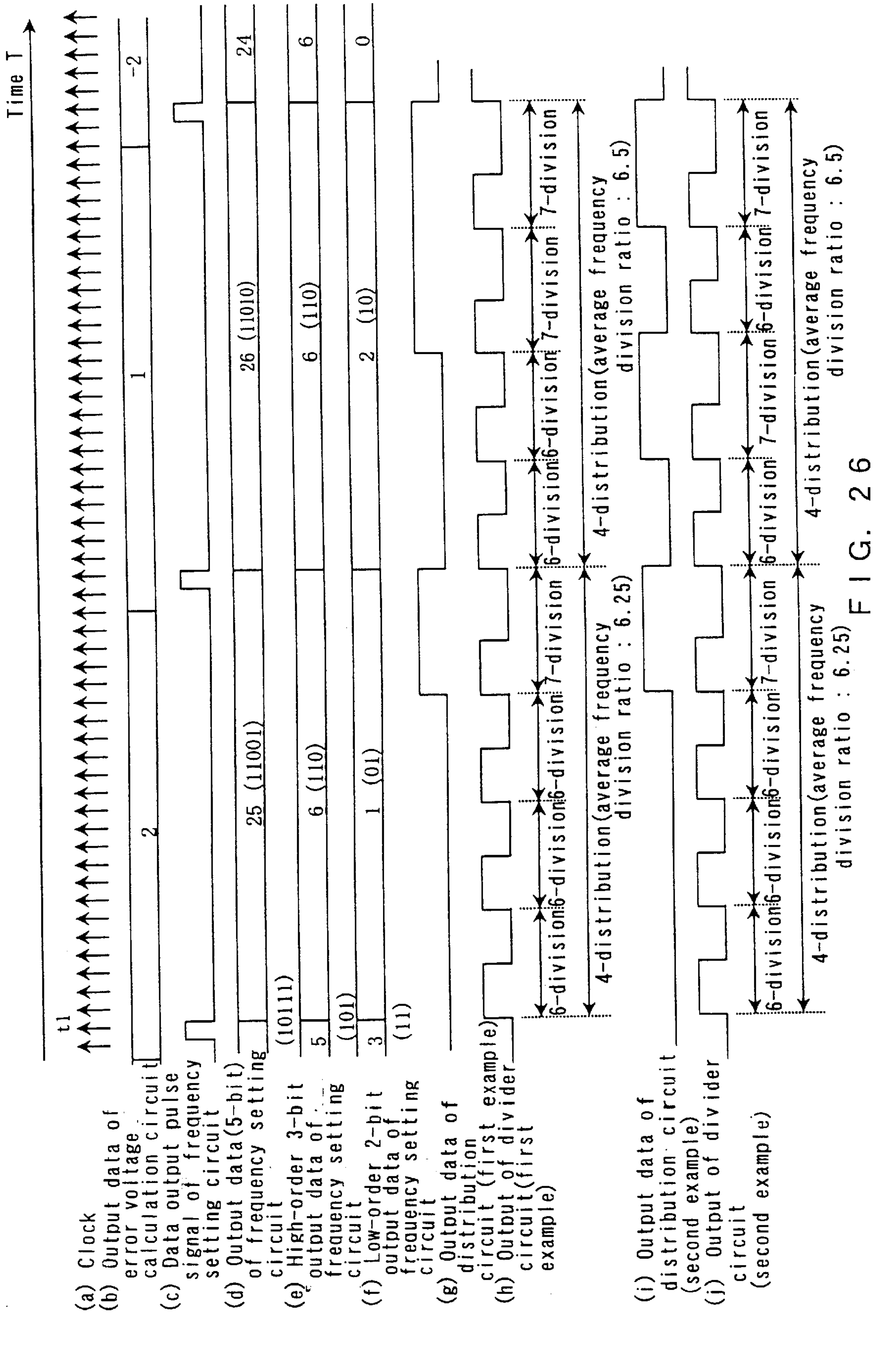
FIG. 26 is a waveform diagram showing the operation timing of the driving circuit of the embodiment 6.

Next, the operations of the piezoelectric transformer-driving circuit of the embodiment 6 shown in FIG. 24 will be described. FIGS. 25 and 26 are waveform diagrams showing the operation timing in the piezoelectric transformer-driving circuit of the embodiment 6.

In (a) of FIG. 25, the waveform shown in a dot line is the voltage waveform obtained by the current detection circuit 204. Although a rectangular waveform is generally used to drive the piezoelectric transformer 201, since the sharpness of resonance, the Q value, of the piezoelectric transformer 1 is high, only the fundamental component is taken out from the secondary electrode, and a substantially sine wave is obtained. Rectifying is carried out at the rectifying circuit 205 to convert this sine wave into a voltage detectable by the A/D converter 206. The waveform shown in a solid line in (a) of FIG. 25 is a rectified signal.

Next, the voltage rectified by the rectifying circuit 205 is converted into the digital signal Vad at the timing of the sampling clock shown in (b) of FIG. 25 by the A/D converter 206. The digital signal Vad is then averaged by the smoothing circuit 207 in a predetermined cycle, thereby obtaining average output data, that is, the digital data shown in (e) of FIG. 25. In the example shown in FIG. 25, the cycle for smoothing is set at the amount of four cycles of the drive pulse signal. At the error voltage calculation circuit 208, the calculation of Verr=K×(Vref−Vlpf) is carried out, and the error data Verr shown in (g) of FIG. 2 is output. This error data Verr is input to the frequency setting circuit 209, and added to the previous setting value Fprev. Then, the frequency setting circuit 209 outputs data Ffreq, that is, the clock frequency in the N cycles of the drive pulse signal. At the frequency division ratio distribution divider circuit 210, the average frequency division ratio Div in the N cycles of the drive pulse signal is divided so as to become Ffreq/N as described before. An example of this operation is shown in FIG. 26 in the condition of N=4.

(a) of FIG. 26 shows the master clock; in synchronization with this master clock, the error voltage Verr shown in (b) of FIG. 26 is output in synchronization with the smoothing cycle pulse signal from the error voltage calculation circuit 208. At the frequency setting circuit 209, in synchronization with the pulse signal shown in (c) of FIG. 26, having the same cycle as that of the smoothing cycle pulse signal and being different only in delay timing, the error voltage Verr is added to the present frequency setting value Fprev, and the result is output at time t1. In the example shown in FIG. 26, the value of Verr is 2 when the data output pulse of the frequency setting circuit 209 in (c) has the H (high) level, and the frequency setting value at that time is 23 (10111 in binary); therefore, the sum of the two, 25 (11001 also in binary), is output at the next clock (at time t1).

(e) and (f) of FIG. 26 show the high-order 3-bit data (frequency division ratio) and the low-order 2-bit data (distribution) of the data Ffreq (5-bit data) output from the frequency setting circuit 209 respectively. Since the distribution number N=4 in the embodiment 6, the distribution number is set in the low-order 2 bits of the 5-bit data output from the frequency setting circuit 209. (g) and (i) of FIG. 26 show distribution examples at the distribution circuit 210A, and (h) and (j) of FIG. 26 show the output examples of the divider circuit 210C. In all the case, operation is carried out so that the clock cycle in the period of the four cycles of the drive pulse signal, obtained by frequency division, is equal to the value of Ffreq, thereby raising the average frequency resolution.

The reverse-edge processing circuit 211 operates to minimize the frequency change of the drive pulse signal wherein the above-mentioned frequency division ratio is distributed. Since the frequency change of the drive pulse signal directly affects brightness change; therefore, if the cycle of the frequency change is particularly long, flicker occurs. In addition, abrupt frequency change causes ripples in the current of the piezoelectric transformer 201 at the change point of the frequency, and applying stress to the piezoelectric transformer 201 (causing breakdown). For this reason, the frequency change should preferably be as small as possible.

Figure 27:
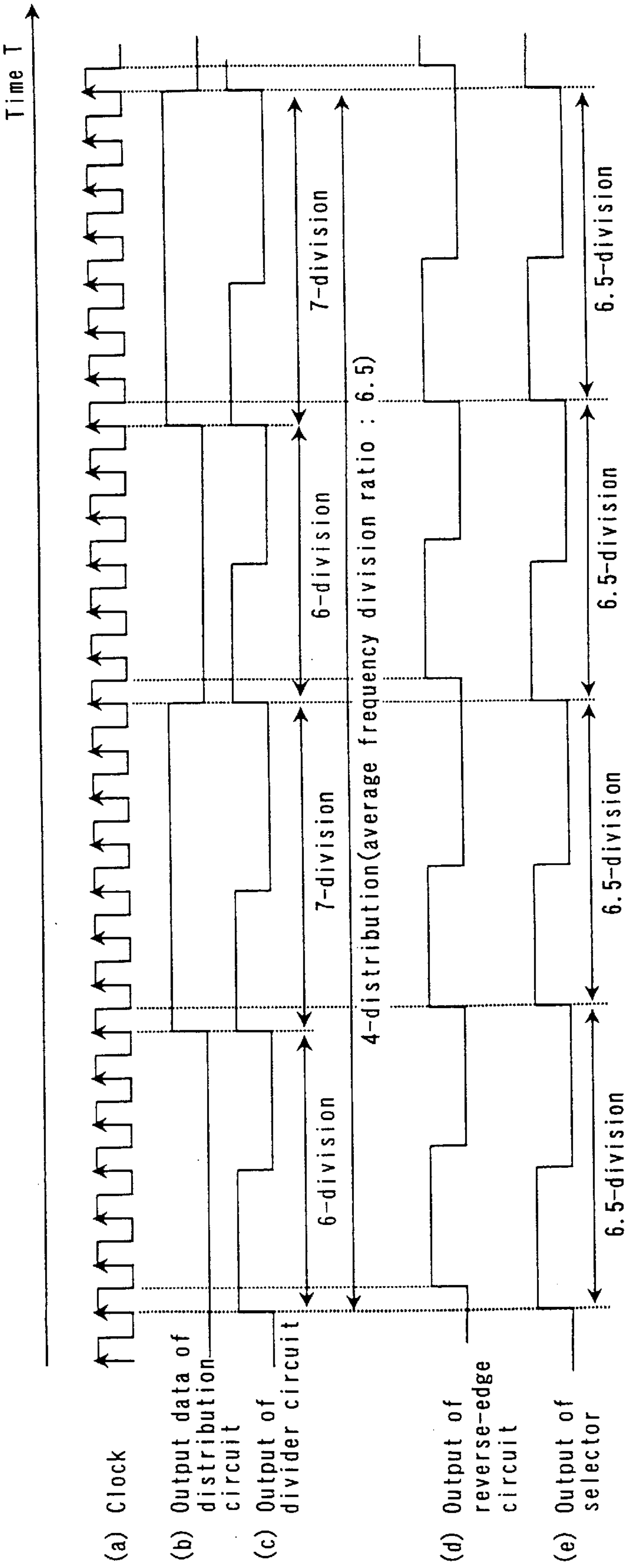
FIG. 27 is a waveform diagram showing the operation timing of the driving circuit of the embodiment 6.

FIG. 27 is a timing waveform diagram showing the operation of the reverse-edge processing circuit 211. In FIG. 27, (a) shows the master clock, (b) shows the output data of the distribution circuit 210A, and (c) shows the output data of the divider circuit 210C. In this example, 0, 1, 0 and 1 are output in the cycle of the drive pulse signal from the distribution circuit 210A, and the frequency division ratio (clock frequency) of the drive pulse signal output from the divider circuit 210C becomes 6, 7, 6 and 7.

Figure 31:
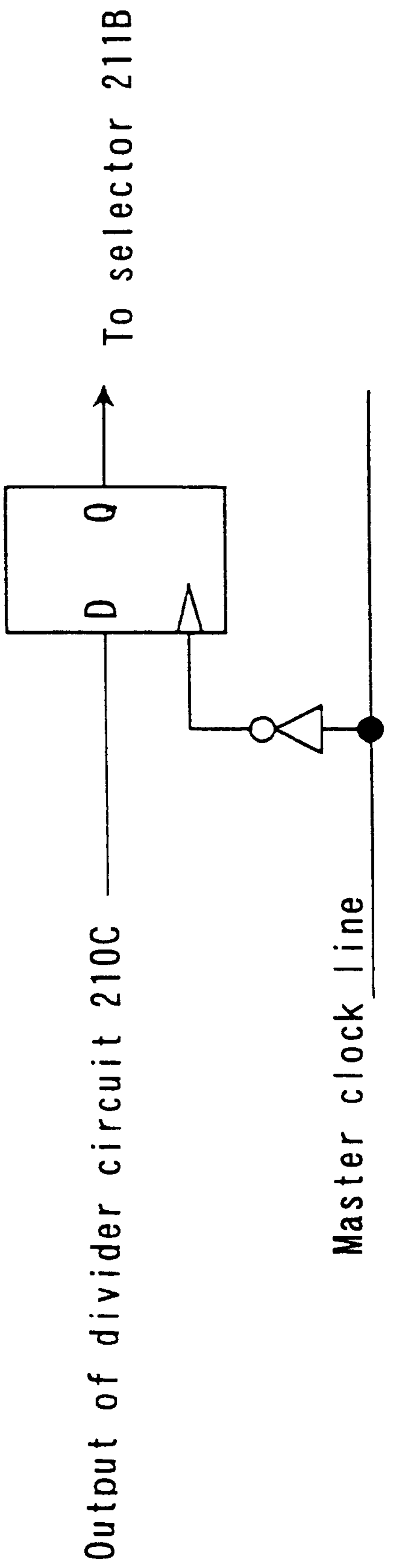
FIG. 31 is a circuit diagram showing the reverse-edge latch circuit of the driving circuit of the embodiment 6.

The reverse-edge circuit 211A, the configuration of which is shown in FIG. 31, latches the output pulse signal of the divider circuit 210C at the falling edges of the master clock and carries out signal switching, thereby obtaining the pulse signal shown in (d) of FIG. 27. The selector 211B is configured to output the output pulse signal of the reverse-edge circuit 211A when the output of the distribution circuit 210A has the H (high) level or to output the output pulse signal of the divider circuit 210C when the output has the L (low) level. Therefore, a 6.5 frequency division pulse signal is output from the selector 211B as shown in (e) of FIG. 27. In this way, the reverse-edge processing circuit 211 has a role of suppressing the frequency change of the drive pulse signal.

Figure 28:
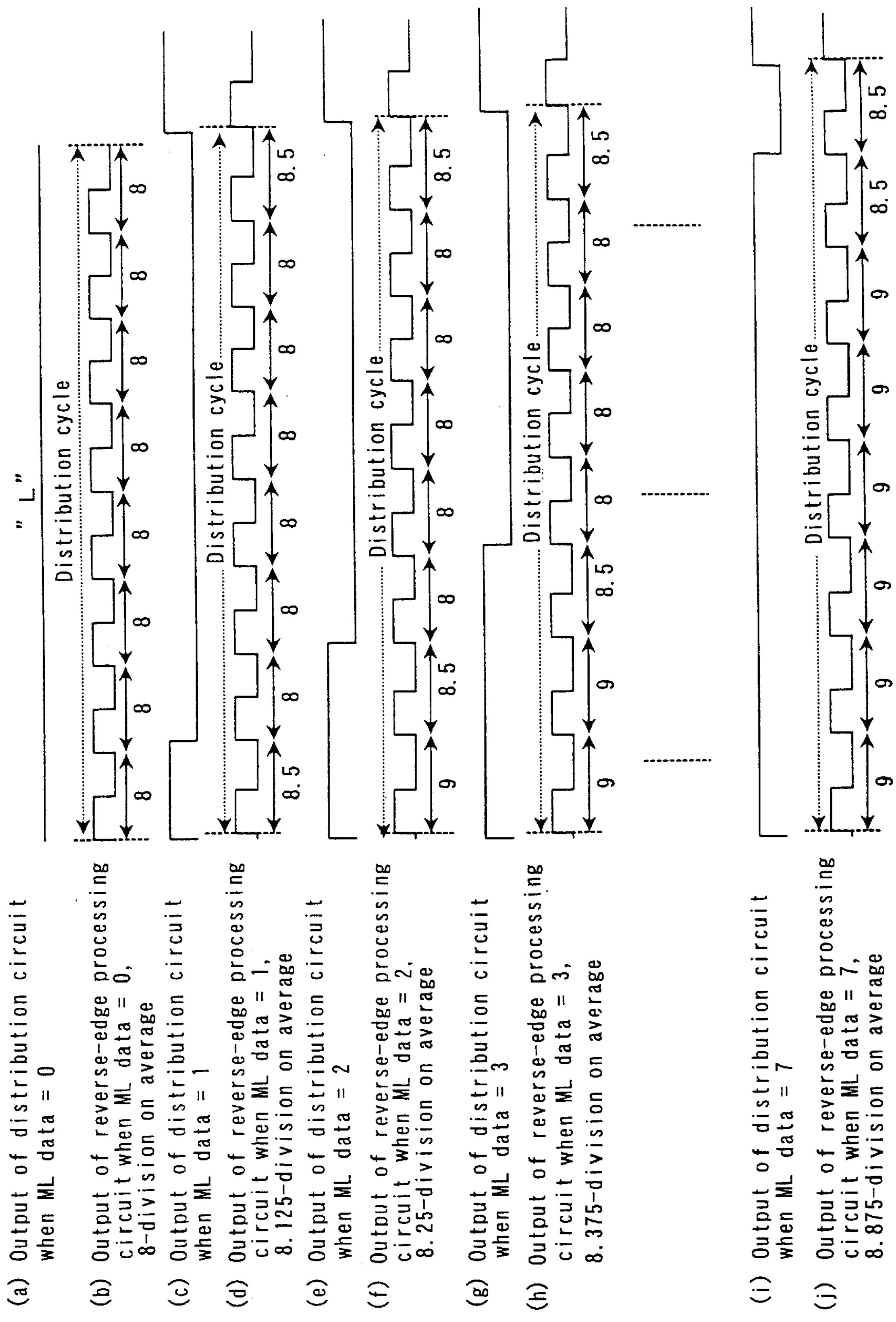
FIG. 28 is a waveform diagram showing the operation timing of the driving circuit of the embodiment 6.
Figure 29:
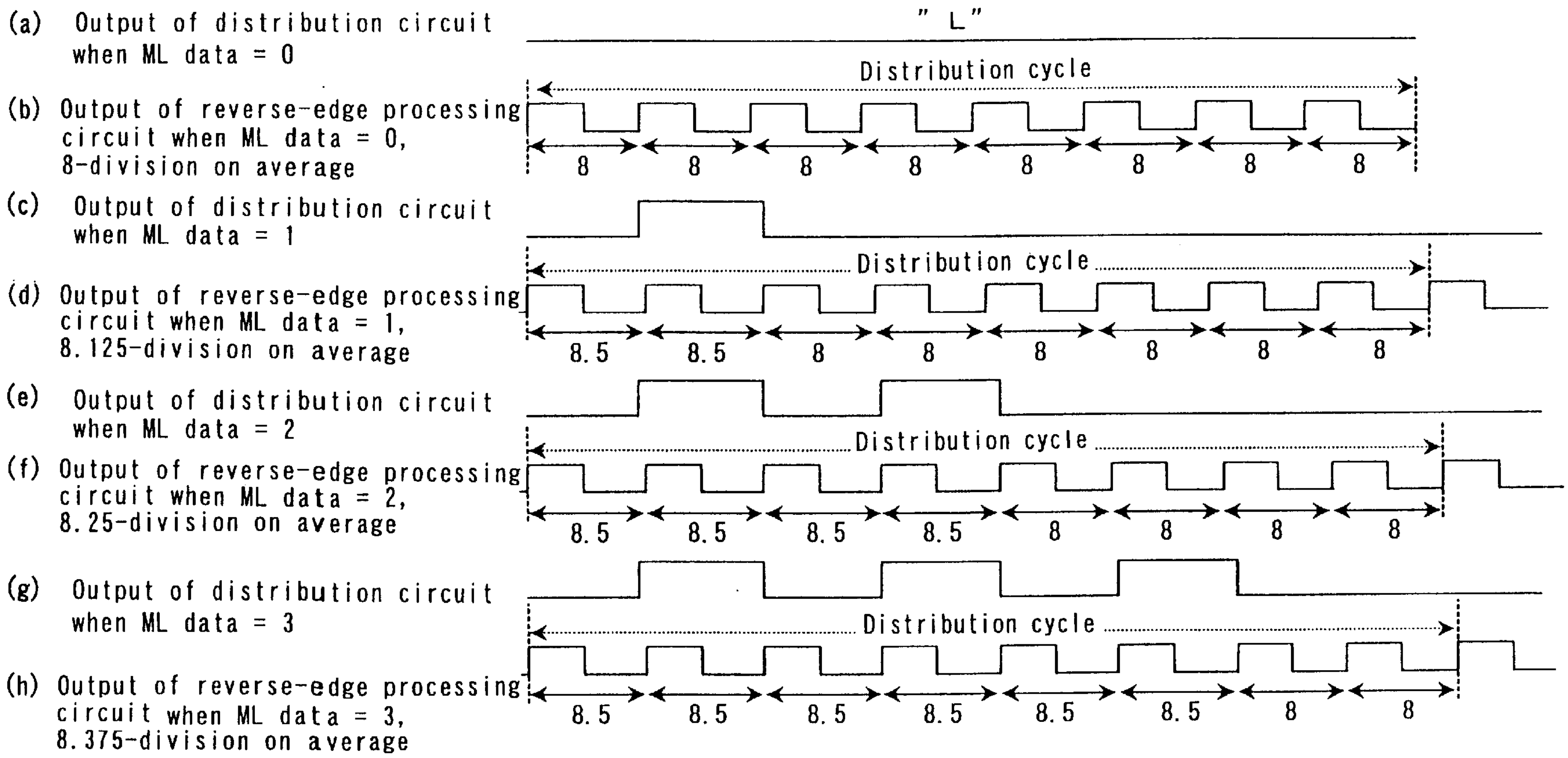
FIG. 29 is a waveform diagram showing the operation timing of the driving circuit of the embodiment 6.
Figure 30:
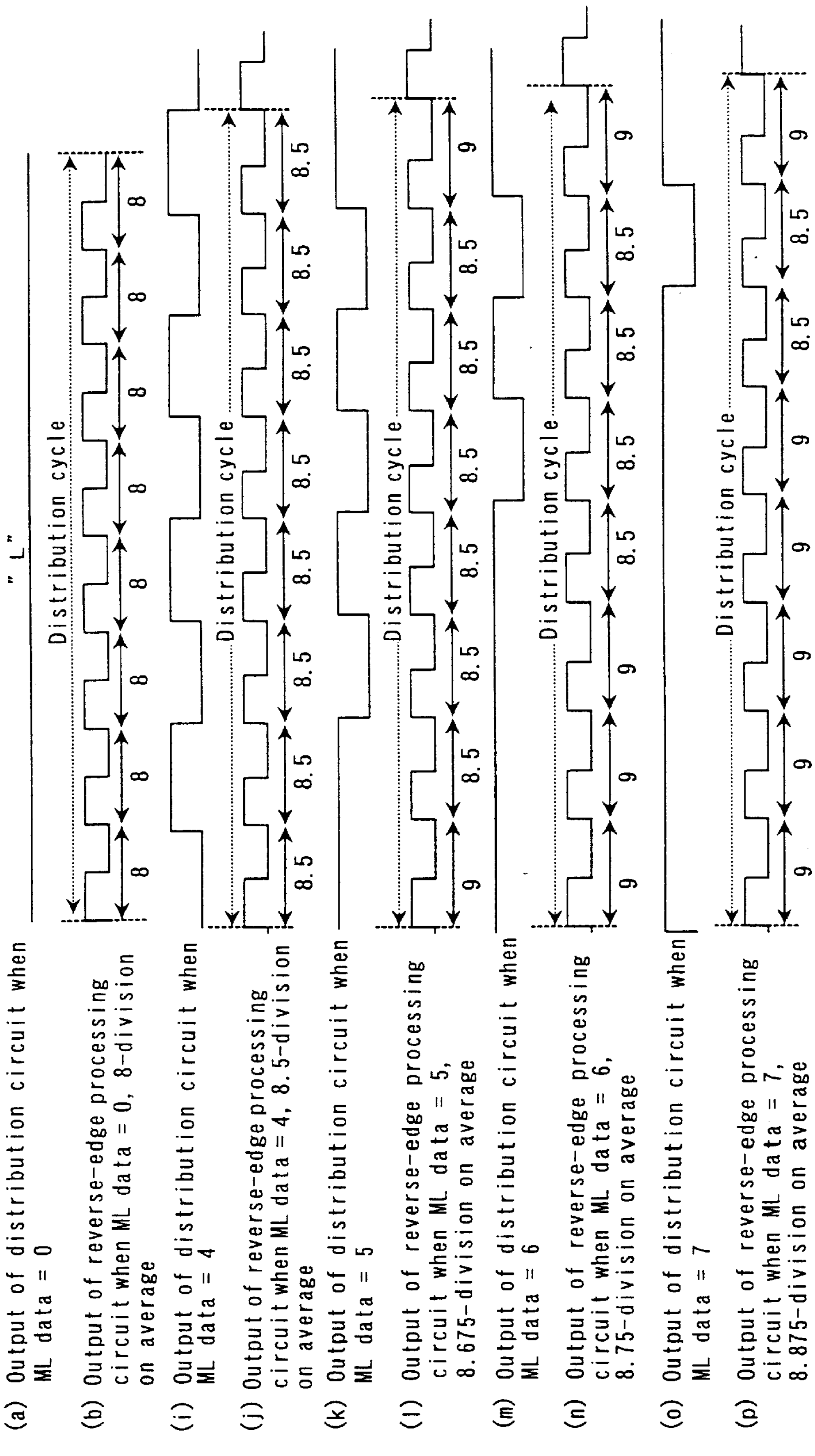
FIG. 30 is a waveform diagram showing the operation timing of the driving circuit of the embodiment 6.

The effect of the reverse-edge processing circuit 211 differs depending on the distribution system at the distribution circuit 210A. The difference in the effect of suppressing the frequency change between the cases of two different distribution systems will be described by referring to FIGS. 28 to 30. FIGS. 28 to 30 are waveform diagrams wherein explanations are given assuming that the distribution cycle is 8 and that the frequency division ratio is distributed in the 8 cycles of the drive pulse signal. In the distribution method shown in FIG. 28, in the data Ffreq output from the frequency setting circuit 209, the low-order Ml-bit data B for setting the distribution of the frequency division ratio is distributed from the first 0th cycle to the Bth cycle. In this method, the distribution circuit 210C outputs an H (high) level signal in the first cycle to the Bth cycle, and outputs an L (low) level signal in the (B+1)th cycle to the 8th cycle.

In the distribution method shown in FIGS. 29 and 30, when the data B is 4 or less, the H (high) level signal is distributed in even-numbered cycles; when the data B is 5 or more, the H (high) level signal is distributed in odd-numbered cycles.

In the method shown in FIG. 28, by the operation of the reverse-edge processing circuit 211, at the time of 8-to-9 frequency division shifting or at the time of 9-to-8 frequency division shifting, an 8.5 frequency division is always present therebetween so that abrupt frequency change does not occur. However, for the period of distribution cycles, i.e., 8 cycles, an 8-frequency division pulse signal and a 9-frequency division pulse signal are present simultaneously, thereby causing frequency change of one frequency division at the maximum. In other words, in the distribution method shown in FIG. 28, stress to the piezoelectric transformer 201 due to abrupt frequency change is reduced; however, no significant effect is obtained for flicker occurrence. On the other hand, in the method of FIGS. 29 and 30, since the maximum frequency change for the period of distribution cycles is 0.5 frequency division, improvement is attained in preventing both the stress to the piezoelectric transformer 201 and flicker occurrence.

The drive pulse signal obtained as described above is power-amplified by the power transistor 210 to drive the piezoelectric transformer 201.

In the driving circuit of the piezoelectric transformer 201 of the embodiment 6, by the above-mentioned operations, the data Verr output from the error voltage calculation circuit 207 becomes a positive value when the current value detected by the current detection circuit 204 is lower than a desired value, in other words, when the digital signal Vlpf output from the smoothing circuit 207 is lower than the reference data Vref. As a result, the frequency division ratio distribution divider circuit 210 increases the frequency division ratio. In other words, at this time, operation is carried out in the direction wherein the frequency of the drive pulse signal lowers, and the step-up ratio of the piezoelectric transformer 201 increases. By this operation, the current flowing through the cold cathode tube 203 increases.

On the other hand, when the current value detected by the current detection circuit 204 is higher than the desired value, in other words, when the digital signal Vlpf output from the smoothing circuit 207 is higher than the reference data Vref, operation opposite to the above-mentioned operation occurs, and the step-up ratio of the piezoelectric transformer 201 decreases, whereby the current flowing through the cold cathode tube 203 decreases.

When the above-mentioned operation is repeated, and when the current value detected by the current detection circuit 204 becomes the desired value, in other words, when the digital signal Vlpf output from the smoothing circuit 207 is equal to the reference data Vref, the data Verr output from the error voltage calculation circuit 208 becomes zero, and the frequency of the drive pulse signal is stabilized.

As described above, in the piezoelectric transformer-driving circuit of the embodiment 6 in accordance with the present invention, when the drive pulse signal is generated by frequency-dividing the master clock, the frequency division ratio is distributed in a predetermined cycle, the resolution is raised by using the average frequency, and the processing of using the reverse edges of the master clock is carried out. Therefore, the piezoelectric transformer-driving circuit of the embodiment 6 can obtain frequency accuracy twice as high as that of the clock equivalently; therefore, the resolution of the average frequency is raised, and it is possible to obtain the frequency for setting the brightness of the cold cathode tube 203 to a desired value.

As described previously, in order to obtain a frequency resolution of 10 KHz when the drive pulse frequency of the piezoelectric transformer 201 is 100 KHz, a clock of 1 GHz is required in the method of simply frequency-dividing the clock. For example, when it is assumed that the distribution cycle N=100, an average resolution of 10 Hz can be obtained at a clock of about 10 KHz usually used for a liquid crystal controller and the like; in addition, stress to the piezoelectric transformer 1 due to frequency distribution can be reduced by the reverse-edge processing, and it is possible to have an effect of suppressing flicker.

In the piezoelectric transformer-driving circuit of the embodiment 6, by the LSI formation of the error voltage calculation circuit 208, the frequency setting circuit 209, the frequency division ratio distribution divider circuit 210 and the reverse-edge processing circuit 211, it is possible to significantly reduce the number of parts, therefore, the effect of making the compact video apparatuses more compact is significant.

As described above, in accordance with the embodiment 6 of the present invention, by using the reverse edges of the master clock, in the distribution cycle N=about 100 for example, it is possible to obtain an average resolution of 10 KHz from a clock of about 10 MHz usually used for a liquid crystal controller and the like; therefore, a significant effect can be obtained for the digitalization of the piezoelectric transformer-driving circuit. In addition, in the embodiment 6, stress to the piezoelectric transformer due to frequency distribution can be reduced by the reverse-edge processing, and it is possible to have a significant effect of suppressing flicker.

<<Embodiment 7>>

Next, a piezoelectric transformer-driving circuit in accordance with embodiment 7 of the present invention will be described. The embodiment 7 is a proposed driving circuit having a drive pulse duty control system capable of attaining high efficiency in a wide power supply voltage range.

Figure 32:
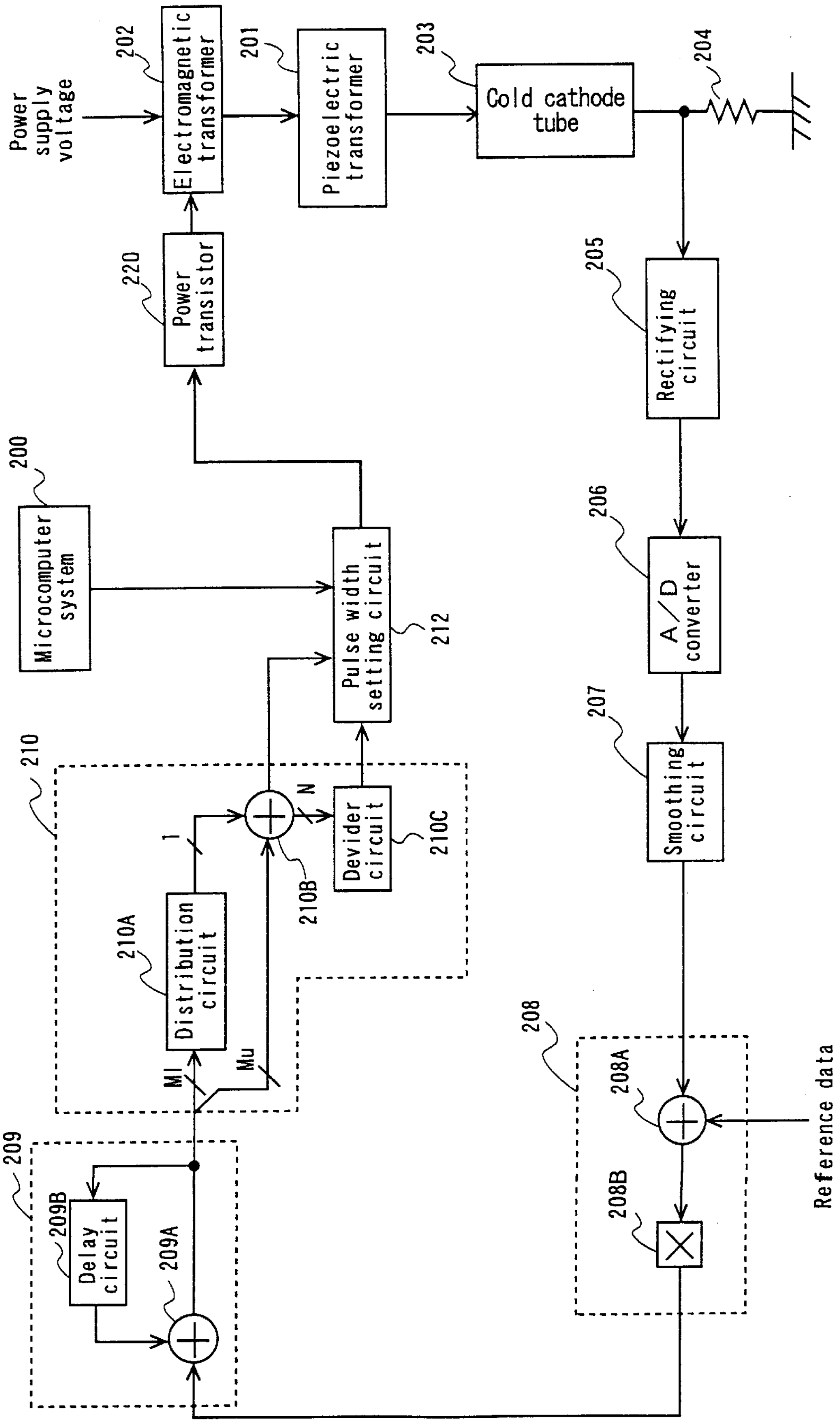
FIG. 32 is a block diagram showing the configuration of a piezoelectric transformer-driving circuit in accordance with embodiment 7 of the present invention.

FIG. 32 is a block diagram showing the piezoelectric transformer-driving circuit of the embodiment 7.In FIG. 32, the components having the same functions and configurations as those of the above-mentioned embodiment 6 are designated by the same numerals, and their explanations are omitted.

In FIG. 32, a microcomputer system 200 controls the overall system. This microcomputer system 200 has means for independently detecting power supply voltage and a ROM for storing pulse width data depending on the value of power supply voltage, and is configured to notify the driving circuit of the embodiment 7 of pulse width data.

Compact video apparatuses such as DVC movie apparatuses usually have a power supply voltage detection means to detect the remaining amount of a battery. The embodiment 7 uses power supply voltage information from this power supply voltage detection means. A pulse width setting circuit 212 sets the pulse width of the pulse signal output from a frequency division ratio distribution divider circuit 210 on the basis of the power supply voltage information from the microcomputer system 200.

Figure 33:
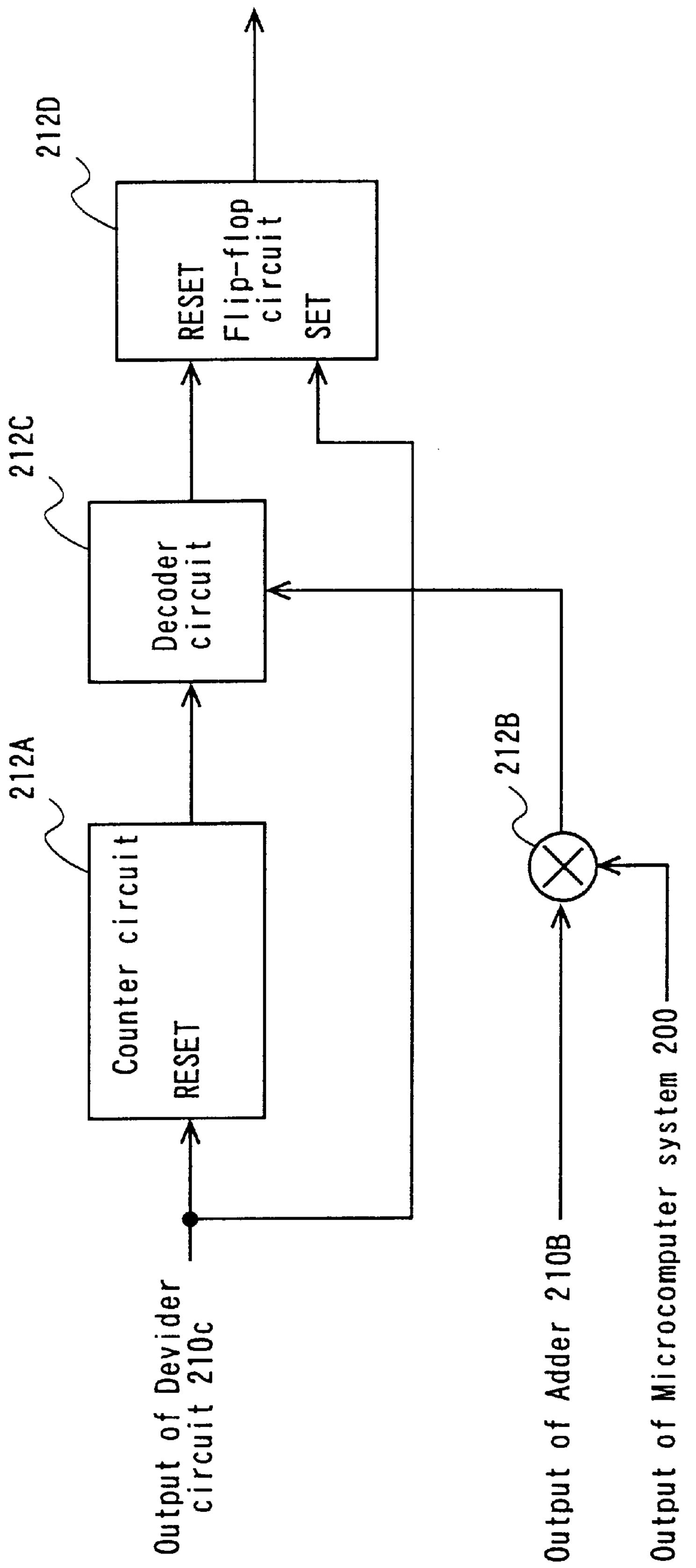
FIG. 33 is a circuit diagram showing the pulse width set circuit of the piezoelectric transformer-driving circuit of the embodiment 7.

The pulse width setting circuit 212 of the piezoelectric transformer-driving circuit of the embodiment 7 will be described specifically. FIG. 33 is a block diagram showing the configuration of the pulse width setting circuit 212. As shown in FIG. 33, the pulse width setting circuit 212 has a counter circuit 212A, a multiplier 212B, a decoder 212C and a flip-flop circuit 212D.

The counter circuit 212A is reset by the pulse signal output from a divider circuit 210C. The multiplier 212B multiplies the frequency division data output from the adder 210B by the pulse width data output from the microcomputer system 200. The decoder circuit 212C outputs an H (high) level signal when the counter value of the counter circuit 212A is equal to the data output from the multiplier 212B. When the output pulse signal of the divider circuit 210C has the H (high) level, the flip-flop circuit 212D is set in synchronization with the master clock; when the output pulse signal of the decoder circuit 212C has the H (high) level, the flip-flop circuit 212D is reset in synchronization with the master clock.

The other configurations in the driving circuit of the embodiment 7 are substantially the same as those of the above-mentioned embodiment 6 shown in FIG. 24. The embodiment 7 differs from the embodiment 6 in that the embodiment 7 is configured so that a pulse having one cycle width of the master clock is output as shown in (c) of FIG. 34 described later, although the pulse width of the drive pulse signal output from the frequency division ratio distribution divider circuit 210 has not been made specific in particular.

The operations of the piezoelectric transformer-driving circuit of the embodiment 7 configured described above will be described by referring to FIG. 34, a timing waveform diagram.

Figure 34:
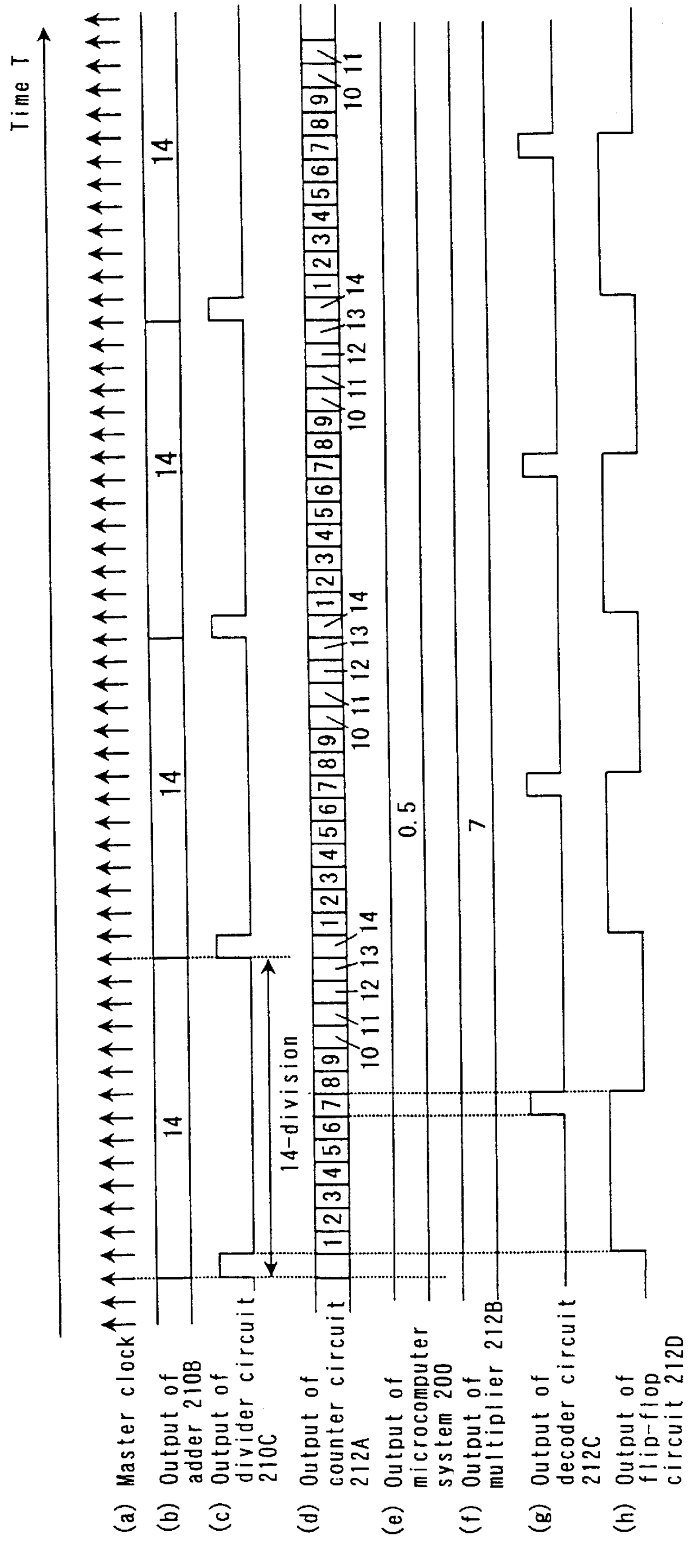
FIG. 34 is a waveform diagram showing the operation timing of the driving circuit of the embodiment 7.

(a) of FIG. 34 shows the master clock, and the pulse width setting circuit 212 shown in FIG. 33 operates in synchronization with this master clock. (b) of FIG. 34 shows the output data of the adder 210B, showing the frequency division ratio of the drive pulse signal. The drive pulse signal shown in (c) of FIG. 34 is output from the divider circuit 210C depending on the frequency ratio on the basis of this output data. When the output pulse signal of the divider circuit 210C has the H (high) level, the counter circuit 212A is set at "1," and the value is incremented in synchronization with the master clock as shown in (d) of FIG. 34.

At the multiplier 212B, the output data of the adder 210B is multiplied by the data ((e) of FIG. 34) transmitted from the microcomputer system 200, and the data shown in (f) of FIG. 34 is output. At the decoder circuit 212C, when the output data of the counter circuit 212A is equal to the output data of the multiplier 212B, an H level signal is output ((g) of FIG. 34). The flip-flop circuit 212D is set by the output pulse signal of the divider circuit 210C and reset by the output pulse signal of the decoder 212D, thereby outputting a signal as the drive pulse signal.

As described above, the pulse width of the output pulse signal of the pulse width setting circuit 212 is determined by multiplying the output data ((b) of FIG. 34) of the adder 210B showing the frequency division ratio of the drive pulse signal is multiplied by the data ((e) of FIG. 34) transmitted from the microcomputer system 200. In this way, the embodiment 7 is configured so that the duty value of the drive pulse signal is made variable depending on the data of the microcomputer system 200. Therefore, by setting the above-mentioned duty value depending on the power supply voltage detected by the power supply voltage detection means provided in the microcomputer system 200, the duty value of the drive pulse signal can be set at a given value depending on the power supply voltage. For this reason, in the driving circuit of the embodiment 7, it is possible to obtain an optimum pulse width depending on the change in power supply voltage. In other words, the driving circuit of the embodiment 7 can drive the piezoelectric transformer at high efficiency in a wide power supply voltage range.

As described above, in the embodiment 7 of the present invention, the duty value of the drive pulse signal can be set as desired depending on the power supply voltage by the power supply voltage detection means of the microcomputer system; therefore, it is possible to obtain an optimum pulse width depending on the change in the power supply voltage. In other words, in the embodiment 7, it is possible to drive the piezoelectric transformer at high efficiency in a wide power supply voltage range.

In the piezoelectric transformer-driving circuit of the embodiment 7 in accordance with the present invention, highly accurate drive control can be carried out for the cold cathode tube 3 depending on the usage environments (brightness, temperature and the like for example) of a cold cathode tube 203 driven by this driving circuit. In this case, measurement data indicating the usage environments are calculated by the microcomputer system 200, and frequency control is carried out depending on the result of the calculation; therefore, it is possible to control the brightness of the cold cathode tube 203 at a desired value.

<<Embodiment 8>>

Figure 35:
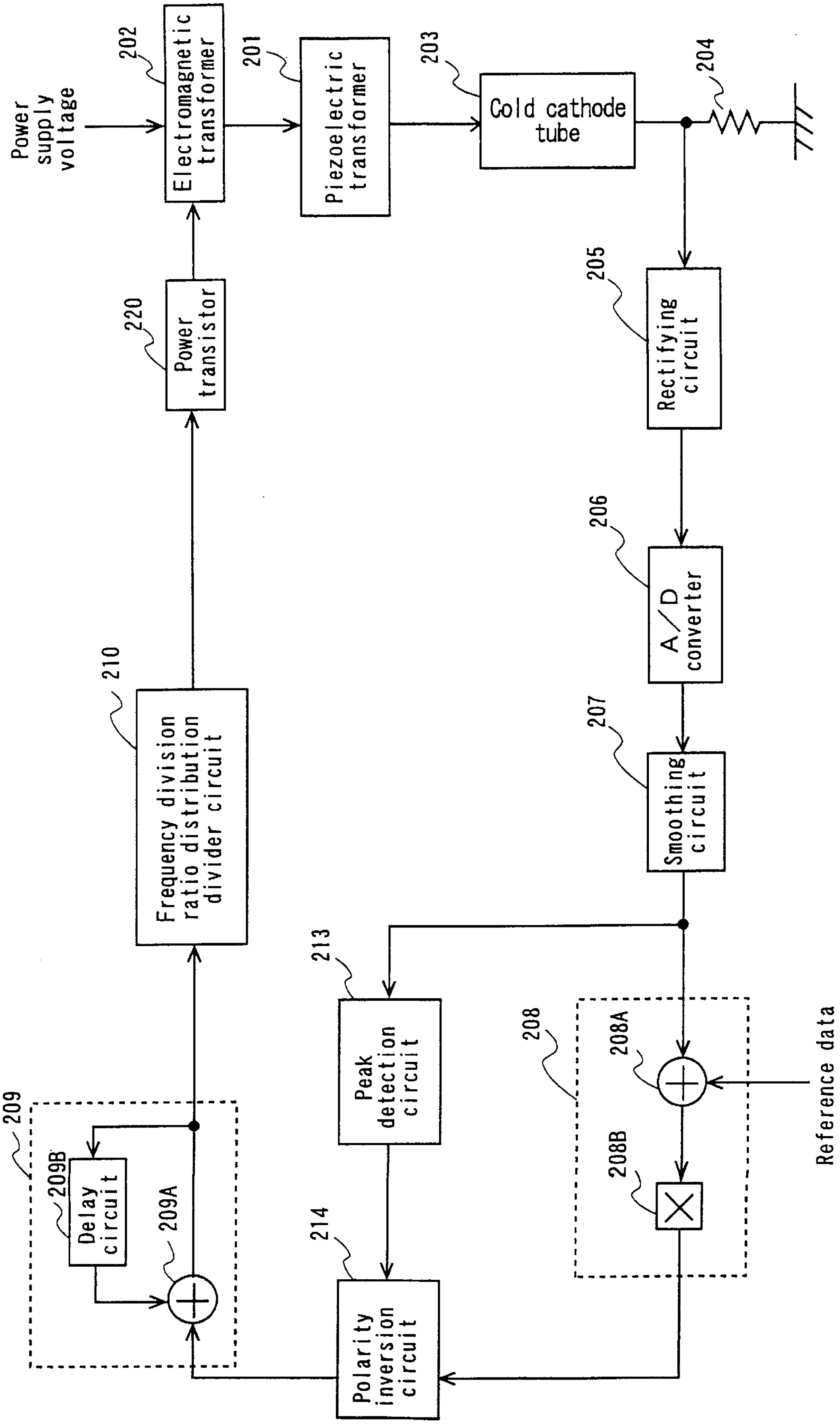
FIG. 35 is a block diagram showing the configuration of a piezoelectric transformer-driving circuit in accordance with embodiment 8 of the present invention.

Next, a piezoelectric transformer-driving circuit in accordance with embodiment 8 of the present invention will be described. In the embodiment 8, a piezoelectric transformer drive system operating stably even if power supply voltage lowers is proposed. FIG. 35 is a block diagram showing the piezoelectric transformer-driving circuit of the embodiment 8. In FIG. 35, the components having the same functions and configurations as those of the above-mentioned embodiments 6 and 7 are designated by the same numerals, and their explanations are omitted.

Figure 36:
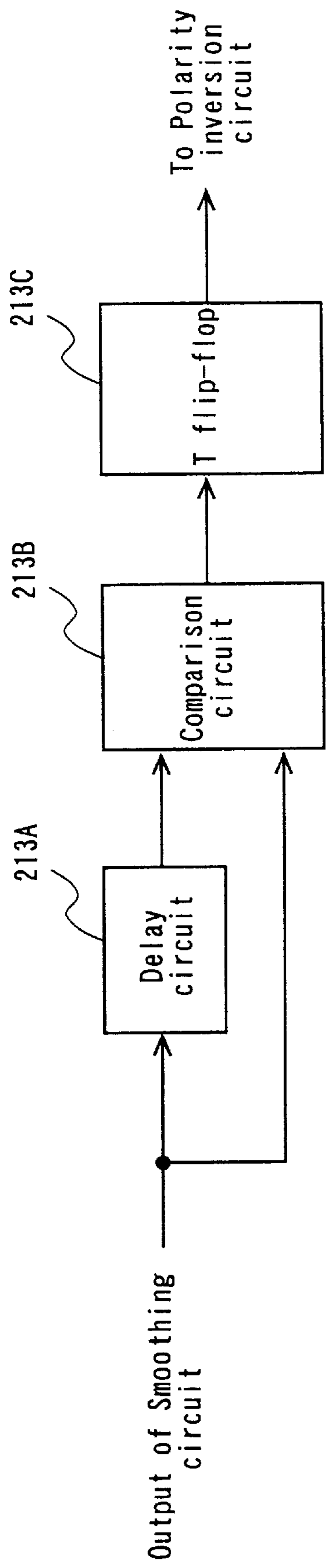
FIG. 36 is a circuit diagram showing the peak detection circuit of the piezoelectric transformer-driving circuit of the embodiment 8.

As shown in FIG. 35, the piezoelectric transformer-driving circuit of the embodiment 8 has a peak detection circuit 213. This peak detection circuit 213 has a function of holding the output voltage of a smoothing circuit 207 for a predetermined period, compares the output voltage of the smoothing circuit 207 obtained at that time with the held voltage, and detects the resonance point of a piezoelectric transformer 201. FIG. 36 is a block diagram showing a concrete example of the peak detection circuit 213. A delay circuit 213A delays the output voltage Vlpf of the smoothing circuit 207 by the period of one cycle of the smoothing cycle pulse signal and outputs it. Hereinafter, the output voltage of the delay circuit 213A is simply referred to as Vdly. A comparison circuit 213B compares the level of the output voltage Vlpf of the smoothing circuit 207 with that of the output voltage Vdly of the delay circuit 213A.

The embodiment 8 is configured to output an H (high) level signal when the output voltage Vdly of the delay circuit 213A is larger than the output voltage Vlpf of the smoothing circuit 207 and to output an L (low) level signal when the output voltage Vdly is smaller on the other hand. Hereinafter, the output voltage of the comparison circuit 213B is simply referred to as Vcmp.

A T flip-flop circuit 213C has a reset function; this circuit is reset at power-on or when the output voltage Vlpf of the smoothing circuit 207 is larger than the reference voltage Vref, and outputs an L (low) level signal. On the other hand, in the cases other than described above, when the output voltage Vlpf of the smoothing circuit 207 is smaller than the output voltage Vdly of the delay circuit 213A, that is, when the value of Vcmp has the H (high) level, the output is inverted at the rising edges of the output voltage Vcmp of the comparison circuit 213B from the L (low) level to the H (high) level. Hereinafter, the output signal of the T flip-flop circuit 213C (the output signal of the peak detection circuit 213) is simply referred to as Vpkdet.

In FIG. 35, a polarity inversion circuit 214 is a circuit for switching the sign of the output data Verr of an error voltage calculation circuit 208 depending on the output signal Vpkdet of the peak detection circuit 213. When the output signal Vpkdet of the T flip-flop circuit 213C has the H (high) level, the output data Verr of the error voltage calculation circuit 208 is inverted and output; on the other hand, when the output signal has the L (low) level, the output data Verr of the error voltage calculation circuit 208 is output directly.

The other configurations and operations of the driving circuit of the embodiment 8 are substantially the same as those of the driving circuit of the above-mentioned embodiment 6 shown in FIG. 24, and their explanations are omitted herein. The operations of the peak detection circuit 213 and the polarity inversion circuit 214 of the embodiment 8 will be described below; in addition, the operations and effects of the overall control of a piezoelectric transformer will be described below.

Figure 37:
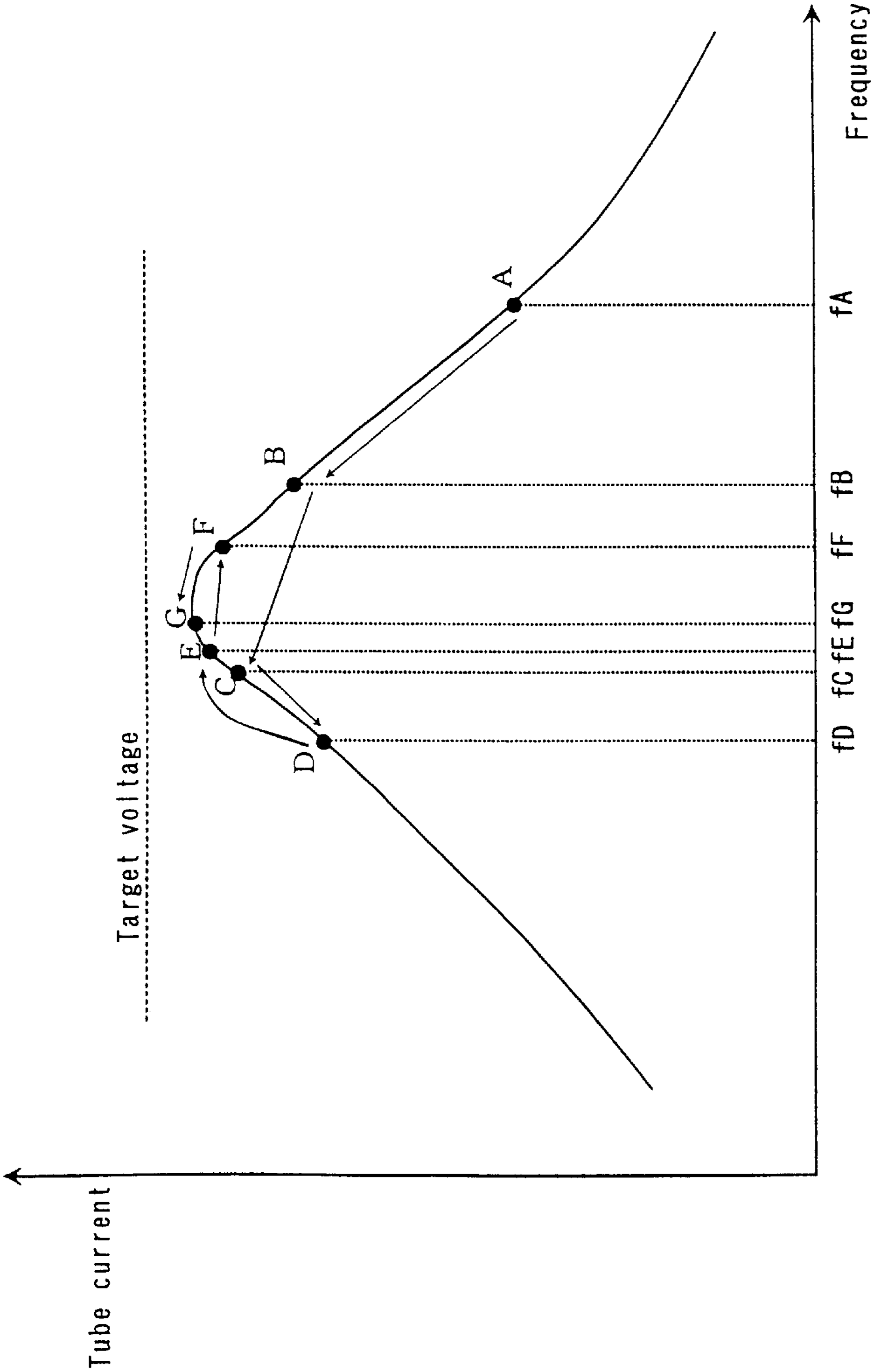
FIG. 37 is a waveform diagram illustrating the operation of the driving circuit of the embodiment 8.
Figure 38:
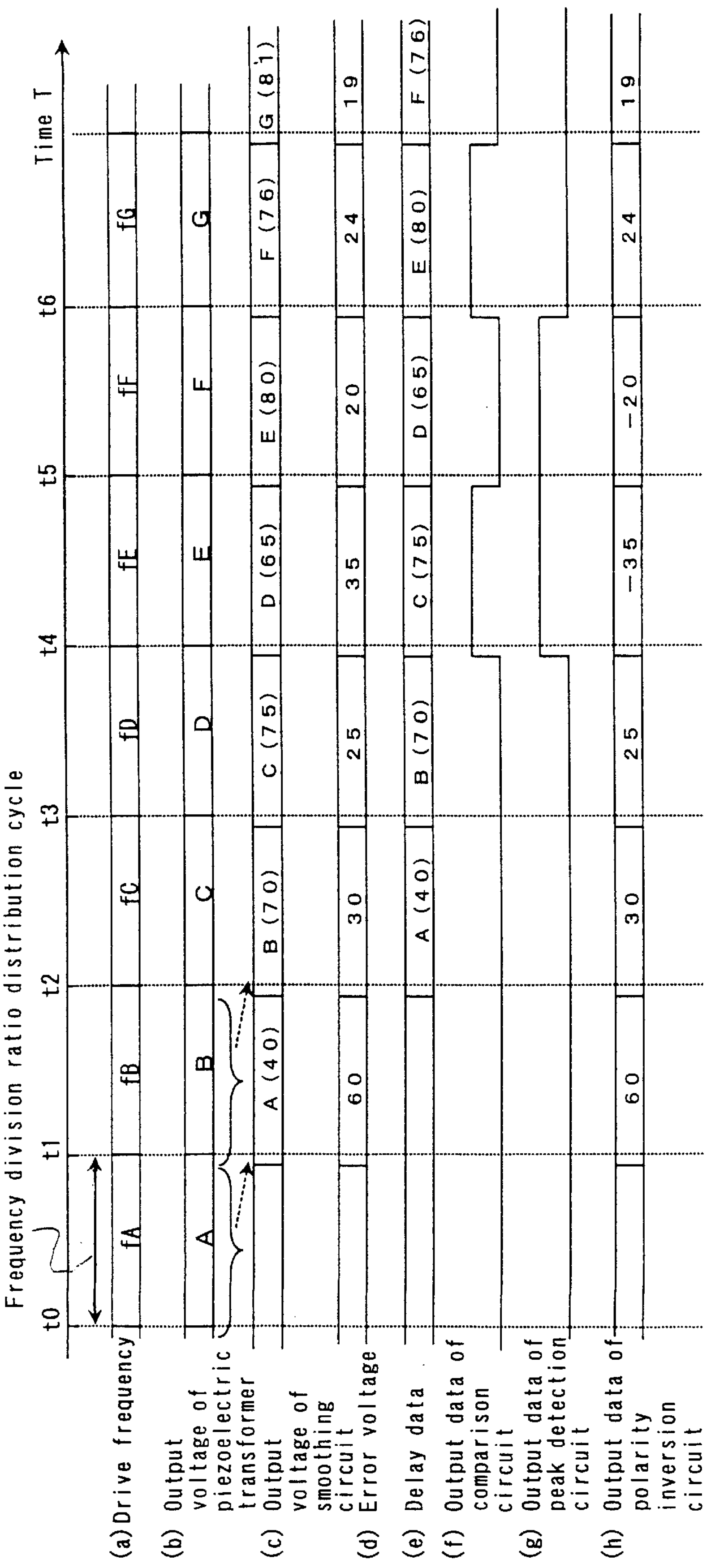
FIG. 38 is a waveform diagram showing the operation timing of the driving circuit of the embodiment 8.

FIG. 37 is a view illustrating the operations of the peak detection circuit 213 and the polarity inversion circuit 214 at the time when the voltage of the piezoelectric transformer 1 at the resonance point thereof is smaller than a target voltage owing to the drop of the power supply voltage. FIG. 38 is a timing waveform diagram illustrating the operations of the overall driving circuit in the embodiment 8.

The conventional piezoelectric transformer drive device, disclosed in the Japanese monthly magazine, NIKKEI ELECTRONICS, Nov. 7, 1994 (No. 621), pages 147 to 157, explained in the descriptions of the prior art, uses a drive system wherein the drive frequency is decreased as low as possible in the dynamic range of the circuit in order to bring the voltage close to the target voltage. Therefore, in this drive system, the drive frequency shifts beyond the peak, and the voltage required to light the cold cathode tube cannot be obtained, resulting in turning it off.

Although the drive system of the driving circuit of the embodiment 8 is a drive system wherein the drive frequency is lowered in order to bring the voltage close to the target voltage, the drive frequency stays around the resonance point, and the tube is not turned off.

The operations of the driving circuit of the embodiment 8 will be described below by referring to FIGS. 37 and 38. At time t0 to time t1, a drive pulse signal having an average frequency fA is output by frequency division ratio distribution; when the average output voltage at the point A of FIG. 37 has been obtained, the voltages at time t0 to time t1 are generally smoothened, and the voltage at the point A is obtained at the timing shown in (c) of FIG. 38 as the output voltage Vlpf of the smoothing circuit 207. In FIG. 38, as a digital value example of the output signal Vlpf of the smoothing circuit 207, the voltage at the point A is set at 40. Ideally, it is best to carry out the average processing between time t0 and time t1 at the smoothing circuit 207; however, since a circuit delay for determining the next drive frequency occurs at time t1, the frequency division ratio distribution cycle of the drive pulse signal is slightly shifted from the smoothing cycle.

When it is assumed that the reference data Vref to be supplied to the error voltage calculation circuit 208 is 100 and that the coefficient of the multiplier 208B is 1, the error voltage Verr is 60(=100−40) as shown in (d) of FIG. 38. Therefore, in the frequency setting circuit 209, the average frequency division ratio of the drive pulse signal is incremented by 60/N(N=distribution cycle), and the frequency becomes a drive frequency fB, which is lower than the previous frequency, at time t1 to time t2, and the average output voltage at the point B of FIG. 37 is obtained. Since the voltage at the point B of FIG. 37 is lower than the target voltage (having the same meaning as the reference data Vref supplied to the error voltage calculation circuit 208), data (positive data) for increasing the frequency division ratio is output to lower the drive frequency from the error voltage calculation circuit 208. This operation continues until the output voltage Vlpf of the smoothing circuit 207 becomes smaller than the output voltage Vdly of the delay circuit 213A. When the drive frequency changes to fD at time t3 to time t4, the output voltage Vlpf (65) of the smoothing circuit 207 for this period becomes smaller than the output voltage Vdly (75) of the delay circuit 213A, and the output voltage Vcmp of the comparison circuit 213B shifts to the H (high) level.

The output of the T flip-flop circuit 213C is inverted at the rising edges from the L (low) level to the H (high) level of the output voltage Vcmp of the comparison circuit 213B, whereby the output signal Vpkdet of the T flip-flop circuit 213C is switched from the L (low) level to the H (high) level. Owing to this switching, the polarity inversion circuit 214 inverts the polarity of the error voltage Verr and outputs the voltage to the frequency setting circuit 209. For this reason, the drive frequency shifts to the high frequency side at time t4 to time t5, and becomes an average drive frequency fE, and the average output voltage at the point E of FIG. 37 can be obtained. Since the voltage at the point E is higher than the voltage at the point D, the output voltage Vcmp of the comparison circuit 213B returns from the H (high) level to the L (low) level; however, the output of the T flip-flop circuit 13C remains unchanged. As a result, the error voltage Verr having an inverted sign is continuously input to the frequency setting circuit 209, and the drive frequency shifts to the higher frequency side, whereby the average output voltage at point F is obtained. This operation continues until the output voltage Vlpf of the smoothing circuit 207 becomes smaller than the output voltage Vdly of the delay circuit 213A and until the output voltage Vcmp of the comparison circuit 213B is switched from the L (low) level to the H (high) level. In the example shown in FIG. 37, when the drive frequency shifts to fF, the voltage becomes smaller than the previous voltage at the point E; therefore, the direction of control is changed again, and the drive frequency changes to the low frequency side.

As described above, the driving circuit of the embodiment 8 is configured so that when the drive frequency shifts beyond the resonance point of the piezoelectric transformer 201, the direction of the frequency control is switched by the peak detection circuit 213 and the polarity inversion circuit 214. Therefore, in the driving circuit of the embodiment 8, even if the target voltage is not attained at the resonance point of the piezoelectric transformer owing to the drop of the power supply voltage or the like, the circuit does not become uncontrollable, and the average output voltage around the resonance point can be obtained. As described above, in the driving circuit of the embodiment 8, the tube is not turned off even if the power supply voltage lowers, whereby a stable lighting state can be obtained; therefore, unlike conventional circuits, it is not necessary to use a pre-transformer or a piezoelectric transformer having an extra margin for the power supply voltage, whereby it is possible to reduce cost and to save space for parts.

In addition, in the embodiment 8 of the present invention, even if the target voltage is not attained at the resonance point of the piezoelectric transformer owing to the drop of the power supply voltage or the like, the circuit does not become uncontrollable, the average output voltage around the resonance point can be obtained, and a stable lighting state can also be obtained. Therefore, unlike conventional circuits, it is not necessary to use a pre-transformer or a piezoelectric transformer having an extra margin for the power supply voltage, whereby it is possible to reduce cost and to save space for parts.

<<Embodiment 9 >>

Figure 39:
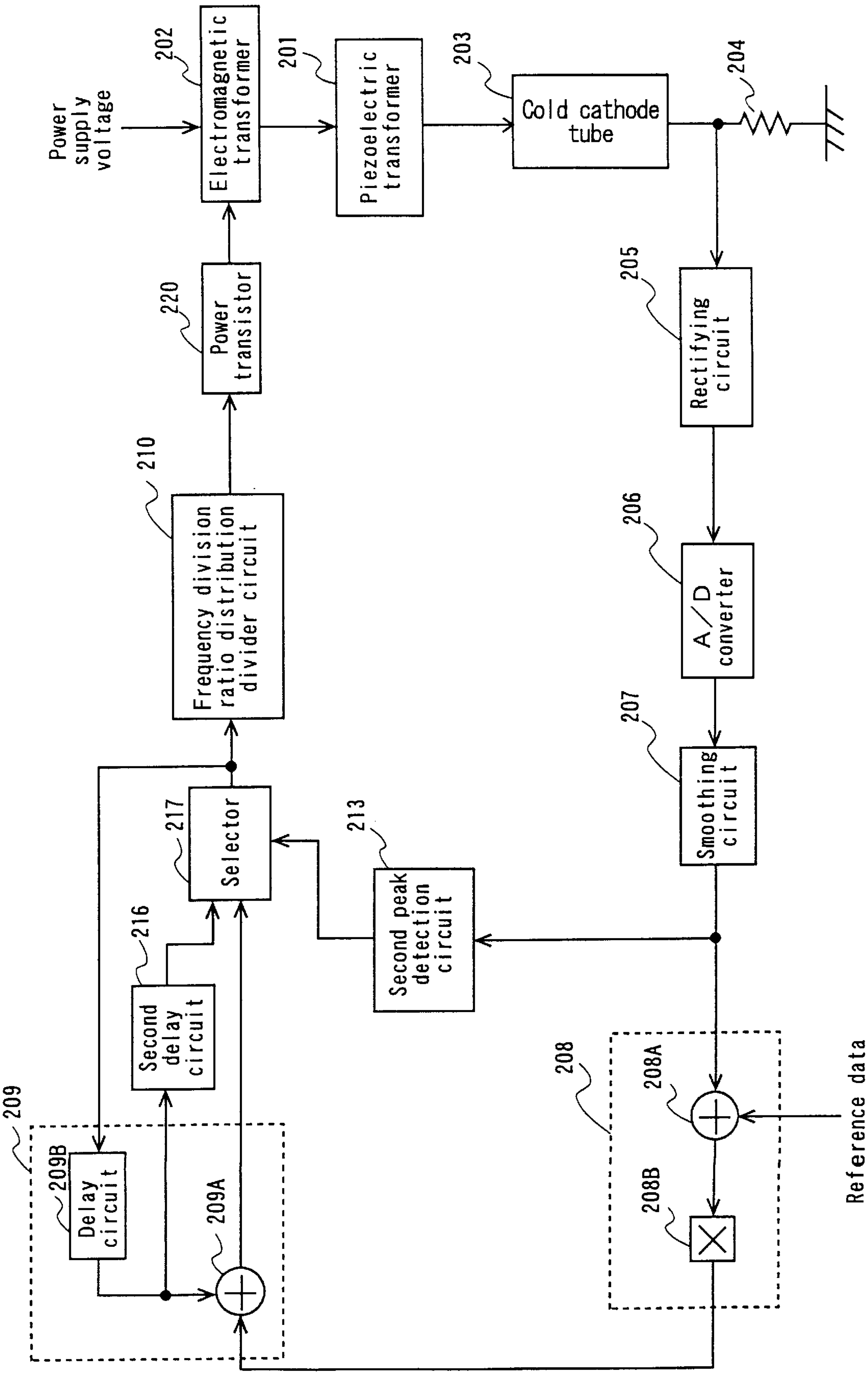
FIG. 39 is a block diagram showing the configuration of a piezoelectric transformer-driving circuit in accordance with embodiment 9 of the present invention.

Next, a piezoelectric transformer-driving circuit in accordance with embodiment 9 of the present invention will be described. In the driving circuit of the embodiment 9, a piezoelectric transformer drive system capable of stably operating in spite of the drop of the power supply voltage is proposed. FIG. 39 is a block diagram showing the piezoelectric transformer-driving circuit of the embodiment 9. In FIG. 39, the components having the same functions and configurations as those of the above-mentioned embodiments are designated by the same numerals, and their explanations are omitted.

Figure 40:
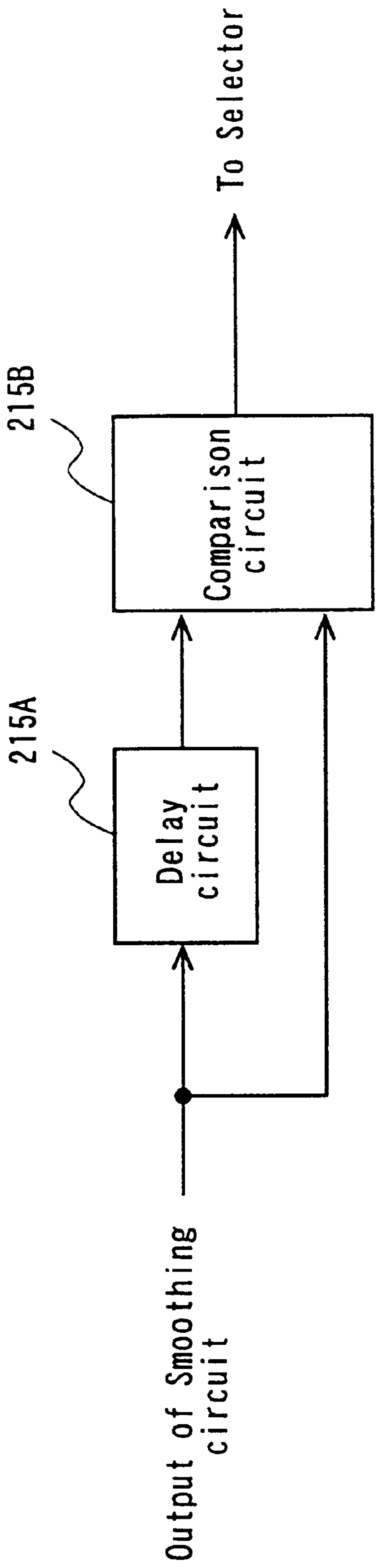
FIG. 40 is a circuit diagram showing a second peak detection circuit of the piezoelectric transformer-driving circuit of the embodiment 9.

In FIG. 39, a second peak detection circuit 215 has a function for holding the output voltage Vlpf of a smoothing circuit 207 for a predetermined period, and detects the resonance point of a piezoelectric transformer 201 by comparing the output voltage of the smoothing circuit 207 at that time with the held voltage. A concrete circuit example of the second peak detection circuit 215 is shown in FIG. 40. As shown in FIG. 40, the peak detection circuit 215 has a delay circuit 215A and a comparison circuit 215B. The configuration of this peak detection circuit 215 is identical to that of the peak detection circuit 213 of the above-mentioned embodiment 8 shown in FIG. 36 except that the T flip-flop circuit 213C is eliminated therefrom.

In the peak detection circuit 215 of the embodiment 9, the delay circuit 215A delays the smooth voltage Vlpf by the period of one cycle of the smooth cycle pulse signal and outputs voltage Vdly; when the output voltage Vlpf of the smoothing circuit 207 is smaller than the output voltage Vdly of the delay circuit 215A, the comparison circuit 215B outputs an H (high) level signal. On the other hand, when the output voltage Vlpf of the smoothing circuit 207 is larger than the output voltage Vdly of the delay circuit 215A, the comparison circuit 215B outputs an L (low) level signal. However, the comparison circuit 215B of the embodiment 9 is configured to be reset and to output an L (low) level signal when the output voltage Vlpf of the smoothing circuit 207 is larger than the reference data Vref and when the power is turned on; in this respect, its configuration differs from that of the peak detection circuit 213 of the above-mentioned embodiment 8.

In the embodiment 9, a second delay circuit 216 holds two-cycle-previous frequency setting data Ffreq. A selector 217 switches between the output data of a frequency setting circuit 209 and the output data of the second delay circuit 215 depending on the output signal Vpkdet of the second peak detection circuit 215, and outputs it. The selector 217 is configured to output the data of the second delay circuit 216 when the output signal Vpkdet of the second peak detection circuit 215 has the H (high) level, or, on the other hand, to output the output data Ffreq of the frequency setting circuit 209 when the output signal has the L (low) level.

In the embodiment 9, the other configurations and operations thereof are substantially the same as those of the above-mentioned embodiment 6 shown in FIG. 24. The piezoelectric transformer-driving circuit of the embodiment 9 has the same effect as that of the piezoelectric transformer-driving circuit of the above-mentioned embodiment 8. However, in the piezoelectric transformer-driving circuit of the embodiment 8, the direction of control is shifted from the low frequency side to the high frequency side when the drive frequency shifts beyond the resonance point of the piezoelectric transformer 201; on the other hand, in the driving circuit of the embodiment 9, when the drive frequency shifts beyond the resonance point, control is carried out to perform operation for returning the drive frequency to the two-cycle-previous drive frequency. By carrying out control in this way, in the embodiment 9, the operation is prevented from becoming uncontrollable when the drive frequency shifts beyond the resonance point.

The operations of the second peak detection circuit 215, the second delay circuit 216 and the selector 217 of the embodiment 9, and the actions and effects on the overall control of the piezoelectric transformer will be described below.

Figure 41:
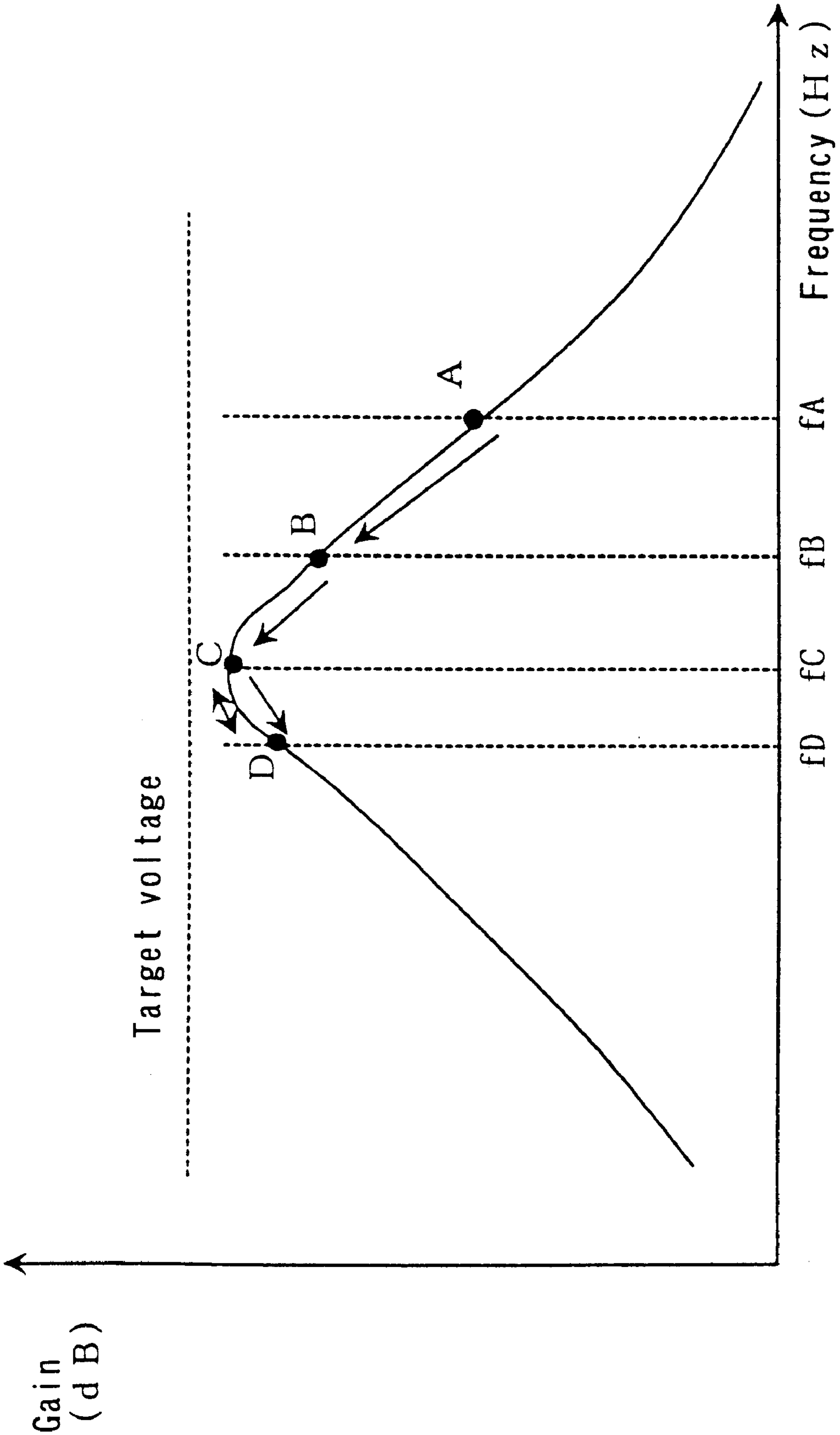
FIG. 41 is a waveform diagram illustrating the operation of the piezoelectric transformer-driving circuit of the embodiment 9.
Figure 42:
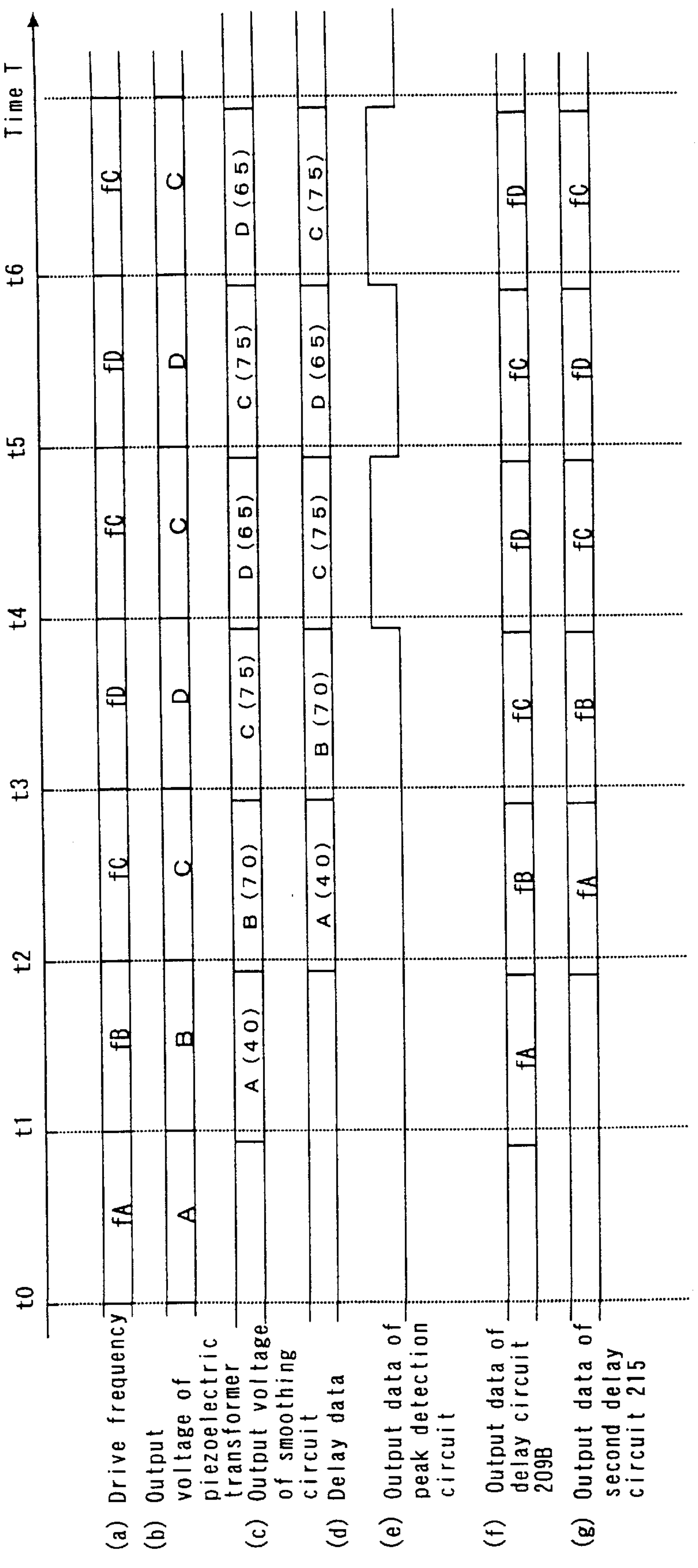
FIG. 42 is a waveform diagram showing the operation timing of the driving circuit of the embodiment 9.

FIG. 41 is a graph illustrating the operations of the second peak control circuit 215, the second delay circuit 216 and the selector 216 in the case when the voltage at the resonance point of the piezoelectric transformer 201 is smaller than the target voltage owing to the drop of the power supply voltage. FIG. 42 is a timing waveform diagram illustrating the operations of the overall driving circuit of the embodiment 9.

As shown in FIG. 42, oscillation occurs at the drive frequency fA between time t0 and t1, and the average output voltage at the point A of FIG. 41 is obtained. In this case, the voltage for this period is smoothed, and the smooth voltage Vlpf is obtained at the timing shown in (c) of FIG. 42 from the smoothing circuit 207.

In (c) of FIG. 42, the voltage at the point A is set at 40 as an example of the smooth voltage value. If this voltage Vlpf is smaller than the reference data Vref supplied to an error voltage calculation circuit 208, the error voltage Verr becomes a positive value, and operation is carried out in the direction wherein the frequency division ratio of the drive pulse signal increases. As a result, the drive frequency becomes fB, which is lower than the previous value, at time t1 to time t2, and the average output voltage at the point B of FIG. 41 is obtained. Hereafter, the operation in the case when the output voltage Vlpf of the smoothing circuit 207 is larger than the previous voltage Vdly is the same as that of the above-mentioned embodiment 8 shown in FIG. 37.

When the drive frequency shifts to fD at time t3 to time t4, the output voltage Vlpf of the smoothing circuit 207 becomes smaller than the output voltage Vdly of the delay circuit 216A immediately before time t4. When the output of the second peak detection circuit 215 becomes the H (high) level, the selector 217 outputs the two-cycle-previous frequency data fC held in the second delay circuit 216, and the voltage at the point C is obtained at time t3 to t4.

Since the voltage at the point C is larger than the voltage at the previous point D, the output of the second peak detection circuit 215 shifts to the L (low) level, and the drive frequency shifts to the low frequency side again. In this way, at time t3 to time t4 and thereafter, the drive frequency becomes fC and then fD repeatedly, and operation is carried out around the resonance point of the piezoelectric transformer 201. If the power supply voltage recovers for some reason and increases hereafter, the step-up ratio rises at an electromagnetic transformer 202. Therefore, the overall step-up ratio of the frequency characteristic of the electromagnetic transformer 202 rises.

Figure 43:
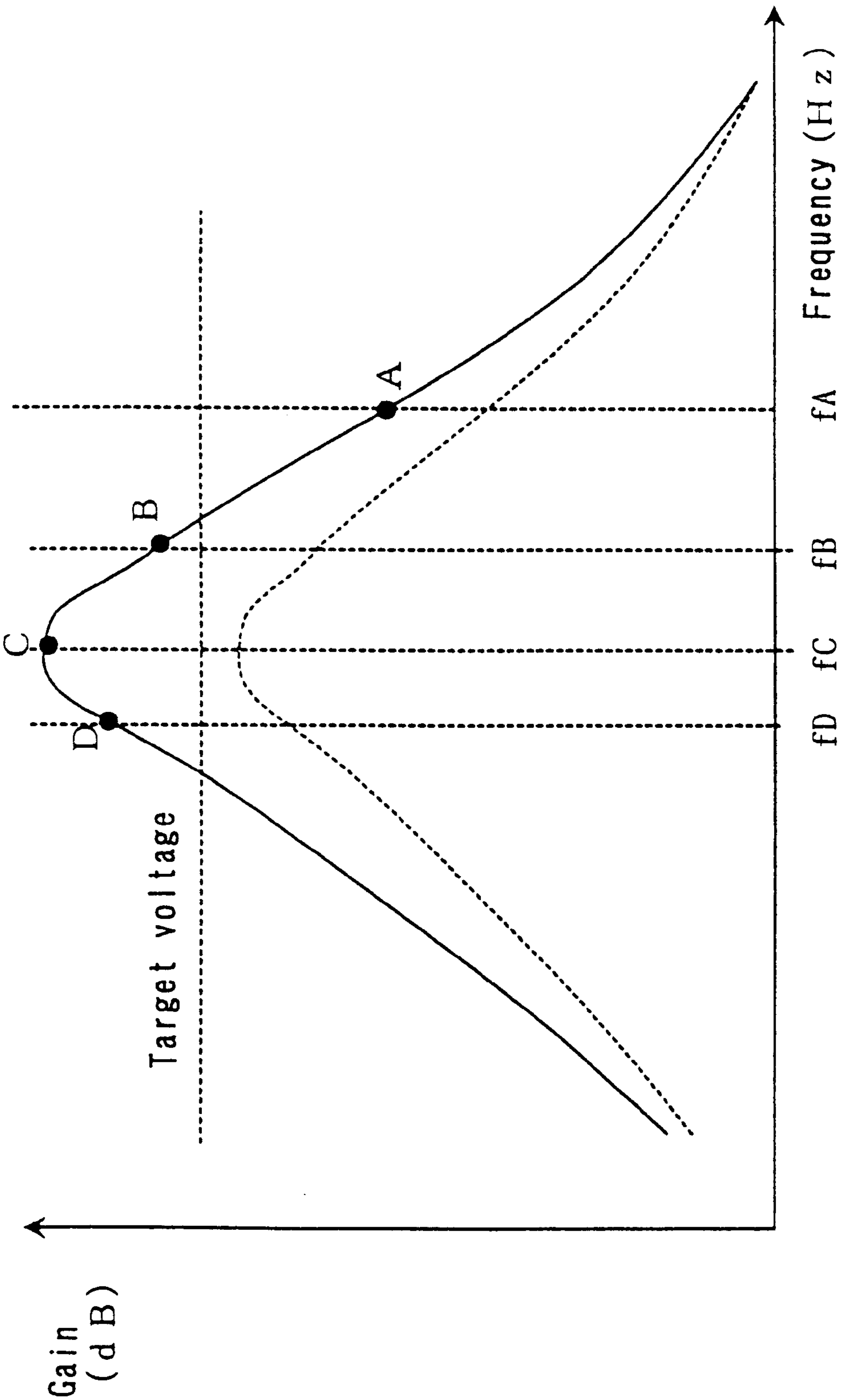
FIG. 43 is a waveform diagram illustrating the operation of the piezoelectric transformer-driving circuit of the embodiment 9.

FIG. 43 is a frequency characteristic curve showing an example wherein the overall step-up ratio of the electromagnetic transformer 202 rises. In the case of the example shown in FIG. 43, since the voltage at the point C or the point D is larger than the target voltage, the output of the comparison circuit 215B is reset, and the data Ffreq of the frequency setting circuit 209 becomes effective at all times. Therefore, as described in the above-mentioned embodiment 6, the drive frequency shifts to the high frequency side and converges to the target voltage.

In this way, in the driving circuit of the embodiment 9, when the drive frequency shifts beyond the resonance point of the piezoelectric transformer 201, a process for returning the drive frequency to the two-cycle-previous frequency is carried out by the second peak detection circuit 215, the second delay circuit 216 and the selector 217. Therefore, even if the target voltage is not attained at the resonance point of the piezoelectric transformer 201 owing to the drop of the power supply voltage or the like, no uncontrollable condition occurs, and the average output voltage around the resonance point can be obtained. As a result, in the piezoelectric transformer-driving circuit of the embodiment 9, the tube is not turned even if the power supply voltage drops, whereby a stable lighting state can be obtained; therefore, unlike conventional circuits, it is not necessary to use an electromagnetic transformer or a piezoelectric transformer having an extra margin for the power supply voltage, whereby it is possible to reduce cost and to save space for parts.

In the driving circuit of the embodiment 9, the delay amount of the second delay circuit 216 is set at one cycle of the frequency division ratio distribution; and when the drive frequency shifts beyond the resonance point, the process for outputting the data of the second delay circuit 216 is carried out. However, the delay amount of the second delay circuit 216 of the embodiment 9 may be set at two cycles or more of the frequency division ratio distribution. For example, when it is assumed that the delay amount of the second delay circuit 216 is the two cycles of the frequency division ratio distribution, in the case when the drive frequency shifts beyond the resonance point, the drive frequency is returned to the three-cycle-previous drive frequency; in the example shown in FIG. 41, the frequency returns from the frequency at the point D to the frequency at the point B. Even in this case, it is possible to obtain an effect similar to that of the embodiment 9 shown in FIG. 39.

In addition, in the embodiment 9 of the present invention, even if the target voltage is not attained at the resonance point of the piezoelectric transformer owing to the drop of the power supply voltage or the like, an uncontrollable condition does not occur, whereby the average output voltage around the resonance point can be obtained, and a stable lighting state can be obtained. Therefore, unlike conventional circuits, it is not necessary to use a pre-transformer or a piezoelectric transformer having an extra margin for the power supply voltage, whereby it is possible to reduce cost and to save space for parts.

<<Embodiment 10>>

Figure 44:
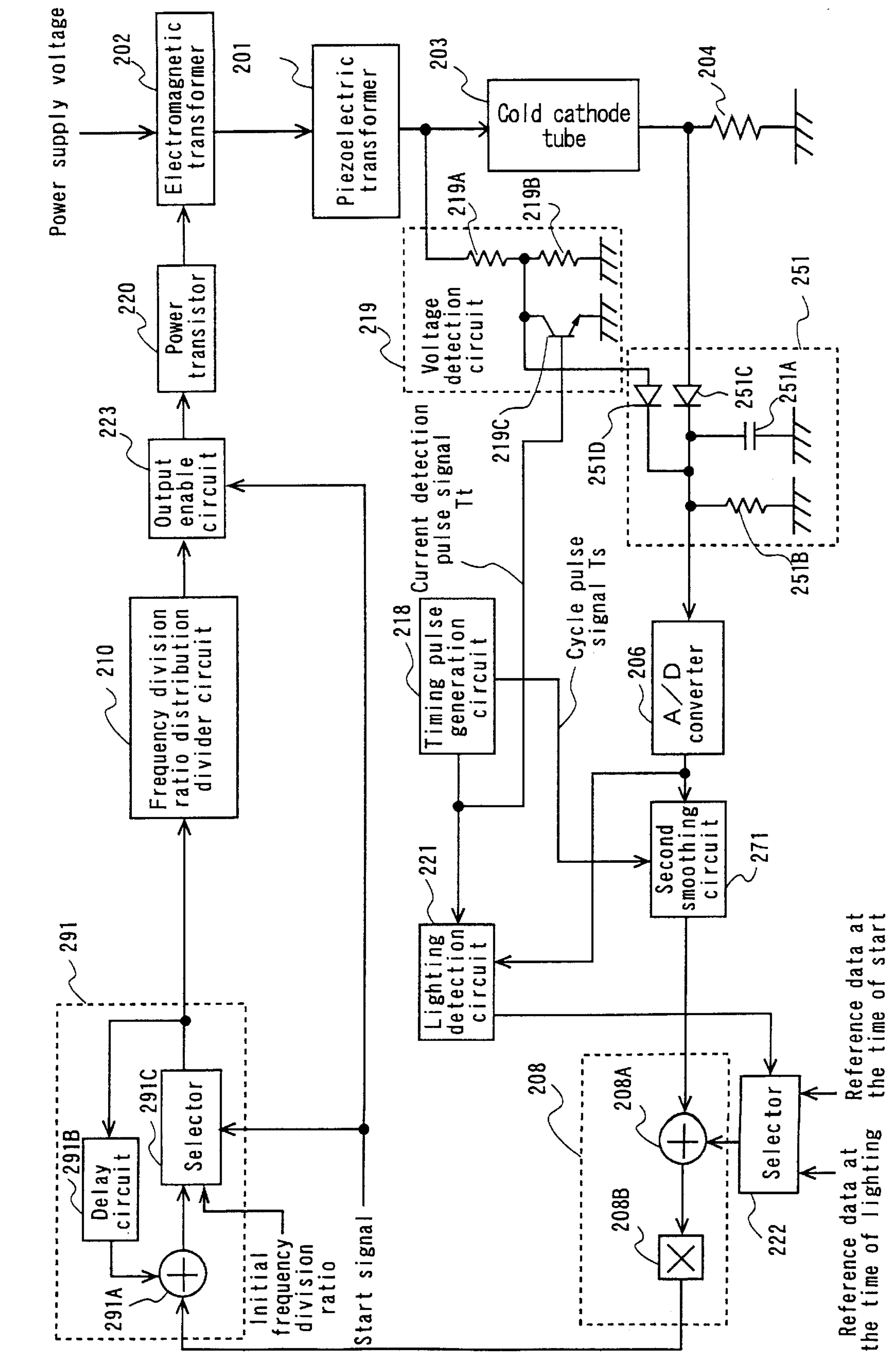
FIG. 44 is a block diagram showing the configuration of a piezoelectric transformer-driving circuit in accordance with embodiment 10 of the present invention.

Next, a piezoelectric transformer-driving circuit in accordance with embodiment 10 of the present invention will be described. FIG. 44 is a block diagram showing the embodiment 10 of the present invention. In the embodiment 10, a start control system suited for the digitalization of the driving circuit is proposed. The driving circuit of the embodiment 10 uses one A/D converter to detect the current flowing through a cold cathode tube 203 and the output voltage of a piezoelectric transformer 201, whereby a simple circuit is used to carry out both start control and lighting control. The start control is control carried out until the cold cathode tube 203 is first excited and lit. In addition, the lighting control is control carried out after the cold cathode tube 203 is lit once. In FIG. 44, the components having the same functions and configurations as those of the above-mentioned embodiments are designated by the same numerals, and their explanations are omitted.

First, the general differences between the start control and lighting control will be described.

In the lighting control, a method of carrying out control by detecting the amount of light (that is, brightness) emitted from the cold cathode tube 203 at the time of lighting is available. However, the method of directly detecting the brightness requires an expensive sensor; therefore, usually, the tube current flowing through the cold cathode tube 203 is detected and controlled. This is because the magnitude of the tube current is nearly proportional to the brightness. As described above, in the lighting control, it is general that the lighting control is carried out by detecting the tube current flowing through the cold cathode tube 203 and by carrying out feedback control so that the tube current becomes a desired current value.

On the other hand, in the start control, control is carried out so that the voltage required for lighting at the time of start is applied to cold cathode tube 203. Since the cold cathode tube 203 is not lit at the time of start, no tube current flows through the cold cathode tube 203. Therefore, the start control is carried out by detecting the output voltage of the piezoelectric transformer 201. To light the cold cathode tube 203, a voltage several times as large as the voltage applied during lighting is required, and the lighting performance becomes higher as this voltage is larger. The lighting performance is a time required for lighting, and the lighting performance lowers at places having a lower temperature and deeper darkness. However, if a large voltage is applied in order to enhance the lighting performance, the stress to the piezoelectric transformer 201 increases conversely, and the transformer is likely to break. For this reason, the voltage applied to the cold cathode tube 203 at the time of start is required to be controlled at an optimum voltage in consideration of the lighting performance of the cold cathode tube 203 and the stress to the piezoelectric transformer 201. Therefore, in the start control, it is general that the output voltage of the piezoelectric transformer 201 is detected and that feedback control is carried out so that this voltage value becomes a predetermined value.

As described above, in order to carry out the start control and the lighting control, it is necessary to have two detection means for detecting the current of the cold cathode tube 203 and the output voltage of the piezoelectric transformer 201, and it is also necessary to have a lighting detection means for promptly shifting the start control to the lighting control after lighting.

Figure 45:
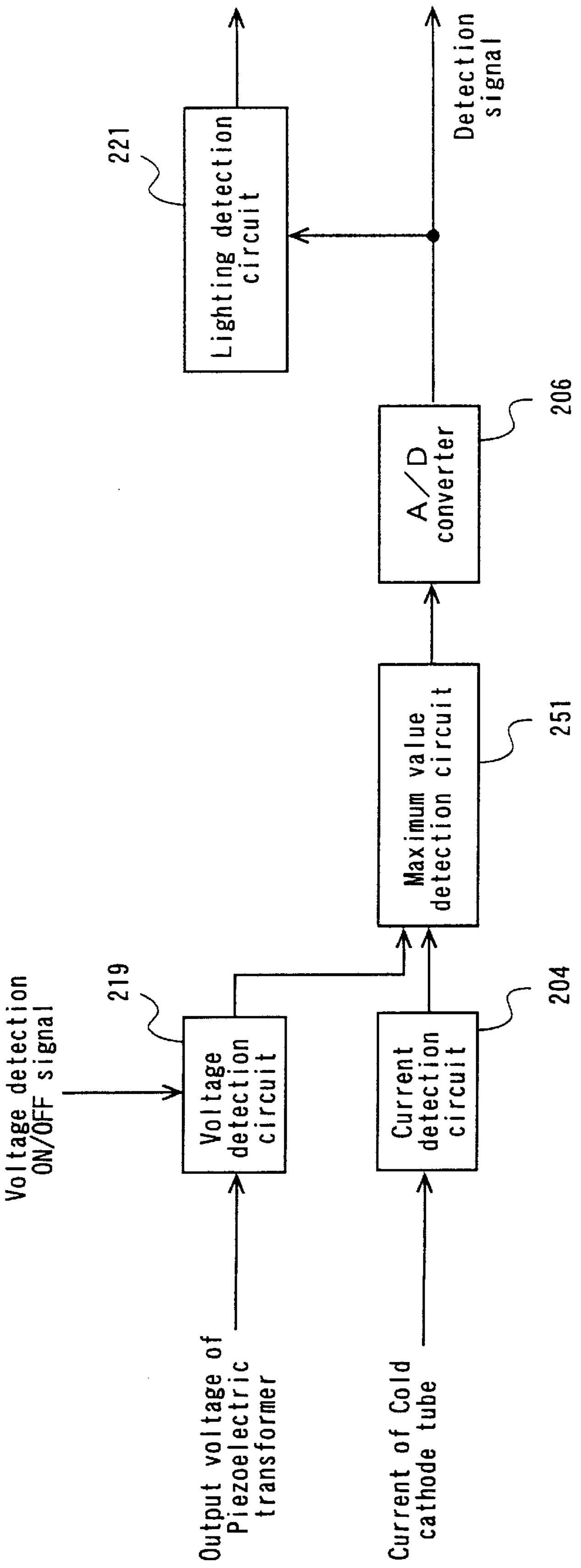
FIG. 45 is a block diagram showing the main configuration the embodiment 10.

FIG. 45 is a block diagram illustrating the principle of the driving circuit of the embodiment 10 of the present invention. As shown in FIG. 45, the driving circuit of the embodiment 10 has a system wherein the current of the cold cathode tube 203 and the output voltage of the piezoelectric transformer 201 are detected in accordance with the time-division method by one A/D converter 206, and both the start control and the lighting control are carried out by using basically the same circuit.

The characteristics of the driving circuit of the embodiment 10 will be described below by referring to FIG. 45.

In FIG. 45, a current detection circuit 204 detects the current flowing through the cold cathode tube 203. A voltage detection circuit 219 detects the output voltage of the piezoelectric transformer 201 and converts the voltage into a voltage capable of being input to the A/D converter 206. The voltage detection circuit 219 is configured so that voltage detection can be turned on/off by a current detection pulse signal Tt described later. A peak hold circuit 251 is a maximum value detection circuit that outputs the output voltage of the voltage detection circuit 219 or the output voltage of the current detection circuit 204, whichever larger, and has a rectifying function. A lighting detection circuit 221 detects lighting depending on the output voltage of the A/D converter 206 and the current detection pulse signal Tt.

Figure 46:
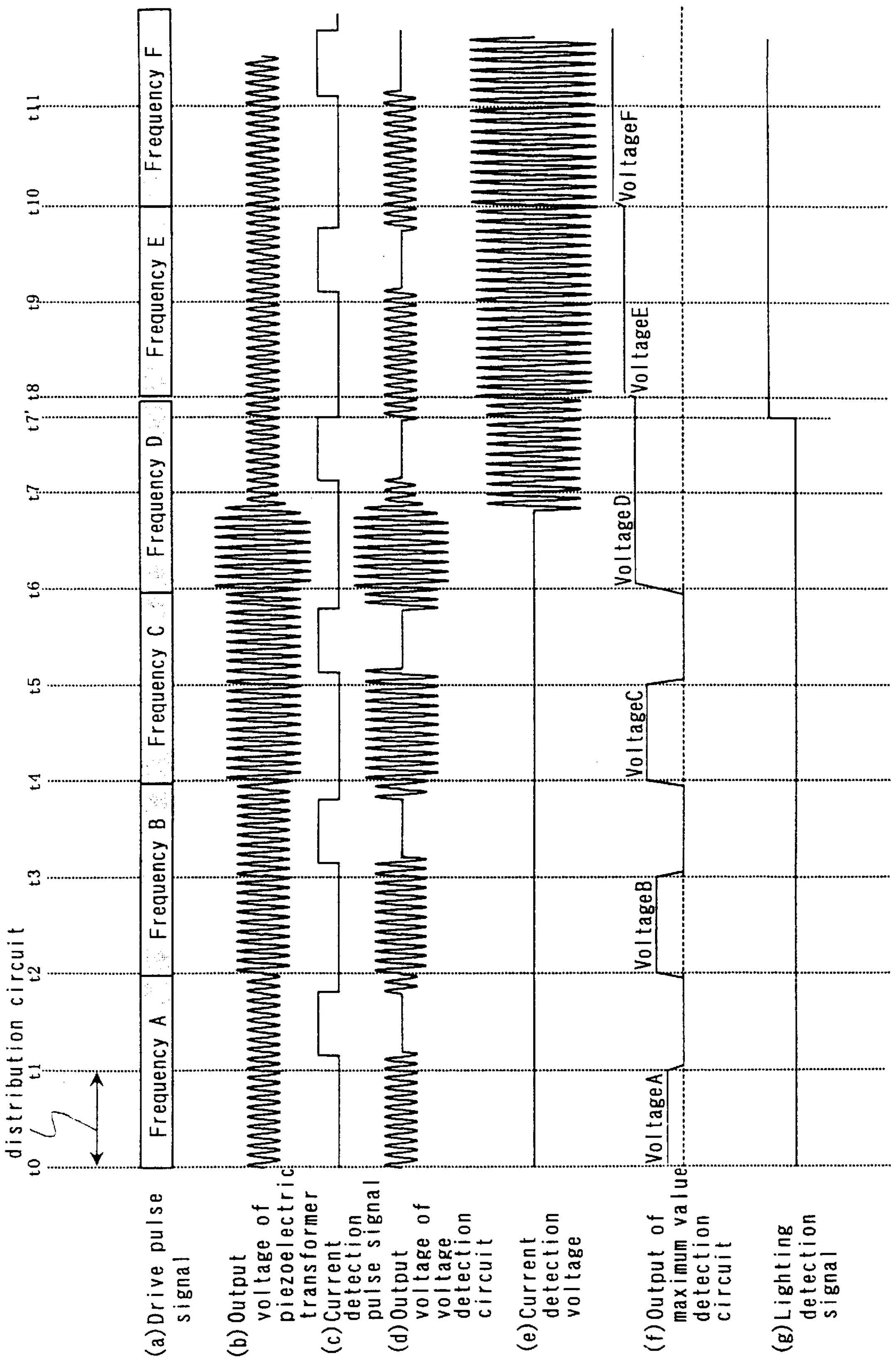
FIG. 46 is a waveform diagram showing the operation of the main configuration of the embodiment 10.

Next, the operation principle of each block shown in FIG. 45 will be described by referring to FIG. 46. FIG. 46 is a waveform diagram showing the operation timing of the driving circuit of the embodiment 10. FIG. 46 is a timing waveform diagram in the range from start to lighting.

(a) of FIG. 46 shows a drive pulse signal; drive is carried out at frequency A from time t0 to t2; drive is carried out at frequency B from time t2 to t4; drive is carried out at frequency C from time t4 to t6; and drive is carried out at frequency D from time t6 to t8. (b) of FIG. 46 shows the output voltage waveform of the piezoelectric transformer 201, and shows a state wherein the output voltage increases gradually depending on the drive frequency. (c) of FIG. 46 shows the current detection pulse signal Tt; when the signal is at the L (low) level, the output voltage of the piezoelectric transformer 201 is output; when the signal is at the H (high) level, a disable state is obtained. As a result, the signal shown in (d) of FIG. 46 is output from the voltage detection circuit 219.

(e) of FIG. 46 shows the output voltage of the current detection circuit 219, and shows a state wherein no current flows through the cold cathode tube 203 because the tube is not lit at the time of start. (f) of FIG. 46 is a waveform diagram of the output of the maximum value detection circuit, that is, the peak hold circuit 251. When no current flows through the cold cathode tube 203 (at time t0 to time t7), only the output voltage of the voltage detection circuit 219 is rectified and output.

Since the driving circuit of the embodiment 10 is configured as described above, the signal output from the peak hold circuit 251 at the time when the current detection pulse signal Tt has the "H" level is limited to the output signal of the current detection circuit 204. This makes it possible to carry out the lighting detection of the cold cathode tube 203 described later.

On the other hand, as detection data used for control, it is necessary to use a period during which effective data is output, while the current detection pulse signal Tt has the "L" level. Therefore, it has been set that the voltage detection signal is output at the time of start and the current detection signal is output at the time of lighting as the detection data for this "L" period.

In order to perform setting as described above, the embodiment 10 uses the characteristic of the piezoelectric transformer 201 wherein its step-up ratio changes depending on the magnitude of a load as described below. Generally, the piezoelectric transformer 201 has a characteristic wherein its step-up ratio lowers significantly when the load increases. (b) of FIG. 46 shows the output voltage of the piezoelectric transformer 201. When a current begins to flow through the cold cathode tube 203 around time t7, the load to the piezoelectric transformer 201 increases; therefore, the output voltage of the piezoelectric transformer 201 lowers even if the drive frequency is constant. For this reason, when the detection voltage level of the current detection circuit 204 is set higher than the detection voltage level of the voltage detection circuit 219, the output voltage of the peak hold circuit 251 while the current detection pulse signal Tt is at the "L" level becomes the detection voltage for the output voltage of the piezoelectric transformer 201 at the time of start; and the output voltage becomes the detection voltage for the tube current flowing through the cold cathode tube 203 at the time of lighting. Therefore, in the driving circuit of the embodiment 10, by using only one A/D converter 206, it is possible to control the output voltage of the piezoelectric transformer 201 at the time of start, and to control the current flowing through the cold cathode tube 203 at the time of lighting.

In the drive control of the above-mentioned cold cathode tube 203, in order to shift start control to lighting control, it is necessary to have a means for actually detecting the lighting state. Such a means for detecting the lighting state can be attained by monitoring the output of the peak hold circuit 251 used as the maximum value detection circuit when the current detection pulse signal Tt has the "H" level. This is because, when no current flows through the cold cathode tube 203, the output of the peak hold circuit 251 is fixed at the "L" level while the current detection pulse signal Tt has the "H" level, and when the tube current flows, the voltage corresponding to the amount of the current is output from the peak hold circuit 251. (g) of FIG. 46 shows a lighting detection signal output from the lighting detection circuit 21.

In the waveform diagram shown in FIG. 46, an example wherein the lighting detection is carried out at the falling edges of the current detection pulse signal (c) is shown; however, the lighting detection may be carried out at any time for the period during which the current detection pulse signal Tt has the "H" level.

Next, the concrete operations of the driving circuit of the embodiment 10 will be described below.

In FIG. 44, a block diagram showing the configuration of the embodiment 10 of the present invention, the frequency division ratio distribution cycle pulse signal of the drive pulse signal is input to a timing pulse generation circuit 218, and the circuit outputs a cycle signal Ts.

Figure 47:
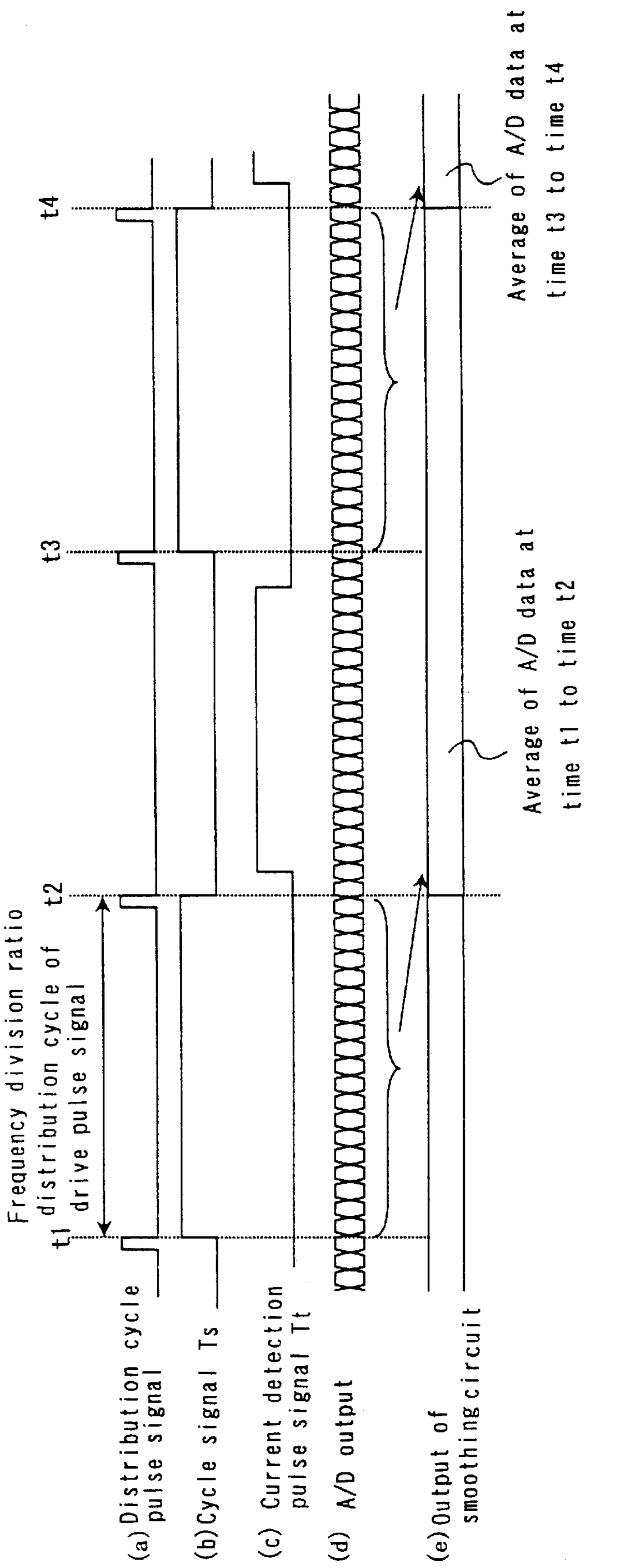
FIG. 47 is a waveform diagram showing the operation timing of the driving circuit of the embodiment 10.

FIG. 47 is a waveform diagram showing the operation timing of the output signals, such as the frequency division ratio distribution cycle pulse signal (a), the cycle signal Ts (b) and the current detection pulse signal (c). The timing pulse generation circuit 218 outputs the cycle signal Ts shown in (b) of FIG. 47 as a first output pulse signal. The cycle signal Ts is repeated in the two-cycle units of the input pulse signal; the signal has the "H" level for the period of a first cycle and has the "L" level for the period of the next cycle. Furthermore, the timing pulse generation circuit 218 outputs the current detection pulse signal Tt, that is, the cycle signal shown in (c) of FIG. 47, as a second output pulse signal. This current detection pulse signal Tt is a cycle signal that becomes the "H" level for a predetermined period wherein the above-mentioned cycle signal Ts has the "L" level.

The voltage detection circuit 219 converts the output voltage of the piezoelectric transformer 201 into a voltage that can be input to the A/D converter 206. The voltage detection circuit 219 is configured to nullify voltage output (0 V output) when the current detection pulse signal Tt output from the timing pulse generation circuit 218 has the "H" level. More specifically, as shown in FIG. 44, the voltage detection circuit 219 divides the output voltage of the piezoelectric transformer 201 by using two resistors 219A and 219B to lower the voltage to a voltage level that can be input to the A/D converter 206. Then, in the voltage detection circuit 219, its output voltage becomes 0 V by virtue of a transistor 219C when the current detection pulse signal Tt has the "H" level.

The peak hold circuit 251 peak-holds the voltage obtained by the current detector 204 and rectifies it. This peak hold circuit 251 corresponds to the maximum value detection circuit shown in FIG. 45. The peak hold circuit 251 comprises a capacitor 251A, a resistor 251B and two diodes 251C and 251D. The peak hold circuit 251 carries out substantially the same operation as that of the rectifying circuit 205 of the above-mentioned embodiment 6 shown in FIG. 24. However, this circuit differs -from the rectifying circuit 205 of the embodiment 6 in that the output voltage of the current detection circuit 204 is input from the diode 251C of the embodiment 10, that the output voltage of the voltage detection circuit 219 is input from the diode 251D, and that the higher voltage is peak-held.

A second smoothing circuit 271 smoothes the output voltage Vad of the A/D converter 206 by average processing only while the cycle pulse signal Ts output from the timing pulse generation circuit 218 has the "H" level. As shown in (e) of FIG. 47, the second smoothing circuit 271 outputs a smooth voltage Vlpf in synchronization with the master clock immediately after the falling edges of the cycle signal Ts. The operation of this second smoothing circuit 271 differs from that of the smoothing circuit 207 of the above-mentioned embodiment 6 shown in FIG. 24 only in the smoothing cycle, but the operation is substantially the same in other points.

The lighting detection circuit 221 judges as to lighting or non-lighting on the basis of the output voltage of the A/D converter 206 while the current detection pulse signal Tt output from the timing pulse generation circuit 218 has the "H" level. In other words, the lighting detection circuit 221 outputs a lighting detection signal Vstate; the circuit outputs an "L" level signal at the time of non-lighting, and outputs an "H" level signal when it judges that the tube is lit.

A selector 222 carries out switching between the reference data Vref (target voltage) at the time of lighting and the reference data Vopen (target voltage) at the time of start provided externally, and outputs the data to the error voltage calculation circuit 208. The selector 222 outputs the reference data Vopen when the lighting detection signal Vstate has the "L" level, and, on the other hand, outputs Vref when the signal has the "H" level.

When the start signal supplied externally has the "L" level, a second frequency setting circuit 291 outputs predetermined initial frequency division ratio data; when the signal has the "H" level, data on the basis of the error voltage Verr output from the error voltage calculation circuit 208 is added to the previous frequency setting data Fprev and then output. This second frequency setting circuit 291 is configured to carry out output in synchronization with the master clock immediately after the rising edges of the cycle signal Ts. The second frequency setting circuit 291 differs from the frequency setting circuit 209 of the above-mentioned embodiment shown in FIG. 24 in the data output cycle and in that the circuit 291 is provided with a function for outputting the initial frequency division ratio data by using the selector 291C, and they are the same in the other configurations.

In an output enable circuit 223, its output is set at a disable state when the start signal has the "L" level; when the signal has the "H" level, the circuit outputs the drive pulses signal. In the piezoelectric transformer-driving circuit of the embodiment 10, the configurations and operations other than those described above are the same as those of the above-mentioned embodiment 6, and their explanations are omitted.

The piezoelectric transformer-driving circuit of the embodiment 10 is configured so that the output voltage of the piezoelectric transformer 201 and the tube current flowing through the cold cathode tube 203 can be detected in accordance with the time-division method by using one A/D converter 206, whereby start control before lighting and lighting detection can be carried out, and start control can be shifted smoothly to ordinary control after lighting.

The operations of the driving circuit of the embodiment 10 will be described below. First, the start control at the time of start will be described.

Figure 48:
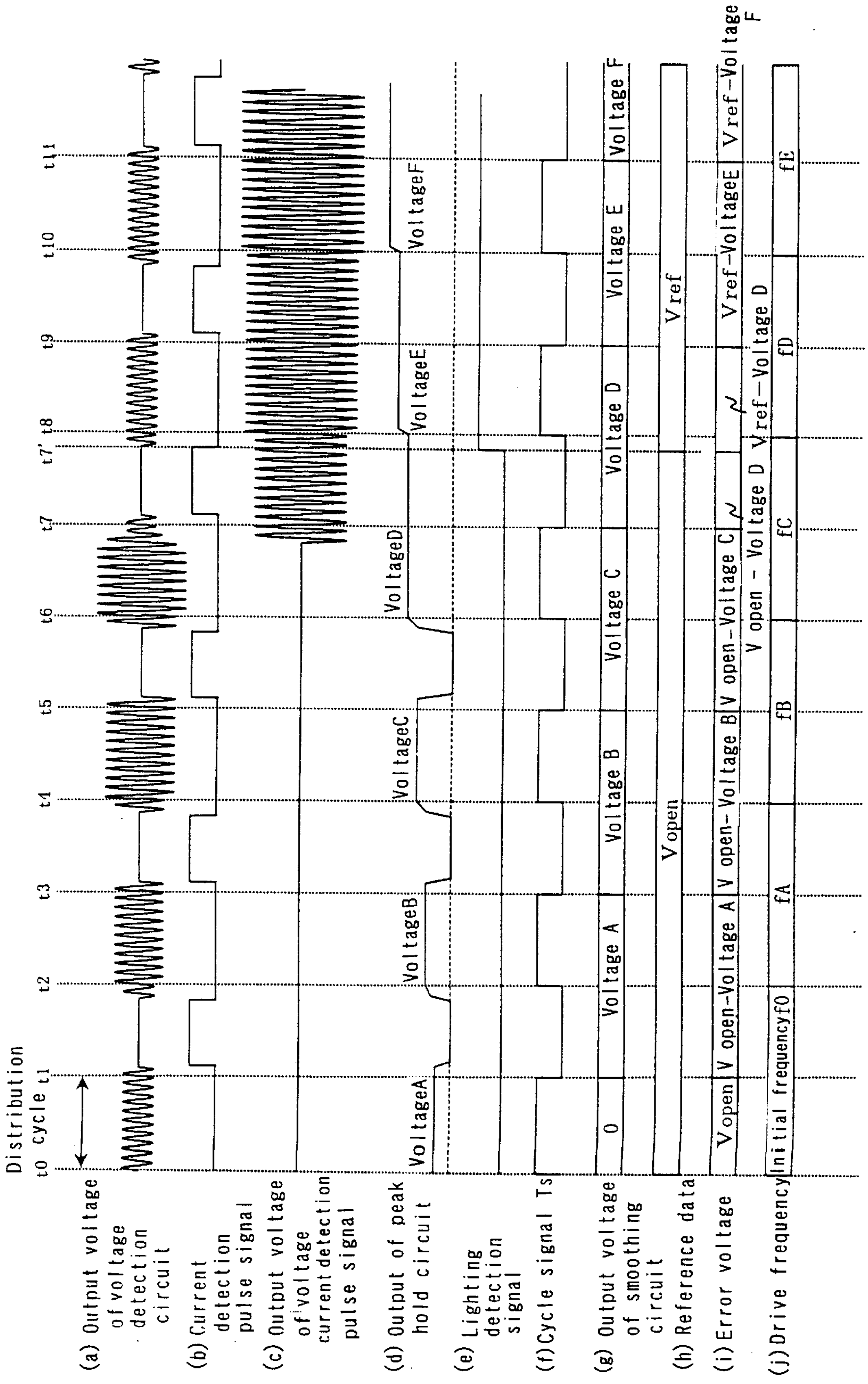
FIG.48 is a waveform diagram showing the operation timing of the driving circuit of the embodiment 10.

When the start signal has the "L" level, the second frequency setting circuit 291 outputs predetermined initial frequency division ratio data. The drive frequency depending on this initial frequency division ratio data has been set at a frequency sufficiently higher than the resonance frequency of the piezoelectric transformer 201, thereby preventing a large output voltage from occurring abruptly. In addition, when the start signal has the "L" level, the output enable circuit 223 is at a disable state; although a drive pulse signal having an initial frequency has been obtained inside the output enable circuit 223, the signal is not output to a power transistor 220, thereby being in a standby state. When the start signal shifts to the "H" level, the drive pulse signal is output from the output enable circuit 223, and an output voltage is obtained from the piezoelectric transformer 201. The above operations will be described by referring to FIG. 48. FIG. 48 is a waveform diagram showing the operation timing of each signal in the driving circuit.

(a) of FIG. 48 shows a voltage waveform resistor-divided by the two resistors 219A and 219B of the voltage detection circuit 219. While the voltage detection pulse signal Tt shown in (b) of FIG. 48 has the "H" level, the transistor 219C becomes the ON state, whereby the output voltage of the voltage detection circuit 219 becomes0 V. This operation is carried out to turn off the output voltage detection of the piezoelectric transformer 201 while the voltage detection pulse signal Tt has the "H" level, to input only the output voltage of the current detection circuit 204 to the A/D converter 206, and to judge as to whether the cold cathode tube 203 is in the lighting state or in the non-lighting state. In other words, when the cold cathode tube 203 is not lit, no tube current flows; therefore, the output voltage of the current detection circuit 204 becomes 0 V. On the other hand, when the cold cathode tube 203 is lit, the tube current flows, and a voltage is detected by the current detection circuit 204. In this way, by monitoring the output voltage of the A/D converter 206 while the voltage detection pulse signal Tt has the "H" level, it is possible to judge as to whether the cold cathode tube 203 is lit or not.

(d) of FIG. 48 shows the output voltage of the peak hold circuit 251. Since the output of the current detection circuit 204 is 0 V, the voltage A at time t0 to t1 is a voltage obtained by peak-holding the output voltage of the voltage detection circuit 219. Even at time t1 to t2, the cold cathode tube 203 is not lit; therefore, while the current detection pulse signal Tt for this period has the "H" level, the output voltage of the peak-hold circuit 251 becomes 0V. In addition, the second smoothing circuit 271 smoothes the voltage A at time t0 to t1, and outputs its smooth data Vlpf at time t1. This smooth data Vlpf is output in synchronization with the master clock immediately after the falling edges of the cycle signal Ts. Therefore, the smooth data Vlpf is output as a smooth output voltage in the timing shown in (g) of FIG. 48.

When the cold cathode tube 203 is not lit, the error voltage calculation circuit 208 outputs the difference data between the reference data Vopen at the time of start and the smooth voltage Vlpf as an error voltage Verr. Then, in the second frequency setting circuit 291, the data based on the error voltage Verr is added to the previous frequency data Fprev, thereby determining the next drive frequency. The basic operation of this second frequency setting circuit 291 and the operation of the frequency division ratio distribution divider circuit 210 are substantially the same as the operations in the above-mentioned embodiment 6.

In the embodiment 10, when the cold cathode tube 203 is not lit, the smooth voltage Vlpf output from the second smoothing circuit 271 is controlled so as to be equal to the reference data Vopen at the time of start by the above-mentioned operations; the operations continue until the cold cathode tube 203 is lit.

Next, the operation at the time when the cold cathode tube 203 shifts from the non-lighting state to the lighting state will be described.

FIG. 22 shows a state wherein the output voltage of the piezoelectric transformer 201 rises gradually, and the tube current begins to flow around time t7. When the voltage detection pulse signal Tt has the "H" level at time t7 to t8 during which the tube current flows, the peak hold circuit 251 outputs the voltage obtained by the current detection circuit 204. If this detection voltage is larger than a predetermined value, the lighting detection circuit 221 judges that the tube is lit, and shifts the lighting detection signal Vstate from the "L" level to the "H" level. In the example shown in FIG. 48, lighting detection is carried out at the timing of time t7', that is, at the timing of the falling edges of the voltage detection pulse signal Tt.

In the embodiment 10, any specific threshold value for judging the lighting, that is, any criterion voltage, is not indicated; however, in the condition that the output voltage of the voltage detection circuit 219 after lighting is sufficiently smaller than the output voltage of the current detection circuit 204, it should only be a voltage sufficiently larger than 0 V in principle and not larger than the reference data Vopen. This is because the lighting detection circuit 221 operates so that the voltage input from the A/D converter 206 is equal to the reference data Vopen at the time of start until the lighting detection circuit 221 judges that the tube is lit even after the tube current is flown.

In addition, when the tube current flows, the impedance of the cold cathode tube 203 lowers greatly, the step-up ratio of the piezoelectric transformer 201 lowers, and the voltage obtained from the voltage detection circuit 219 also lowers greatly. Therefore, when the cold cathode tube 203 is lit, the setting wherein the output voltage of the voltage detection circuit 219 is smaller than the output voltage of the current detection circuit 204 can be carried out easily.

When the lighting detection signal from the lighting detection circuit 221 becomes the "H" level by the above-mentioned operations, the reference data supplied to the error voltage calculation circuit 208 is switched to the reference data Vref used at the time of lighting, and control is carried out so that the voltage Vref input from the A/D converter 206 becomes equal to Vref.

After lighting, by setting the voltage output from the current detection circuit 204 higher than the output voltage of the voltage detection circuit 219, the start control before lighting is switched to the current control wherein the current flowing through the cold cathode tube 203 is controlled. The operation after the switching to the current control is the same as that described in the above-mentioned embodiment 6.

By carrying out switching between the output voltage of the piezoelectric transformer 201 and the current detection of the tube current flowing through the cold cathode tube 203 in accordance with the time division method in the embodiment 10 as described above, the start control at the time of start and the lighting control are made possible by the 1-channel A/D converter 206, whereby both the start control and the lighting control are attained, and the smooth shifting of the control switching is accomplished.

Furthermore, the driving circuit of the embodiment 10 is configured so that one control cycle is set at the two frequency division ratio distribution cycles each having the same frequency division ratio, wherein the voltage for setting the next frequency is obtained at the first cycle, and voltage detection is turned off and current detection is carried out at the second cycle. Because of this configuration, in the embodiment 10, the above-mentioned time-division control is made possible by using the circuit configuration having few parts.

In addition, in the embodiment 10, it is possible to individually set the reference data Vopen at the time of start and the reference data Vref at the time of lighting; therefore, in particular, the open voltage (the output voltage of the piezoelectric transformer 201 before lighting) can be set as desired, whereby the output voltage of the piezoelectric transformer 201 can be set as low as possible while obtaining the lowest voltage at which the cold cathode tube 203 is lit, and fine setting can be done.

In the embodiment 10 of the present invention, by carrying out switching between the output voltage of the piezoelectric transformer and the detection of the current flowing through the cold cathode tube in accordance with the time division method as described above, the start control at the time of start and the lighting control are made possible by the 1-channel (1 ch) A/D converter, whereby both the start control and the lighting control are attained, and the smooth shifting of the control switching is accomplished. Furthermore, one control cycle is set at the two frequency division ratio distribution cycles each having the same frequency division ratio, wherein the voltage for setting the next frequency is obtained at the first cycle, and voltage detection is turned off and current detection is carried out at the second cycle. Therefore, the above-mentioned time-division control is made possible by using the circuit having few parts. In addition, it is possible to individually set the reference data Vopen at the time of start and the reference data Vref at the time of lighting; therefore, in particular, the open voltage can be set as desired, whereby the output voltage of the piezoelectric transformer can be set as low as possible while obtaining the lowest voltage at which the cold cathode tube 3 is lit, and fine setting can be carried out.

<<Embodiment 11>>

Next, a piezoelectric transformer-driving circuit in accordance with embodiment 11 of the present invention will be described.

Figure 49:
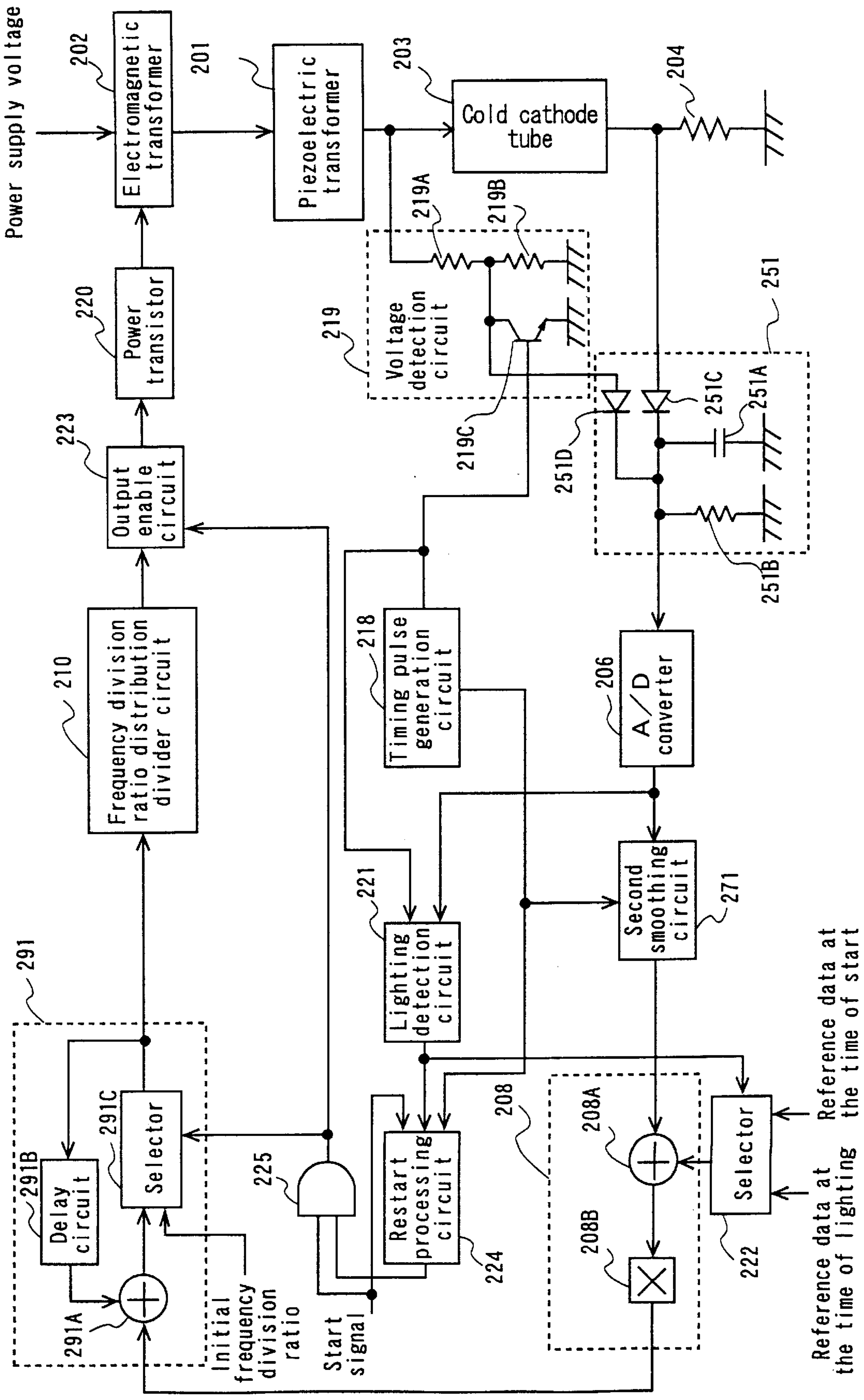
FIG. 49 is a block diagram showing the configuration of a piezoelectric transformer-driving circuit in accordance with embodiment 11 of the present invention.

FIG. 49 is a block diagram showing the configuration of the piezoelectric transformer-driving circuit of the embodiment 11 of the present invention. In FIG. 44, the components having the same functions and configurations as those of the above-mentioned embodiments are designated by the same numerals, and their explanations are omitted.

In the embodiment 10, a start control system suited for the digitalization of the driving circuit is proposed, wherein the lighting performance of the cold cathode tube is improved while the stress to the piezoelectric transformer at the time of start is suppressed at the minimum.

Figure 50:
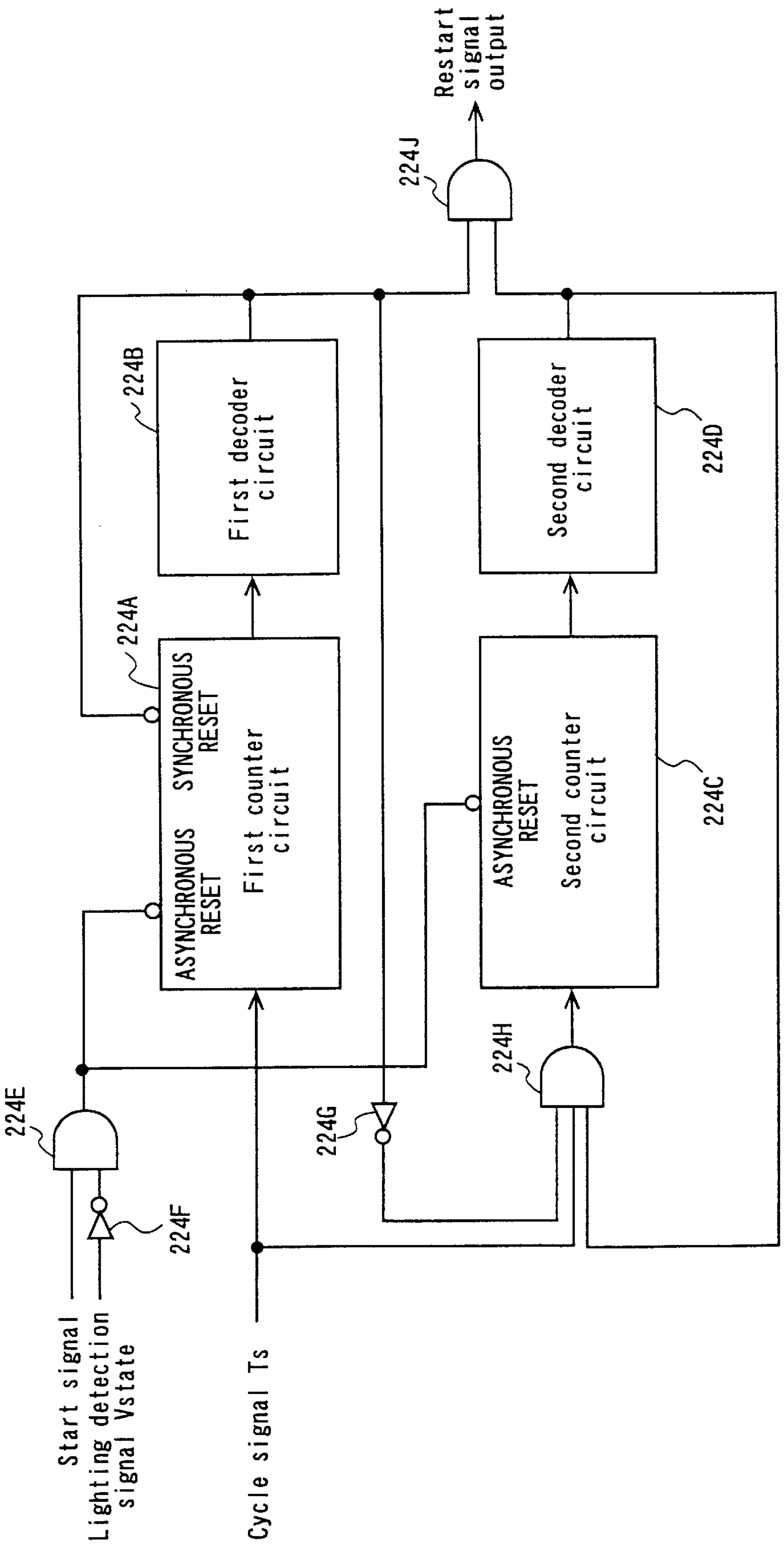
FIG. 50 is a circuit diagram showing the restart processing circuit of the piezoelectric transformer-driving circuit of the embodiment 11.

In FIG. 49, if lighting is not attained even after a predetermined time has passed during the open control at the time of start, a restart processing circuit 224 stops the output of the drive pulse signal once, and performs restart from the initial frequency. FIG. 50 is a block diagram showing a concrete example of the restart processing circuit 224. In FIG. 50, a first counter circuit 224A counts the rising edges of the cycle signal Ts output from the timing pulse generation circuit 218. At the time of the state before start or the state after lighting, the first counter circuit 224 A is reset out of synchronization with the cycle signal Ts; when the counter value reaches a predetermined value, the circuit is reset in synchronization with the cycle signal Ts.

The reset processing of the first counter circuit 224A is carried out by an AND gate 224E, an inverter 224F and a first decoder circuit 224B. When the start signal has the L (low) level, or when the lighting detection signal Vstate has the H (high) level, an L level signal is output from the AND gate 224E, whereby the first counter circuit 224A is reset. The first decoder circuit 224B is configured to output an L level signal when the counter value of the first counter circuit 224A reaches the predetermined value, and to output an H level signal in the other cases. As described above, when the counter value reaches the predetermined value of the first decoder circuit 224B, an L level signal is output from the first decoder circuit 224B, whereby the output of the AND gate 224G becomes the L level; therefore, the first counter circuit 224A is reset in synchronization with the rising edge of the next cycle signal Ts.

A second counter circuit 224C performs counting when the cycle signal Ts output from the timing pulse generation circuit 218 has the H level and when the output of the first decoder circuit 224B has the L level. This second counter circuit 224C is asynchronously reset in the state before start or in the state after lighting. In addition, the second counter circuit 224C is configured to stop counter processing when the counter value reaches a predetermined value.

The processing of stopping the above-mentioned counter processing is carried out by a second decoder circuit 224D and an AND gate 224H. In other words, the second decoder circuit 224D outputs an L level signal when the count value of the second counter circuit 224C reaches the predetermined value, and outputs an H level signal in other cases. When the count value of the second counter circuit 224C reaches the predetermined value, the second decoder circuit 224D outputs an L level signal, whereby the output of the AND gate 224H is fixed at the L level, and after this, the cycle signal Ts and the L level signal from the first decoder circuit 224B are ignored.

The reset processing of the second counter circuit 224C is basically the same as the reset processing of the above-mentioned first counter circuit 224A. An AND gate 224J outputs the logical AND of the output of the first decoder circuit 224B and the output of the second decoder circuit 224D.

As described above, the embodiment 11 is provided with the restart processing circuit 224 comprising the first counter circuit 224A and the first decoder circuit 224B. Therefore, if lighting is not attained even if the open control is carried out for a predetermined period, the output of the drive pulse signal is stopped once, and the drive frequency is returned to the initial frequency. In addition, if lighting is not attained even if the above-mentioned restart processing is performed a predetermined number of times, processing for stopping the start processing is carried out.

In FIG. 49, an AND gate 225 outputs the logical AND of the start signal and the output of the restart processing circuit 224. When either of the input signals has the L level, the AND gate 225 switches the input of the selector 291C to the initial frequency division ratio and disables the output of the output enable circuit 223.

Other configurations and operations of the embodiment 11 are substantially the same as those of the driving circuit of the above-mentioned embodiment 10.

Figure 51:
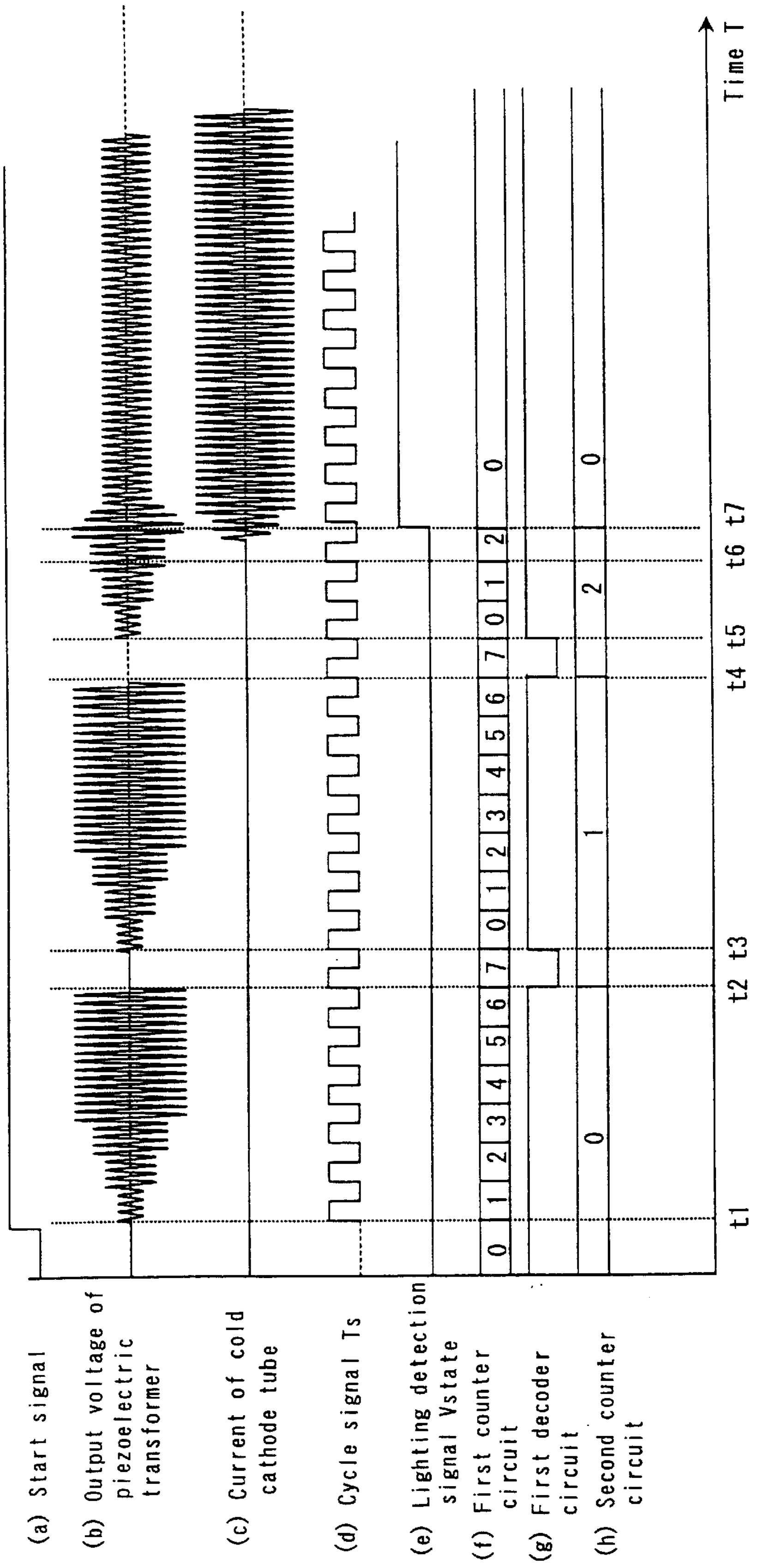
FIG. 51 is a waveform diagram showing the operation timing of the driving circuit of the embodiment 11.

Next, the operation of the restart processing circuit in the driving circuit of the embodiment 11 configured as described above will be described. FIG. 51 is a timing waveform diagram illustrating the restart processing operation in the embodiment 11. IN FIG. 51, (b) shows the output voltage of the piezoelectric transformer 201 at the time of restart processing, and (c) shows the waveform of the current flowing through the cold cathode tube 203.

First, the operation of the restart processing will be described by referring to (b) and (c) of FIG. 51. When the start signal shown in (a) of FIG. 51 rises from the L (low) level to the H (high) level at time t1, the drive pulse signal is output and the output voltage is obtained from the piezoelectric transformer 201. After this, the output voltage rises until it reaches the reference data Vopen, the target voltage at the time of start; if lighting is not attained after a predetermined time has passed, drive is stopped once at time t2. This avoids long-time open control to prevent the piezoelectric transformer 201 from breaking. As described previously, in order to light the cold cathode tube 203, it is necessary to apply a large voltage to the cold cathode tube 203. At this time, since the piezoelectric transformer 201 causes large vibration, it undergoes stress most significantly. Therefore, if lighting is not attained after a predetermined time has passed, drive is stopped once to prevent the piezoelectric transformer 201 from breaking.

Furthermore, in the embodiment 11, the lighting performance of the cold cathode tube 203 is improved by repeating the above-mentioned processing. This repeated processing is not repeated endlessly; after the processing is carried out a predetermined number of times, it is judged that the cold cathode tube 203 is improper, that a wire short-circuit has occurred in a PC board pattern, or the like, and start processing is stopped. The example shown in FIG. 51 is a waveform diagram at the time when the cold cathode tube 203 is lit by the third start processing and when a current begins to flow after start processing is carried out two times.

Next, the concrete operation of the restart processing circuit 224 in the embodiment 11 will be described below. The embodiment 11 is explained assuming that the decode value of the first decoder circuit 224B shown in FIG. 50 is 7, and that the decode value of the second decoder circuit 224D is 3.

First, when the start signal has the L (low) level, the output of the AND gate 24E has the L (low) level, and the first counter circuit 224A and the second counter circuit 224C are reset, whereby both have a counter value 0. Therefore, both the outputs of the first decoder circuit 224B and the second decoder circuit 224D have the H (high) level, and an H (high) level signal is output from the AND gate 224J.

Next, when the level of the start signal rises from the L level to the H level at time t1, the output of the AND gate 225 has the H level; therefore, the output enable circuit 223 becomes enable, and the drive pulse signal is output. After this, the first counter circuit 224A carries out counting in synchronization with the rising edges of the cycle signal Ts. This counting operation continues until the lighting detection signal Vstate becomes the H level. When the count value reaches 7, the output of the first decoder circuit 224B is shifted to the L level, and the first counter circuit 224A is reset at the rising edge of the next cycle signal Ts. This operation is shown in (f) and (g) of FIG. 51.

When the output of the first decoder circuit 224B becomes the L level, the output of the AND gate 224J becomes the L level. As a result, the output of the AND gate 225 also becomes the L level, whereby the frequency data output from the second frequency setting circuit 291 is returned to the initial frequency, and the output enable circuit 223 is disabled, thereby stopping the drive pulse signal.

Next, when the first counter circuit 224A is reset at time t3, the output of the first decoder circuit 224B becomes the H level, whereby the output of the AND gate 225 also becomes the H level, thereby outputting the drive pulse signal again. The above operations continue until the lighting detection signal Vstate becomes the H level.

Next, the second counter circuit 224C carries out counting in synchronization with the falling edges of the output signal of the first decoder circuit 224B. In this counting operation, as shown in (h) of FIG. 51, increment is carried out at the falling edges of the output signal of the first decoder circuit at time t2 and time t4. This counting operation continues until the count value reaches the decode value preset in the second decoder circuit 224D, provided that the lighting detection signal Vstate does not become the H level. If the counter value of the second counter circuit 224C becomes 5, the output of the second decoder circuit 224D becomes the L level, thereby stopping the operation of the second counter circuit 224C. As a result, the AND gate 224J is fixed at the L level, and the output enable circuit 223 is disabled, thereby stopping the drive pulse signal.

Once the second counter circuit 224C stops counting, it continues to stop until it is reset at the time when the start signal becomes the L level. In the example shown in FIG. 51, the lighting detection signal Vstate shifts from the L level to the H level at time t7; therefore, the first counter circuit 224A and the second counter circuit 224C are reset, and the operation of the restart processing circuit 224 is stopped. In other words, the restart processing circuit 224 operates only during open control; when the cold cathode tube 203 is lit, the operation is stopped, and the output of the AND gate 224J is fixed at the H level.

As described above, in the driving circuit of the embodiment 11, open control is prevented from continuing for a long time by providing the restart processing circuit 224, whereby it is possible to prevent the piezoelectric transformer 201 from breaking. In addition, the driving circuit of the embodiment 11 repeats the above-mentioned open control operation several times if the cold cathode tube 203 is not lit by one open control operation, whereby the lighting performance of the cold cathode tube 203 is enhanced.

In the conventional drive system disclosed in the above-mentioned Japanese published unexamined Patent Application No. Hei 10-52068, if the output voltage of the piezoelectric transformer 201 becomes larger than a predetermined value, the drive frequency is shifted to the high frequency side thereby to lower the output voltage once. However, the drive system of the embodiment 11 of the present invention is configured so that, when the output voltage of the piezoelectric transformer 201 becomes the predetermined value, the voltage value is held for the predetermined time; therefore, it is possible to control both the output voltage and the time, and the number of restart processing operations can also be controlled. Therefore, the driving circuit of the embodiment 11 has a significant effect of obtaining the best setting for improving the lighting performance of the cold cathode tube 203 while preventing stress to the piezoelectric transformer 201 as much as possible.

As described above, in the embodiment 11 of the present invention, by using the restart processing circuit 224, open control is prevented from continuing for a long time, thereby preventing the piezoelectric transformer 201 from breaking; in addition, even if the cold cathode tube 203 is not lit by one open control operation, the above-mentioned open control is repeated several times. Therefore, the lighting performance of the cold cathode tube 203 is not impaired. Furthermore, the embodiment 11 is configured so that, when the output voltage of the piezoelectric transformer 1 becomes the predetermined value, the voltage value is held for the predetermined time, whereby it is possible to control both the output voltage and the time, and the number of restart processing operations can also be controlled. Therefore, it is possible to obtain the best setting for improving the lighting performance of the cold cathode tube 203 while preventing stress to the piezoelectric transformer 201 as much as possible.

<<Embodiment 12>>

Next, a piezoelectric transformer-driving circuit in accordance with embodiment 12 of the present invention will be described.

Figure 52:
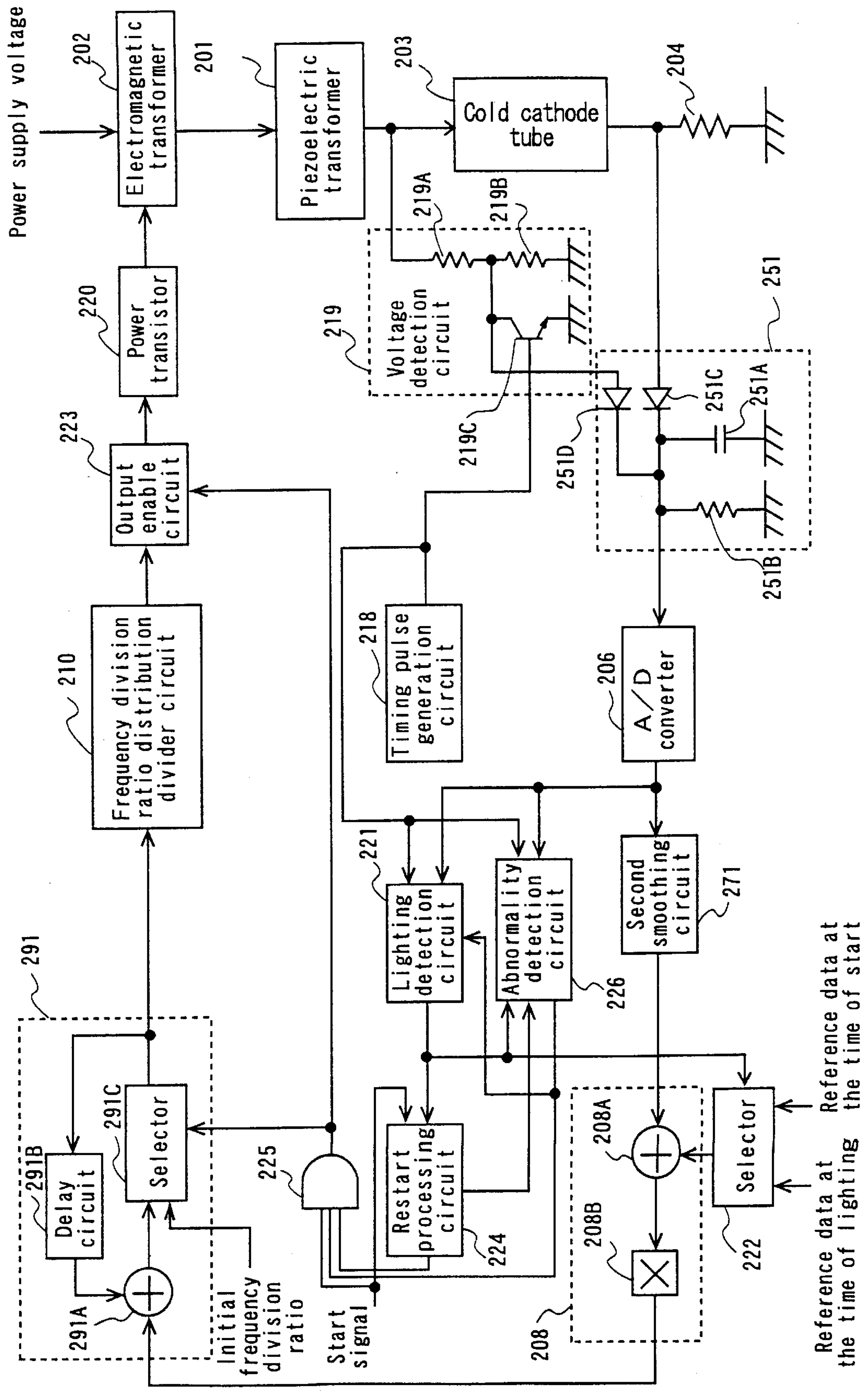
FIG. 52 is a block diagram showing the configuration of a piezoelectric transformer-driving circuit in accordance with embodiment 12 of the present invention.

FIG. 52 is a block diagram showing the configuration of the piezoelectric transformer-driving circuit of the embodiment 12 of the present invention. In FIG. 52, the components having the same functions and configurations as those of the above-mentioned embodiments are designated by the same numerals, and their explanations are omitted.

A high voltage is output from a piezoelectric transformer 201; therefore, in order to practically use this, sufficient countermeasures are required to prevent device breakage, fires due to large current and the like. The driving circuit of the embodiment 12 in accordance with the present invention is a proposal for improvement suited for digitalization with respect to the protection function of the piezoelectric transformer 201. In the embodiment 12, specifically speaking, a drive system is proposed wherein, when the output of the piezoelectric transformer 201 becomes open because of the wire breakage or short-circuit in a PC board pattern during the lighting of a cold cathode tube 203, the breakdown of the cold cathode tube 203 or the like, the output is stopped promptly; and restart processing is also proposed to operate in the case when the power supply voltage drops momentarily because of instantaneous power interruption or the like and the cold cathode tube 203 is turned off.

In FIG. 52, an abnormality detection circuit 226 detects the load open state of the piezoelectric transformer 201 or output drop because of instantaneous power interruption or the like depending on the output voltage Vad of an A/D converter 206, a current detection pulse signal Tt output from a timing pulse generation circuit 218 and a lighting detection signal Vstate, and outputs an abnormal stop signal Voff. The abnormality detection signal Voff is usually at the H (high) level, and this abnormality detection signal Voff becomes the L (low) level at the time of abnormality. When it is detected that the abnormality detection signal Voff has the L (low) level, the output of an AND gate 225 is shifted to the L level, and the output of an output enable circuit 223 is disabled, thereby stopping the output of the drive pulse signal. At this time, by shifting the output of the AND gate 225 to the L level, the frequency data Ffreq output from a second frequency setting circuit 291 is returned to the initial frequency.

The other configurations and operations of the driving circuit of the embodiment 12 are substantially the same as those described in the above-mentioned embodiment 11.

Next, the abnormality detection method of the abnormality detection circuit 226 of the embodiment 12 will be described by referring to the accompanying drawings.

Figure 54:
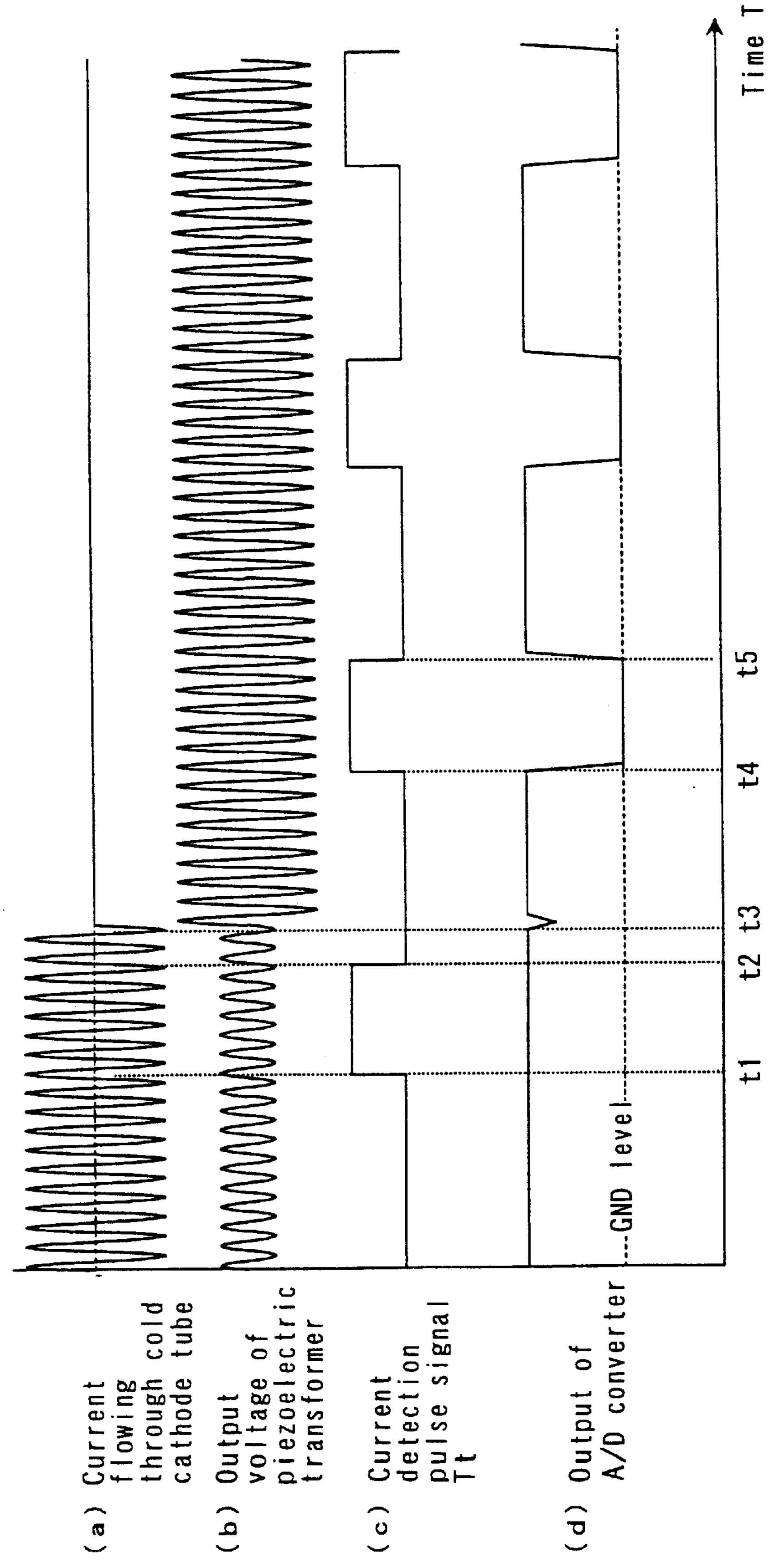
FIG. 54 is a waveform diagram showing the operation timing of the piezoelectric transformer-driving circuit of the embodiment 12.

The waveform diagram shown in FIG. 54 shows an example wherein the load of the piezoelectric transformer 201 has become an open state because of the wire breakage or short-circuit in a PC board pattern, the breakdown of the cold cathode tube 203 or the like, for example, the breakage of connection wires between the output of the piezoelectric transformer 201 and the input of the cold cathode tube 203 or the short-circuit breakdown of a current detection circuit 204. (a) of FIG. 54 shows the waveform of the current flowing through the cold cathode tube 203, and (b) shows the output voltage waveform of the piezoelectric transformer 201; and these show that a load open state has occurred at time t3 because of some cause.

When the load open state has occurred as described above, no current flows through the current detection circuit 204 as shown in (a) of FIG. 54, and the output voltage of the piezoelectric transformer 201 becomes larger as shown in (b) of FIG. 54. This condition is the same as that before the cold cathode tube 203 is lit; the output voltage Vad of the A/D converter 206 drops significantly when the current detection pulse signal Tt has the H (high) level, and becomes substantially the same level as that in the lighting state by virtue of the voltage of a voltage detection circuit 219 when the current detection pulse signal Tt has the L (low) level.

Figure 55:
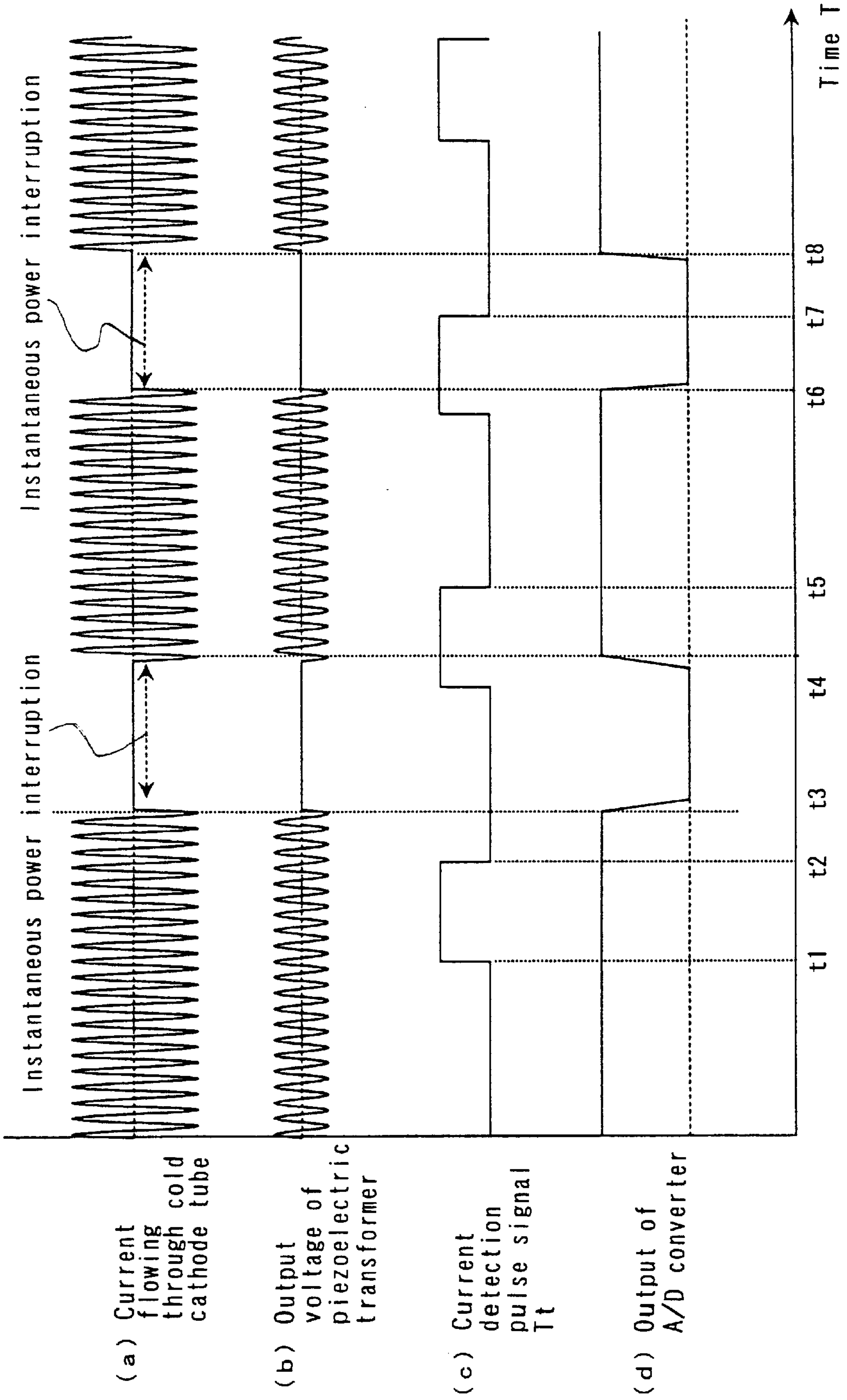
FIG. 55 is a waveform diagram showing the operation timing of the piezoelectric transformer-driving circuit of the embodiment 12.

The waveform diagram shown in FIG. 55 shows an example wherein the power supply voltage has dropped momentarily because of instantaneous power interruption. (a) of FIG. 55 shows the current waveform of the cold cathode tube 203, and (b) shows the output voltage waveform of the piezoelectric transformer 201. In this example, both the tube current of the cold cathode tube 203 and the voltage of the piezoelectric transformer 201 drop during instantaneous power interruption. Therefore, the voltage Vad output from the A/D converter 206 also drops simultaneously.

The instantaneous power interruption described herein is a state wherein only the voltage applied to the electromagnetic transformer 202 drops while the power supply voltage of the driving circuit is held. Usually, compact portable video apparatuses, such as DVC movie apparatuses and the like, have a power supply circuit inside and are configured so that the output voltage can be held in spite of some instantaneous power interruption. However, in order to reduce loss in the power conversion at the backlight, the power supply voltage for driving the cold cathode tube 203 is directly supplied from an AC adaptor in many cases. In a portable video apparatus, in the case when electric power is directly supplied via an AC adaptor instead of a battery, the apparatus is directly affected by instantaneous power interruption, and power supply stops during the interruption. In particular, the backlight power supply of a portable video apparatus is configured so that electric power is supplied directly from an AC adaptor without passing through any power supply circuit, in order to prevent efficiency drop due to use of a power supply circuit. Therefore, the backlight power supply is likely to be affected by instantaneous power interruption in comparison with the circuit portion to which electric power is supplied through a power supply circuit. Therefore, the power supply voltage of the LSI is held in the case of ordinary instantaneous power interruption; however, only the voltage for driving the cold cathode tube 203 may drop in some cases. In the electric power for home use, instantaneous power interruption of about several tens of milliseconds may occur in some cases because of the power supply circumstances in each home or each region, or thunder or the like.

As described above, in the piezoelectric transformer-driving circuit, there are two cases of abnormal states shown in FIGS. 54 and 55. In both case, stopping should desirably be carried out promptly at the time of the output open state shown in FIG. 54; when the instantaneous power interruption shown in FIG. 55 occurs, it is desired that output is stopped once to prevent the driving circuit from becoming out of control and that restart should be started promptly after the power supply voltage is restored. Therefore, it is necessary to distinguish the above-mentioned abnormal states.

In the driving circuit of the embodiment 12 of the present invention, the two abnormal states are detected on the basis of the principle described below.

If the output of the A/D converter 206 lowers significantly while the current detection pulse signal Tt has the L (low) level, both the output voltage of the piezoelectric transformer 201 and the current of the cold cathode tube 203 are lowered; therefore, this state is judged as instantaneous power interruption.

Next, when the output of the A/D converter 206 lowers significantly while the current detection pulse signal Tt has the H (high) level, it is supposed that there are two causes, that is, instantaneous power interruption and output open state. If the output of the A/D converter 206 lowers significantly in the embodiment 12, the two are distinguished depending on the detection signal Vad of the A/D converter 206 at the time when the next current detection pulse Tt shifts to the L level. This is because, in the case of an output open state, the output voltage Vad of the A/D converter 6 is restored when the next current detection pulse Tt shifts to the L level; however, usually, the voltage is not restored in the case of instantaneous power interruption. Therefore, in the driving circuit of the embodiment 12, if the detection signal Vad at the time when the next current detection pulse Tt shifts to the L level is larger than a predetermined value, it is judged that an output open state has occurred, and in other cases, it is judged that instantaneous power interruption has occurred.

Figure 53:
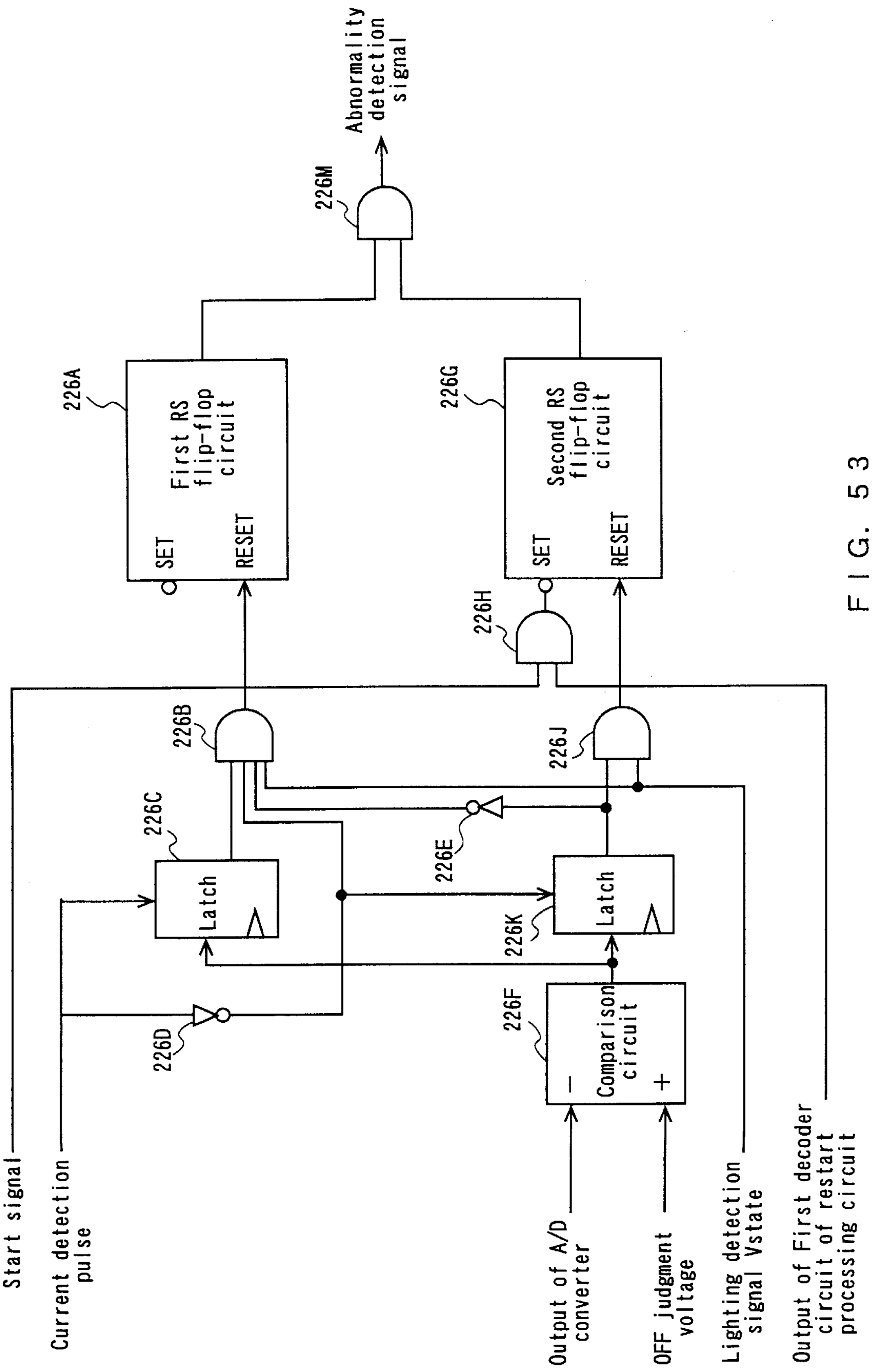
FIG. 53 is a circuit diagram showing the abnormality detection circuit of the piezoelectric transformer-driving circuit of the embodiment 12.

FIG. 53 is a block diagram showing a concrete example of the abnormality detection circuit 226 in accordance with the embodiment 12.

In FIG. 53, a comparison circuit 226F outputs an H (high) level signal if the input signal from the A/D converter 206 is lower than a predetermined value Voff; and the circuit outputs an L (low) level signal if the input signal is higher. A first RS flip-flop circuit 226A is set to output an H level signal when the start signal has the L level, and is reset at the time of open state detection, thereby outputting an L level signal. An AND gate 226B outputs an H level signal at the time of open state detection. A latch circuit 26C latches the output of the comparison circuit 226F immediately before the falling edges of the current detection pulse signal Tt and outputs it. An inverter 226D inverts the polarity of the current detection pulse signal Tt. The latch circuit 226K latches the output of the comparison circuit 226F only while the current detection pulse signal has the L level and outputs it. An inverter 226E inverts the output of the latch circuit 226K. An AND gate 226J outputs an L level signal at the time of instantaneous power interruption. An AND gate 226H outputs the logical AND of the start signal and the output signal of the first decoder circuit 224B in the restart processing circuit 224. A second RS flip-flop circuit 226G is reset at the time of instantaneous power interruption, and outputs an L level signal; and it outputs an H level signal when the start signal has the L level or when the output of the first decoder circuit 224B in the restart processing circuit 224 has the L level. An AND gate 226M outputs an L level signal when an abnormality is detected.

In the abnormality detection circuit 226 of the embodiment 12 configured as described above, the first RS flip-flop circuit 226A, the AND gate 226B, the latch circuit 226C and the comparison circuit 226F are used for open state detection; and the second RS flip-flop circuit 226G, the AND gates 226J and 226H, the latch circuit 226K and the comparison circuit 226F are used to detect instantaneous power interruption.

Next, the operation of the driving circuit of the embodiment 12 at the time of instantaneous power interruption will be described.

In the configuration of FIG. 53, when the start signal applied to the abnormality detection circuit 226 has the L level, the output signal of the second RS flip-flop circuit 226G is fixed at the H level. Furthermore, at this time, the lighting detection signal Vstate is set at the L level so that the operation for instantaneous power interruption is not carried out at the time of start; therefore, the output of the AND gate 226J becomes the L level, and the second RS flip-flop circuit 226G is not reset.

After the start signal becomes the H level, and shifting to the lighting state is performed, the output signal of the second decoder circuit 224B in the restart processing circuit 224 is fixed at the H level. Therefore, the second RS flip-flop circuit 226G is not set until the start signal becomes the L level, and the lighting detection signal Vstate becomes the H level. Therefore, after the lighting, only the output of the latch circuit 226K becomes effective.

If the output voltage Vad of the A/D converter 206 is higher than the predetermined voltage Voff, an L level signal is input to the latch circuit 226K via the comparison circuit 226F. On the other hand, if the output voltage Vad of the AID converter 206 is lower than the predetermined voltage Voff, an H level signal is input to the latch circuit 226K. If the input has the L level when the current detection pulse signal Tt has the L level, the latch circuit 226K directly outputs the L level signal to reset the second RS flip-flop circuit 226G. As a result, the output of the AND gate 226M becomes the L level, and the output operation stops once. At that time, an L level signal is output to the lighting detection circuit 221, thereby shifting the lighting detection signal Vstate to the L level. Therefore, the restart processing circuit 224 begins to operate; when the first decoder circuit 224B becomes the L level, the second RS flip-flop circuit 226G is set, and the output of the AND gate 226M becomes the H level. As a result, the output enable circuit 223 becomes enable, and driving starts. Since the subsequent operation is the same as the restart processing operation in the above-mentioned embodiment 11, its explanation is omitted. Next, the open state detection operation in the embodiment 12 will be described.

When the start signal has the L level, the output of the first RS flip-flop circuit 226A is fixed at the H level. Furthermore, when the lighting detection signal Vstate has the L level, the output of the AND gate 226B is fixed at the L level in order to prevent the open state detection operation at the time of start, whereby the first RS flip-flop circuit 226A is not reset.

After the start signal becomes the H level, and shifting to the lighting state is performed, when all the four inputs of the AND gate 226B become the H level, it is judged that an open state has occurred, whereby the first RS flip-flop circuit 226A is reset, and an L level signal is output from the AND gate 226M. As a result, driving is stopped by the output enable circuit 223.

The conditions wherein all the four inputs of the AND gate 226B become the H level as described above are based on the logic described in the above-mentioned principle. The first condition is that the output of the latch circuit 226C has the H level, in other words, that the output of the A/D converter 206 is smaller than the predetermined voltage Voff immediately before the falling edges of the current detection pulse signal Tt.

The second condition is a period during which the current detection pulse signal Tt has the L level; in this period, the output of the inverter 226D has the H level.

The third condition is that the output Vad of the A/D converter 206 is larger than the predetermined voltage Voff in the second condition, wherein the output of the inverter 226E becomes the H level.

The fourth condition is that the cold cathode tube is lighting, wherein the lighting detection signal Vstate becomes the H level.

The piezoelectric transformer-driving circuit of the embodiment 12 configured as described above is configured to promptly stop driving if connections around the cold cathode tube 203 are broken during lighting because of some cause, or if the output of the piezoelectric transformer 201 becomes an open state because the cold cathode tube 203 is broken owing to impacts. Furthermore, the driving circuit of the embodiment 12 is configured so that, at the time of instantaneous power interruption, outputting operation is stopped once, and restart begins after a predetermined time has passed after the stop; therefore, it is possible to prevent the breakdown of the piezoelectric transformer 201 and the breakdown of devices such as the power transistor 220 and the like owing to an out-of-control condition due to instantaneous power interruption.

As described above, in accordance with the configuration of the embodiment 12 of the present invention, if connections around the cold cathode tube 203 are broken during lighting because of some cause, or if the output of the piezoelectric transformer 201 becomes an open state because the cold cathode tube 203 is broken owing to impacts, the driving operation is stopped promptly; at the same time, the output operation is stopped once at the time of instantaneous power interruption, and restart begins after the predetermined time has passed after the stop. Therefore, in accordance with the driving circuit of the embodiment 12, it is possible to prevent the breakdown of the piezoelectric transformer 201 and the breakdown of devices such as the power transistor 220 and the like owing to an out-of-control condition due to instantaneous power interruption.

<<Embodiment 13 >>

Next, a piezoelectric transformer-driving circuit in accordance with embodiment 13 of the present invention will be described.

Figure 56:
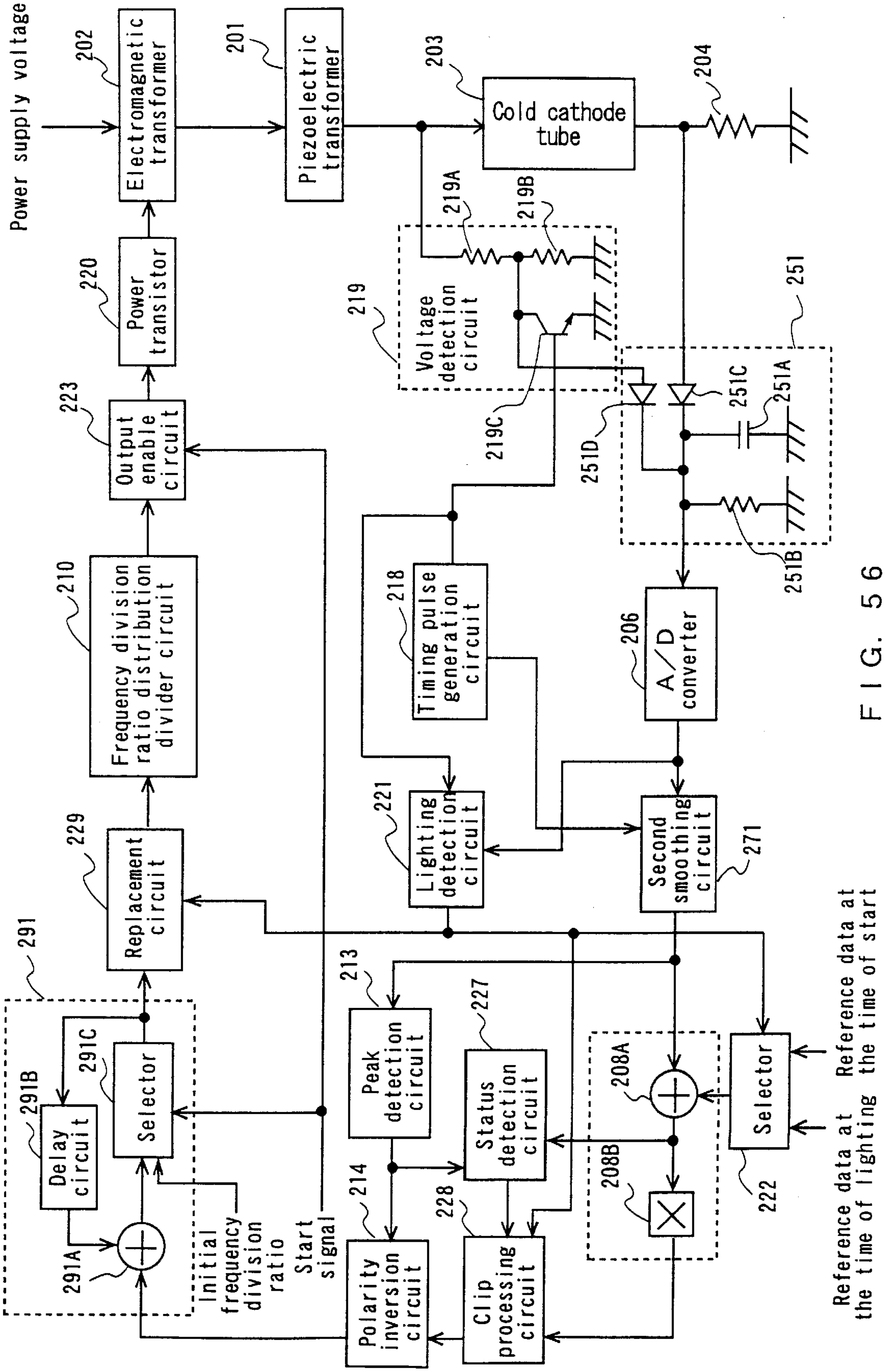
FIG. 56 is a block diagram showing the configuration of a piezoelectric transformer-driving circuit in accordance with embodiment 13 of the present invention.

FIG. 56 is a block diagram showing the configuration of the piezoelectric transformer-driving circuit of the embodiment 13 of the present invention. In FIG. 56, the components having the same functions and configurations as those of the above-mentioned embodiments are designated by the same numerals, and their explanations are omitted.

Unlike the case when a drive pulse signal is generated in an analog system, in the case when a drive pulse signal is generated in a digital system, the drive frequency becomes discrete; therefore, when the drive frequency changes, an impact, although it is slight, is applied to a piezoelectric transformer 201. In the driving circuit of the embodiment 13, a drive system is proposed wherein the change in the drive frequency during lighting control or start control is made as gentle as possible to minimize the impact. Furthermore, in the embodiment 13, a drive system is proposed to suppress flicker occurring at the time when the drive frequency changes greatly during control around the resonance point of the piezoelectric transformer 201 described in the descriptions of the above-mentioned embodiments 8 and 9.

In addition to the configuration of the above-mentioned embodiment 10 shown in FIG. 44, the driving circuit of the embodiment 13 has the peak detection circuit 213 and the polarity inversion circuit 214 shown in FIG. 35 and is provided with a function for carrying out control around the resonance point of the piezoelectric transformer 201 (hereinafter simply referred to as a peak control function). The driving circuit of the embodiment 13 is further provided with a status detection circuit 227 for detecting the state of control at the time of lighting, a clip processing circuit 228 for clipping the error voltage Verr output from an error voltage calculation circuit 208 by using a clip value depending on the state of control, and a replacement circuit 229 for replacing only the frequency division ratio distribution data in the frequency data output from a second frequency setting circuit 291 at the time of start control before lighting. Next, the status detection circuit 227, the clip processing circuit 228 and the replacement circuit 229 in the driving circuit of the piezoelectric transformer 201 of the embodiment 13 shown in FIG. 56 will be described in detail.

The status detection circuit 227 is a circuit for detecting whether the state is the peak control state or the ordinary control state at the time of lighting; in the embodiment 13, the circuit is configured to output an L level signal during ordinary control, and to output an H level signal during peak control. A concrete circuit example of the status detection circuit 227 is shown in FIG. 57.

Figure 57:
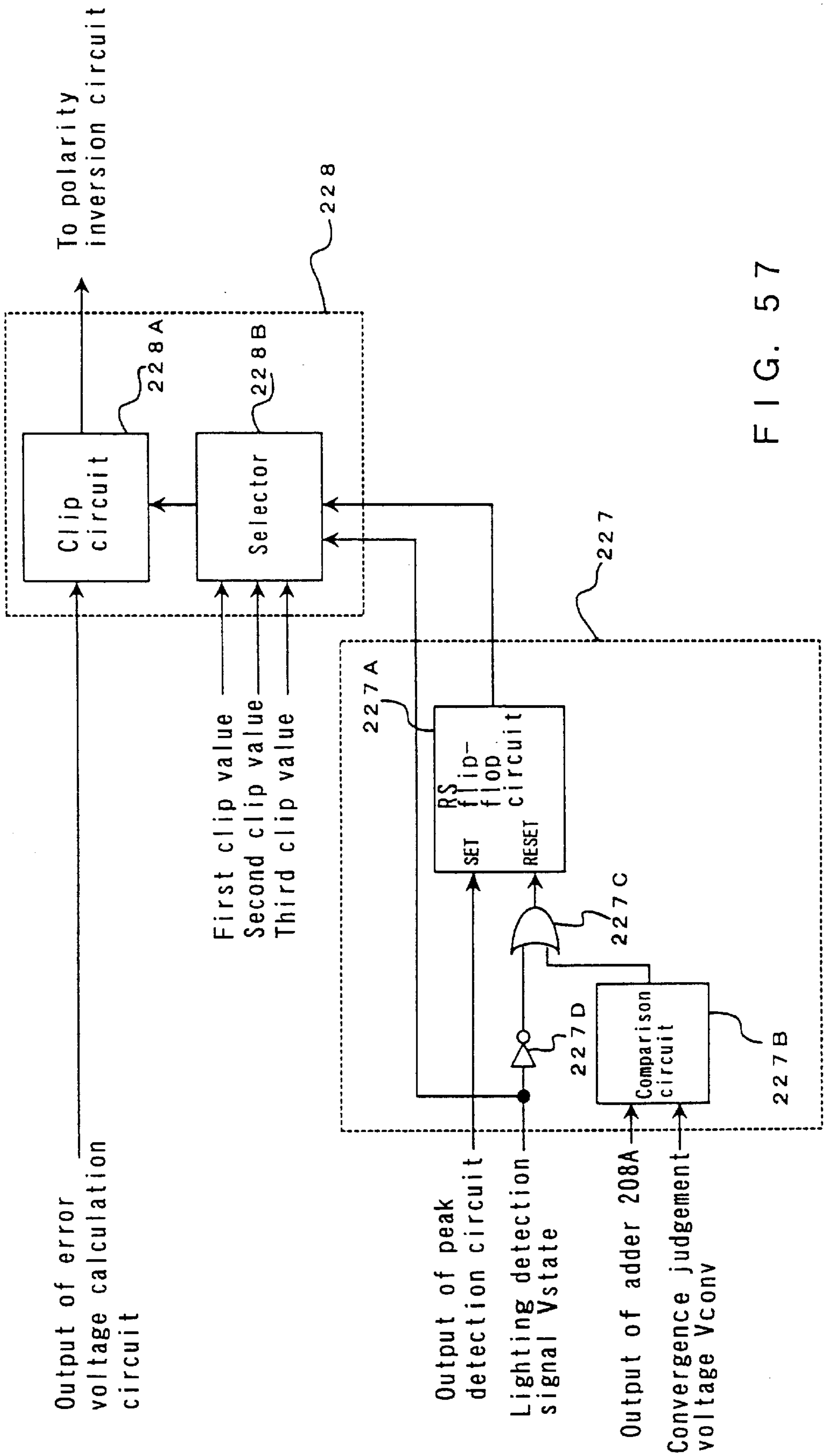
FIG. 57 is a circuit diagram showing the status detection circuit and the clipping circuit of the piezoelectric transformer-driving circuit of the embodiment 13.

In FIG. 57, a comparison circuit 227B compares the output (equivalent to the error voltage Verr) of an adder 208A with a preset convergence judgment voltage Vconv (described later); the circuit outputs an L level signal when the output of the adder 208A is larger than the convergence judgment voltage Vconv, and, on the other hand, outputs an H level signal when the output is smaller. The comparison circuit 227B judges as to whether the present current of the cold cathode tube 203 is in the conversion state, or larger or smaller than a target current. An RS flip-flop circuit 227A is reset when the lighting detection signal Vstate is in the state before lighting, that is, the L level, or when the output of the comparison circuit 227B has the H level, that is, the current of the cold cathode tube 203 is in the convergence state or larger than the target current. In addition, the RS flip-f lop circuit 227A is set when the output of the peak detection circuit 13 has the H level.

The status detection circuit 227, configured as described above, outputs an H level signal at the time of the peak control state, and outputs an L level signal at the time of ordinary control state. The clip processing circuit 228 is a circuit for clipping the value of the error voltage Verr output from the error voltage calculation circuit 208 at a predetermined value. This clip value is switched depending on the state before lighting, the peak control state and the ordinary control state after lighting. A concrete circuit example of the clip processing circuit 228 is shown in FIG. 57.

In FIG. 57, a clip circuit 228A outputs a predetermined value when the error voltage Verr is larger or smaller than a separately set predetermined value. The separately set predetermined value is output from a selector 228B.

The selector 228B has been set to output a first clip value before lighting, to output a second clip value in the case of the ordinary control state after lighting, and to output a third clip value in the case of the peak control state also after lighting.

The first clip value before lighting has been set in the clip circuit 228A, and the circuit outputs 0 when the error voltage Verr is smaller than 0. In addition, when the error voltage Verr is an error voltage having one or more frequency divisions in terms of the frequency division ratio of the drive pulse signal, it is clipped at the value of the one frequency division. For example,in the case when the frequency data Ffreq output from the second frequency setting circuit 291 has been set as 8-bit data, its high-order 4 bits are used to set a frequency division ratio, and its low-order 4 bits are used to set distribution data, and when the error voltage Verr is 16 or more, the frequency division ratio changes by 1 or more. In this case, the first clip value is set at 16 or less.

Furthermore, in the case of the second clip value, when the absolute value of the error voltage Verr is an error voltage having one or more frequency divisions in terms of the frequency division ratio of the drive pulse signal, the error voltage is clipped at the value of the one frequency division. Therefore, the clip value is set at −16 (minus 16) or more or 16 or less when the above-mentioned example is used. In addition, it is assumed that the third clip value has been set at a small value so that the change in the brightness of the backlight is almost negligible.

The clip processing circuit 228 is configured as described above; therefore, when the error voltage Verr is 0 or less before lighting, the error voltage is clipped at 0, and operation is performed so that the drive frequency does not shift in the frequency increasing direction. During the ordinary control after lighting, operation is performed so that the shift amount of the drive frequency is surely 1 frequency division or less; during the peak control, operation is performed so that the average drive frequency does not change greatly (so that the drive frequency can change only gradually), even if the absolute value of the error voltage Verr is large, that is, even if the error voltage is away from the target value.

The replacement circuit 229 of the embodiment 13 has been set to stop the distribution of the frequency division ratio before lighting. A concrete circuit example of the replacement circuit 229 is shown in FIG. 58.

Figure 58:
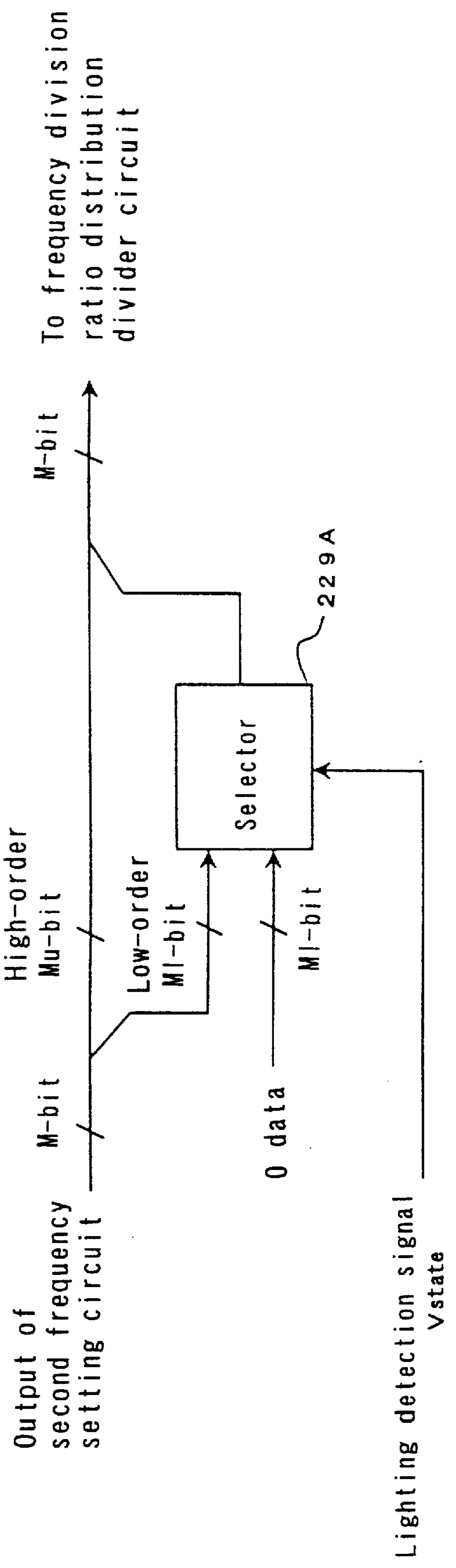
FIG. 58 is a circuit diagram showing the replacement circuit of the piezoelectric transformer-driving circuit of the embodiment 13.

In FIG. 58, when the lighting detection signal Vstate is at the L level, that is, during the start control before lighting, a selector 229A outputs 0 as distribution data to stop the distribution of the frequency division ratio. After lighting, the selector 229A selects the distribution data output from the second frequency setting circuit 291 and outputs it in order to distribute the frequency division ratio so that dimming performance can be obtained.

Other configurations and operations of the embodiment 13 are the same as those described in the above-mentioned embodiments 8 and 10; therefore, their explanations are omitted herein.

The first characteristic of the embodiment 13 is that it is configured to sensitively respond to discrete frequency change at the time of start when the load of the piezoelectric transformer is in the open state in particular. In the configuration of the embodiment 13, in order to reduce stress applied to the piezoelectric transformer as small as possible, the distribution of the frequency division ratio is stopped; when a target voltage is reached, the drive frequency is fixed and the lighting of the cold cathode tube 203 is waited. This prevents the output voltage of the piezoelectric transformer from changing owing to the fluctuation of the drive frequency around the target voltage during open control at the time of start.

The second characteristic thereof is that the change amount of the frequency division ratio during frequency control is limited to 1 or less in order to reduce the effect of abrupt frequency change on the piezoelectric transformer 201.

In addition, the third characteristic thereof is that the average frequency change amount during frequency control is decreased during peak control in order to suppress flicker owing to the large frequency change around the resonance point during peak control.

The operation having the above-mentioned first characteristic will be described by using the operation in the embodiment 13 shown in FIG. 56.

Figure 59:
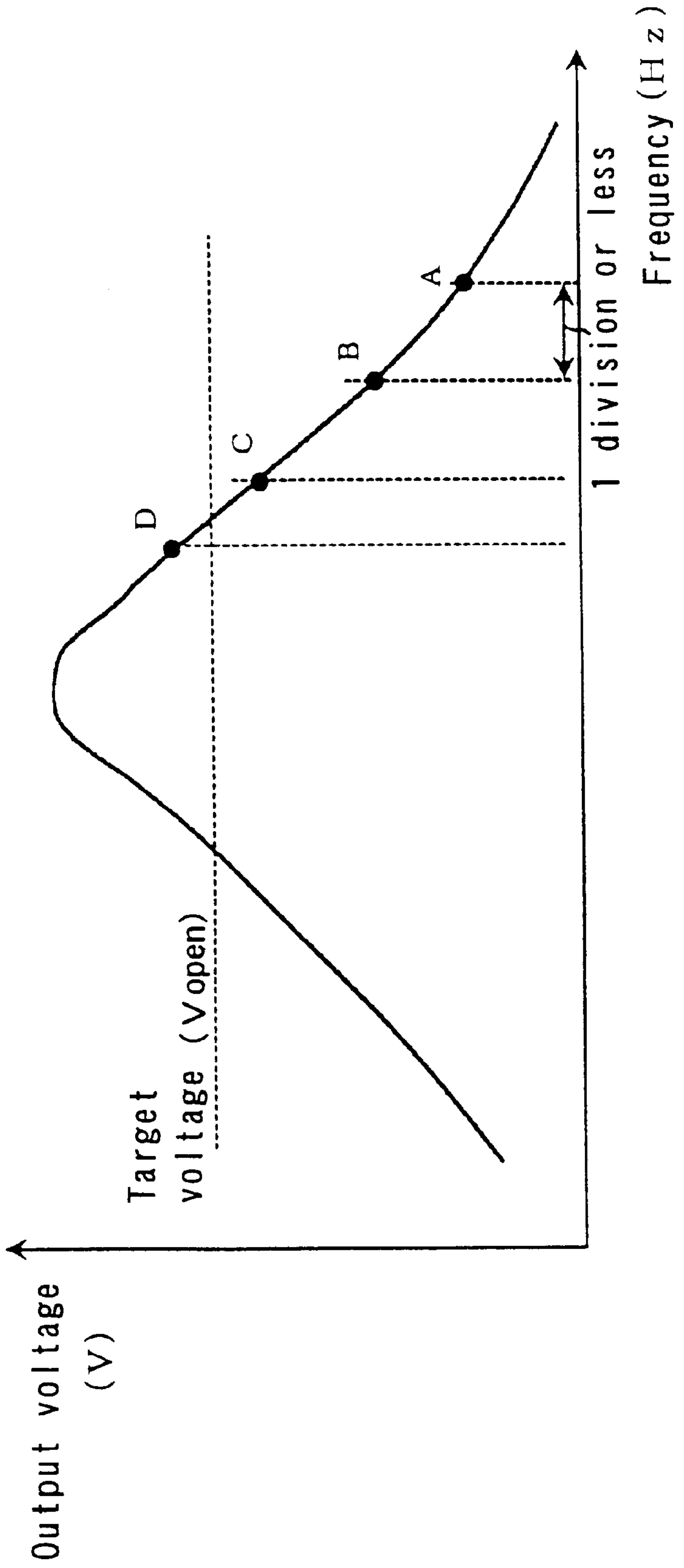
FIG. 59 is a waveform diagram illustrating the operation of the piezoelectric transformer-driving circuit of the embodiment 13.

First, the lighting detection signal Vstate has the L level during lighting start control; therefore, when the error voltage Verr is a negative value, it is clipped at 0 by the clip processing circuit 228. For this reason, the frequency does not shift in the direction wherein the frequency division ratio decreases, that is, to the high frequency side. FIG. 59 shows the relationship between the frequency and output voltage during drive control. The change of the frequency setting operation during drive control will be described by referring to FIG. 59.

First, the initial frequency at the time of start has been set at a point sufficiently higher than the resonance frequency of the piezoelectric transformer 201. This setting point is assumed to be point A. Starting from the voltage at the point A, the output voltage rises gradually to point B and then point C; when the voltage exceeds the target voltage Vopen and reaches point D, the error voltage Verr has a negative value. Therefore, the clip processing circuit 228 clips the error voltage Verr at 0, whereby the same frequency as the previous drive frequency is obtained, the voltage is held at the voltage of the point D, and the lighting of the cold cathode tube 203 is waited. At the time of start, the operation for stopping the distribution of the frequency division ratio is carried out as described with respect to the above-mentioned replacement circuit 229.

Next, the operation having the above-mentioned second characteristic will be described. In FIG. 59, the error voltage Verr is added to the output voltage at the drive frequency of the point A, whereby the drive frequency of the point B is determined. When the error voltage Verr to be added is large at this time, the frequency changes abruptly; therefore, when the error voltage Verr is larger than the value of one frequency division, it is clipped to the data corresponding to the one frequency division by the clip processing circuit 228, thereby preventing the abrupt change of the frequency. This clip processing is also performed similarly after lighting. However, the current flowing through the cold cathode tube 203 may change from a larger value to a smaller value after lighting, for example when the brightness is lowered by dimming or the like; therefore, clipping is carried out so that the absolute value of the error voltage Verr is equal to the clip value.

Figure 60:
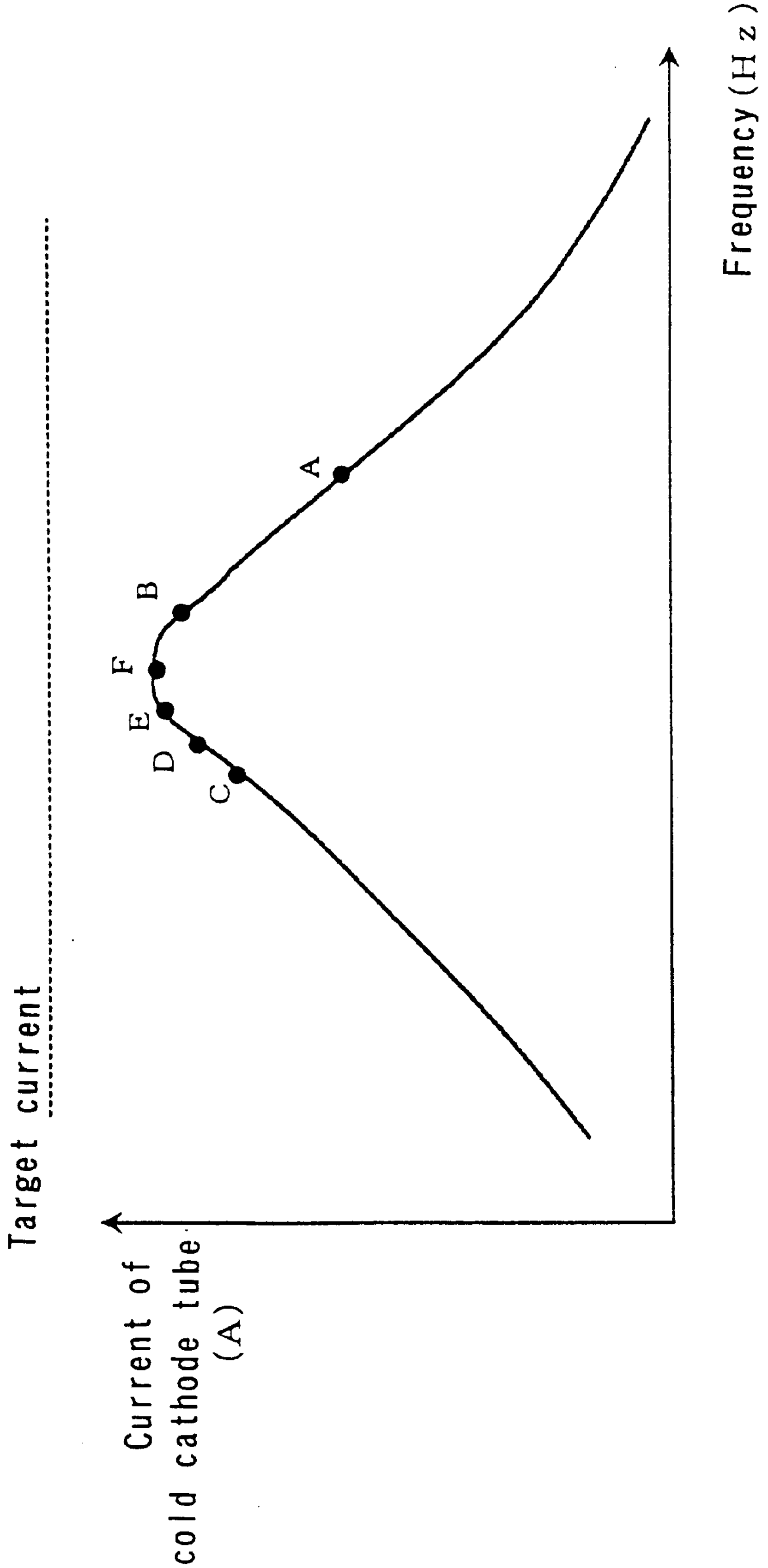
FIG. 60 is a waveform diagram illustrating the operation of the piezoelectric transformer-driving circuit of the embodiment 13.

Next, the operation having the third characteristic will be described. FIG. 60 is a characteristic curve showing the tube current of the cold cathode tube 203 with respect to the drive frequency and shows a case wherein the tube current of the cold cathode tube 203 is smaller than a target current.

When the operation point is point A in FIG. 60, the drive frequency shifts to the low frequency side in order to bring the voltage close to the target voltage. When the frequency has shifted to point B and then point C, control is shifted to peak control as described in the above-mentioned embodiment 8. At this time, the output voltage of the peak detection circuit 213 shifts to the H (high) level; therefore, an H level signal is output from the status detection circuit 227, and the clip value is switched from a second clip value to a third clip value. For this reason, the movement amount from the point C to the point D becomes small; furthermore, the frequency shifts to point E and then point F. Therefore, control is carried out near the resonance point, and the amount of current change decreases, whereby flicker occurrence is decreased significantly.

In the case when the target current becomes smaller than the present current hereafter by decreasing the target current for example, an H (high) level signal is output from the comparison circuit 227B, thereby resetting the RS flip-flop circuit 227A. As a result, an L (low) level signal is output from the status detection circuit 227, and the clip value is shifted to the original value, that is, the second clip value. For this reason, it is possible to carry out prompt shifting to the target current.

In the embodiment 13, the distribution of the frequency division ratio at the time of start is stopped, abrupt frequency change is prevented, and the increment of frequency change is decreased during peak control by using the station detection circuit 227, the clip processing circuit 228 and the displacement circuit 229 as described above. Therefore, it is possible to attain significant effects of reducing stress to the piezoelectric transformer 201 and of preventing flicker during peak control.

In addition, in the embodiment 13 of the present invention, the distribution of the frequency division ratio at the time of start is stopped, abrupt frequency change is prevented, and the increment of frequency change is decreased during peak control. Therefore, the driving circuit of the embodiment 13 has significant effects of reducing stress to the piezoelectric transformer 201 and of preventing flicker during peak control.

Furthermore, each of the driving circuits shown in the above-mentioned embodiments has a drive system suited for digital LSI formation; by combining the drive system with a liquid crystal controller and the like to form one chip, the number of parts can be reduced significantly. Therefore, it is expected to have an effect of making compact video apparatuses more compact. Furthermore, the present invention has taken effective countermeasures with respect to various protection functions and the like to prevent the problem of power supply voltage fluctuation, a problem to be solved for practical use, and to prevent worst conditions; therefore, the piezoelectric transformer-driving circuit of the present invention is significantly effective for practical use.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The piezoelectric transformer-driving circuit in accordance with the present invention is used to drive a cold cathode tube for the backlight of a liquid crystal display monitor and so on, and used also for personal computers (PC), liquid crystal television sets, a VCR integrated with a camera with liquid crystal display and so on. In particular, the piezoelectric transformer-driving circuit in accordance with the present invention employs a digital system; therefore, it can be formed into one chip together with other LSIs, and space saving is attainable, thereby being particularly effective for a VCR integrated with a camera, a digital camera, etc., required to be made ultra-compact. Furthermore, since the driving circuit employs the digital system, information exchange to a microcomputer system is made easy, and advanced dimming control and the like can be attained; therefore, automatic dimming depending on the video scene and ambient brightness can also be obtained at performance higher than that of conventional dimming control.

What is claimed is:

1. A piezoelectric transformer-driving circuit comprising:

a piezoelectric transformer which is supplied with a controlled current to be supplied to a cold cathode tube and driven at the frequency of a drive pulse signal, a current detector for detecting a load current flowing through said cold cathode tube, a rectifying circuit for converting a sine wave like AC voltage obtained from said current detector into a substantially DC voltage, an A/D converter for converting the voltage signal rectified by said rectifying circuit into a digital signal, an error voltage calculation circuit for multiplying the difference data between the output data of said A/D converter and reference data supplied externally by a constant and for outputting the result as error data, a frequency setting circuit for setting the frequency of said drive pulse signal of said piezoelectric transformer as M-bit data (M: an integer) depending on said error data, a divider circuit for dividing a clock having a predetermined frequency at a predetermined frequency division ratio to generate said drive pulse signal of said piezoelectric transformer, for distributing said frequency division ratio for the period of N cycles (N: an integer) of said drive pulse signal of said piezoelectric transformer and for carrying out control so that the average frequency division ratio for said period of N cycles is substantially equal to the value obtained by dividing said M-bit data output from said frequency setting circuit by N, and a power transistor for driving said piezoelectric transformer.

2. A piezoelectric transformer-driving circuit comprising:

a piezoelectric transformer supplied with a controlled current to be supplied to a cold cathode tube and driven at the frequency of a drive pulse signal, a current detector for detecting a load current flowing through said cold cathode tube, a rectifying circuit for converting a sine wave like AC voltage obtained from said current detector into a substantially DC voltage, an A/D converter for converting the voltage signal rectified by said rectifying circuit into a digital signal, an error voltage calculation circuit for multiplying the difference data between the output data of said A/D converter and reference data supplied externally by a constant and for outputting the result as error data, a frequency setting circuit for setting the frequency of said drive pulse signal of said piezoelectric transformer as M-bit data (M: an integer) depending on said error data, a divider circuit for dividing a clock having a predetermined frequency to generate said drive pulse signal of said piezoelectric transformer, and a power transistor for driving said piezoelectric transformer, wherein the frequency division ratio of said divider circuit is distributed for the period of predetermined cycles, and the frequency division ratio at the $(A0\cdot 2^0+A1\cdot 2^1+\ldots+An-1\cdot 2^{n-1})$th cycle (wherein, in the above-mentioned expression, Ax represented by A0, A1, . . . , An−1 is a numerical value, 0 or 1) is given from the low-order n-bit data $(B0\cdot 2^0+B1\cdot 2^1+\ldots+Bn-1\cdot 2^{n-1}$; wherein in the above-mentioned expression, Bx represented by B0, B1, . . . , Bn−1 is a numerical value, 0 or 1) and the high-order m-bit data C (C: a decimal number) of the M-bit data output from said frequency setting circuit by the following expression (1):

$$\{A0\cdot Bn-1+\overline{A0}\cdot A1\cdot Bn-2+\ldots+\overline{A0}\cdot\overline{A1}\cdot\ldots\cdot\overline{An-2}\cdot An-1\cdot B0\}+C \quad (1).$$

3. A piezoelectric transformer-driving circuit comprising:

a piezoelectric transformer supplied with a controlled current to be supplied to a cold cathode tube and driven at the frequency of a drive pulse signal, a current detector for detecting a load current flowing through said cold cathode tube, a rectifying circuit for converting a sine wave like AC voltage obtained from said current detector into a substantially DC voltage, an A/D converter for converting the rectified voltage signal into a digital signal by using a predetermined sampling clock, a smoothing circuit for smoothing the output data of said A/D converter in a predetermined cycle, an error voltage calculation circuit for multiplying the difference data between the output data of said smoothing circuit and reference data supplied externally by a constant and for outputting the result as error data, a frequency setting circuit for setting the frequency of said drive pulse signal of said piezoelectric transformer as M-bit data depending on said error data, a divider circuit for dividing a clock having a predetermined frequency to generate said drive pulse signal of said piezoelectric transformer, and a power transistor for driving said piezoelectric transformer.

4. A piezoelectric transformer-driving circuit in accordance with claim 3, further comprising:

a smoothing circuit including a plurality of smoothing circuits having the same smoothing cycle and different smoothing phases, and a selector circuit for switching the output of said plurality of smoothing circuits and for outputting the output at predetermined timing to said error voltage calculation circuit in order to output the newest smooth data.

5. A piezoelectric transformer-driving circuit in accordance with claim 3, wherein said frequency division ratio of said divider circuit is distributed for the period of N cycles (N: an integer) of said drive pulse signal of said piezoelectric transformer, the average frequency division ratio for said period of N cycles is set so as to be substantially equal to the value obtained by dividing said M-bit data (M: an integer) output from said frequency setting circuit by N, and the smoothing cycle of said smoothing circuit is an integral multiple of the N cycles of said drive pulse signal.

6. A piezoelectric transformer-driving circuit in accordance with claim 3, wherein the frequency division ratio of said divider circuit is distributed for the period of N cycles of said drive pulse signal of said piezoelectric transformer, and the frequency division ratio at the $(A0\cdot 2^0+A1\cdot 2^1+\ldots+An-1\cdot 2^{n-1})$th cycle (wherein, in the above expression, Ax represented by A0, A1, . . . , An−1 is a numerical value, 0 or 1) is given from the low-order n-bit data $(B0\cdot 2^0+B1\cdot 2^1+\ldots+Bn-1\cdot 2^{n-1}$; wherein in the above-mentioned expression, Bx represented by B0, B1, . . . , Bn−1 is a numerical value, 0 or 1) and the high-order m-bit data C (C: a decimal number) of the M-bit data output from said frequency setting circuit by the following expression (2):

$$\{A0\cdot Bn-1\cdot\overline{A0}\cdot A1\cdot Bn-2+\ldots+\overline{A0}\cdot\overline{A1}\cdot\ldots\cdot\overline{An-2}\cdot An-1\cdot B0\}+C \quad (2)$$

and the smoothing cycle of said smoothing circuit is an integral multiple of the N cycles of said drive pulse signal.

7. A piezoelectric transformer-driving circuit comprising:

a piezoelectric transformer supplied with a controlled current to be supplied to a cold cathode tube and driven at the frequency of a drive pulse signal, a current detector for detecting a load current flowing through said cold cathode tube, a half-wave rectifying circuit for half-wave rectifying a sine wave like AC voltage obtained from said current detector, a comparator for comparing the half-wave rectified voltage signal with a predetermined reference voltage and for outputting "H" level data or "L" level data, a pulse width detection circuit for detecting the pulse width of the output data of said comparator, a smoothing circuit for smoothing the pulse width data output from said pulse width detection circuit in a predetermined cycle, an error voltage calculation circuit for multiplying the difference data between the output data of said smoothing circuit and reference data supplied externally by a constant and for outputting the result as error data, a frequency setting circuit for multiplying the output data of said smoothing circuit by a constant and for setting the frequency of said drive pulse signal of said piezoelectric transformer as M-bit data (M: an integer), a divider circuit for dividing a clock having a predetermined frequency to generate said drive pulse signal of said piezoelectric transformer, and a power transistor for driving said piezoelectric transformer.

8. A piezoelectric transformer-driving circuit in accordance with claim 3, comprising:

a smoothing portion including a plurality of smoothing circuits having the same smoothing cycle and different smoothing phases, and a selector circuit for switching the output of said plurality of smoothing circuits and for outputting the output at predetermined timing to said error voltage calculation circuit in order to output the newest smooth data.

9. A piezoelectric transformer-driving circuit in accordance with claim 7, wherein said frequency division ratio of said divider circuit is distributed for the period of N cycles (N: an integer) of said drive pulse signal of said piezoelectric transformer, the average frequency division ratio for said period of N cycles is set so as to be substantially equal to the value obtained by dividing said M-bit data (M: an integer) output from said frequency setting circuit by N, and the smoothing cycle of said smoothing circuit is an integral multiple of the N cycles of said drive pulse signal.

10. A piezoelectric transformer-driving circuit in accordance with claim 7, wherein the frequency division ratio of said divider circuit is distributed for the period of N cycles of said drive pulse signal of said piezoelectric transformer, and the frequency division ratio at the ($A0 \cdot 2^0 + A1 \cdot 2^1 + \ldots + An-1 \cdot 2^{n-1}$)th cycle (wherein, in the above expression, Ax represented by A0, A1, . . . , An−1 is a numerical value, 0 or 1) is given from the low-order n-bit data ($B0 \cdot 2^0 + B1 \cdot 2^1 + \ldots + Bn-1 \cdot 2^{n-1}$; wherein in the above-mentioned expression, Bx represented by B0, B1, . . . , Bn−1 is a numerical value, 0 or 1) and the high-order m-bit data C (C: a decimal number) of the M-bit data output from said frequency setting circuit by the following expression (3):

$$\{A0 \cdot Bn-1 + \overline{A0} \cdot A1 \cdot Bn-2 + \ldots + \overline{A0} \cdot \overline{A1} \cdot \ldots \cdot \overline{An-2} \cdot An-1 \cdot B0\} + C \quad (3)$$

and the smoothing cycle of said smoothing circuit is an integral multiple of the N cycles of said drive pulse signal.

11. A piezoelectric transformer-driving circuit comprising:

a piezoelectric transformer supplied with a controlled current to be supplied to a cold cathode tube and driven at the frequency of a drive pulse signal, a current detector for detecting a load current flowing through said cold cathode tube, a rectifying circuit for converting a sine wave like AC voltage obtained from said current detector into a substantially DC voltage, a comparator for comparing the rectified voltage signal with a predetermined reference voltage and for outputting "H" level data or "L" level data, a counter circuit for counting the output data of said comparator for a predetermined period, a smoothing circuit for smoothing the count data output from said counter circuit in a predetermined cycle, a selector circuit for selecting the output data of said smoothing circuit or the output data of said counter circuit and for outputting the selected data, an error voltage calculation circuit for multiplying the difference data between the output data of said selector circuit and reference data supplied externally by a constant and for outputting the result as error data, a frequency setting circuit for setting the frequency of said drive pulse signal of said piezoelectric transformer as M-bit data (M: an integer) depending on said error data, a divider circuit for dividing a clock having a predetermined frequency to generate said drive pulse signal of said piezoelectric transformer, and a power transistor for driving said piezoelectric transformer.

12. A piezoelectric transformer-driving circuit in accordance with claim 11, wherein said frequency division ratio of said divider circuit is distributed for the period of N cycles (N: an integer) of said drive pulse signal of said piezoelectric transformer, the average frequency division ratio for said period of N cycles is set so as to be substantially equal to the value obtained by dividing said M-bit data (M: an integer) output from said frequency setting circuit by N, and the smoothing cycle of said smoothing circuit is an integral multiple of the N cycles of said drive pulse signal.

13. A piezoelectric transformer-driving circuit in accordance with claim 11, wherein the frequency division ratio of said divider circuit is distributed for the period of N cycles (N: an integer) of said drive pulse signal of said piezoelectric transformer, and the frequency division ratio at the ($A0 \cdot 2^0 + A1 \cdot 2^1 + \ldots + An-1 \cdot 2^{n-1}$)th cycle(wherein, in the above expression, Ax represented by A0, A1, . . . , An−1 is a numerical value, 0 or 1) is given from the low-order n-bit data ($B0 \cdot 2^0 + B1 \cdot 2^1 + \ldots + Bn-1 \cdot 2^{n-1}$; wherein in the above-mentioned expression, Bx represented by B0, B1, . . . , Bn−1 is a numerical value, 0 or 1) and the high-order m-bit data C (C: a decimal number) of the M-bit data (M: an integer) output from said frequency setting circuit by the following expression (4):

$$\{A0 \cdot Bn-1 + \overline{A0} \cdot A1 \cdot Bn-2 + \ldots + \overline{A0} \cdot \overline{A1} \cdot \ldots \cdot \overline{An-2} \cdot An-1 \cdot B0\} + C \quad (4)$$

and the smoothing cycle of said smoothing circuit is an integral multiple of the N cycles of said drive pulse signal.

14. A piezoelectric transformer-driving circuit, wherein the output voltage thereof is changed by changing the frequency of a drive pulse signal to control the current flowing through a cold cathode tube, comprising:

a current detection circuit for detecting a load current, a rectifying circuit for converting a sine wave like voltage obtained from said current detection circuit into a DC voltage, an A/D converter for converting the rectified voltage signal into a digital signal, an error voltage calculation circuit for multiplying the difference data between the output data of said A/D converter and reference data supplied externally by a constant and for outputting the result as error data, a frequency setting circuit for setting the frequency of said drive pulse signal of said piezoelectric transformer as M-bit data depending on said error data, a divider circuit for performing frequency division at the positive edges of a clock having a predetermined frequency to generate said drive pulse signal of said piezoelectric transformer, a reverse-edge processing circuit for latching the output pulse signal of said divider circuit at the reverse edges of said clock and for outputting the latched signal, a selector for selecting the drive pulse signal output from said divider circuit or the drive pulse signal output from said reverse-edge processing circuit and for outputting said selected pulse signal, and a power transistor for driving said piezoelectric transformer, wherein the frequency division ratio of said divider circuit is distributed for the period of N cycles of said drive pulse signal of said piezoelectric transformer so that the average frequency division ratio for said period of N cycles is substantially equal to the value obtained by dividing the M-bit data output from said frequency setting circuit by N and so that the fluctuation of the frequency division ratio for said period of N cycles is one or less.

15. A piezoelectric transformer-driving circuit in accordance with claim 14, wherein the frequency division ratio of said divider circuit is given by the sum of data Div given by the high-order Mu bits in the M-bit data output from said frequency setting circuit and the output data of said distribution circuit having been set so that data A given by the low-order M−Mu bits in the M-bit data is used to output an H (high) signal A times for the period of cycles N (=2M−Mu) of said drive pulse signal of said piezoelectric transformer.

16. A piezoelectric transformer-driving circuit in accordance with claim 15, wherein said selector outputs the drive pulse signal output from said reverse-edge processing circuit when the output of said distribution circuit is an H (high) signal, or outputs the drive pulse signal output from said divider circuit when the output of said distribution circuit is an L (low) signal.

17. A piezoelectric transformer-driving circuit in accordance with claim 15, wherein said distribution circuit outputs an H (high) signal so as to distribute said signal at even-numbered times or odd-numbered times for the period of N (=2M−Mu) cycles when said data A of said low-order M−Mu bits output from said frequency setting circuit is smaller than 2M−Mu/2.

18. A piezoelectric transformer-driving circuit, wherein the output voltage thereof is changed by changing the frequency of a drive pulse signal to control the current flowing through a cold cathode tube, comprising:

a current detection circuit for detecting a load current, a rectifying circuit for converting a sine wave like voltage obtained from said current detection circuit into a DC voltage, an A/D converter for converting the rectified voltage signal into a digital signal, an error voltage calculation circuit for multiplying the difference data between the output data of said A/D converter and reference data supplied externally by a constant and for outputting the result as error data, a peak detection circuit for holding the output data of said A/D converter for a predetermined period and for comparing the output data with previous data to detect the resonance point of said piezoelectric transformer, a polarity inversion circuit for inverting the polarity of said error data depending on the output data of said peak detection circuit, a frequency setting circuit for setting the frequency of said drive pulse signal of said piezoelectric transformer by adding the output data of said polarity inversion circuit to the previous frequency setting value, a divider circuit for dividing a clock having a predetermined frequency at a frequency division ratio depending on the output data of said frequency setting circuit to generate said drive pulse signal of said piezoelectric transformer, and a power transistor for driving said piezoelectric transformer.

19. A piezoelectric transformer-driving circuit in accordance with claim 18, wherein the output data of said peak detection circuit is reset when the output data of said A/D converter is larger than said reference data or when the absolute value of the output data of said error voltage calculation circuit is smaller than a predetermined value, and the polarity of the previous output value of said peak detection circuit is inverted when the output data of said A/D converter is smaller than said reference data and also smaller than the previous output data of said A/D converter.

20. A piezoelectric transformer-driving circuit in accordance with claim 18, wherein the frequency division ratio of said divider circuit is distributed for the period of N cycles of said drive pulse signal.

21. A piezoelectric transformer-driving circuit in accordance with claim 18, further comprising a smoothing circuit for averaging the output data of said A/D converter for the period of N cycles of said drive pulse signal and for outputting the result to said error voltage calculation circuit.

22. A piezoelectric transformer-driving circuit, wherein the output voltage thereof is changed by changing the frequency of a drive pulse signal to control the current flowing through a cold cathode tube, comprising:

a current detection circuit for detecting a load current, a rectifying circuit for converting a sine wave like voltage obtained from said current detection circuit into a DC voltage, A/D converter for converting the rectified voltage signal into a digital signal, an error voltage calculation circuit for multiplying the difference data between the output data of said A/D converter and reference data supplied externally by a constant and for outputting the result as error data, a peak detection circuit for holding the output data of said A/D converter for a predetermined period and for comparing the output data with previous data to detect the resonance point of said piezoelectric transformer, a frequency setting circuit for adding said error data to the previous frequency setting data and for outputting the result, a selector for selecting the output of said frequency setting circuit or the frequency setting data at the previous N-th time and for outputting the selected data as the frequency setting data of said drive pulse signal of said piezoelectric transformer, a divider circuit for dividing a clock having a predetermined frequency at a frequency division ratio depending on the output data of said selector to generate said drive pulse signal of said piezoelectric transformer, and a power transistor for driving said piezoelectric transformer.

23. A piezoelectric transformer-driving circuit in accordance with claim 22, wherein the frequency division ratio of said divider circuit is distributed for the period of N cycles of said drive pulse signal.

24. A piezoelectric transformer-driving circuit in accordance with claim 22, further comprising a smoothing circuit for averaging the output data of said A/D converter for the period of N cycles of said drive pulse signal and for outputting the result to said error voltage calculation circuit.

25. A piezoelectric transformer-driving circuit in accordance with claim 22, wherein the output data of said peak detection circuit is reset when the output data of said A/D converter is larger than said reference data or when the absolute value of the output data of said error voltage calculation circuit is smaller than a predetermined value, and is set when the output data of said A/D converter is smaller than said reference data and also smaller than the previous output data of said A/D converter.

26. A piezoelectric transformer-driving circuit, wherein the output voltage thereof is changed by changing the frequency of a drive pulse signal to control the current flowing through a cold cathode tube, comprising:

a current detection circuit for detecting a load current, a voltage detection circuit for detecting the output voltage of said piezoelectric transformer, a rectifying circuit for detecting the sine wave like voltage obtained from said current detection circuit or the sine wave like voltage obtained from said voltage detection circuit, whichever larger, and for converting the voltage into a DC voltage, a turning-off circuit for periodically turning off the output of said voltage detection circuit for a predetermined period, an A/D converter for converting the rectified voltage signal into a digital signal, a lighting detection circuit for detecting the output voltage of said A/D converter at the time when said turning-off circuit is on and for judging the lighting of said cold cathode tube, an error voltage calculation circuit for multiplying the difference data between the output data of said A/D converter and reference data supplied externally by a constant and for outputting the result as error data, a selector for selecting said reference data at the time of lighting or said reference data at the time of start and for outputting the selected data, a frequency setting circuit for setting an initial frequency at the time of start and for adding said error data to the previous frequency setting data and outputting the result at the next time and thereafter, a divider circuit for dividing a clock having a predetermined frequency at a frequency division ratio depending on the output data of said frequency setting circuit to generate said drive pulse signal of said piezoelectric transformer, and a power transistor for driving said piezoelectric transformer, wherein the frequency of said drive pulse signal of said piezoelectric transformer is held constant at the time when said turning-off circuit is on.

27. A piezoelectric transformer-driving circuit in accordance with claim 26, further comprising a distribution circuit for distributing the frequency division ratio of said divider circuit for the period of N cycles of said drive pulse signal, wherein said distribution circuit operates only during lighting.

28. A piezoelectric transformer-driving circuit in accordance with claim 26, further comprising a smoothing circuit for averaging the output data of said A/D converter for the period of N cycles of said drive pulse signal and for outputting the result to said error voltage calculation circuit.

29. A piezoelectric transformer-driving circuit in accordance with claim 28, wherein the output of said smoothing circuit is held constant when said turning-off circuit is on in order to set the frequency of the drive pulse signal output from said divider circuit constant.

30. A piezoelectric transformer-driving circuit, wherein the output voltage thereof is changed by changing the frequency of a drive pulse signal to control the current flowing through a cold cathode tube, comprising:

a current detection circuit for detecting a load current, a rectifying circuit for detecting the sine wave like voltage obtained from said current detection circuit and for converting the voltage into a DC voltage, an A/D converter for converting the rectified voltage signal into a digital signal, a lighting detection circuit for detecting the output voltage of said A/D converter and for judging the lighting of said cold cathode tube, an error voltage calculation circuit for multiplying the difference data between the output data of said A/D converter and reference data supplied externally by a constant and for outputting the result as error data, a frequency setting circuit for setting an initial frequency at the time of start and for adding said error data to the previous frequency setting data and outputting the result at the next time and thereafter, a divider circuit for dividing a clock having a predetermined frequency at a frequency division ratio depending on the output data of said frequency setting circuit to generate said drive pulse signal of said piezoelectric transformer, an output enable circuit for controlling the output of said drive pulse signal output from said divider circuit, a power transistor for driving said piezoelectric transformer, and a restart processing circuit that disables said output enable circuit if said lighting detection circuit does not judge that lighting is attained even after a predetermined period has passed and sets the frequency setting data output from said frequency setting circuit at an initial frequency to perform restart processing.

31. A piezoelectric transformer-driving circuit in accordance with claim 30, further comprising a voltage detection circuit for detecting the output voltage of said piezoelectric transformer, and a turning-off circuit for periodically turning off the output of said voltage detection circuit for a predetermined period, wherein said rectifying circuit detects the sine wave like voltage obtained from said current detection circuit or the sine wave like voltage obtained from said voltage detection circuit, whichever larger, converts the voltage into a DC voltage, and carries out lighting detection when said turning-off circuit is on.

32. A piezoelectric transformer-driving circuit In accordance with claim 30, wherein said restart processing circuit stops outputting if said lighting detection circuit does not judge that lighting is attained even when restart processing is performed a preset number of times.

33. A piezoelectric transformer-driving circuit in accordance with claim 30, wherein said restart circuit comprises a first counter circuit for carrying out counting in a predetermined cycle, for switching the frequency data of said frequency setting circuit to an initial value when the counter value thereof reaches a predetermined value and for outputting a reset signal for disabling said output enable circuit, and a second counter circuit for counting the reset signal output from said counter circuit, for disabling said output enable circuit when the counter value thereof reaches a predetermined value, and for stopping counting the counter value.

34. A piezoelectric transformer-driving circuit, wherein the output voltage thereof is changed by changing the frequency of a drive pulse signal to control the current flowing through a cold cathode tube, comprising:

a current detection circuit for detecting a load current, a voltage detection circuit for detecting the output voltage of the piezoelectric transformer, a rectifying circuit for detecting the sine wave like voltage obtained from said current detection circuit or the sine wave like voltage obtained from said voltage detection circuit, whichever larger, and for converting the voltage into a DC voltage, a turning-off circuit for periodically turning off the output of said voltage detection circuit for a predetermined period, an A/D converter for converting the rectified voltage signal into a digital signal, an error voltage calculation circuit for multiplying the difference data between the output data of said A/D converter and reference data supplied externally by a constant and for outputting the result as error data, a frequency setting circuit for setting an initial frequency at the time of start and for adding said error data to the previous frequency setting data and outputting the result at the next time and thereafter, a divider circuit for dividing a clock having a predetermined frequency at a frequency division ratio depending on the output data of said frequency setting circuit to generate the drive pulse signal of said piezoelectric transformer, an output enable circuit for controlling the output of said drive pulse signal output from said divider circuit, an abnormality detection circuit for detecting the output voltage A of said A/D converter when said turning-off circuit is on or for detecting the output voltage B of said A/D converter when said turning-off circuit is off, a protection circuit having functions for outputting a reset signal used to switch the frequency data of said frequency setting circuit to said initial frequency for a predetermined period and to disable said output enable circuit when said output voltage B is less than a predetermined level and for disabling the output enable circuit to stop outputting when the output voltage A is less than said predetermined level and the output voltage B is not less than said predetermined level, and a power transistor for driving said piezoelectric transformer.

35. A piezoelectric transformer-driving circuit, wherein the output voltage thereof is changed by changing the frequency of a drive pulse signal to control the current flowing through a cold cathode tube, comprising:

a current detection circuit for detecting a load current, a rectifying circuit for converting the sine wave like voltage obtained from said current detection circuit into a DC voltage, an A/D converter for converting the rectified voltage signal into a digital signal, an error voltage calculation circuit for multiplying the difference data between the output data of said A/D converter and reference data supplied externally by a constant and for outputting the result as error data, a clip circuit for clipping said error data value in a predetermined range, a frequency setting circuit for adding the output data of said clip circuit to the previous frequency setting data and for outputting the result as the frequency setting data of said drive pulse signal of said piezoelectric transformer, a divider circuit for dividing a clock having a predetermined frequency at a frequency division ratio depending on said frequency setting data to generate said drive pulse signal of said piezoelectric transformer, and a power transistor for driving said piezoelectric transformer.

36. A piezoelectric transformer-driving circuit in accordance with claim 35, further comprising a peak detection circuit for holding the output data of said A/D converter for a predetermined period and for comparing the output data with previous data to detect the resonance point of said piezoelectric transformer, a peak control circuit for carrying out control near said resonance point when said peak detection circuit has detected said resonance point, and a status detection circuit for judging whether the state of control is a peak control state or an ordinary control state, wherein the clip value of said clip circuit is switched depending on the output value of said status detection circuit.

37. A piezoelectric transformer-driving circuit in accordance with claim 36, wherein said clip value at the time of peak control is smaller than that at the time of ordinary control.

38. A piezoelectric transformer-driving circuit in accordance with claim 35, further comprising a lighting detection circuit for detecting whether said cold cathode tube is in a state before lighting or after lighting, wherein said clip value of said clip circuit is switched depending on the output value of said lighting detection circuit.

39. A piezoelectric transformer-driving circuit in accordance with claim 35, wherein said error data input to said frequency setting circuit is clipped at zero when said error data output from said error voltage calculation circuit is negative before lighting.

40. A piezoelectric transformer-driving circuit in accordance with claim 7, comprising:

a smoothing portion including a plurality of smoothing circuits having the same smoothing cycle and different smoothing phases, and a selector circuit for switching the output of said plurality of smoothing circuits and for outputting the output at a predetermined timing to said error voltage calculation circuit in order to output the newest smooth data.

* * * * *

UNITED STATES PATENT AND TRADEMARK OFFICE

CERTIFICATE OF CORRECTION

PATENT NO. : 6,407,480 B1
DATED : June 18, 2002
INVENTOR(S) : Hideyuki Nakanishi et al.

It is certified that error appears in the above-identified patent and that said Letters Patent is hereby corrected as shown below:

Title page,
Item [56], References Cited, FOREIGN PATENT DOCUMENTS, please delete "EP 0 388 109 10/1989", and insert therefor -- EP 0 338 109 10/1989 --.

Column 5,
Line 44, after "A1...", please insert -- , --.
Line 53, please delete "$\left\{A0\cdot Bn-1+\overline{A0}\cdot A1\cdot Bn-2+\ldots+\overline{A0}\cdot A1\cdot\ldots An-2\cdot An-1\cdot B0\right\}+C$", and insert therefor -- $\left\{A0\cdot Bn-1+\overline{A0}\cdot A1\cdot Bn-2+\ldots+\overline{A0}\cdot\overline{A1}\cdot\ldots\cdot\overline{An-2}\cdot An-1\cdot B0\right\}+C$ --.

Column 13,
Line 27, please delete ",".

Column 14,
Line 15, please delete "set", and insert therefor -- setting --.

Column 19,
Line 59, please delete

"$A0\cdot Bn+\overline{A0}A1\cdot Bn-1+\ldots+\overline{A0}\cdot\overline{A1}\cdot\ldots\cdot\overline{An-2}\cdot\overline{An-1}\cdot An\cdot B0$", And insert therefor -- $A0\cdot Bn+\overline{A0}\cdot A1\cdot Bn-1+\ldots+\overline{A0}\cdot\overline{A1}\cdot\ldots\cdot\overline{An-2}\cdot\overline{An-1}\cdot An\cdot B0$ --.

Column 27,
Line 56, please delete the second occurrence of ",".

Column 48,
Line 56, please delete "-from", and insert therefor -- from --.

Column 50,
Line 14, please delete "becomes0", and insert therefor -- becomes 0 --.

Column 70,
Line 39, before "A/D", please insert -- an --.

UNITED STATES PATENT AND TRADEMARK OFFICE

CERTIFICATE OF CORRECTION

PATENT NO. : 6,407,480 B1
DATED : June 18, 2002
INVENTOR(S) : Hideyuki Nakanishi et al.

It is certified that error appears in the above-identified patent and that said Letters Patent is hereby corrected as shown below:

Column 72,
Line 58, please delete “In”, and insert therefor -- in --.

Signed and Sealed this

Twenty-first Day of January, 2003

JAMES E. ROGAN
*Director of the United States Patent and Trademark Office*